(12) United States Patent
Ejiri

(10) Patent No.: US 12,680,868 B2
(45) Date of Patent: Jul. 14, 2026

(54) COMPARATOR, LIGHT DETECTION ELEMENT, AND ELECTRONIC DEVICE

(71) Applicant: Sony Semiconductor Solutions Corporation, Kanagawa (JP)

(72) Inventor: Hirokazu Ejiri, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 137 days.

(21) Appl. No.: 18/725,642

(22) PCT Filed: Jan. 30, 2023

(86) PCT No.: PCT/JP2023/002878
§ 371 (c)(1),
(2) Date: Jun. 28, 2024

(87) PCT Pub. No.: WO2023/157627
PCT Pub. Date: Aug. 24, 2023

(65) Prior Publication Data
US 2025/0155283 A1      May 15, 2025

(30) Foreign Application Priority Data

Feb. 18, 2022    (JP) ................................. 2022-024242

(51) Int. Cl.
*G01J 1/44*          (2006.01)
*G01R 19/10*        (2006.01)
(52) U.S. Cl.
CPC ................ *G01J 1/44* (2013.01); *G01R 19/10* (2013.01); *G01J 2001/446* (2013.01)
(58) Field of Classification Search
CPC ...... G01J 1/44; G01J 2001/446; G01R 19/10; H04N 25/70; H04N 25/772; H10D 30/021; H10D 30/60; H10D 84/00; H10D 84/0126; H10D 84/038; H10D 84/83; H10D 84/85; H10F 39/12
See application file for complete search history.

(56) References Cited

U.S. PATENT DOCUMENTS

2023/0097485 A1* 3/2023 Kino ..................... H10F 39/151
257/292

FOREIGN PATENT DOCUMENTS

JP          H04256356 A      9/1992
JP          H09223794 A      8/1997
(Continued)

OTHER PUBLICATIONS

International Search Report (PCT/ISA/210), International Application No. PCT/JP2023/002878, dated Mar. 28, 2023.

*Primary Examiner* — Tony Ko
(74) *Attorney, Agent, or Firm* — Michael Best & Friedrich LLP

(57) ABSTRACT

Light detection with reduced noise is disclosed. In one example, a comparator compares a signal with a reference signal and outputs a comparison result. The comparator includes a differential circuit that outputs a differential voltage between the signal and the reference signal, and an active load circuit electrically connected to the differential circuit, in which the active load circuit includes first and second transistors provided on a surface of a substrate, and the first and second transistors have channel regions extending in a direction substantially perpendicular to the surface of the substrate.

16 Claims, 69 Drawing Sheets

200

(56) References Cited

FOREIGN PATENT DOCUMENTS

| JP | 2009200471 | A | 9/2009 |
| JP | 2019140532 | A | 8/2019 |
| WO | 2015122305 | A1 | 8/2015 |
| WO | 2019092999 | A1 | 5/2019 |
| WO | 2020179300 | A1 | 9/2020 |
| WO | 2021186969 | A1 | 9/2021 |

* cited by examiner

FIG. 6
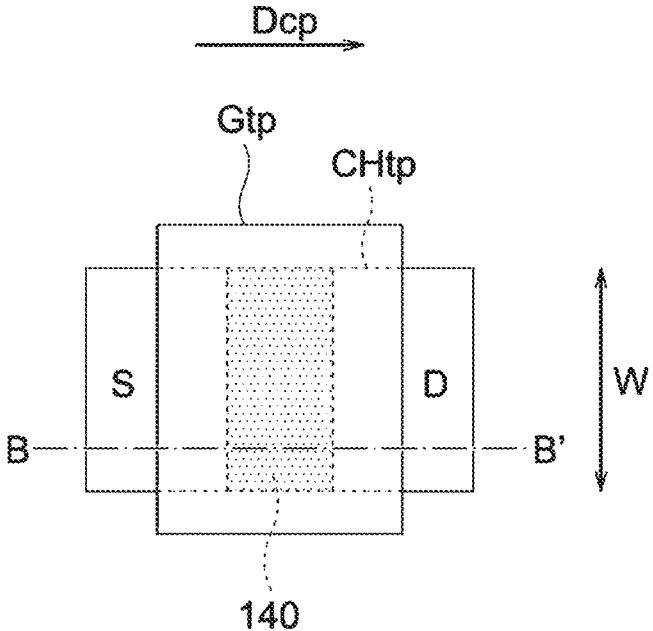
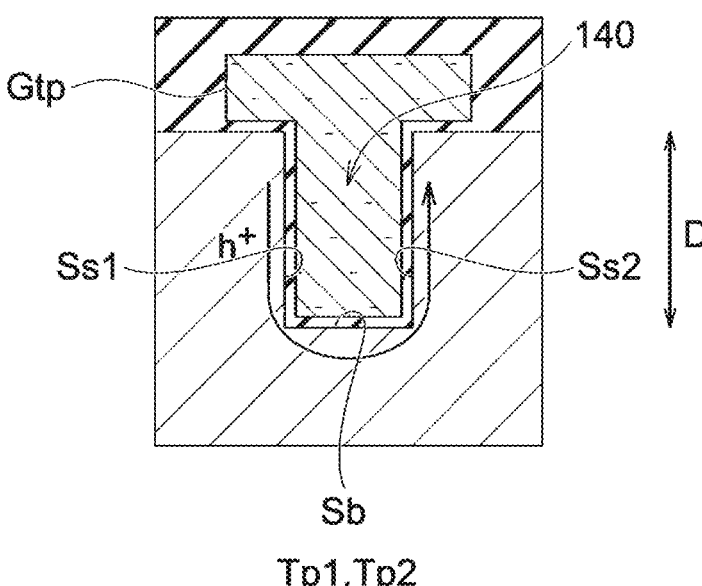
Tp1,Tp2

FIG. 8
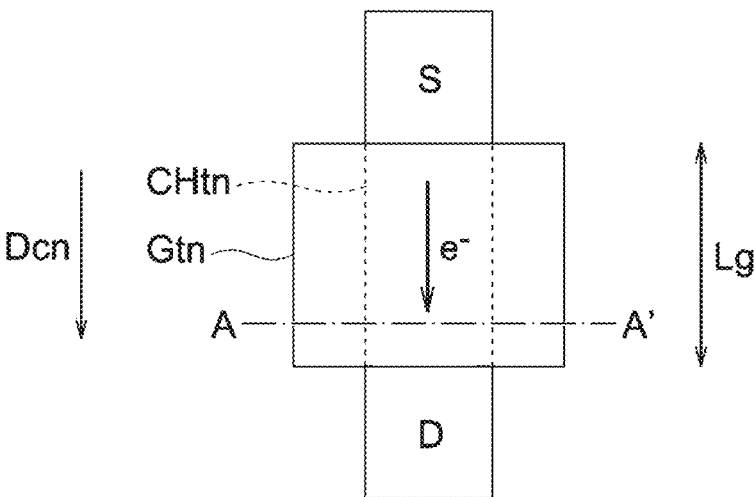
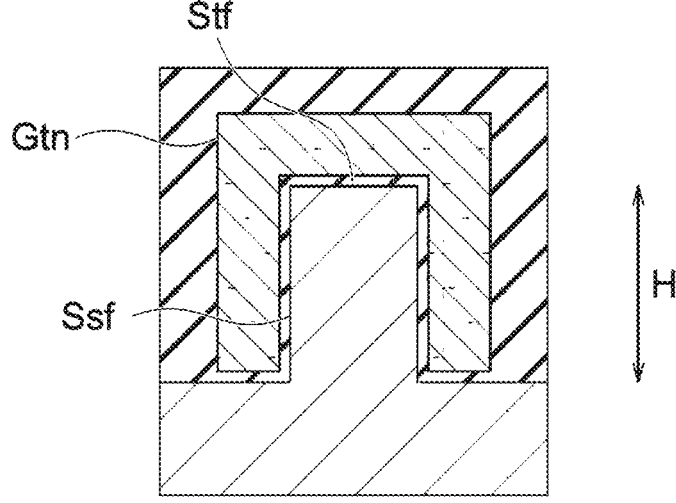
Tn1,Tn2

100

CNT

RCNT

Dcn RAn

RCNT

WCNT

Dcp RAp

RCNT

200

Tp1,Tp2

Tp1,Tp2

Tp1,Tp2

Tp1,Tp2

Tp1,Tp2

Tp1 or Tp2

Tp1 or Tp2

0 DEGREE
NOTCH SUBSTRATE

W0

D2

140

Gtp

CHtp (110)

(110)

Tp1 or Tp2

0 DEGREE
NOTCH SUBSTRATE

W0

140

D2

CHtp

Gtp (110)

(110)

Tp1 or Tp2

PD,TG,OF,210(Tn1 TO Tn4)

210(Tp1, Tp2)

100

200

550,560

MEMORY CIRCUIT

300

Y

X

Z

FIG. 28
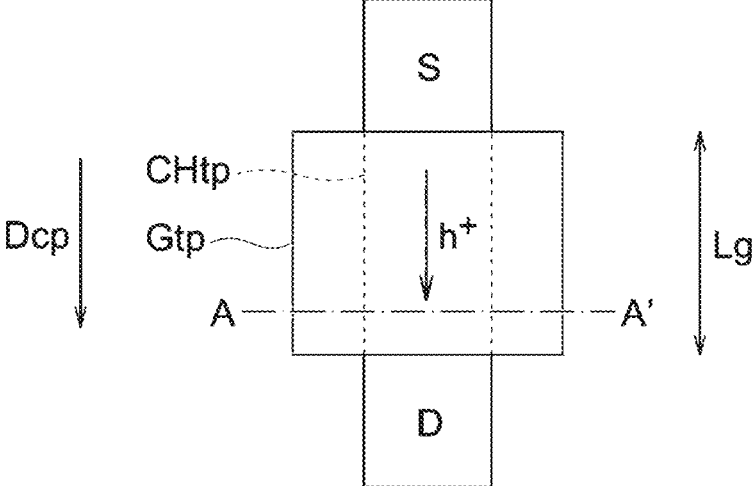
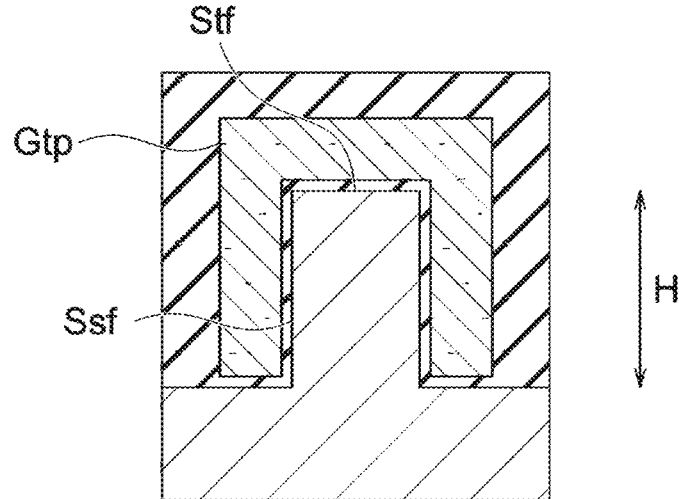
Tp11.Tp12

FIG. 29
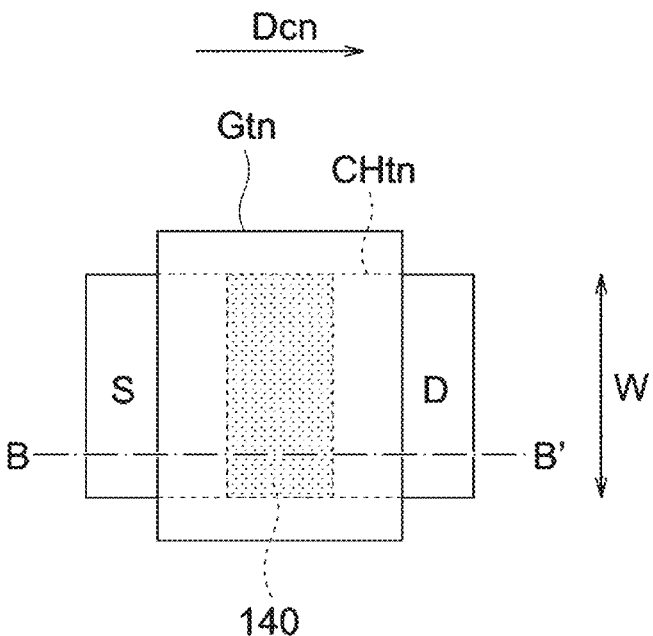
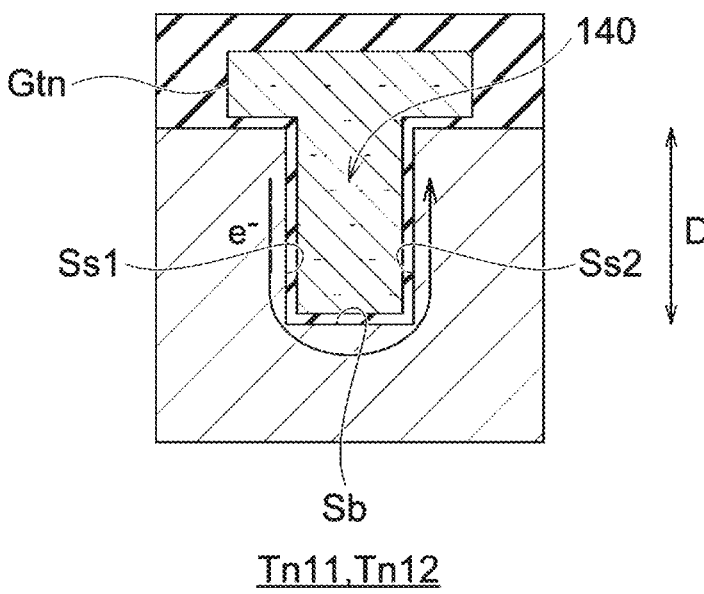
Tn11,Tn12

0 DEGREE
NOTCH SUBSTRATE

W0

S

D1

Gtp

CHtp

D (110)

(110)

Tp11 or Tp12

0 DEGREE
NOTCH SUBSTRATE

W0

D1

D   S

CHtp

Gtp (110)

Figure 74:
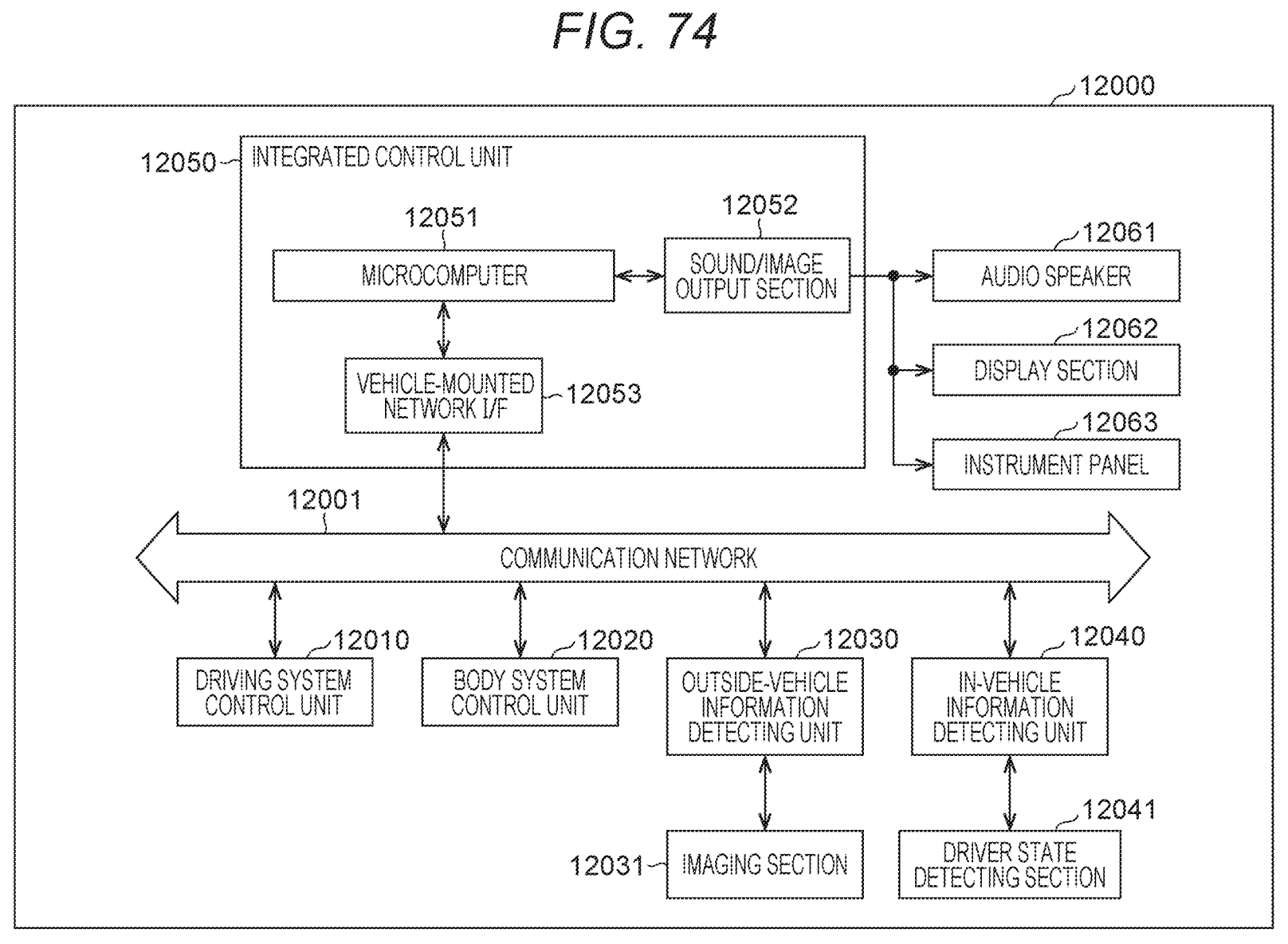

12050 — INTEGRATED CONTROL UNIT

12052 — SOUND/IMAGE OUTPUT SECTION

12051 — MICROCOMPUTER

12053 — VEHICLE-MOUNTED NETWORK I/F

12061 — AUDIO SPEAKER

12062 — DISPLAY SECTION

12063 — INSTRUMENT PANEL

12001 — COMMUNICATION NETWORK

12010 — DRIVING SYSTEM CONTROL UNIT

12020 — BODY SYSTEM CONTROL UNIT

12030 — OUTSIDE-VEHICLE INFORMATION DETECTING UNIT

12031 — IMAGING SECTION

12040 — IN-VEHICLE INFORMATION DETECTING UNIT

12041 — DRIVER STATE DETECTING SECTION

COMPARATOR, LIGHT DETECTION ELEMENT, AND ELECTRONIC DEVICE

TECHNICAL FIELD

Embodiments according to the present disclosure relate to a comparator, a light detection element, and an electronic device.

BACKGROUND ART

In a solid-state imaging apparatus such as a CIS (complementary metal oxide semiconductor (CMOS) image sensor), it is required to reduce noise characteristics of a comparator and an AD conversion circuit used for a pixel circuit. In order to reduce noise characteristics, it has been proposed to use a tunnel field effect transistor (TFET) for a transistor constituting a differential pair of a comparator (see Patent Document 1).

CITATION LIST

Patent Document

Patent Document 1: WO 2019/092999 A

SUMMARY OF THE INVENTION

Problems to be Solved by the Invention

However, this method cannot sufficiently reduce noise characteristics.

Provided are a comparator, a light detection element, and an electronic device capable of reducing noise.

Solutions to Problems

In order to solve the above problem, according to the present disclosure, there is provided a comparator that compares a signal with a reference signal and outputs a comparison result, the comparator including:

a differential circuit that outputs a differential voltage between the signal and the reference signal; and an active load circuit electrically connected to the differential circuit, in which the active load circuit includes first and second transistors provided on a surface of a substrate, and the first and second transistors have channel regions extending in a direction substantially perpendicular to the surface of the substrate.

The channel regions of the first and second transistors may have at least one recess substantially perpendicular to the surface of the substrate or at least one protrusion substantially perpendicular to the surface of the substrate along a channel length direction.

The recess or the protrusion may include:

two first side surfaces substantially perpendicular to the surface of the substrate; and a first bottom surface or a first upper surface substantially parallel to the surface of the substrate.

The differential circuit may include third and fourth transistors provided on the surface of the substrate, and the third and fourth transistors may have channel regions including a second upper surface substantially parallel to the surface of the substrate and a second side surface substantially perpendicular to the surface of the substrate.

The channel regions of the first and second transistors may extend in a direction substantially perpendicular to the surface of the substrate to a depth substantially equal to a height of the second side surface or to a height substantially equal to the height of the second side surface.

The differential circuit may include third and fourth transistors provided on the surface of the substrate, and channel length directions of the first and second transistors and the third and fourth transistors as viewed from a direction substantially perpendicular to the surface of the substrate may be inclined by about 90° with respect to each other.

The differential circuit may include third and fourth transistors provided on the surface of the substrate, the first and second transistors may be p-type transistors, and the third and fourth transistors may be n-type transistors.

Channel length directions of the first and second transistors may be substantially perpendicular or substantially parallel to a (100) crystal plane of the substrate.

The differential circuit may include third and fourth transistors provided on the surface of the substrate, the first and second transistors may be n-type transistors, and the third and fourth transistors may be p-type transistors.

Channel length directions of the third and fourth transistors may be substantially perpendicular or substantially parallel to a (110) crystal plane of the substrate.

According to the present disclosure, there is provided a light detection element including:

a pixel portion including a photoelectric conversion element that photoelectrically converts incident light into a pixel signal; and a comparator that compares the pixel signal with a reference signal and outputs a comparison result, the comparator including:

a differential circuit that outputs a differential voltage between the pixel signal and the reference signal; and an active load circuit electrically connected to the differential circuit, in which the active load circuit includes first and second transistors provided on a surface of a substrate, and the first and second transistors have channel regions extending in a direction substantially perpendicular to the surface of the substrate.

The pixel portion may be provided on a first substrate, the comparator may be provided on a second substrate different from the first substrate, the first substrate and the second substrate may be laminated, and the pixel portion and the comparator may be electrically connected by a through electrode provided on the first or second substrate or a wiring junction between a wiring of the first substrate and a wiring of the second substrate.

The pixel portion and the comparator may be provided on the same first substrate, the comparator may be provided above the pixel portion of the first substrate, and the pixel portion and the comparator may be electrically connected by a contact plug provided in an interlayer insulating film between the pixel portion and the comparator.

The differential circuit may be provided on a first substrate, the active load circuit may be provided on a second substrate different from the first substrate, the first substrate and the second substrate may be laminated, and the differential circuit and the active load circuit may be electrically connected by bonding a wiring of the first substrate and a wiring of the second substrate.

The pixel portion and the differential circuit may be provided on the same first substrate, the differential circuit may be provided above the pixel portion of the first substrate, and the pixel portion and the differential circuit may be electrically connected by a contact plug provided in an interlayer insulating film between the pixel portion and the differential circuit.

The pixel portion and the comparator may be provided on the same first substrate, the differential circuit may be provided in a same layer as a transistor of the pixel portion, the active load circuit may be provided above the pixel portion of the first substrate, and the differential circuit and the active load circuit may be electrically connected by a contact plug provided in an interlayer insulating film between the differential circuit and the active load circuit.

According to the present disclosure, an electronic device including a light detection element is provided.

BRIEF DESCRIPTION OF DRAWINGS

FIG. 6 is a diagram illustrating an example of a configuration of a p-type transistor according to the first embodiment.

FIG. 8 is a diagram illustrating an example of a configuration of an n-type transistor according to the first embodiment.

FIG. 28 is a diagram illustrating an example of a configuration of a p-type transistor according to the sixth embodiment.

FIG. 29 is a diagram illustrating an example of a configuration of an n-type transistor according to the sixth embodiment.

FIG. 47 is a schematic diagram for explaining a path of an input signal to the imaging apparatus illustrated in FIG. 3.

FIG. 67 is a schematic diagram for explaining a path of an input signal to the imaging apparatus illustrated in FIG. 66.

FIG. 71 is a schematic plan view illustrating another example of the pixel isolation portion illustrated in FIG. 41A and the like.

FIG. 72 is a diagram illustrating an example of a schematic configuration of an imaging system including the imaging apparatus according to the above embodiment and the modifications thereof.

FIG. 74 is a block diagram illustrating an example of a schematic configuration of a vehicle control system.

MODE FOR CARRYING OUT THE INVENTION

Hereinafter, embodiments of a comparator, a light detection element, and an electronic device will be described with reference to the drawings. Hereinafter, the main components of the comparator, the light detection element, and the electronic device will be mainly described, but the comparator, the light detection element, and the electronic device may have components and functions that are not illustrated or described. The following description does not exclude components and functions that are not depicted or described.

First Embodiment (Configuration of Imaging Apparatus 1)

Figure 1:
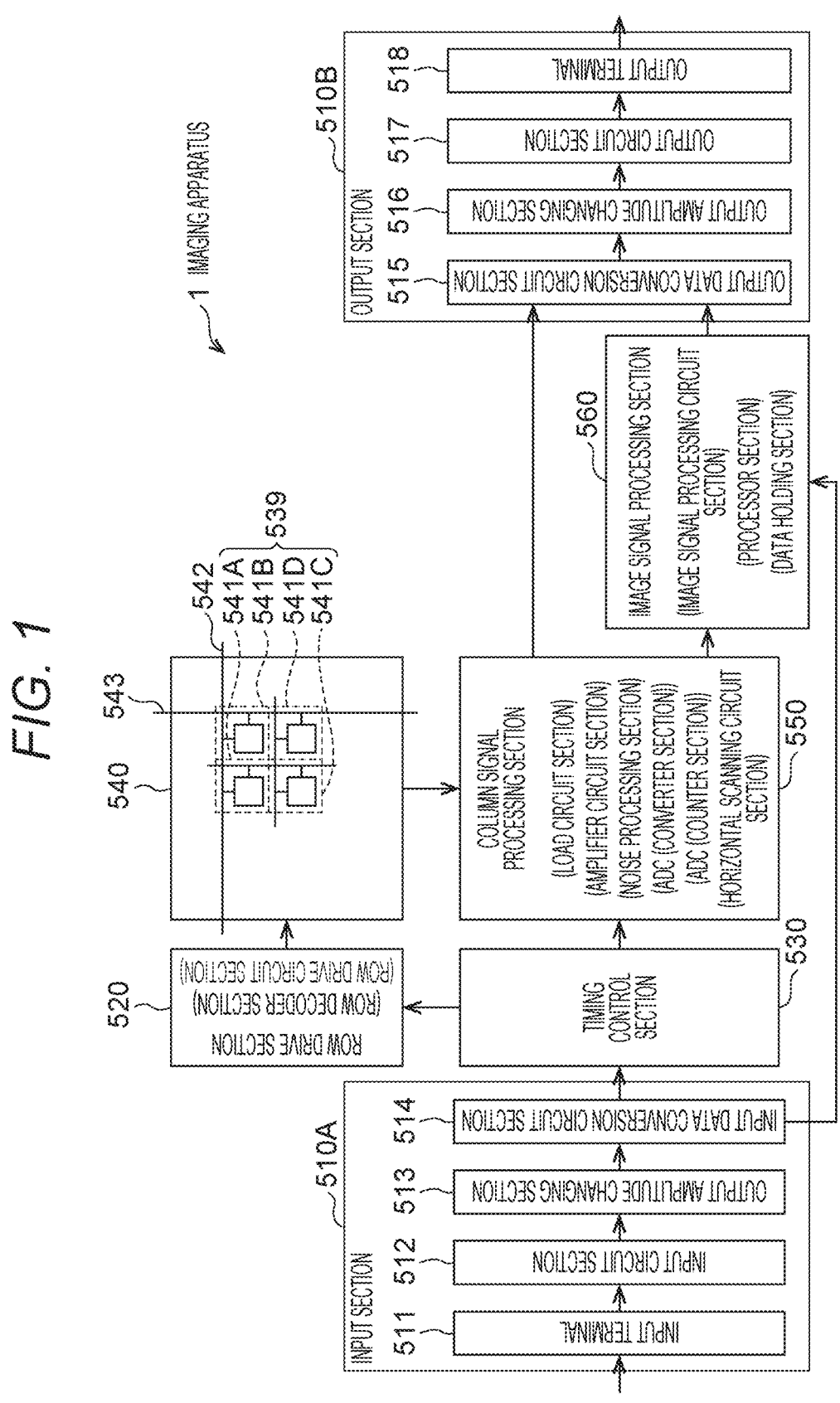
FIG. 1 is a block diagram illustrating an example of a functional configuration of an imaging apparatus according to a first embodiment.

FIG. 1 is a block diagram illustrating an example of a functional configuration of an imaging apparatus according to a first embodiment.

The imaging apparatus 1 of FIG. 1 includes, for example, an input section 510A, a row drive section 520, a timing control section 530, a pixel array section 540, a column signal processing section 550, an image signal processing section 560, and an output section 510B.

Figure 2:
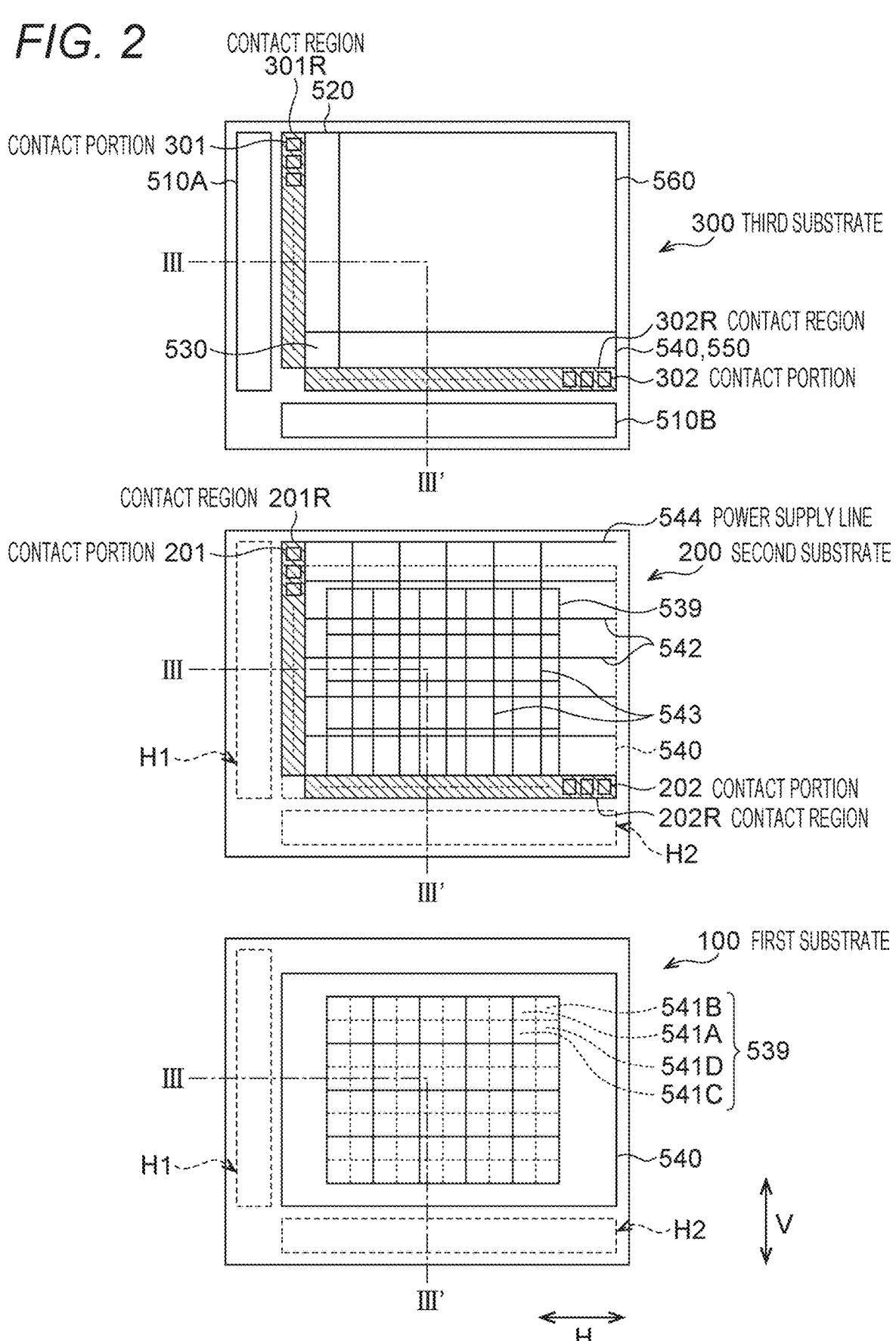
FIG. 2 is a diagram illustrating an example of a schematic configuration of an imaging apparatus.

In the pixel array section 540, the pixels 541 are repeatedly arranged in an array. More specifically, the pixel sharing unit 539 including a plurality of pixels is a repeating unit, and is repeatedly arranged in an array including a row direction and a column direction. Note that, in the present specification, for convenience, the row direction may be referred to as an H direction, and the column direction orthogonal to the row direction may be referred to as a V direction. In the present embodiment, as illustrated in FIG. 2, one pixel sharing unit 539 includes eight pixels 541. Each of the pixels 541 includes a photodiode PD. The pixel sharing unit 539 is a unit that shares one pixel circuit. In other words, one pixel circuit (for example, the comparator section 210 in FIG. 2) is provided for each of the eight pixels 541. By operating the pixel circuit in a time division manner, the pixel signal of each of the pixels 541 is sequentially read. The pixels 541 are arranged in, for example, two rows×two columns. In the pixel array section 540 of FIG. 1, a plurality of row drive signal lines 542 and a plurality of vertical signal lines (column readout lines) 543 are provided together with a plurality of pixels 541. The row drive signal line 542 drives the pixels 541 included in each of the plurality of pixel sharing units 539 arranged side by side in the row direction in the pixel array section 540. In the pixel sharing unit 539, each pixel arranged side by side in the row direction is driven. The pixel sharing unit 539 is provided with a plurality of transistors. In order to drive each of the plurality of transistors, a plurality of row drive signal lines 542 is connected to one pixel sharing unit 539. The pixel sharing unit 539 is connected to the vertical signal line (column readout line) 543. A pixel signal is read from each of the pixels 541 included in the pixel sharing unit 539 via a vertical signal line (column readout line) 543.

The row drive section 520 includes, for example, a row address control section that determines a position of a row for driving pixels, in other words, a row decoder section, and a row drive circuit section that generates a signal for driving the pixels 541.

The column signal processing section 550 includes, for example, a load circuit section that is connected to the vertical signal line 543 and forms a source follower circuit with the pixel sharing unit 539. The column signal processing section 550 may include an amplifier circuit section that amplifies the pixel signal read from the pixel sharing unit 539 via the vertical signal line 543. The column signal processing section 550 may include a noise processing section. In the noise processing section, for example, the noise level of the system is removed from the signal read from the pixel sharing unit 539 as a result of the photoelectric conversion.

The column signal processing section 550 includes, for example, an analog-to-digital converter (ADC). In the analog-to-digital converter, the signal read from the pixel sharing unit 539 or the noise-processed analog signal described above is converted into a digital signal. The ADC may include, for example, a comparator section (210 in FIG. 5) and a counter section. In the comparator section 210, an analog signal (pixel signal) to be converted is compared with a reference signal to be compared. The comparator section 210 will be described later with reference to FIG. 5. In the counter section, the time until the comparison result in the comparator section 210 is inverted is measured. The count value from the counter section is a pixel signal subjected to correlated double sampling (CDS) processing and subjected to AD conversion. The column signal processing section 550 may include a horizontal scanning circuit section that performs control to scan a readout column in order to output a pixel signal.

The timing control section 530 supplies a signal for controlling timing to the row drive section 520 and the column signal processing section 550 on the basis of the reference clock signal and the timing control signal input to the apparatus.

The image signal processing section 560 is a circuit that performs various types of signal processing on data obtained as a result of photoelectric conversion, in other words, data obtained as a result of an imaging operation in the imaging apparatus 1. The image signal processing section 560 includes, for example, an image signal processing circuit section and a data holding section. The image signal processing section 560 may include a processor section.

An example of the signal processing executed in the image signal processing section 560 is tone curve correction processing of providing a large number of gradations in a case where the AD-converted imaging data is data obtained by imaging a dark subject, and reducing the gradations in a case where the AD converted imaging data is data obtained by imaging a bright subject. In this case, it is desirable to store the characteristic data of the tone curve in the data holding section of the image signal processing section 560 in advance on the basis of which tone curve the gradation of the imaging data is corrected.

The input section 510A is, for example, for inputting the above-described reference clock signal, the timing control signal, the characteristic data, and the like from the outside of the apparatus to the imaging apparatus 1. The timing control signal is, for example, a vertical synchronization signal, a horizontal synchronization signal, or the like. The characteristic data is, for example, to be stored in the data holding section of the image signal processing section 560. The input section 510A includes, for example, an input terminal 511, an input circuit section 512, an input amplitude changing section 513, an input data conversion circuit section 514, and a power supply section (not illustrated).

The input terminal 511 is an external terminal for inputting data. The input circuit section 512 is for taking a signal input to the input terminal 511 into the imaging apparatus 1. In the input amplitude changing section 513, the amplitude of the signal captured by the input circuit section 512 is changed to an amplitude that can be easily used inside the imaging apparatus 1. In the input data conversion circuit section 514, the arrangement of data strings of the input data is changed. The input data conversion circuit section 514 includes, for example, a serial-to-parallel conversion circuit. In this serial-to-parallel conversion circuit, a serial signal received as input data is converted into a parallel signal. Note that, in the input section 510A, the input amplitude changing section 513 and the input data conversion circuit section 514 may be omitted. The power supply section supplies power set to various voltages required inside the imaging apparatus 1 on the basis of power supplied from the outside to the imaging apparatus 1.

When the imaging apparatus 1 is connected to an external memory device, the input section 510A may be provided with a memory interface circuit that receives data from the external memory device. Examples of the external memory device include a flash memory, an SRAM, and a DRAM.

The output section 510B outputs the image data to the outside of the apparatus. The image data is, for example, image data captured by the imaging apparatus 1, image data subjected to signal processing by the image signal processing section 560, and the like. The output section 510B includes, for example, an output data conversion circuit section 515, an output amplitude changing section 516, an output circuit section 517, and an output terminal 518.

The output data conversion circuit section 515 includes, for example, a parallel/serial conversion circuit, and in the output data conversion circuit section 515, a parallel signal used inside the imaging apparatus 1 is converted into a serial signal. The output amplitude changing section 516 changes the amplitude of a signal used inside the imaging apparatus 1. The signal having the changed amplitude is easily used in an external device connected to the outside of the imaging apparatus 1. The output circuit section 517 is a circuit that outputs data from the inside of the imaging apparatus 1 to the outside of the apparatus, and wiring outside the imaging apparatus 1 connected to the output terminal 518 is driven by the output circuit section 517. At the output terminal 518, data is output from the imaging apparatus 1 to the outside of the apparatus. In the output section 510B, the output data conversion circuit section 515 and the output amplitude changing section 516 may be omitted.

When the imaging apparatus 1 is connected to an external memory device, the output section 510B may be provided with a memory interface circuit that outputs data to the external memory device. Examples of the external memory device include a flash memory, an SRAM, and a DRAM.

(Schematic Configuration of Imaging Apparatus 1)

Figure 3:
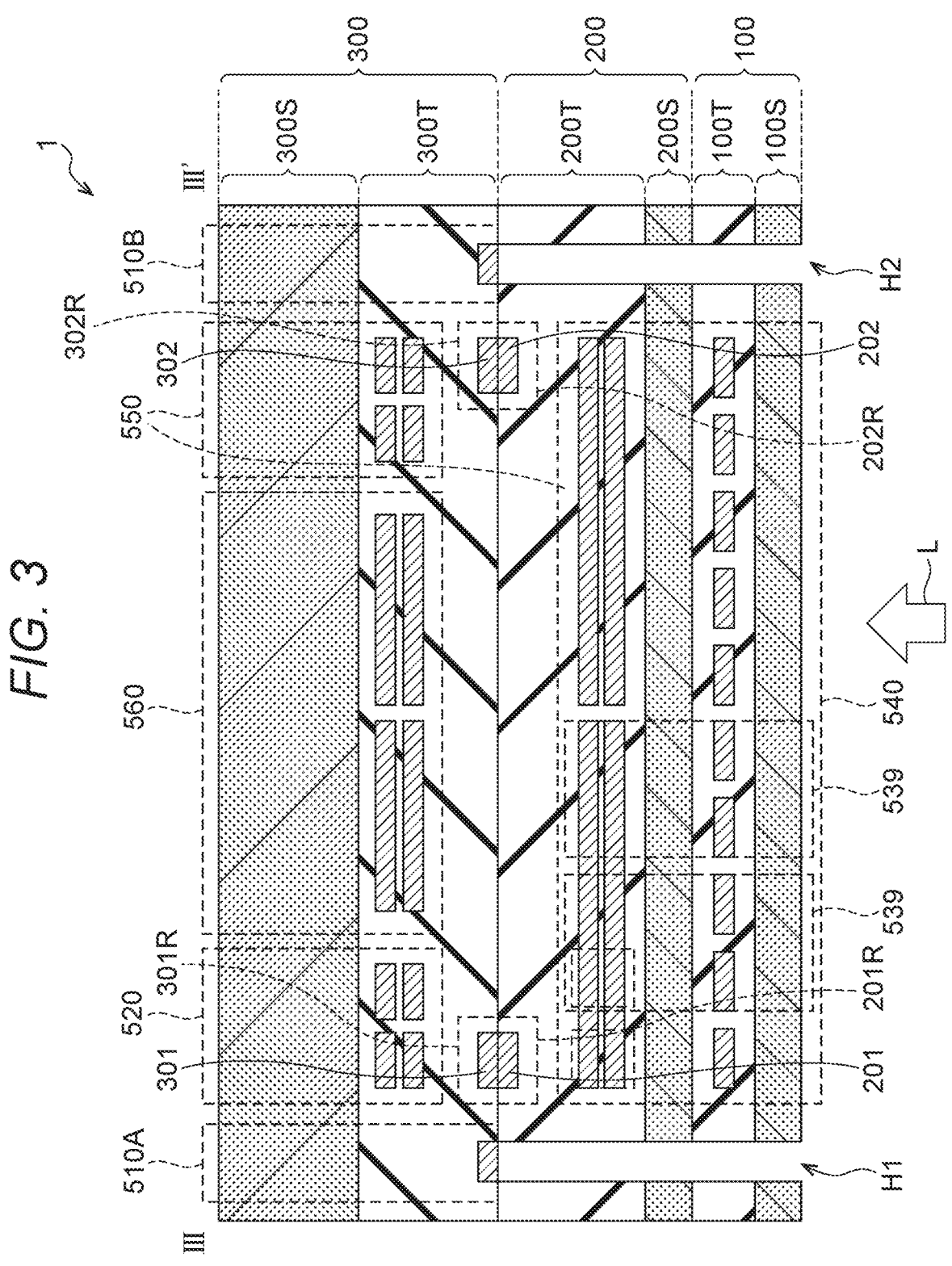
FIG. 3 is a diagram illustrating an example of a schematic configuration of an imaging apparatus.

FIGS. 2 and 3 are diagrams illustrating an example of a schematic configuration of the imaging apparatus 1. The imaging apparatus 1 includes three substrates (first substrate 100, second substrate 200, and third substrate 300). FIG. 2 schematically illustrates a planar configuration of each of the first substrate 100, the second substrate 200, and the third substrate 300, and FIG. 3 schematically illustrates a cross-sectional configuration of the first substrate 100, the second substrate 200, and the third substrate 300 laminated on each other. FIG. 3 corresponds to the cross-sectional configuration taken along line III-III' illustrated in FIG. 2. The imaging apparatus 1 is an imaging apparatus having a three-dimensional structure formed by bonding three substrates (first substrate 100, second substrate 200, and third substrate 300). The first substrate 100 includes a semiconductor layer 100S and a wiring layer 100T. The second substrate 200 includes a semiconductor layer 200S and a wiring layer 200T. The third substrate 300 includes a semiconductor layer 300S and a wiring layer 300T. Here, a combination of the wiring included in each substrate of the first substrate 100, the second substrate 200, and the third substrate 300 and the interlayer insulating film around the wiring is referred to as a wiring layer (100T, 200T, 300T) provided on each substrate (first substrate 100, second substrate 200, and third substrate 300) for convenience. The first substrate 100, the second substrate 200, and the third substrate 300 are laminated in this order, and the semiconductor layer 100S, the wiring layer 100T, the semiconductor layer 200S, the wiring layer 200T, the wiring layer 300T, and the semiconductor layer 300S are arranged in this order along the laminating direction. Specific configurations of the first substrate 100, the second substrate 200, and the third substrate 300 will be described later. The arrow illustrated in FIG. 3 indicates the incident direction of the light L on the imaging apparatus 1. In the present specification, for convenience, in the following cross-sectional views, the light incident side in the imaging apparatus 1 may be referred to as "lower", "lower side", and "lower direction", and the side opposite to the light incident side may be referred to as "upper", "upper side", and "upper direction". In addition, in the present specification, for convenience, in a substrate including a semiconductor layer and a wiring layer, a side of the wiring layer may be referred to as a front surface, and a side of the semiconductor layer may be referred to as a back surface. Note that, the description of the specification is not limited to the above terms. The imaging apparatus 1 is, for example, a back-illuminated imaging apparatus in which light enters from the back surface side of the first substrate 100 having a photodiode.

Both the pixel array section 540 and the pixel sharing unit 539 included in the pixel array section 540 are configured using both the first substrate 100 and the second substrate 200. The first substrate 100 is provided with a plurality of pixels 541A, 541B, 541C, and 541D included in the pixel sharing unit 539. Each of these pixels 541 includes a photodiode (photodiode PD described later) and a transfer transistor (transfer transistor TG or TR described later). The second substrate 200 is provided with a pixel circuit included in the pixel sharing unit 539. The pixel circuit reads the pixel signal transferred from the photodiode of each of the pixels 541A, 541B, 541C, and 541D via the transfer transistor, or resets the photodiode. In addition to such a pixel circuit, the second substrate 200 includes a plurality of row drive signal lines 542 extending in the row direction and a plurality of vertical signal lines 543 extending in the column direction. The second substrate 200 further includes a power supply line 544 extending in the row direction and a part of the column signal processing section 550. The third substrate 300 includes, for example, the input section 510A, the row drive section 520, the timing control section 530, the remainder of the column signal processing section 550, the image signal processing section 560, and the output section 510B. The row drive section 520 is provided, for example, in a region where a part thereof overlaps the pixel array section 540 in the laminating direction (hereinafter, simply referred to as a laminating direction) of the first substrate 100, the second substrate 200, and the third substrate 300. More specifically, the row drive section 520 is provided in a region overlapping the vicinity of the end portion of the pixel array section 540 in the H direction in the laminating direction (FIG. 2). The column signal processing section 550 is provided, for example, in a region partially overlapping the pixel array section 540 in the laminating direction. More specifically, the column signal processing section 550 is provided in a region overlapping the vicinity of the end portion of the pixel array section 540 in the V direction in the laminating direction (FIG. 2). Although not illustrated, the input section 510A and the output section 510B may be disposed in a portion other than the third substrate 300, for example, may be disposed on the second substrate 200. Alternatively, the input section 510A and the output section 510B may be provided on the back surface (light incident surface) side of the first substrate 100. Note that the pixel circuit provided on the second substrate 200 described above may also be referred to as a pixel transistor circuit, a pixel transistor group, a pixel transistor, a pixel readout circuit, or a readout circuit as another name. In the present specification, the term "pixel circuit" is used.

The first substrate 100 and the second substrate 200 are electrically connected by, for example, a through electrode. The second substrate 200 and the third substrate 300 are electrically connected via, for example, a contact portion 201, 202, 301, or 302. The contact portions 201 and 202 are provided on the second substrate 200, and the contact portions 301 and 302 are provided on the third substrate 300. The contact portion 201 of the second substrate 200 is in contact with the contact portion 301 of the third substrate 300, and the contact portion 202 of the second substrate 200 is in contact with the contact portion 302 of the third substrate 300. The second substrate 200 includes a contact region 201R in which the plurality of contact portions 201 is provided and a contact region 202R in which the plurality of contact portions 202 is provided. The third substrate 300 includes a contact region 301R in which the plurality of contact portions 301 is provided and a contact region 302R in which the plurality of contact portions 302 is provided. The contact regions 201R and 301R are provided between the pixel array section 540 and the row drive section 520 in the laminating direction (FIG. 3). In other words, the contact regions 201R and 301R are provided, for example, in a region where the row drive section 520 (third substrate 300) and the pixel array section 540 (second substrate 200) overlap in the laminating direction or in a region in the vicinity thereof. The contact regions 201R and 301R are disposed, for example, at end portions in the H direction in such regions (FIG. 2). In the third substrate 300, for example, the contact region 301R is provided at a position overlapping a part of the row drive section 520, specifically, the end portion of the row drive section 520 in the H direction (FIGS. 2 and 3). The contact portions 201 and 301 connect, for example, the row drive section 520 provided on the third substrate 300 and the row drive line 542 provided on the second substrate 200. For example, the contact portions 201 and 301 may connect the input section 510A provided on the third substrate 300 to the power supply line 544 and a reference potential line (reference potential line VSS described later). The contact regions 202R and 302R are provided between the pixel array section 540 and the column signal processing section 550 in the laminating direction (FIG. 3). In other words, the contact regions 202R and 302R are provided, for example, in a region where the column signal processing section 550 (third substrate 300) and the pixel array section 540 (second substrate 200) overlap in the laminating direction or in a vicinity region thereof. The contact regions 202R and 302R are disposed, for example, at end portions in the V direction in such regions (FIG. 2). In the third substrate 300, for example, the contact region 301R is provided at a position overlapping with a part of the column signal processing section 550, specifically, the end portion of the column signal processing section 550 in the V direction (FIGS. 2 and 3). The contact portions 202 and 302 are, for example, for connecting a pixel signal (a signal corresponding to the amount of charge generated as a result of photoelectric conversion in a photodiode) output from each of the plurality of pixel sharing units 539 included in the pixel array section 540 to the column signal processing section 550 provided on the third substrate 300. The pixel signal is transmitted from the second substrate 200 to the third substrate 300.

FIG. 3 is an example of a cross-sectional view of the imaging apparatus 1 as described above. The first substrate 100, the second substrate 200, and the third substrate 300 are electrically connected via the wiring layers 100T, 200T, and 300T. For example, the imaging apparatus 1 includes an electrical connection portion that electrically connects the second substrate 200 and the third substrate 300. Specifically, the contact portions 201, 202, 301, and 302 are constituted by an electrode constituted by a conductive material. The conductive material is constituted by, for example, a metal material such as copper (Cu), aluminum (Al), or gold (Au). The contact regions 201R, 202R, 301R, and 302R electrically connect the second substrate and the third substrate by directly bonding wirings formed as electrodes, for example, and enable signal input and/or output between the second substrate 200 and the third substrate 300.

An electrical connection portion that electrically connects the second substrate 200 and the third substrate 300 can be provided at a desired location. For example, as described as the contact regions 201R, 202R, 301R, and 302R in FIG. 3, the contact regions may be provided in a region overlapping the pixel array section 540 in the laminating direction. Furthermore, the electrical connection portion may be provided in a region not overlapping the pixel array section 540 in the laminating direction. Specifically, it may be provided in a region overlapping a peripheral portion arranged outside the pixel array section 540 in the laminating direction.

The first substrate 100 and the second substrate 200 are provided with, for example, connection holes H1 and H2. The connection holes H1 and H2 penetrate the first substrate 100 and the second substrate 200 (FIG. 3). The connection holes H1 and H2 are provided outside the pixel array section 540 (or a portion overlapping the pixel array section 540) (FIG. 2). For example, the connection hole H1 is arranged outside the pixel array section 540 in the H direction, and the connection hole H2 is arranged outside the pixel array section 540 in the V direction. For example, the connection hole H1 reaches the input section 510A provided in the third substrate 300, and the connection hole H2 reaches the output section 510B provided in the third substrate 300. The connection holes H1 and H2 may be hollow, and at least a part thereof may contain a conductive material. For example, there is a configuration in which a bonding wire is connected to an electrode formed as the input section 510A and/or the output section 510B. Alternatively, there is a configuration in which the electrode formed as the input section 510A and/or the output section 510B is connected to the conductive material provided in the connection holes H1 and H2. The conductive material provided in the connection holes H1 and H2 may be embedded in a part or all of the connection holes H1 and H2, and the conductive material may be formed on the side walls of the connection holes H1 and H2.

Note that, in FIG. 3, the input section 510A and the output section 510B are provided on the third substrate 300, but the present invention is not limited thereto. For example, by sending a signal of the third substrate 300 to the second substrate 200 via the wiring layers 200T and 300T, the input section 510A and/or the output section 510B can be provided on the second substrate 200. Similarly, by sending a signal of the second substrate 200 to the first substrate 1000 via the wiring layers 100T and 200T, the input section 510A and/or the output section 510B can be provided on the first substrate 100.

Figure 4:
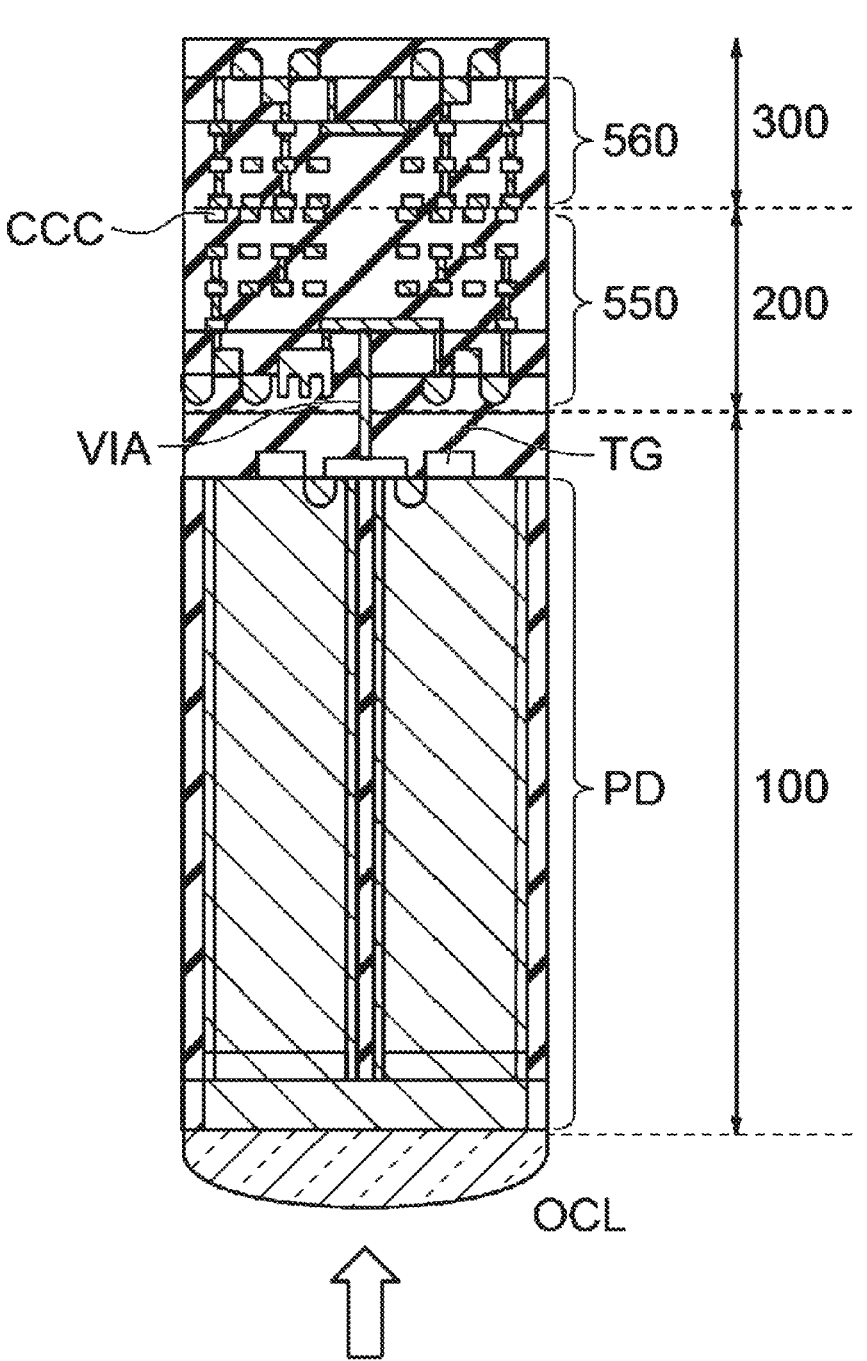
FIG. 4 is a schematic cross-sectional view illustrating configurations of a pixel sharing unit, a column signal processing section, and a pixel signal processing section according to the first embodiment.

FIG. 4 is a schematic cross-sectional view illustrating configurations of the pixel sharing unit 539, the column signal processing section 550, and the pixel signal processing section 560 according to the first embodiment. The pixel sharing unit 539, the column signal processing section 550, and the pixel signal processing section 560 are provided on, for example, the first substrate 100, the second substrate 200, and the third substrate 300, respectively. The first to third substrates 100 to 300 are, for example, silicon substrates and are laminated on each other. The first to third substrates 100 to 300 are electrically connected to each other by using a via contact VIA, a through electrode (through silicon via (TSV)), and/or a wiring junction (Cu—Cu junction) CCC. The via contact VIA is a contact plug provided through the interlayer insulating film. The through electrode TSV is an electrode that penetrates the substrate and electrically connects the semiconductor element to the semiconductor element of another substrate. The wiring junction CCC is formed by directly joining the wirings provided on each of the first to third substrates 100 to 300 by laminating the substrates.

The first substrate 100 is provided with, for example, components corresponding to the respective pixels 541, such as a photodiode PD, a transfer transistor TG, an overflow gate (not illustrated in FIG. 4), and a floating diffusion FD. The solid-state imaging apparatus in FIG. 4 is a back-illuminated CIS, and an on-chip lens OCL is provided on the light receiving surface of the first substrate 100. A transfer transistor TG and an overflow gate are provided on a surface of the first substrate 100 opposite to the light receiving surface. The transfer transistor TG and the overflow gate are covered with an interlayer insulating film, and are electrically connected to the via contact VIA embedded in the interlayer insulating film. The comparator section 210 of the column signal processing section 550 is provided on the second substrate 200, for example. The column signal processing section 550 is electrically connected to the floating diffusion FD and the like of the first substrate 100 via the through electrode TSV penetrating the second substrate 200 and the via contact VIA. The column signal processing section 550 is also covered with an interlayer insulating film, and is electrically connected to the wiring embedded in the interlayer insulating film. A part of the wiring is exposed on the surface of the interlayer insulating film. The third substrate 300 is provided with, for example, a logic circuit subsequent to the comparator section 210 of the column signal processing section 550, the pixel signal processing section 560, and the like. The logic circuit, the pixel signal processing section 560, and the like are also covered with an interlayer insulating film, and are electrically connected to the wiring embedded in the interlayer insulating film. A part of the wiring is exposed on the surface of the interlayer insulating film.

Parts of the wirings of the second and third substrates 200 and 300 are bonded to each other by laminating of the second and third substrates 200 and 300, and the wirings are electrically connected to each other. As a result, the wiring junction CCC is formed.

Figure 5:
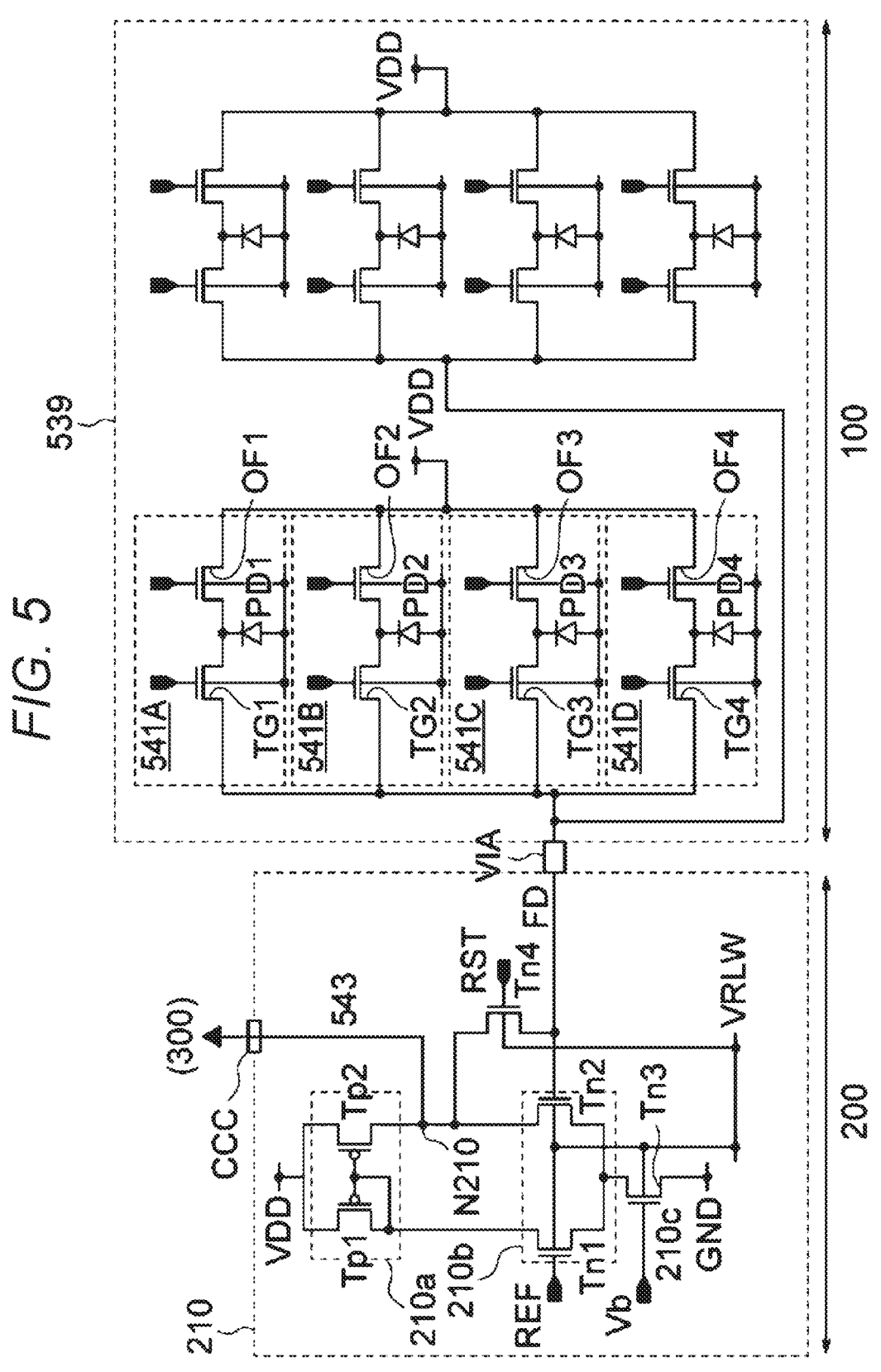
FIG. 5 is an equivalent circuit diagram illustrating an example of configurations of a pixel sharing unit and a comparator section.

FIG. 5 is an equivalent circuit diagram illustrating an example of the configurations of the pixel sharing unit 539 and the comparator section 210. The pixel sharing unit 539 includes a plurality of pixels 541 and one comparator section 210 connected to the plurality of pixels 541. The plurality of pixels 541 is provided on the first substrate 100, and the comparator section 210 is provided on the second substrate 200. The first substrate 100 and the second substrate 200 are electrically connected by a through electrode electrically connected in a wiring junction (Cu—Cu junction) CCC.

(Configuration of Pixel Sharing Unit 539)

The pixel sharing unit 539 sequentially outputs pixel signals of the plurality of pixels 541 (pixels 541A, 541B, 541C, and 541D) included in the pixel sharing unit 539 to the vertical signal line 543 by operating one comparator section 210 in a time division manner. One comparator section 210 is connected to a plurality of pixels 541, and a mode in which pixel signals of the plurality of pixels 541 are output by one comparator section 210 in a time division manner is referred to as "a plurality of pixels 541 shares one comparator section 210". In FIG. 5, eight pixels 541 share one comparator section 210, but the number thereof is not particularly limited.

The pixels 541 have components common to each other. Hereinafter, in a case where it is not necessary to distinguish the components of the plurality of pixels 541A, 541B, 541C, and 541D from one another, the identification numbers at the ends of the reference signs of the components of the pixels 541A, 541B, 541C, and 541D are omitted.

The pixel 541 includes, for example, a photodiode PD, a transfer transistor TG electrically connected to the photodiode PD, an overflow gate OF electrically connected to the photodiode PD, and a floating diffusion FD electrically connected to the transfer transistor TG.

In the photodiode PD (PD1 to PD4), a cathode is electrically connected to a source or a drain of the transfer transistor TG and the overflow gate OF, and an anode is electrically connected to a reference potential line (for example, ground). The photodiode PD is a photoelectric conversion element that photoelectrically converts incident light into a pixel signal and generates a charge corresponding to the amount of received light.

The transfer transistors TG (TG1 to TG4) are, for example, complementary metal oxide semiconductor (CMOS) transistors. In the transfer transistor TG, the drain is electrically connected to the floating diffusion FD, and the gate is electrically connected to the drive signal line. The drive signal line is a part of the plurality of row drive signal lines 542 (see FIG. 1) connected to one pixel sharing unit 539. The transfer transistor TG transfers the charge generated in the photodiode PD to the floating diffusion FD.

The floating diffusion FD is an n-type diffusion layer region formed in the p-type semiconductor layer. The floating diffusion FD is a charge holding means that temporarily holds the charge transferred from the photodiode PD, and is a charge-voltage conversion means that generates a voltage corresponding to the charge amount. The floating diffusion FD is shared by the plurality of pixels 541.

The overflow gate OF (OF1 to OF4) is connected between the photodiode PD and the power supply VDD, and a predetermined voltage is applied to the gate. The overflow gate OF causes a charge exceeding the saturation charge amount of the photodiode PD to flow to the power supply VDD. The overflow gate OF includes, for example, an n-type transistor.

(Configuration and Function of Comparator Section 210)

The comparator section 210 includes a current mirror circuit 210a which is an active load circuit, a differential circuit 210b, a current source 210c, and a reset transistor 210d.

The current mirror circuit 210a includes p-type transistors Tp1 and Tp2. The source of the transistor Tp1 is connected to the power supply VDD, and the drain thereof is connected to the drain of the n-type transistor Tn1. The gate of the transistor Tp1 is connected to the drain of the transistor Tp1 in common with the gate of the transistor Tp2. The source of the transistor Tp2 is connected to the power supply VDD, and the drain thereof is connected to the drain of the n-type transistor Tn2. The gate of the transistor Tp2 is connected to the drain of the transistor Tp1 in common with the gate of the transistor Tp1.

Since the gates of the transistors Tp1 and Tp2 are commonly connected to the drain of the transistor Tp1, the transistors Tp1 and Tp2 constitute a current mirror circuit, and a current corresponding to a predetermined mirror ratio flows through the transistors Tn1 and Tn2. A more detailed configuration of the transistors Tp1 and Tp2 will be described later.

The differential circuit 210b includes n-type transistors Tn1 and Tn2. The drain of the transistor Tn1 is connected to the drain and the gate of the transistor Tp1. The source of the transistor Tn1 is connected to the drain of the n-type transistor Tn3 in common with the source of the transistor Tn2. The drain of the transistor Tn2 is connected to the drain of the transistor Tp2. The source of the transistor Tn2 is connected to the drain of the transistor Tn3 in common with the source of the transistor Tn1.

The transistors Tn1 and Tn2 receive the pixel signal and the reference signal from the floating diffusion FD at their gates, and output the voltage difference from the node N210.

The current source 210c includes an n-type transistor Tn3, and maintains the entire current flowing through the transistors Tn1 and Tn2 at a predetermined value. The drain of the transistor Tn3 is commonly connected to the sources of the transistors Tn1 and Tn2, and the source of the transistor Tn3 is connected to the ground GND. A predetermined voltage Vb is applied to the gate of the transistor Tn3.

The n-type transistor Tn4 is connected between the node N210 and the gate (floating diffusion FD) of the transistor Tn2. The gate of the n-type transistor Tn4 receives the reset signal RST. The n-type transistor Tn4 functions as an AZ transistor, and performs an auto-zero operation by electrically connecting the floating diffusion FD and the node N210 before detecting the output signal.

A negative voltage VRLW is applied as a back bias to the transistors Tn1 to Tn4.

(Transconductance and Noise)

Here, noise reduction is required in the ADC. By reducing the transconductance gm of the p-type transistors Tp1 and Tp2 constituting the current mirror circuit 210a, noise is reduced and noise characteristics are improved. On the other hand, by increasing the transconductance gm of the n-type transistors Tn1 and Tn2 constituting the differential circuit 210b, noise is reduced and noise characteristics are improved. For example, a signal/noise (S/N) ratio is improved, and a dynamic range can be expanded. As a result, the sensor characteristics of the solid-state imaging apparatus (light detection element) according to the present embodiment are improved.

The transconductance gm changes according to the relationship between the channel length Lg and the channel width W of the transistor. For example, the transconductance gm decreases as the channel length Lg increases and increases as the channel width W increases.

(Configuration of p-Type Transistors Tp1 and Tp2)

Figure 7:
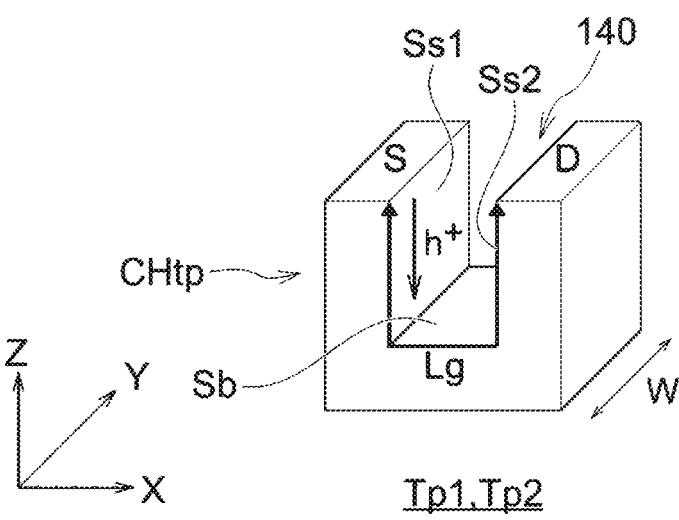
FIG. 7 is a perspective view illustrating an example of a configuration of a channel region of the p-type transistor according to the first embodiment.

FIG. 6 is a diagram illustrating an example of a configuration of the p-type transistors Tp1 and Tp2 according to the first embodiment. The upper part of FIG. 6 illustrates a plan view. The lower part of FIG. 6 illustrates a cross-sectional view corresponding to the cross section taken along line B-B' of the plan view of FIG. 6. FIG. 7 is a perspective view illustrating an example of a configuration of a channel region CHtp of the p-type transistors Tp1 and Tp2 according to the first embodiment.

The p-type transistors Tp1 and Tp2 have a channel region CHtp extending in a direction substantially perpendicular to the surface of the substrate. In addition, the channel region CHtp of the p-type transistors Tp1 and Tp2 has at least one recess (groove) 140 substantially perpendicular to the surface of the substrate along the channel length direction Dcp. In the example illustrated in FIGS. 6 and 7, one recess 140 is provided.

The recess 140 includes two first side surfaces Ss1 and Ss2 and a first bottom surface Sb. The first side surfaces Ss1 and Ss2 are surfaces substantially perpendicular to the surface of the substrate. The first bottom surface Sb is a surface substantially parallel to the surface of the substrate. As illustrated in FIG. 7, the first bottom surface Sb is substantially parallel to the X-Y plane, and the first side surfaces Ss1 and Ss2 are substantially perpendicular to the X-Y plane.

The channel length Lg extends over the first side surface Ss1, the first bottom surface Sb, and the first side surface Ss2. Therefore, charges (holes) sequentially move along the first side surface Ss1, the first bottom surface Sb, and the first side surface Ss2 from the source region S to the drain region D. That is, the hole moves along the recess 140 in a direction substantially perpendicular to the surface of the substrate, in a direction substantially horizontal to the surface of the substrate, and in a direction substantially perpendicular to the surface of the substrate.

As illustrated in FIG. 7, the channel length Lg is a length along the recess 140. That is, the channel length Lg can be extended by the distance along the first side surfaces Ss1 and Ss2. As a result, transconductance of the p-type transistors Tp1 and Tp2 can be reduced, and noise can be reduced. In addition, since the distance in the depth direction of the substrate is used, the channel length Lg can be extended without increasing the installation area (gate size) of the transistor. As a result, pixel miniaturization with less noise characteristic deterioration can be achieved.

As illustrated in FIG. 6, the channel width W of the p-type transistors Tp1 and Tp2 is represented. Furthermore, the depth of the recess 140 is represented by a depth D.

(Configuration of n-Type Transistors Tn1 and Tn2)

Figure 9:
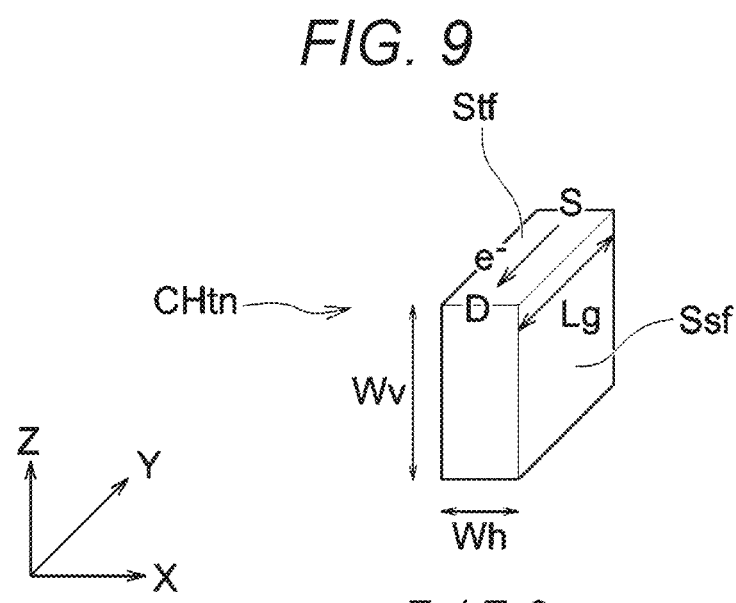
FIG. 9 is a perspective view illustrating an example of a configuration of a channel region of the n-type transistor according to the first embodiment.

FIG. 8 is a diagram illustrating an example of a configuration of n-type transistors Tn1 and Tn2 according to the first embodiment. The upper part of FIG. 8 illustrates a plan view. The lower part of FIG. 8 illustrates a cross-sectional view corresponding to the cross section taken along line A-A' of the plan view of FIG. 8. FIG. 9 is a perspective view illustrating an example of a configuration of a channel region CHtn of the n-type transistors Tn1 and Tn2 according to the first embodiment.

The n-type transistors Tn1 and Tn2 are, for example, Fin-type field effect transistors (FETs) formed on a substrate. In this case, the channel region CHtn is formed in a vertical shape (Fin shape) on the substrate as illustrated in FIGS. 8 and 9. The channel region CHtn of the n-type transistors Tn1 and Tn2, which are Fin-type FETs, has a second upper surface Stf substantially parallel to the surface of the substrate and a second side surface Ssf substantially perpendicular to the surface. As illustrated in FIG. 9, the second upper surface Stf is substantially parallel to the X-Y plane, and the second side surface Ssf is substantially perpendicular to the X-Y plane.

As illustrated in FIGS. 8 and 9, the channel region CHtn is substantially linear. As illustrated in FIG. 9, the channel length Lg is represented by a distance from the source region S to the drain region D. In the Fin-type FET, as the miniaturization progresses, for example, as the channel length Lg becomes shorter, the transconductance gm can be increased.

Further, as illustrated in FIG. 9, a channel width Wh in a direction substantially horizontal to the surface of the substrate and a channel width Wv in a direction substantially perpendicular to the surface of the substrate are represented as the channel widths W of the p-type transistors Tp1 and Tp2. Furthermore, as illustrated in FIG. 8, the height of Fin is the height H of the second side surface Ssf.

As illustrated in the plan views of FIGS. 6 and 8, between the p-type transistors Tp1 and Tp2 and the n-type transistors Tn1 and Tn2, the channel length directions Dcp and Dcn as viewed from a direction substantially perpendicular to the surface of the substrate are inclined to each other by about 90°. As a result, noise characteristics (S/N) can be improved, and pixel miniaturization (high resolution) in which noise characteristic deterioration is suppressed can be achieved. Note that details of the relationship between the planar layout and the noise characteristics will be described later with reference to FIG. 11.

Figure 10:
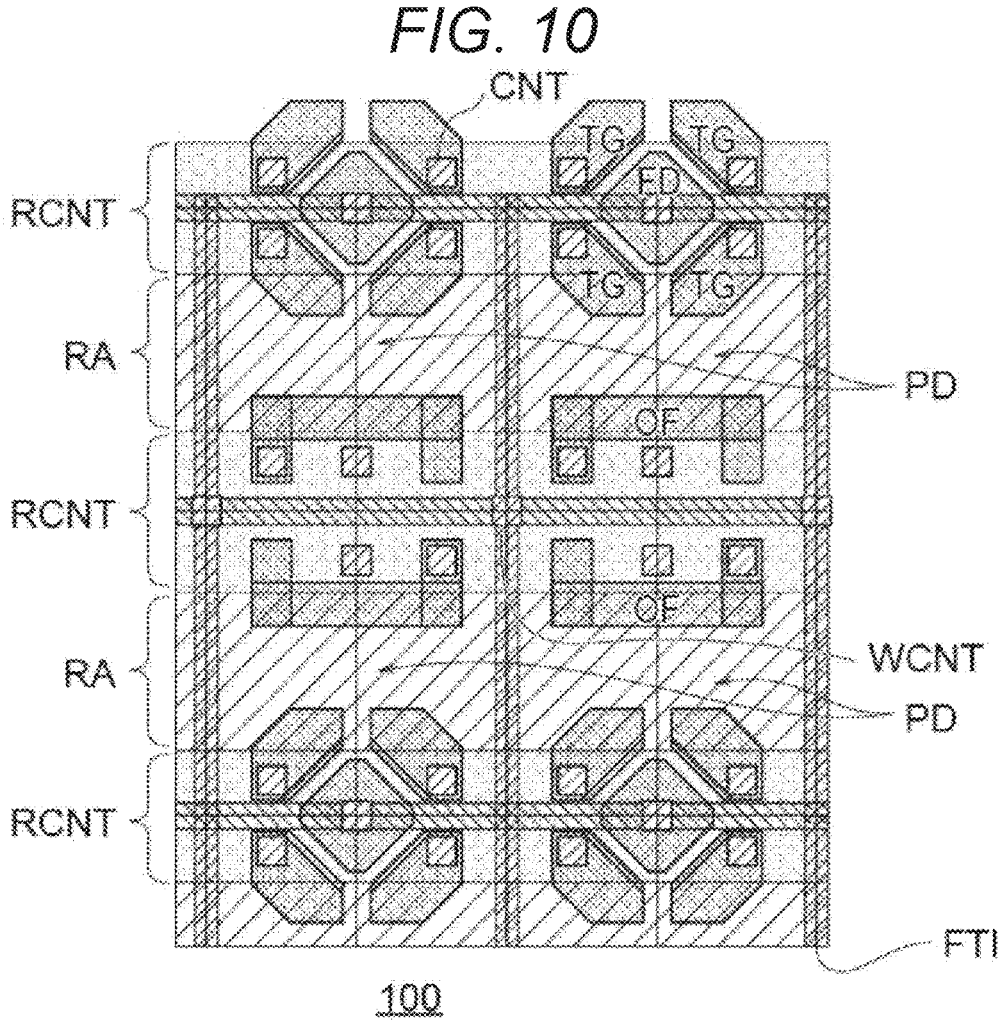
FIG. 10 is a schematic plan view illustrating an example of a planar layout of a first substrate.

FIG. 10 is a schematic plan view illustrating an example of a planar layout of the first substrate 100. The photodiode PD is partitioned by an element isolation portion deep trench isolation (DTI) penetrating the first substrate 100. In FIG. 10, four photodiodes PD are displayed, but the present invention is not limited thereto. The photodiode PD is provided in the element formation region RA.

The element formation region PA is provided between the adjacent contact regions RCNT, and is a region for forming a semiconductor element such as a transistor. The contact region RCNT is a region for forming a contact such as TSV.

A transfer transistor TG is provided on one side of the photodiode PD, and an overflow gate OF is provided on the other side thereof.

A well contact WCNT is a contact provided to apply a well potential to a well diffusion layer (not illustrated) formed on the first substrate 100.

Figure 11:
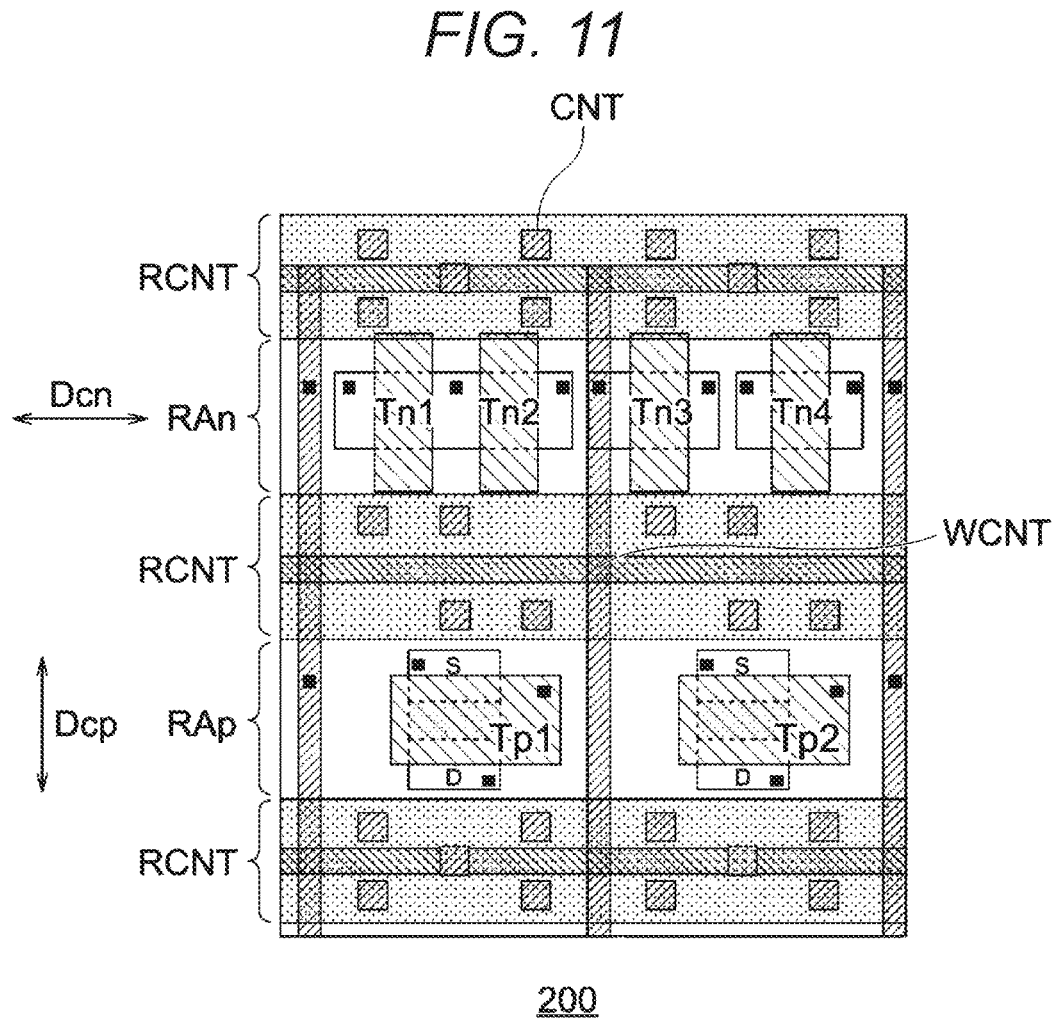
FIG. 11 is a schematic plan view illustrating an example of a planar layout of a second substrate.

FIG. 11 is a schematic plan view illustrating an example of a planar layout of the second substrate 200. The second substrate 200 includes element formation regions RAn and RAp and a contact region RCNT. The element formation regions RAn and RAp and the contact region RCNT of the second substrate 200 are arranged so as to correspond to the element formation region RA and the contact region RCNT of the first substrate 100, respectively, when the first substrate 100 and the second substrate 200 are laminated.

The n-type transistors Tn1 to Tn4 are formed in the element formation region RAn, and the p-type transistors Tp1 and Tp2 are formed in the element formation region RAp. As described above, the n-type transistors Tn1 to Tn4 and the p-type transistors Tp1 and Tp2 are provided in different element formation regions RAn and RAp, respectively. The transistors Tn1 to Tn4, Tp1, and Tp2 are provided above the photodiode PD of the first substrate 100, and overlap the photodiode PD when viewed from the surface of the second substrate 200.

In the second substrate 200 and the first substrate 100, each contact of the contact region RCNT is provided corresponding to each other. These contacts CNT are constituted by TSV, for example. The contact CNT of the first substrate 100 and the contact CNT of the second substrate 200 are wire-bonded using, for example, CCC.

Such a planar layout of the first and second substrates 100 and 200 enables a circuit configuration of the pixel sharing unit 539 and the comparator section 210 illustrated in FIG. 5. The pixel sharing unit 539 is provided on the first substrate 100, and the comparator section 210 is provided on the second substrate 200 different from the first substrate 100. The first and second substrates 100 and 200 are laminated, and the pixel sharing unit 539 and the comparator section 210 are electrically connected by wiring junction CCC between the wiring of the first substrate 100 and the wiring of the second substrate 200. Note that the pixel sharing unit 539 and the comparator section 210 may be electrically connected by a through electrode penetrating the first or second substrate 100 or 200.

Here, the channel length direction Dcp of the p-type transistors Tp1 and Tp2 is an up-down direction on the paper surface of FIG. 11. The channel length direction Dcn of the n-type transistors Tn1 and Tn2 is a left-right direction on the paper surface of FIG. 11. That is, between the p-type transistors Tp1 and Tp2 and the n-type transistors Tn1 and Tn2, the channel length directions Dcp and Dcn as viewed from a direction substantially perpendicular to the surface of the substrate are inclined to each other by approximately 90°.

As an example of miniaturization, hereinafter, a case where the pixel region or the transistor size is narrowed, for example, in the left-right direction on the paper surface of FIG. 11 will be described.

The channel width W of the p-type transistors Tp1 and Tp2 becomes shorter due to miniaturization. The channel lengths Lg of the p-type transistors Tp1 and Tp2 do not change depending on miniaturization. From the relationship between the channel width W and the channel length Lg, the transconductance gm of the p-type transistors Tp1 and Tp2 can be reduced, and noise can be reduced. Therefore, as pixel miniaturization progresses, noise characteristics can be improved.

The channel width W (channel width Wh) of the n-type transistors Tn1 and Tn2 does not change depending on miniaturization. The channel length Lg of the n-type transistors Tn1 and Tn2 becomes shorter due to miniaturization. From the relationship between the channel width W and the channel length Lg, the transconductance gm of the n-type transistors Tn1 and Tn2 can be increased, and noise can be reduced. Therefore, as pixel miniaturization progresses, noise characteristics can be improved.

As described above, according to the first embodiment, the p-type transistors Tp1 and Tp2 have the channel region CHtp extending in a direction substantially perpendicular to the surface of the substrate. That is, the p-type transistors Tp1 and Tp2 have a channel region CHtp having an uneven shape. By using a direction substantially perpendicular to the surface of the substrate, the channel length Lg can be extended regardless of the installation area (gate size) of the transistor. As a result, it is possible to reduce the transconductance gm of the p-type transistors Tp1 and Tp2 and reduce noise while suppressing an increase in the installation area (gate size) of the transistors. In addition, pixel miniaturization (high resolution) in which noise characteristic deterioration is suppressed becomes possible.

Furthermore, in the first embodiment, the n-type transistors Tn1 and Tn2 are Fin-type FETs. In addition, the p-type transistors Tp1 and Tp2 and the n-type transistors Tn1 and Tn2 are arranged such that the channel length directions Dcp and Dcn are inclined to each other by about 90° when viewed from a direction substantially perpendicular to the surface of the substrate. As a result, as described with reference to FIG. 11, noise characteristics can be improved as pixel miniaturization progresses. In addition, pixel miniaturization (high resolution) in which noise characteristic deterioration is suppressed becomes possible.

Furthermore, in a case where the p-type transistors Tp1 and Tp2 and the n-type transistors Tn1 and Tn2 are provided on the same substrate, the channel region CHtp of the p-type transistors Tp1 and Tp2 preferably extends to a depth D substantially equal to the height H of the second side surface Ssf in a direction substantially perpendicular to the surface of the substrate (see the cross-sectional views of FIGS. 6 and 8). That is, the depth D of the recess 140 illustrated in FIG. 6 is preferably substantially the same as the height H of the second side surface Ssf illustrated in FIG. 8. As a result, the formation of the recesses 140 of the p-type transistors Tp1 and Tp2 and the formation of the channel regions CHtn (Fin) of the n-type transistors Tn1 and Tn2 can be simultaneously performed in the same process. As a result, an increase in the number of steps can be suppressed.

Note that, in a case where the depth D of the recess 140 is substantially the same as the height H of the second side surface Ssf, the height H (channel width Wv) of the second side surface Ssf increases as the depth D of the recess 140 increases. In this case, the channel lengths Lg of the p-type transistors Tp1 and Tp2 illustrated in FIG. 7 increase, and the channel width Wv illustrated in FIG. 9 increases. As a result, the transconductance gm of the p-type transistors Tp1 and Tp2 can be reduced, and the transconductance gm of the n-type transistors Tn1 and Tn2 can be increased. As a result, noise can be reduced for the p-type transistors Tp1 and Tp2, and noise can be reduced for the n-type transistors Tn1 and Tn2. Therefore, from the viewpoint of improving noise characteristics, the depth D of the recess 140 and the height H of the second side surface Ssf are preferably large.

Note that since noise characteristics can be improved by the configuration and arrangement of the p-type transistors Tp1 and Tp2, the n-type transistors Tn1 and Tn2 are not necessarily Fin-type FETs, and the channel length directions Dcp and Dcn are not necessarily inclined by about 90°. However, by configuring and arranging the n-type transistors Tn1 and Tn2 as described above, noise characteristics can be further improved.

(First Modification Example of First Embodiment)

Figure 12:
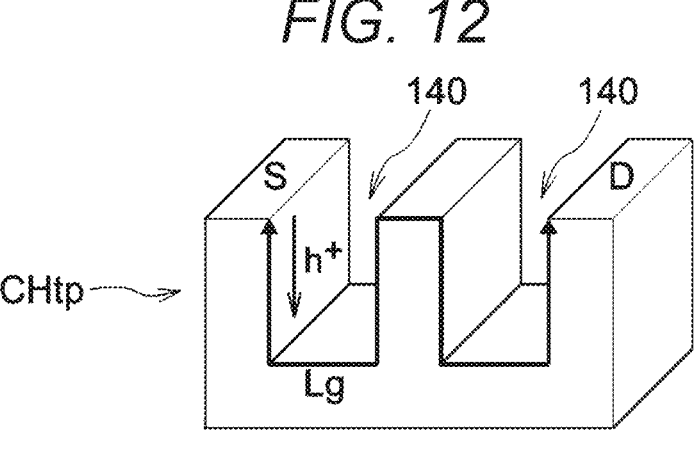
FIG. 12 is a perspective view illustrating an example of a configuration of a channel region of a p-type transistor according to a first modification of the first embodiment.

FIG. 12 is a perspective view illustrating an example of a configuration of a channel region CHtp of p-type transistors Tp1 and Tp2 according to a first modification of the first embodiment. The first modification of the first embodiment is different from the first embodiment in that two recesses 140 are provided.

In the example illustrated in FIG. 12, the channel region CHtp has two recesses 140 along the channel length direction Dcp. In this case, the number of the first side surfaces Ss1 and Ss2 increases. The charges move in a direction substantially perpendicular to the surface of the substrate along the first side surfaces Ss1 and Ss2. As a result, the channel length Lg can be further extended. As a result, noise characteristics can be further improved.

As in the first modification of the first embodiment, two recesses 140 may be provided. In this case, effects similar to those of the first embodiment can be obtained.

Second Modification of First Embodiment

Figure 13:
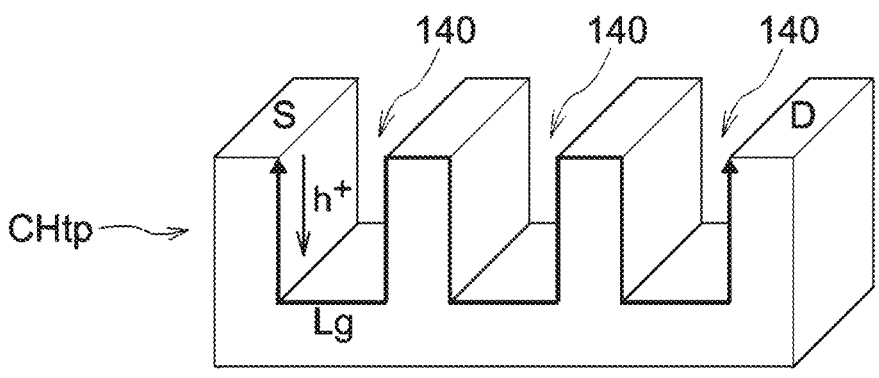
FIG. 13 is a perspective view illustrating an example of a configuration of a channel region of a p-type transistor according to a second modification of the first embodiment.

FIG. 13 is a perspective view illustrating an example of a configuration of a channel region CHtp of p-type transistors Tp1 and Tp2 according to a second modification of the first embodiment. The second modification of the first embodiment is different from the first modification of the first embodiment in that three recesses 140 are provided.

Note that the channel region CHtp may have two or more recesses 140.

As in the second modification of the first embodiment, three recesses 140 may be provided. Also in this case, effects similar to those of the first modification of the first embodiment can be obtained.

Third Modification of First Embodiment

Figure 14:
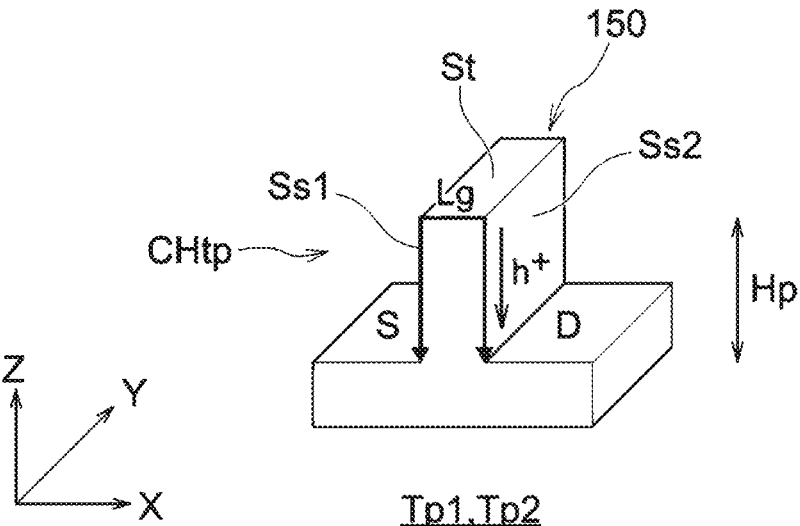
FIG. 14 is a perspective view illustrating an example of a configuration of a channel region of a p-type transistor according to a third modification of the first embodiment.

FIG. 14 is a perspective view illustrating an example of a configuration of a channel region CHtp of p-type transistors Tp1 and Tp2 according to a third modification of the first embodiment. The third modification of the first embodiment is different from the first embodiment in that a protrusion 150 is provided instead of the recess 140.

The channel region CHtp of the p-type transistors Tp1 and Tp2 has at least one protrusion 150 substantially perpendicular to the surface of the substrate along the channel length direction Dcp. In the example illustrated in FIG. 14, one protrusion 150 is provided.

The protrusion 150 includes two first side surfaces Ss1 and Ss2 and a first upper surface St. The first side surfaces Ss1 and Ss2 are surfaces substantially perpendicular to the surface of the substrate. The first upper surface St is a surface substantially parallel to the surface of the substrate. As illustrated in FIG. 14, the first upper surface St is substantially parallel to the X-Y plane, and the first side surfaces Ss1 and Ss2 are substantially perpendicular to the X-Y plane.

The channel length Lg extends over the first side surface Ss1, the first upper surface St, and the first side surface Ss2. Therefore, charges (holes) sequentially move along the first side surface Ss1, the first upper surface St, and the first side surface Ss2 from the source region S to the drain region D. That is, the hole moves along the protrusion 150 in a direction substantially perpendicular to the surface of the substrate, in a direction substantially horizontal to the surface of the substrate, and in a direction substantially perpendicular to the surface of the substrate.

Furthermore, in a case where the p-type transistors Tp1 and Tp2 and the n-type transistors Tn1 and Tn2 are provided on the same substrate, the channel region CHtp of the p-type transistors Tp1 and Tp2 preferably extends in a direction substantially perpendicular to the surface of the substrate to a height substantially equal to the height H of the second side surface Ssf. That is, the height Hp of the protrusion 150 illustrated in FIG. 14 is preferably substantially the same as the height H of the second side surface Ssf illustrated in FIG. 8. As a result, the formation of the protrusion 150 of the p-type transistors Tp1 and Tp2 and the formation of the channel region CHtn (Fin) of the n-type transistors Tn1 and Tn2 can be simultaneously performed. As a result, an increase in the number of steps can be suppressed.

As in the third modification of the first embodiment, the protrusion 150 may be provided instead of the recess 140. In this case, effects similar to those of the first embodiment can be obtained.

Fourth Modification of First Embodiment

Figures 15, 16:
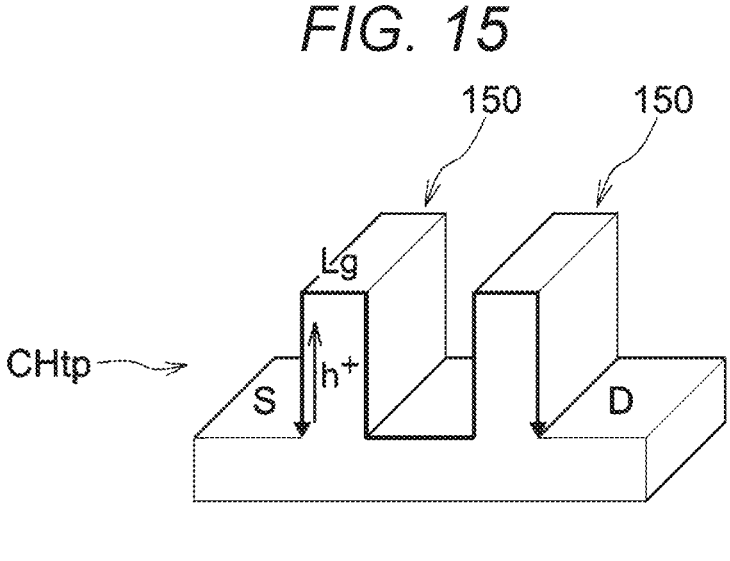
FIG. 15 is a perspective view illustrating an example of a configuration of a channel region of a p-type transistor according to a fourth modification of the first embodiment.
FIG. 16 is a perspective view illustrating an example of a configuration of a channel region of a p-type transistor according to a fifth modification of the first embodiment.

FIG. 15 is a perspective view illustrating an example of a configuration of a channel region CHtp of p-type transistors Tp1 and Tp2 according to a fourth modification of the first embodiment. The fourth modification of the first embodiment is different from the third modification of the first embodiment in that two protrusions 150 are provided.

In the example illustrated in FIG. 15, the channel region CHtp has two protrusions 150 along the channel length direction Dcp. In this case, the number of the first side surfaces Ss1 and Ss2 increases. The charges move in a direction substantially perpendicular to the surface of the substrate along the first side surfaces Ss1 and Ss2. As a result, the channel length Lg can be further extended. As a result, noise characteristics can be further improved.

As in the fourth modification of the first embodiment, two protrusions 150 may be provided. Also in this case, effects similar to those of the third modification of the first embodiment can be obtained.

Fifth Modification of First Embodiment

FIG. 16 is a perspective view illustrating an example of a configuration of a channel region CHtp of p-type transistors Tp1 and Tp2 according to a fifth modification of the first embodiment. The fifth modification of the first embodiment is different from the third modification of the first embodiment in that three protrusions 150 are provided.

Note that the channel region CHtp may have two or more protrusions 150.

As in the fifth modification of the first embodiment, three protrusions 150 may be provided. Also in this case, effects similar to those of the third modification of the first embodiment can be obtained.

Second Embodiment

FIGS. 17 to 20 are plan views illustrating configuration examples of the p-type transistors Tp1 and Tp2. In FIGS. 17 to 20, one of the transistors Tp1 and Tp2 is illustrated, and illustration of the other configuration is omitted. The transistors Tp1 and Tp2 may have the same configuration. In addition, the transistors Tp1 and Tp2 may be a combination of any two of the configurations illustrated in FIGS. 17 to 20.

Figures 17, 18:
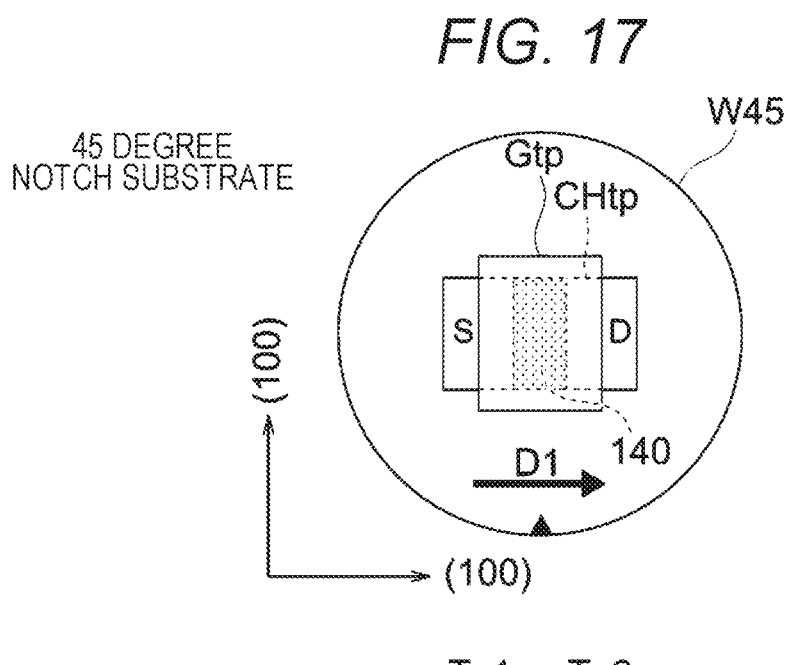
FIG. 17 is a plan view illustrating a configuration example of a p-type transistor.
FIG. 18 is a plan view illustrating a configuration example of a p-type transistor.

FIGS. 17 and 18 illustrate the 45 degree notch substrate W45. The 45 degree notch substrate W45 is a silicon substrate having a plane of a crystal orientation (100) ((100) crystal plane). The transistors Tp1 and Tp2 are provided on the 45 degree notch substrate W45, and include a source region S, a drain region D, and a gate electrode Gtp. The channel region CHtp is provided between the source region S and the drain region D. The gate electrode Gtp covers the first bottom surface Sb and the first side surfaces Ss1 and Ss2 of the recess 140 in the channel region CHtp via a gate insulating film (not illustrated). The gate electrode Gtp is electrode-like insulated from the channel region CHtp by a gate insulating film. The first bottom surface Sb or the first side surfaces Ss1 and Ss2 of the recess 140 in the channel region CHtp of the transistors Tp1 and Tp2 are in a plane substantially parallel to the (100) crystal plane of the substrate W45 on the surface of the substrate W45.

By applying a voltage to the gate electrode Gtp, the first bottom surface Sb and the first side surfaces Ss1 and Ss2 of the recess 140 in the channel region CHtp are inverted, and the source region S and the drain region D are electrically conducted. As a result, a current flows in the channel region CHtp in the D1 direction. The D1 direction is a direction in which a current flows in the transistors Tp1 and Tp2, and is also a channel length direction of the transistors Tp1 and Tp2. The D1 direction is a direction substantially perpendicular or substantially parallel to the (100) crystal plane of the substrate W45. That is, the channel length direction of the transistors Tp1 and Tp2 is substantially parallel or substantially perpendicular to the (100) crystal plane (notch plane) of the substrate W45 on the surface of the substrate W45.

Figures 19, 20:
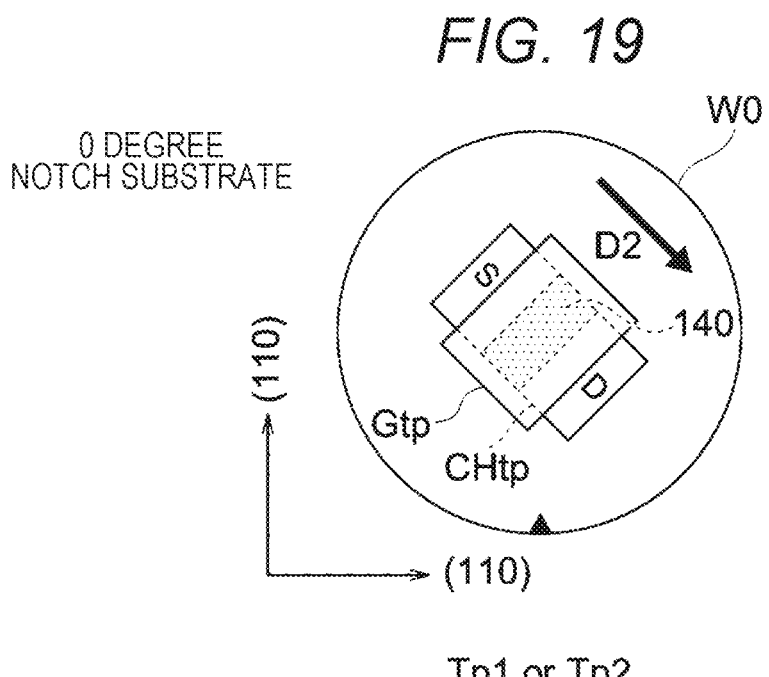
FIG. 19 is a plan view illustrating a configuration example of a p-type transistor.
FIG. 20 is a plan view illustrating a configuration example of a p-type transistor.

FIGS. 19 and 20 illustrate the 0 degree notch substrate W0 having a plane of the crystal orientation (100). The transistors Tp1 and Tp2 are provided on the 0 degree notch substrate W0, and include a source region S, a drain region D, and a gate electrode Gtp. The channel region CHtp is provided between the source region S and the drain region D. The gate electrode Gtp covers the first bottom surface Sb and the first side surfaces Ss1 and Ss2 of the recess 140 in the channel region CHtp via a gate insulating film (not illustrated). The gate electrode Gtp is electrode-like insulated from the channel region CHtp by a gate insulating film. The first bottom surface Sb or the first side surfaces Ss1 and Ss2 of the recess 140 in the channel region CHtp of the transistors Tp1 and Tp2 are in a plane inclined at about 45 degrees or about 135 degrees with respect to the (110) crystal plane (notch plane) of the substrate W0 on the surface of the substrate W0.

By applying a voltage to the gate electrode Gtp, the first bottom surface Sb and the first side surfaces Ss1 and Ss2 of the recess 140 in the channel region CHtp are inverted, and the source region S and the drain region D are electrically conducted. As a result, a current flows in the channel region CHtp in the D2 direction. The direction D2 is a direction in which a current flows in the transistors Tp1 and Tp2, and is also a channel length direction of the transistors Tp1 and Tp2. The D2 direction is a direction substantially perpendicular or substantially parallel to the (100) crystal plane of the substrate W0. That is, the channel length direction of the transistors Tp1 and Tp2 is about 45 degrees or about 135 degrees with respect to the (110) crystal plane (notch plane) of the substrate W45 on the surface of the substrate W0.

Here, as the carrier mobility of the transistor decreases, the transconductance gm decreases. On the other hand, as the carrier mobility of the transistor increases, the transconductance gm increases. The mobility of the n-type transistor hardly changes depending on the direction with respect to the (100) crystal plane or the (110) crystal plane of the substrate. On the other hand, the mobility of the p-type transistor changes depending on the direction with respect to the (100) crystal plane or the (110) crystal plane of the substrate. Therefore, noise can be reduced by reducing the mobility of the p-type transistors Tp1 and Tp2 to reduce the transconductance gm.

In the case of the 45 degree notch substrate W45, as illustrated in FIG. 17 or 18, the channel length direction (D1 direction) of the transistors Tp1 and Tp2 is substantially perpendicular or substantially parallel to the (100) crystal plane (notch plane) of the substrate W45 on the front surface F45 of the substrate W45. In the case of the 0 degree notch substrate W0, as illustrated in FIG. 8 or 9, the channel length direction (D1 direction) of the transistors Tp1 and Tp2 is inclined at about 45 degrees or about 135 degrees with respect to the (110) crystal plane (notch plane) of the substrate W0 on the front surface F0 of the substrate W0. In this case, carrier mobility is relatively low.

On the other hand, in the case of the 45 degree notch substrate W45, the channel length direction (D1 direction) of the transistors Tp1 and Tp2 is inclined at about 45 degrees or about 135 degrees with respect to the (100) crystal plane (notch plane) of the substrate W45 on the front surface F45 of the substrate W45. In the case of the 0 degree notch substrate W0, the channel length direction (D1 direction) of the transistors Tp1 and Tp2 is substantially perpendicular or substantially parallel to the (110) crystal plane (notch plane) of the substrate W0 on the surface F0 of the substrate W0. In this case, carrier mobility is relatively high.

As described above, in a case where the channel length direction is substantially perpendicular or substantially parallel to the (100) crystal plane (notch plane) of the substrate W45, the p-type transistors Tp1 and Tp2 have carrier mobility much lower than that in a case where the channel length direction is inclined at about 45 degrees or about 135 degrees with respect to the (100) crystal plane (notch plane)

of the substrate W45. That is, the transconductance gm of the p-type transistors Tp1 and Tp2 can be reduced.

By reducing the transconductance gm of the p-type transistors Tp1 and Tp2, noise is reduced and noise characteristics are improved. For example, a signal/noise (S/N) ratio is improved, and a dynamic range can be expanded. As a result, the sensor characteristics of the solid-state imaging apparatus according to the present embodiment are improved.

In the n-type transistors Tn1 and Tn2 of the Fin-type FET, the inclination angle of the upper surface or the side surface of the channel region with respect to the crystal plane of the substrate hardly changes the transconductance gm of the n-type transistors Tn1 and Tn2. The higher the transconductance gm of the n-type transistors Tn1 and Tn2 is, the more noise characteristics are improved. However, the transconductance gm of the n-type transistors Tn1 and Tn2 does not change much depending on the inclination angle of the upper surface or the side surface of the channel region with respect to the crystal plane of the substrate. Therefore, the change in the channel length direction (D1) of the n-type transistors Tn1 and Tn2 with respect to the crystal plane of the substrate does not contribute much to, for example, improvement of the S/N ratio and the dynamic range.

In the present embodiment, based on the above knowledge, the channel length direction of only the p-type transistors Tp1 and Tp2 is made to be a plane substantially parallel or substantially perpendicular to the (100) crystal plane of the substrate W45. As a result, the transconductance gm of the p-type transistors Tp1 and Tp2 can be reduced, and the noise characteristics can be efficiently improved. As a result, a high-resolution image with less deterioration in noise characteristics can be obtained.

Third Embodiment

Figure 21:
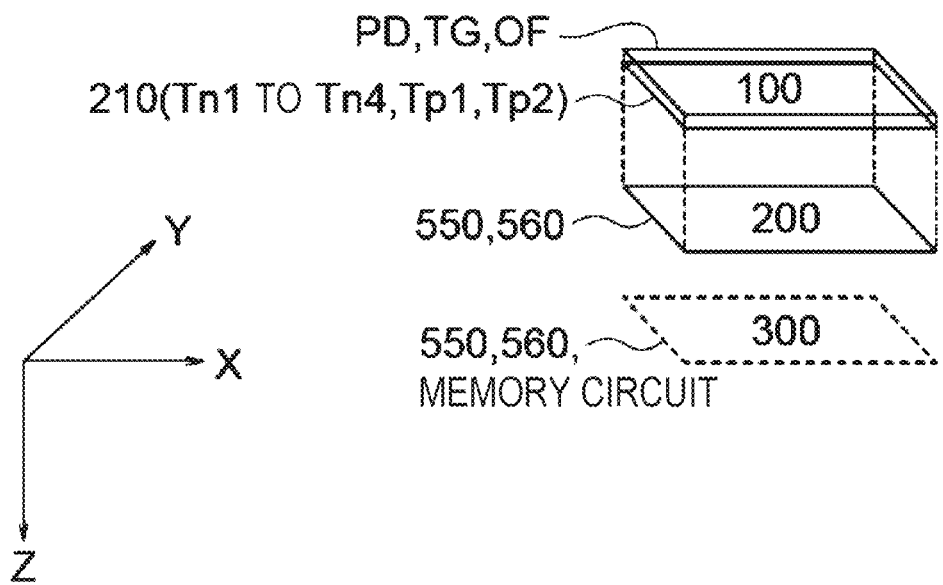
FIG. 21 is a conceptual diagram illustrating a configuration example of a solid-state imaging apparatus according to a third embodiment.

FIG. 21 is a conceptual diagram illustrating a configuration example of a solid-state imaging apparatus according to a third embodiment. The second embodiment is similar to the first embodiment in that the n-type transistors Tn1 to Tn4 and the p-type transistors Tp1 and Tp2 of the comparator section 210 are provided on the same substrate. However, in the first embodiment, the photodiode PD is formed on the first substrate 100, and the comparator section 210 is formed on the second substrate 200 different from the first substrate 100. On the other hand, in the third embodiment, the comparator section 210 is formed on the same first substrate 100 as the photodiode PD, and is formed so as to be laminated above the photodiode PD. Note that, here, the light receiving surface of the first substrate 100 is expressed as "lower" in the up-down direction. Therefore, in FIG. 21, the +Z direction is "upward direction".

Figure 22:
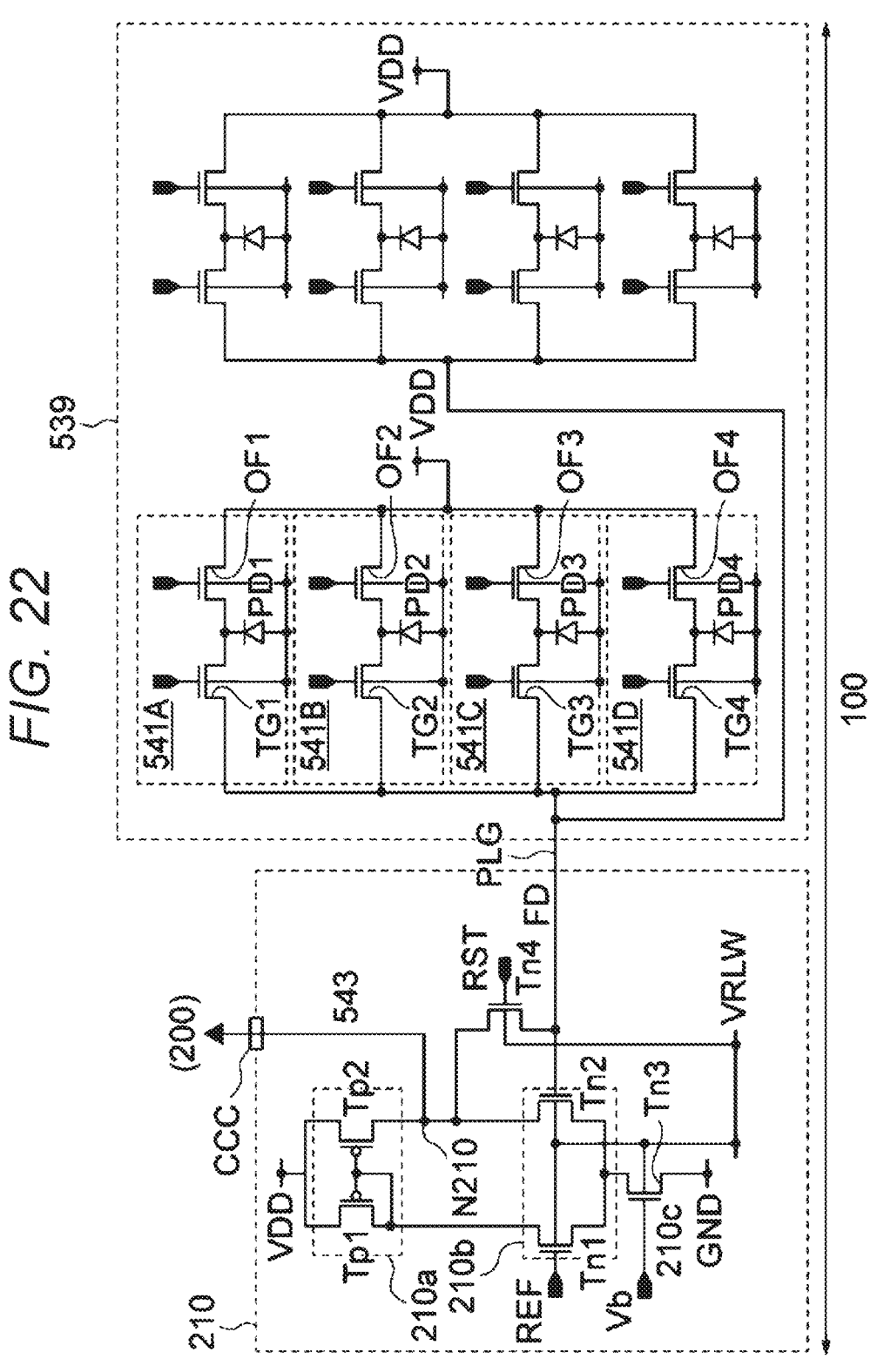
FIG. 22 is an equivalent circuit diagram illustrating an example of configurations of a pixel sharing unit and a comparator section according to the third embodiment.

As a result, the connection between the photodiode PD and the comparator section 210 can be configured by the contact plug PLG as illustrated in FIG. 22 without the CCC. FIG. 22 is an equivalent circuit diagram illustrating an example of configurations of the pixel sharing unit 539 and the comparator section 210 according to the third embodiment. The comparator section 210 is formed on the same first substrate 100 as the photodiode PD. Therefore, a contact plug PLG is formed between the comparator section 210 and the photodiode PD. The contact plug PLG penetrates an interlayer insulating film between the comparator section 210 and the photodiode PD to electrically connect them. No wiring junction CCC between the plurality of substrates 100 and 200 is formed between the comparator section 210 and the photodiode PD. Therefore, it is advantageous for miniaturization of the photodiode PD and the comparator section 210. In addition, one wiring junction CCC between the first substrate 100 and the second substrate 200 is sufficient for connection from the photodiode PD to the logic circuit (column signal processing section 550) after the comparator section 210. Therefore, noise characteristics are improved.

Fourth Embodiment

Figure 23:
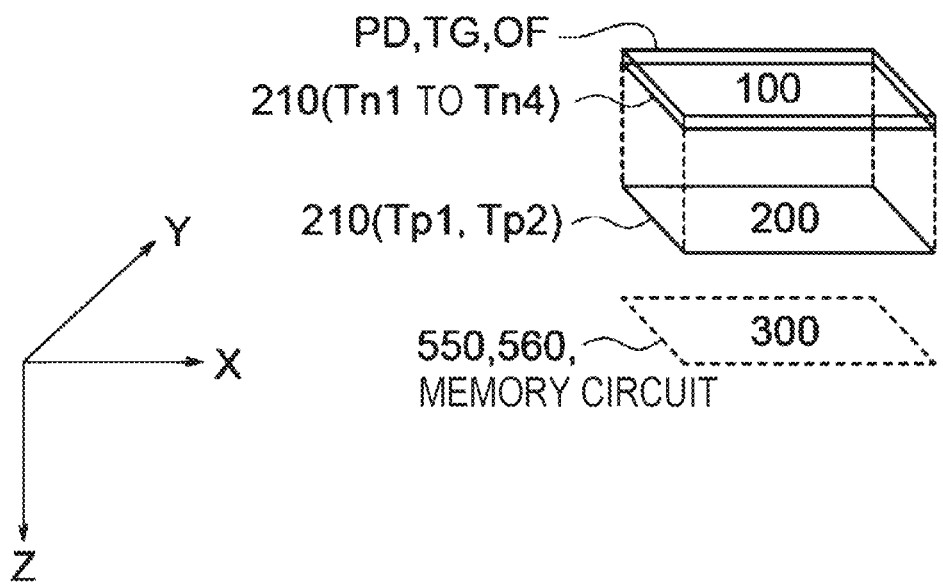
FIG. 23 is a conceptual diagram illustrating a configuration example of a solid-state imaging apparatus according to a fourth embodiment.

FIG. 23 is a conceptual diagram illustrating a configuration example of a solid-state imaging apparatus according to a fourth embodiment. The fourth embodiment is different from the first to third embodiments in that the n-type transistors Tn1 to Tn4 and the p-type transistors Tp1 and Tp2 of the comparator section 210 are provided on different substrates. For example, the n-type transistors Tn1 to Tn4 of the comparator section 210 are formed on the same first substrate 100 as the photodiode PD, and are formed in a semiconductor layer above the photodiode PD. On the other hand, the p-type transistors Tp1 and Tp2 of the comparator section 210 are formed on the second substrate 200 different from the first substrate 100.

Figure 24:
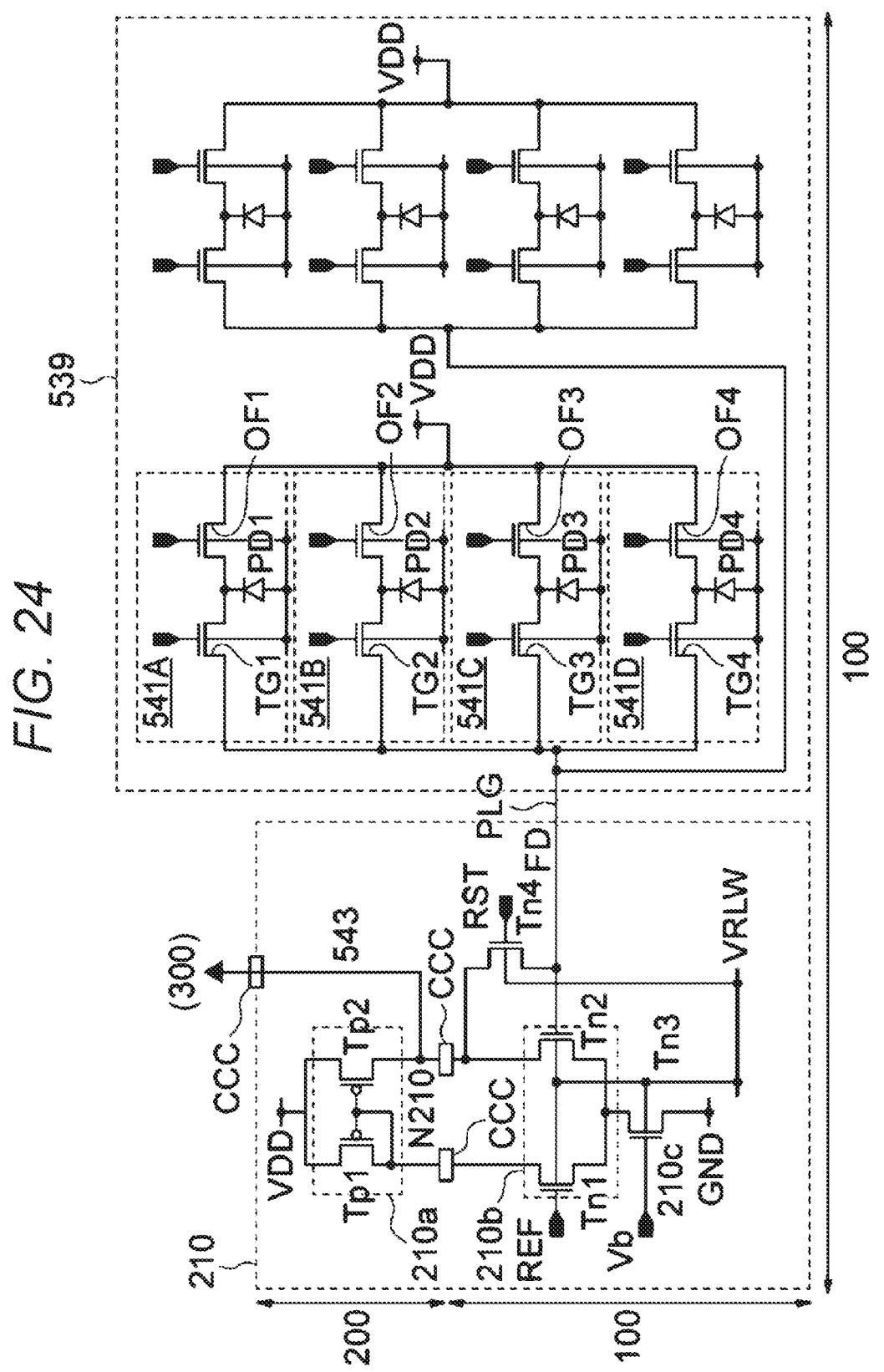
FIG. 24 is an equivalent circuit diagram illustrating an example of configurations of a pixel sharing unit and a comparator section according to the fourth embodiment.

FIG. 24 is an equivalent circuit diagram illustrating an example of configurations of the pixel sharing unit 539 and the comparator section 210 according to the fourth embodiment. In the comparator section 210, the n-type transistors Tn1 to Tn4 including the differential circuit 210b are formed on the same first substrate 100 as the photodiode PD. The n-type transistors Tn1 to Tn4 are provided above the photodiode PD. Therefore, a contact plug PLG is formed between the differential circuit 210b of the comparator section 210 and the photodiode PD. The contact plug PLG penetrates an interlayer insulating film between the comparator section 210 and the photodiode PD to electrically connect them. No wiring junction CCC between the plurality of substrates 100 and 200 is formed between the comparator 210 and the photodiode PD. Therefore, it is advantageous for miniaturization of the photodiode PD and the comparator 210.

On the other hand, in the comparator section 210, the p-type transistors Tp1 and Tp2 constituting the current mirror circuit 210a are formed on the second substrate 200 different from the first substrate 100. Therefore, the differential circuit 210b and the current mirror circuit 210a in the comparator 210 are provided on separate substrates 100 and 200, respectively. Two wiring junctions CCC are provided between the current mirror circuit 210a and the differential circuit 210b. That is, a plurality of wiring junctions CCC is used at one interface between the first substrate 100 and the second substrate 200.

One wiring junction CCC is used for one interface between the second substrate 200 and the third substrate 300 in connection from the photodiode PD to the logic circuit (column signal processing section 550) after the comparator 210.

As described above, in the fourth embodiment, the p-type transistors Tp1 and Tp2 of the comparator 210 are formed on the separate substrates 100 and 200 from the n-type transistors Tn1 to Tn4. Therefore, the n-type transistors Tn1 to Tn4 and the p-type transistors Tp1 and Tp2 can be formed in separate semiconductor manufacturing processes. Thus, the semiconductor manufacturing process can be simplified.

Fifth Embodiment

Figure 25:
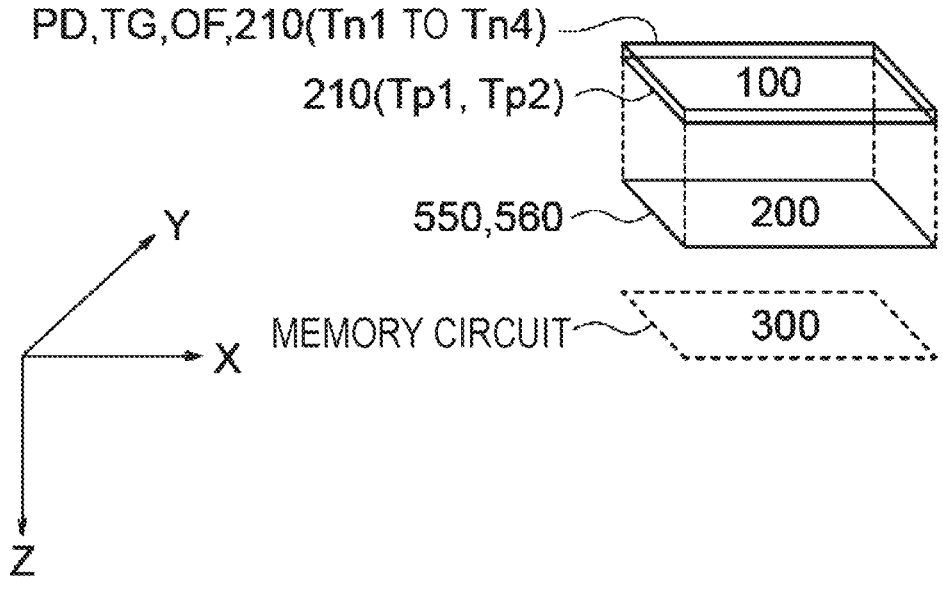
FIG. 25 is a conceptual diagram illustrating a configuration example of a solid-state imaging apparatus according to a fifth embodiment.

FIG. 25 is a conceptual diagram illustrating a configuration example of a solid-state imaging apparatus according to a fifth embodiment. In the fifth embodiment, the n-type transistors Tn1 to Tn4 and the p-type transistors Tp1 and Tp2 of the comparator 210 are provided on the same substrate. However, the n-type transistors Tn1 to Tn4 of the comparator 210 are formed on the first substrate 100 in the same semiconductor manufacturing process as the photodiode PD, the transfer transistor TG, and the overflow gate OF, and are provided in the same semiconductor layer as the transfer transistor TG and the overflow gate OF. On the other hand, in the comparator 210, the p-type transistors Tp1 and Tp2 constituting the current mirror circuit 210a are formed so as to be laminated on the photodiode PD, the transfer transistor TG, the overflow gate OF, and another semiconductor layer above the n-type transistors Tn1 to Tn4 (differential circuit 210b).

Figure 26:
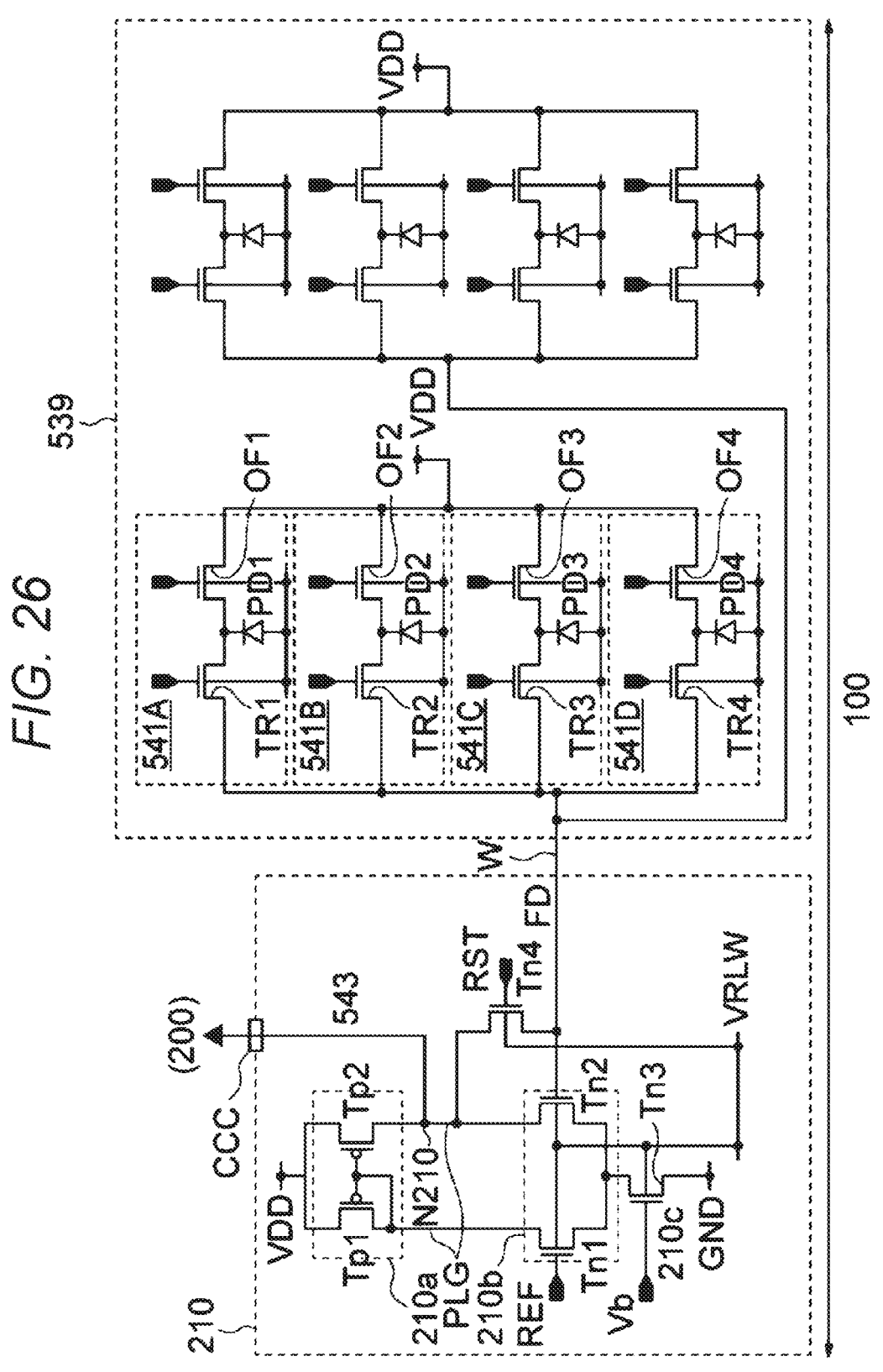
FIG. 26 is an equivalent circuit diagram illustrating an example of configurations of a pixel sharing unit and a comparator section according to the fifth embodiment.

As a result, the connection between the photodiode PD and the n-type transistors Tn1 to Tn4 of the comparator 210 can include a normal wiring W and a contact (not illustrated) as illustrated in FIG. 26. FIG. 26 is an equivalent circuit diagram illustrating an example of configurations of the pixel sharing unit 539 and the comparator section 210 according to the fifth embodiment. The comparator 210 is formed on the same first substrate 100 as the photodiode PD. Therefore, the wiring W is formed between the comparator 210 and the photodiode PD. The wiring W electrically connects the comparator 210 and the photodiode PD. No wiring junction CCC between the plurality of substrates 100 and 200 is formed between the comparator 210 and the photodiode PD. Therefore, it is advantageous for miniaturization of the photodiode PD and the comparator 210.

In addition, the length of the wiring W between the floating diffusion FD and the input of the differential circuit 210b is shortened, and the capacitance of the wiring is reduced. As a result, the conversion efficiency of the potential of the floating diffusion FD is improved, and the noise characteristics are improved.

In the comparator 210, a contact plug PLG is formed between the n-type transistors Tn1 to Tn4 and the p-type transistors Tp1 and Tp2. A contact plug PLG penetrates an interlayer insulating film between the n-type transistors Tn1 to Tn4 and the p-type transistors Tp1 and Tp2 to electrically connect them. Note that no wiring junction CCC between the plurality of substrates 100 and 200 is formed between the n-type transistors Tn1 to Tn4 and the p-type transistors Tp1 and Tp2. Therefore, it is advantageous for miniaturization of the photodiode PD and the comparator 210.

Sixth Embodiment

Figure 27:
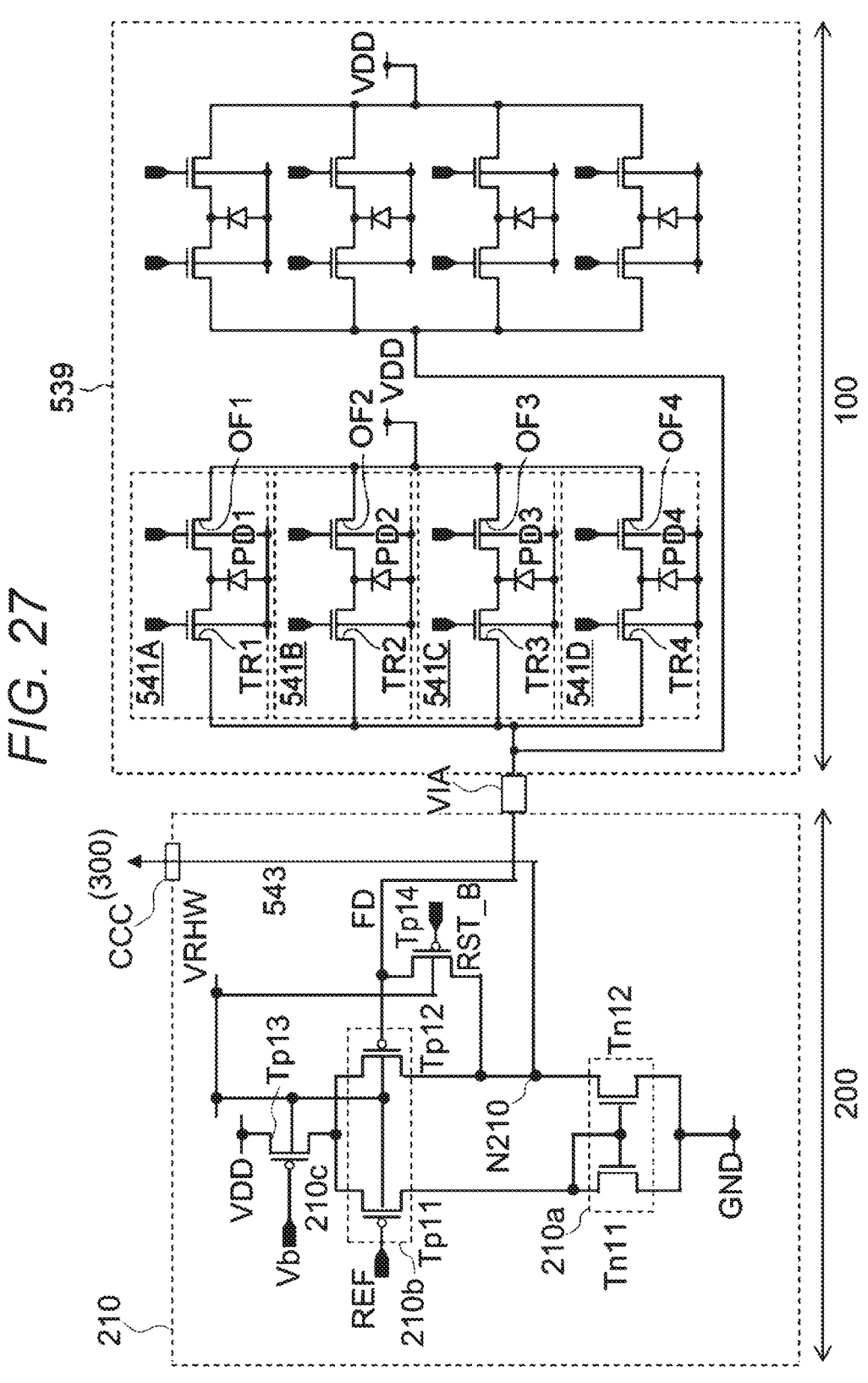
FIG. 27 is an equivalent circuit diagram illustrating an example of configurations of a pixel sharing unit and a comparator section according to a sixth embodiment.

FIG. 27 is an equivalent circuit diagram illustrating an example of configurations of the pixel sharing unit 539 and the comparator section 210 according to a sixth embodiment. In the sixth embodiment, the current mirror circuit 210a includes n-type transistors Tn11 and Tn12, and the differential circuit 210b includes p-type transistors Tp11 and Tp12. In this case, in order to improve noise characteristics, the transconductance gm of the p-type transistors Tp11 and Tp12 of the differential circuit 210b is preferably large. Note that a voltage VRHW equal to or higher than the power supply VDD is applied as a back bias to the transistors Tp11 to Tp14.

In the sixth embodiment, by reducing the transconductance gm of the n-type transistors Tn11 and Tn12 constituting the current mirror circuit 210a, noise is reduced and noise characteristics are improved. On the other hand, by increasing the transconductance gm of the p-type transistors Tp11 and Tp12 constituting the differential circuit 210b, noise is reduced and noise characteristics are improved.

FIG. 28 is a diagram illustrating an example of a configuration of the p-type transistors Tp11 and Tp12 according to the sixth embodiment. The upper part of FIG. 28 illustrates a plan view. The lower part of FIG. 28 illustrates a cross-sectional view corresponding to the cross section taken along line B-B' of the plan view of FIG. 28.

The p-type transistors Tp11 and Tp12 are Fin-type FETs. That is, the configurations of the p-type transistors Tp11 and Tp12 illustrated in FIG. 28 are substantially the same as the configurations of the n-type transistors Tn1 and Tn2 illustrated in FIG. 8.

FIG. 29 is a diagram illustrating an example of a configuration of n-type transistors Tn11 and Tn12 according to the sixth embodiment. The upper part of FIG. 29 illustrates a plan view. The lower part of FIG. 29 illustrates a cross-sectional view corresponding to the cross section taken along line A-A' of the plan view of FIG. 29.

The n-type transistors Tn11 and Tn12 have a channel region CHtn extending in a direction substantially perpendicular to the surface of the substrate. That is, the configurations of the n-type transistors Tn11 and Tn12 illustrated in FIG. 29 are substantially the same as the configurations of the p-type transistors Tp1 and Tp2 illustrated in FIG. 6.

In the sixth embodiment, the configuration and arrangement of the p-type transistors Tp11 and Tp12 and the n-type transistors Tn11 and Tn12 make it possible to improve noise characteristics (S/N) and to achieve pixel miniaturization (high resolution) with suppressed noise characteristic deterioration, similarly to the first embodiment.

Here, as described in the second embodiment, the mobility of the p-type transistor varies depending on the direction with respect to the (100) crystal plane or the (110) crystal plane of the substrate. Therefore, noise can be reduced by increasing the mobility of the p-type transistors Tp11 and Tp12 constituting the differential circuit 210b to increase the transconductance gm.

FIGS. 30 to 33 are plan views illustrating configuration examples of the p-type transistors Tp11 and Tp12. In FIGS. 30 to 33, one of the transistors Tp11 and Tp12 is illustrated, and illustration of the other configuration is omitted. The transistors Tp11 and Tp12 may have the same configuration. In addition, the transistors Tp11 and Tp12 may be a combination of any two of the configurations illustrated in FIGS. 30 to 33.

Figures 30, 31:
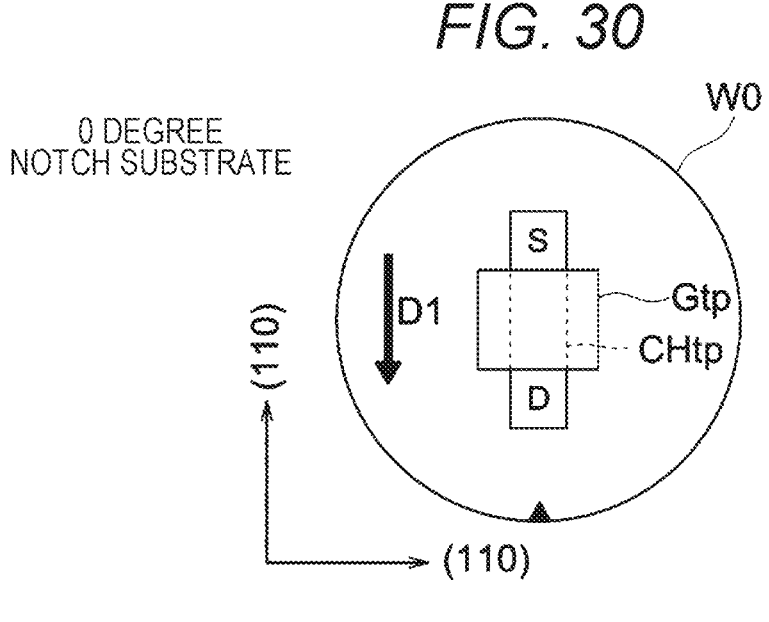
FIG. 30 is a plan view illustrating a configuration example of a p-type transistor.
FIG. 31 is a plan view illustrating a configuration example of a p-type transistor.

In FIGS. 30 and 31, the transistors Tp11 and Tp12 are provided on the 0 degree notch substrate W0. The upper surface or the side surface of the channel region CHtp of each of the transistors Tp11 and Tp12 is in a plane substantially parallel or substantially perpendicular to the (110) crystal plane of the substrate W0 on the surface of the substrate W0. The D1 direction is a direction substantially perpendicular or substantially parallel to the (110) crystal plane of the substrate W0. That is, the channel length direction of the transistors Tp11 and Tp12 is substantially parallel or substantially perpendicular to the (110) crystal plane (notch plane) of the substrate W0 on the surface of the substrate W0. As a result, the transconductance gm of the transistors Tp11 and Tp12 becomes relatively large.

Figure 32:
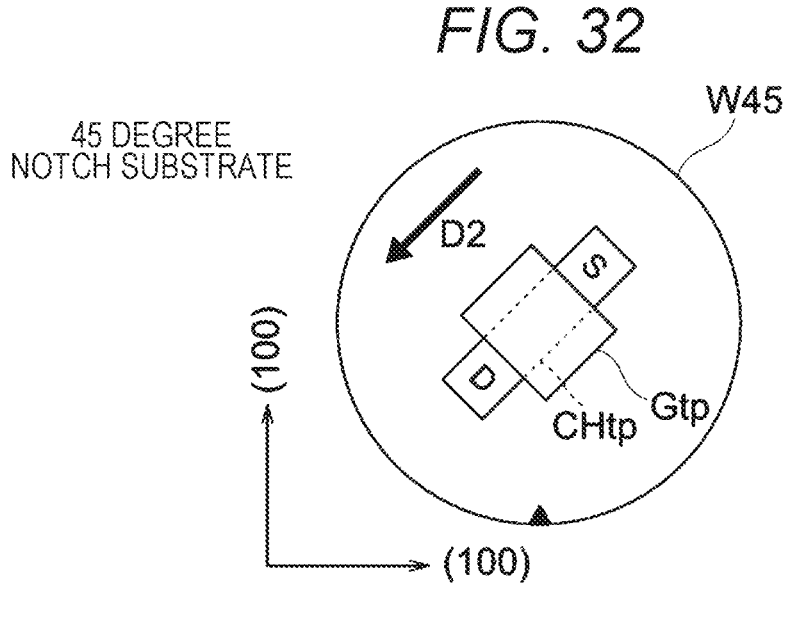
FIG. 32 is a plan view illustrating a configuration example of a p-type transistor.
Figure 33:
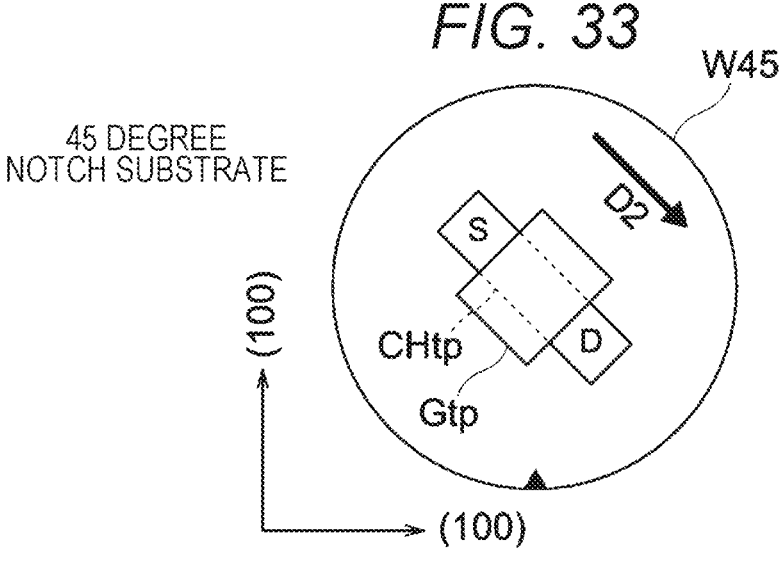
FIG. 33 is a plan view illustrating a configuration example of a p-type transistor.

In FIGS. 32 and 33, the transistors Tp11 and Tp12 are provided on the 45 degree notch substrate W45. An upper surface or a side surface of the channel region CHtp of each of the transistors Tp11 and Tp12 is in a plane inclined at about 45 degrees or about 135 degrees with respect to the (100) crystal plane of the substrate W45 on the surface of the substrate W45. The D1 direction is a direction inclined at about 45 degrees or about 135 degrees with respect to the (100) crystal plane of the substrate W45. That is, the channel length direction of the transistors Tp11 and Tp12 is a direction inclined at about 45 degrees or about 135 degrees with respect to the (100) crystal plane (notch plane) of the substrate W45. As a result, the transconductance gm of the transistors Tp11 and Tp12 becomes relatively large.

As a result, even in a case where the conductivity types of the transistors constituting the current mirror circuit 210a and the differential circuit 210b are opposite to those of the first embodiment, effects similar to those of the second embodiment can be obtained.

Figure 34:
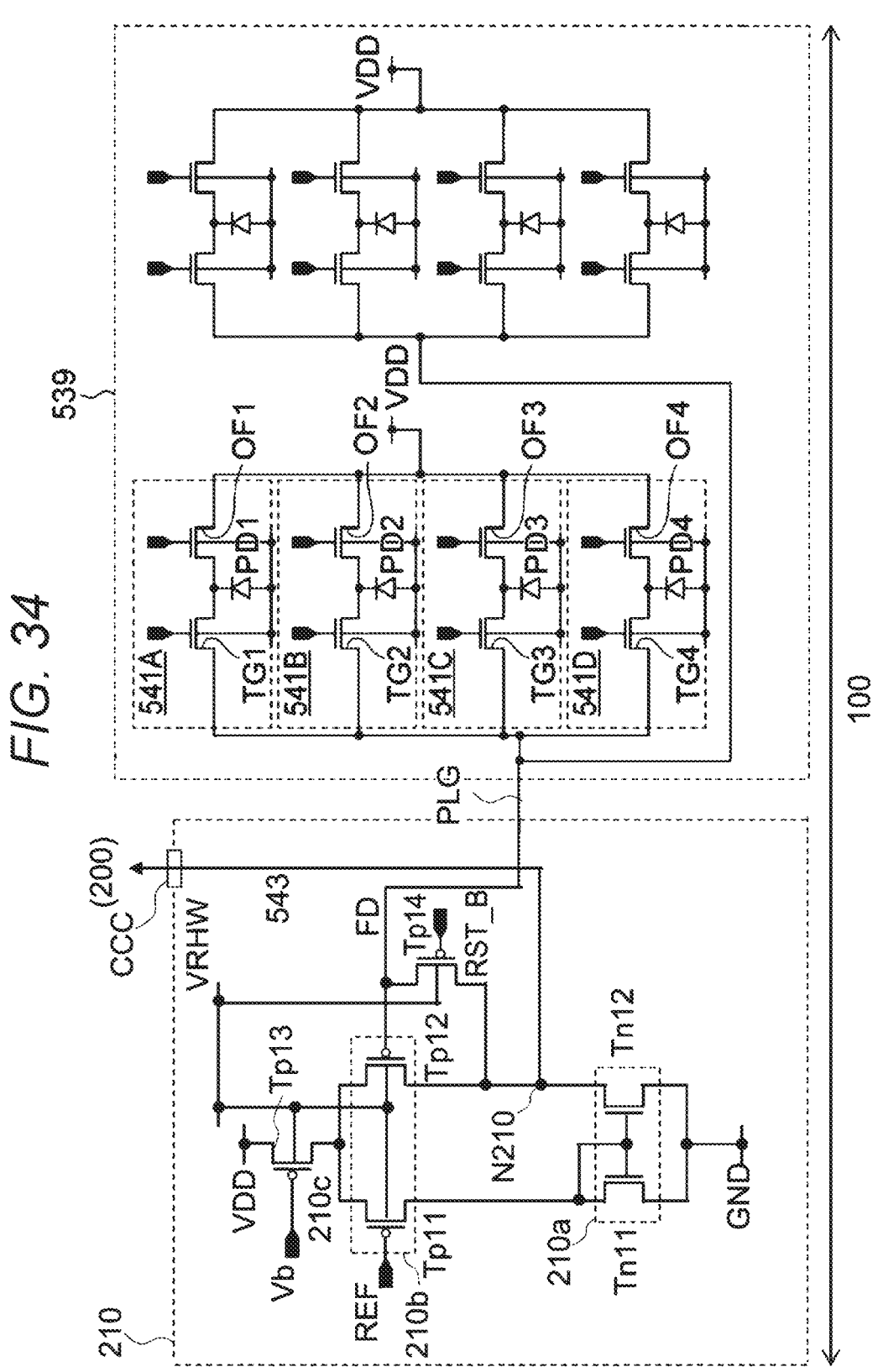
FIG. 34 is a diagram illustrating an embodiment in which the sixth embodiment is combined with the third embodiment.
Figure 35:
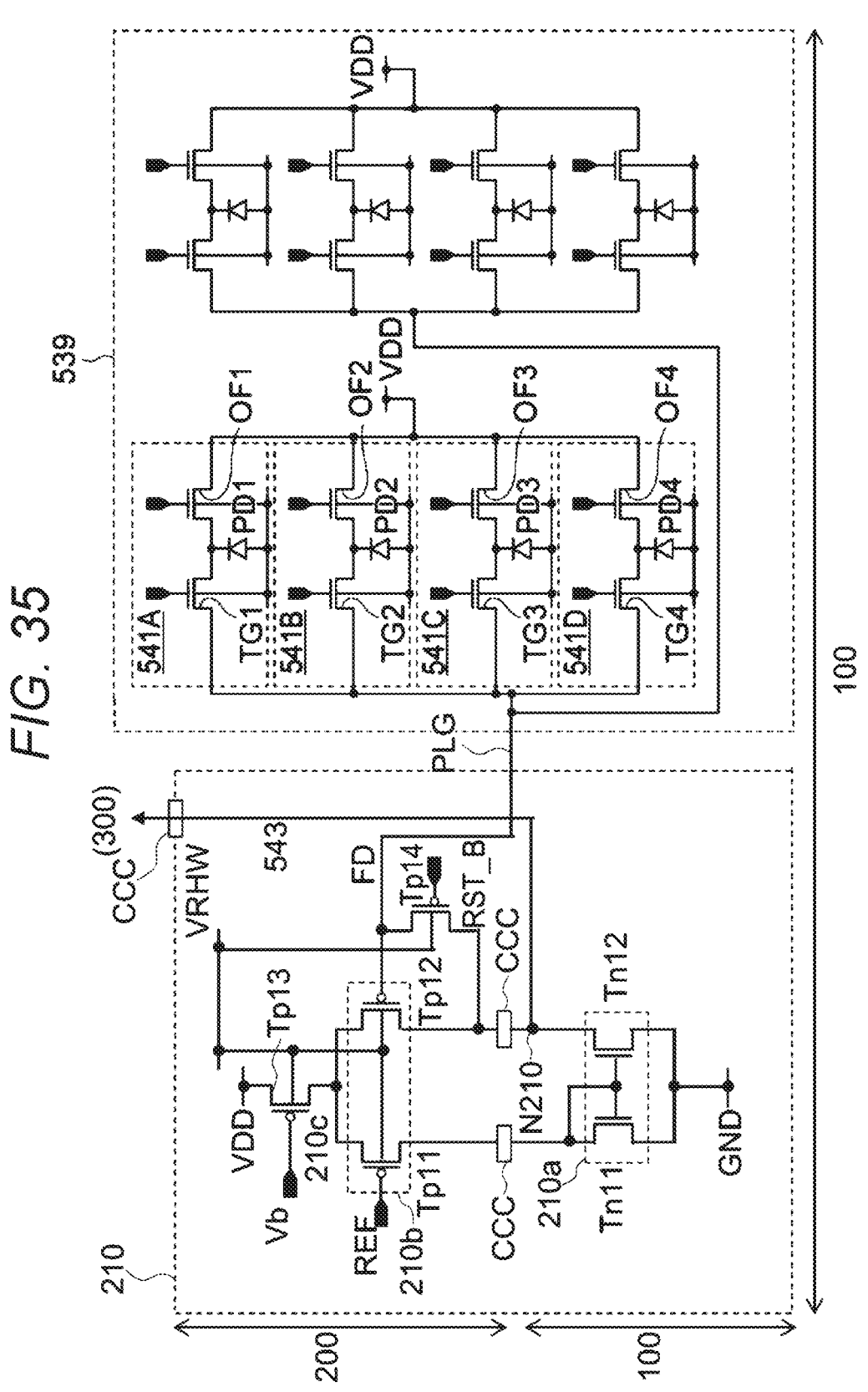
FIG. 35 is a diagram illustrating an embodiment in which the sixth embodiment is combined with the fourth embodiment.
Figure 36:
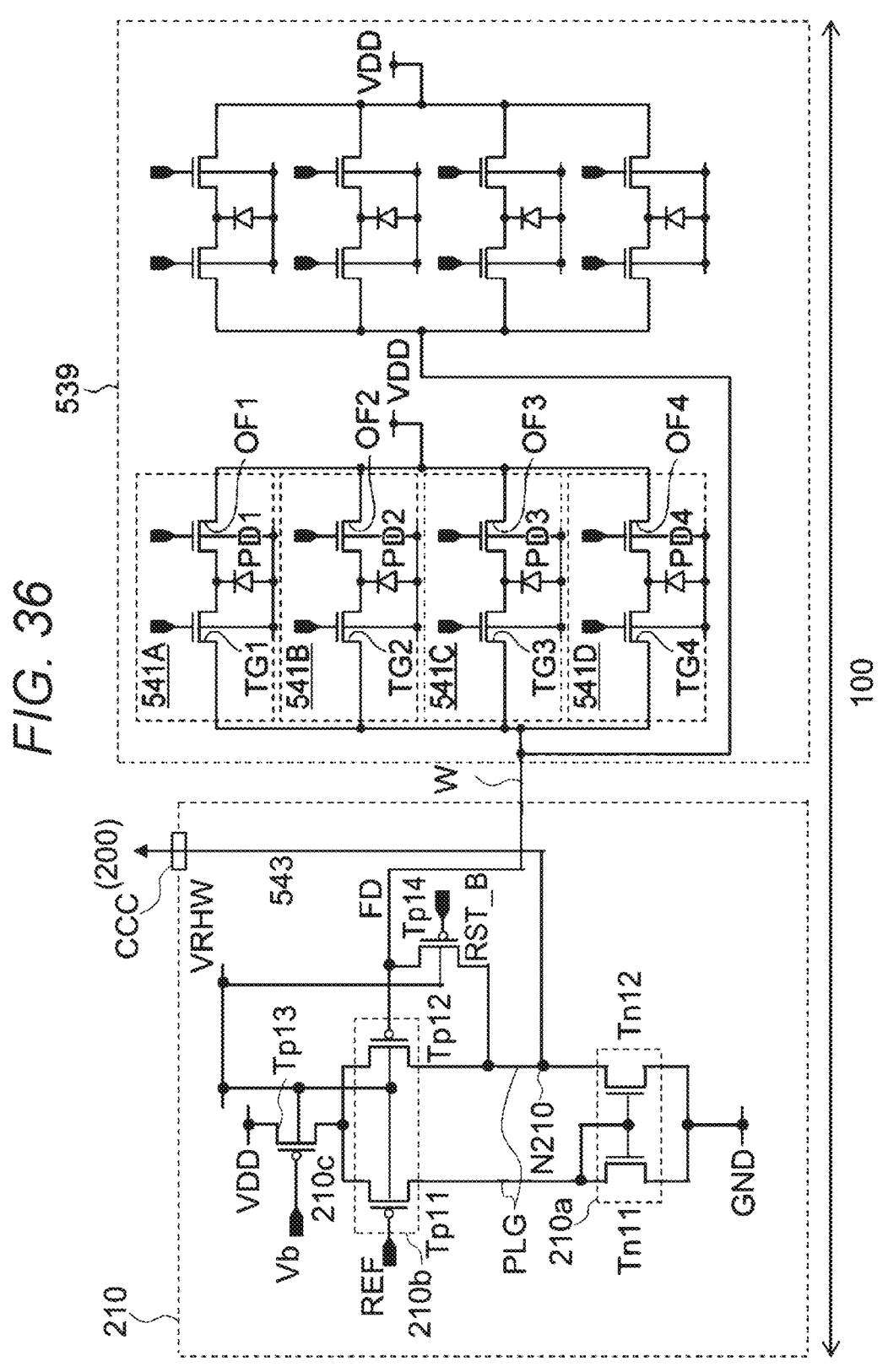
FIG. 36 is a diagram illustrating an embodiment in which the sixth embodiment is combined with the fifth embodiment.

FIGS. 34 to 36 are diagrams illustrating an embodiment in which the third to fifth embodiments are combined with the sixth embodiment, respectively. The conductivity types of the transistors constituting the current mirror circuit 210a and the differential circuit 210b of the third to fifth embodiments are reversed. The p-type transistors Tp11 and Tp12 of the differential circuit 210b may have the same configuration as those of the sixth embodiment.

As a result, even in a case where the conductivity types of the transistors constituting the current mirror circuit 210a and the differential circuit 210b are opposite to those of the third to fifth embodiments, effects similar to those of each of the third to fifth embodiments can be obtained.

Seventh Embodiment

Figure 37:
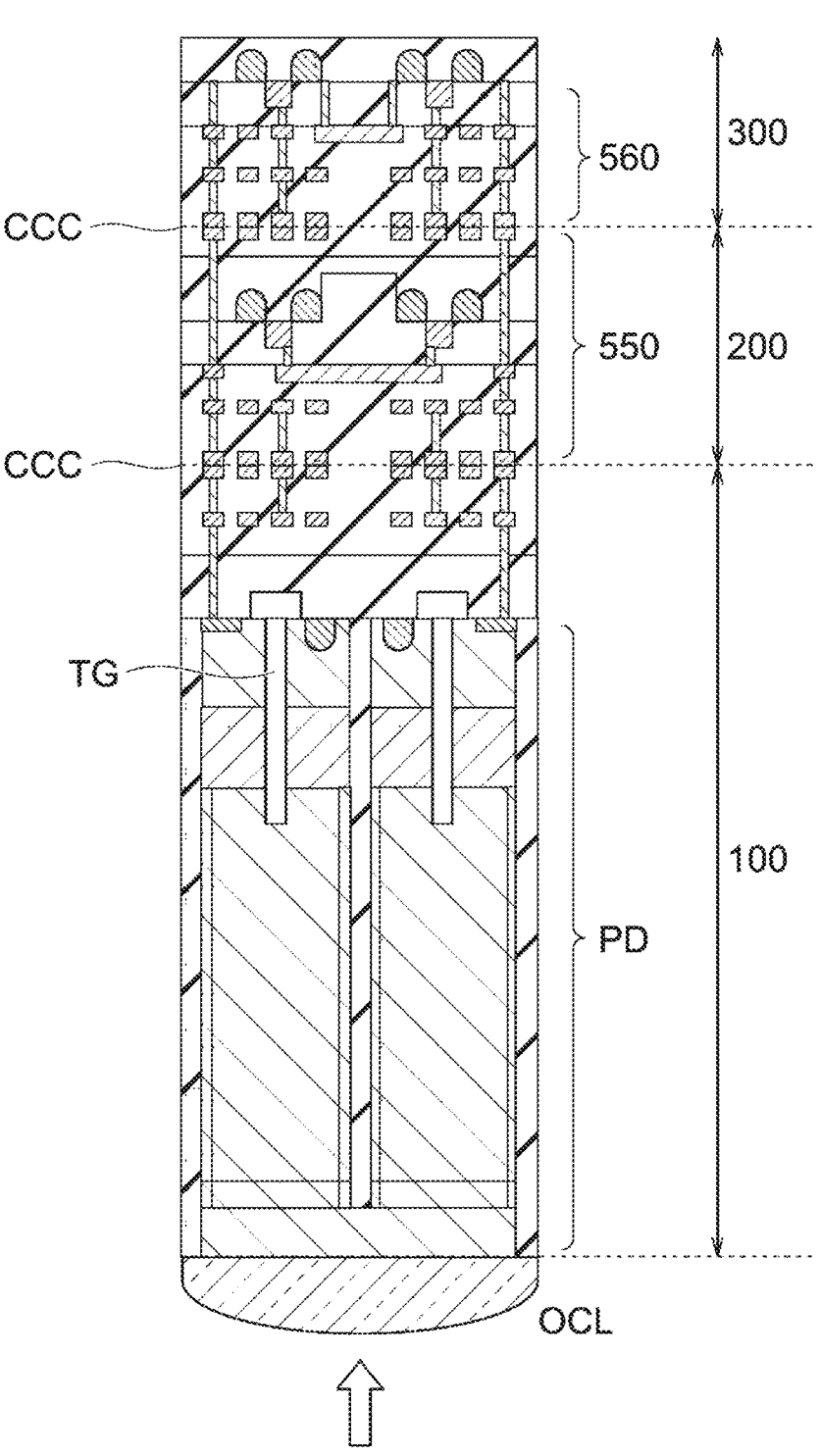
FIG. 37 is a schematic cross-sectional view illustrating configurations of a pixel sharing unit, a column signal processing section, and a pixel signal processing section according to a seventh embodiment.

FIG. 37 is a schematic cross-sectional view illustrating configurations of the pixel sharing unit 539, the column signal processing section 550, and the pixel signal processing section 560 according to a seventh embodiment. The seventh embodiment is different from the first embodiment in that the electrical connection between the first substrate 100 and the second substrate 200 is performed by wiring junction CCC instead of the via contact VIA.

As in the seventh embodiment, the electrical connection between the first substrate 100 and the second substrate 200 may be performed by wiring junction CCC instead of the via contact VIA. In this case, effects similar to those of the first embodiment can be obtained.

(Other Modifications)

Hereinafter, a solid-state imaging apparatus to which any one of the above embodiments is applicable will be described. The present embodiment can also be applied to the following solid-state imaging apparatus.

Figure 38:
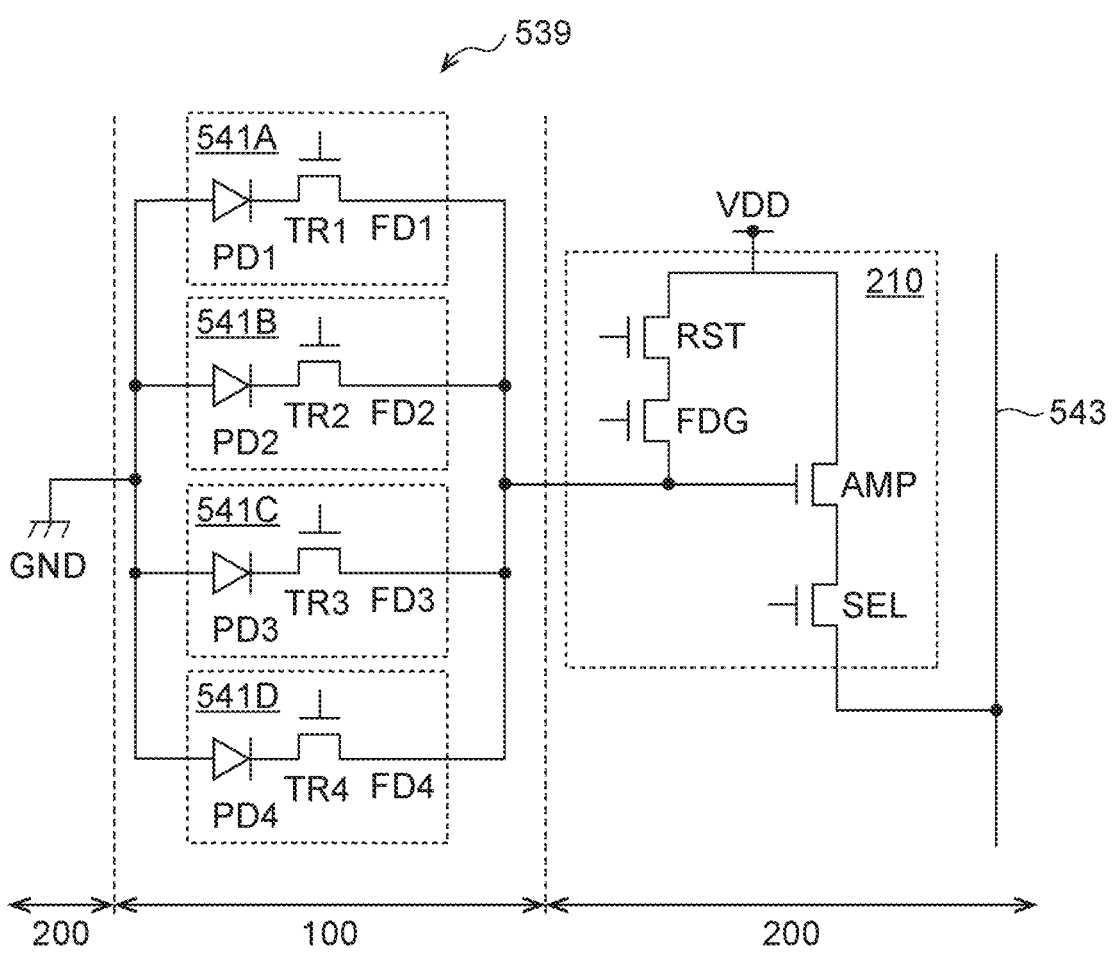
FIG. 38 is an equivalent circuit diagram of the pixel sharing unit illustrated in FIG. 1.

FIG. 38 is an equivalent circuit diagram illustrating an example of a configuration of the pixel sharing unit 539. The pixel sharing unit 539 includes a plurality of pixels 541 (FIG. 38 illustrates four pixels 541 of pixels 541A, 541B, 541C, and 541D), one pixel circuit 210 connected to the plurality of pixels 541, and a vertical signal line 5433 connected to the pixel circuit 210. Hereinafter, the comparator section 210 may be considered to be included in the pixel circuit. In addition to the comparator section, the pixel circuit 210 includes, for example, four transistors, specifically, an amplification transistor AMP, a selection transistor SEL, a reset transistor RST, and an FD conversion gain switching transistor FD. As described above, the pixel sharing unit 539 sequentially outputs the pixel signals of the four pixels 541 (pixels 541A, 541B, 541C, and 541D) included in the pixel sharing unit 539 to the vertical signal line 543 by operating one pixel circuit 210 in a time division manner. One pixel circuit 210 is connected to a plurality of pixels 541, and a mode in which pixel signals of the plurality of pixels 541 are output by one pixel circuit 210 in a time division manner is referred to as "a plurality of pixels 541 shares one pixel circuit 210".

The pixels 541A, 541B, 541C, and 541D have common components. Hereinafter, in order to distinguish the components of the pixels 541A, 541B, 541C, and 541D from each other, an identification number 1 is assigned to the end of the reference sign of the component of the pixel 541A, an identification number 2 is assigned to the end of the reference sign of the component of the pixel 541B, an identification number 3 is assigned to the end of the reference sign of the component of the pixel 541C, and an identification number 4 is assigned to the end of the reference sign of the component of the pixel 541D. In a case where it is not necessary to distinguish the components of the pixels 541A, 541B, 541C, and 541D from each other, the identification numbers at the ends of the reference signs of the components of the pixels 541A, 541B, 541C, and 541D are omitted.

The pixels 541A, 541B, 541C, and 541D include, for example, a photodiode PD, a transfer transistor TR electrically connected to the photodiode PD, and a floating diffusion FD electrically connected to the transfer transistor TR. Hereinafter, the transfer transistor TG is also referred to as a transfer transistor TR. In the photodiode PD (PD1, PD2, PD3, or PD4), a cathode is electrically connected to a source of the transfer transistor TR, and an anode is electrically connected to a reference potential line (for example, ground). The photodiode PD photoelectrically converts incident light and generates a charge corresponding to the amount of received light. The transfer transistor TR (transfer transistor TR1, TR2, TR3, or TR4) is, for example, an n-type complementary metal oxide semiconductor (CMOS) transistor. In the transfer transistor TR, the drain is electrically connected to the floating diffusion FD, and the gate is electrically connected to the drive signal line. The drive signal line is a part of the plurality of row drive signal lines 542 (see FIG. 1) connected to one pixel sharing unit 539. The transfer transistor TR transfers the charge generated in the photodiode PD to the floating diffusion FD. The floating diffusion FD (floating diffusion FD1, FD2, FD3, or FD4) is an n-type diffusion layer region formed in the p-type semiconductor layer. The floating diffusion FD is a charge holding means that temporarily holds the charge transferred from the photodiode PD, and is a charge-voltage conversion means that generates a voltage corresponding to the charge amount.

The four floating diffusions FD (floating diffusions FD1, FD2, FD3, and FD4) included in one pixel sharing unit 539 are electrically connected to each other, and are electrically connected to the gate of the amplification transistor AMP and the source of the FD conversion gain switching transistor FDG. A drain of the FD conversion gain switching transistor FDG is connected to a source of the reset transistor RST, and a gate of the FD conversion gain switching transistor FDG is connected to a drive signal line. This drive signal line is a part of the plurality of row drive signal lines 542 connected to one pixel sharing unit 539. A drain of the reset transistor RST is connected to the power supply line VDD, and a gate of the reset transistor RST is connected to the drive signal line. This drive signal line is a part of the plurality of row drive signal lines 542 connected to one pixel sharing unit 539. The gate of the amplification transistor AMP is connected to the floating diffusion FD, the drain of the amplification transistor AMP is connected to the power supply line VDD, and the source of the amplification transistor AMP is connected to the drain of the selection transistor SEL. A source of the selection transistor SEL is connected to the vertical signal line 543, and a gate of the selection transistor SEL is connected to the drive signal line. This drive signal line is a part of the plurality of row drive signal lines 542 connected to one pixel sharing unit 539.

Figure 40:
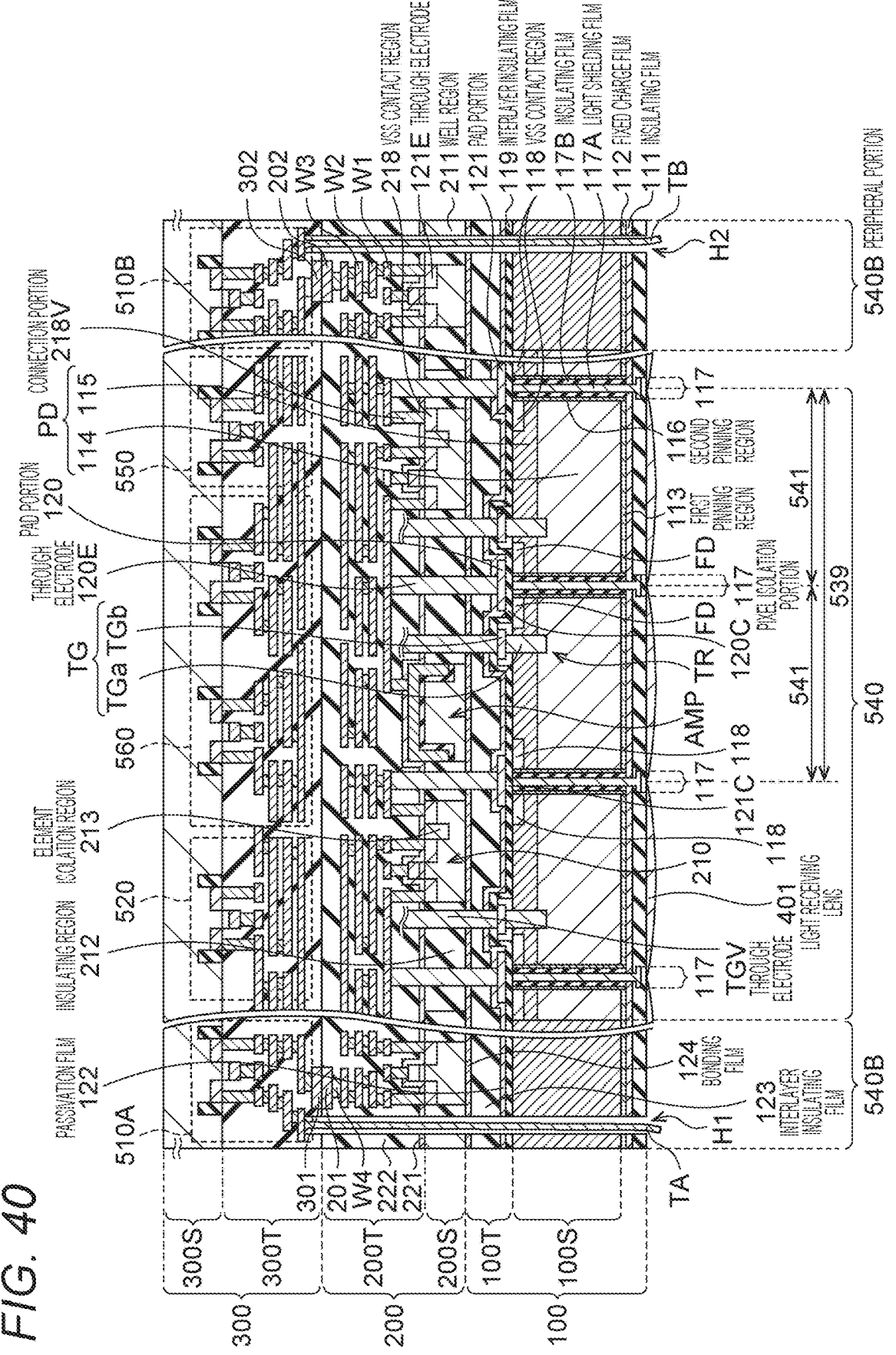
FIG. 40 is a schematic cross-sectional view illustrating an example of a specific configuration of the imaging apparatus illustrated in FIG. 3.

When the transfer transistor TR is turned on, the transfer transistor TR transfers the charge of the photodiode PD to the floating diffusion FD. A gate (transfer gate TG) of the transfer transistor TR includes, for example, a so-called vertical electrode, and is provided to extend from a surface of a semiconductor layer (a semiconductor layer 100S in FIG. 40 to be described later) to a depth reaching the PD as illustrated in FIG. 40 to be described later. The reset transistor RST resets the potential of the floating diffusions FD to a predetermined potential. The reset transistor RST resets the potential of the floating diffusions FD to a potential of the power supply line VDD when turned on. The selection transistor SEL controls an output timing of the pixel signal from the pixel circuit 210. The amplification transistor AMP generates a signal of a voltage corresponding to the level of the charges held in the floating diffusion FD as a pixel signal. The amplification transistor AMP is connected to the vertical signal line 543 via the selection transistor SEL. The amplification transistor AMP constitutes a source follower together with a load circuit section (see FIG. 1) connected to the vertical signal line 543 in the column signal processing section 550. When the selection transistor SEL is turned on, the amplification transistor AMP outputs the voltage of the floating diffusion FD to the column signal processing section 550 via the vertical signal line 543. The reset transistor RST, the amplification transistor AMP, and the selection transistor SEL are, for example, N-type CMOS transistors.

The FD conversion gain switching transistor FDG is used to change the gain of charge-voltage conversion in the floating diffusion FD. In general, a pixel signal is small at the time of imaging in a dark place. If the capacitance (FD capacitance C) of the floating diffusion FD is large at the time of performing charge-voltage conversion on the basis of Q=CV, V at the time of conversion into a voltage by the amplification transistor AMP becomes small. On the other hand, in a bright place, since the pixel signal becomes large, the floating diffusion FD cannot receive the charge of the photodiode PD unless the FD capacitance C is large. Furthermore, the FD capacitance C needs to be large so that V at the time of conversion into a voltage by the amplification transistor AMP does not become too large (in other words, is made smaller). In view of these, when the FD conversion gain switching transistor FDG is turned on, the gate capacitance of the FD conversion gain switching transistor FDG increases, so that the entire FD capacitance C increases. On the other hand, when the FD conversion gain switching transistor FDG is turned off, the entire FD capacitance C decreases. In this manner, by switching the FD conversion gain switching transistor FDG on and off, the FD capacitance C can be made variable, and the conversion efficiency can be switched. The FD conversion gain switching transistor FDG is, for example, an N-type CMOS transistor.

Note that a configuration in which the FD conversion gain switching transistor FDG is not provided is also possible. At this time, for example, the pixel circuit 210 includes three transistors, for example, an amplification transistor AMP, a selection transistor SEL, and a reset transistor RST. The pixel circuit 210 includes, for example, at least one of pixel transistors such as an amplification transistor AMP, a selection transistor SEL, a reset transistor RST, or an FD conversion gain switching transistor FDG.

The selection transistor SEL may be provided between the power supply line VDD and the amplification transistor AMP. In this case, the drain of the reset transistor RST is electrically connected to the power supply line VDD and the drain of the selection transistor SEL. The source of the selection transistor SEL is electrically connected to the drain of the amplification transistor AMP, and the gate of the selection transistor SEL is electrically connected to the row drive signal line 542 (see FIG. 1). The source of the amplification transistor AMP (the output terminal of the pixel circuit 210) is electrically connected to the vertical signal line 543, and the gate of the amplification transistor AMP is electrically connected to the source of the reset transistor RST. Note that, although not illustrated, the number of pixels 541 sharing one pixel circuit 210 may be other than four. For example, two or eight pixels 541 may share one pixel circuit 210.

Figure 39:
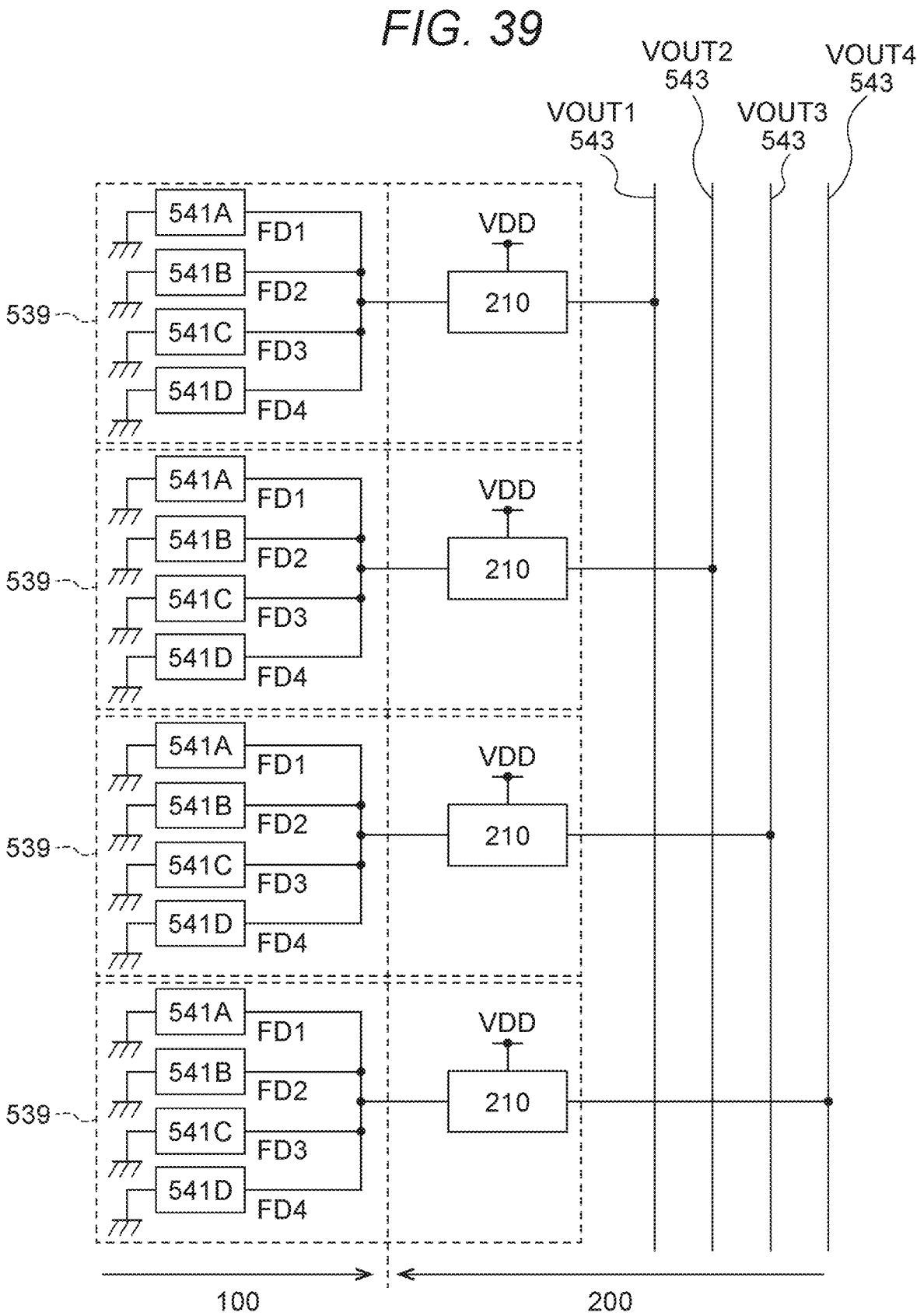
FIG. 39 is a diagram illustrating an example of a connection mode between a plurality of pixel sharing units and a plurality of vertical signal lines.

FIG. 39 illustrates an example of a connection mode between the plurality of pixel sharing units 539 and the vertical signal line 543. For example, the four pixel sharing units 539 arranged in the column direction are divided into four groups, and the vertical signal line 543 is connected to each of the four groups. For ease of description, FIG. 39 illustrates an example in which four groups each have one pixel sharing unit 539, but the four groups may each include a plurality of pixel sharing units 539. As described above, in the imaging apparatus 1, the plurality of pixel sharing units 539 arranged in the column direction may be divided into groups including one or a plurality of pixel sharing units 539. For example, the vertical signal line 543 and the column signal processing circuit 550 are connected to each group, and pixel signals can be simultaneously read from each group. Alternatively, in the imaging apparatus 1, one vertical signal line 543 may be connected to the plurality of pixel sharing units 539 arranged in the column direction. At this time, the pixel signals are sequentially read from the plurality of pixel sharing units 539 connected to one vertical signal line 543 in a time division manner.

[Specific Configuration of Imaging Apparatus 1]

FIG. 40 illustrates an example of a cross-sectional configuration in a direction perpendicular to the main surfaces of the first substrate 100, the second substrate 100, and the third substrate 300 of the imaging apparatus 1. FIG. 40 schematically illustrates the positional relationship of the components for easy understanding, and may be different from the actual cross section. In the imaging apparatus 1, the first substrate 100, the second substrate 200, and the third substrate 300 are laminated in this order. The imaging apparatus 1 further includes a light receiving lens 401 on the back surface side (light incident surface side) of the first substrate 100. A color filter layer (not illustrated) may be provided between the light receiving lens 401 and the first substrate 100. The light receiving lens 401 is provided in each of the pixels 541A, 541B, 541C, and 541D, for example. The imaging apparatus 1 is, for example, a back-illuminated imaging apparatus. The imaging apparatus 1 includes a pixel array section 540 arranged in a central portion and a peripheral portion 540B arranged outside the pixel array section 540.

The first substrate 100 includes an insulating film 111, a fixed charge film 112, a semiconductor layer 100S, and a wiring layer 100T in this order from the light receiving lens 401 side. The semiconductor layer 100S is constituted by, for example, a silicon substrate. The semiconductor layer 100S includes, for example, a p-well layer 115 in a part of the front surface (surface on the wiring layer 100T side) and in the vicinity thereof, and an n-type semiconductor region 114 in the other region (region deeper than the p-well layer 115). For example, the n-type semiconductor region 114 and the p-well layer 115 constitute a pn junction type photodiode PD. The p-well layer 115 is a p-type semiconductor region.

Figure 41A:
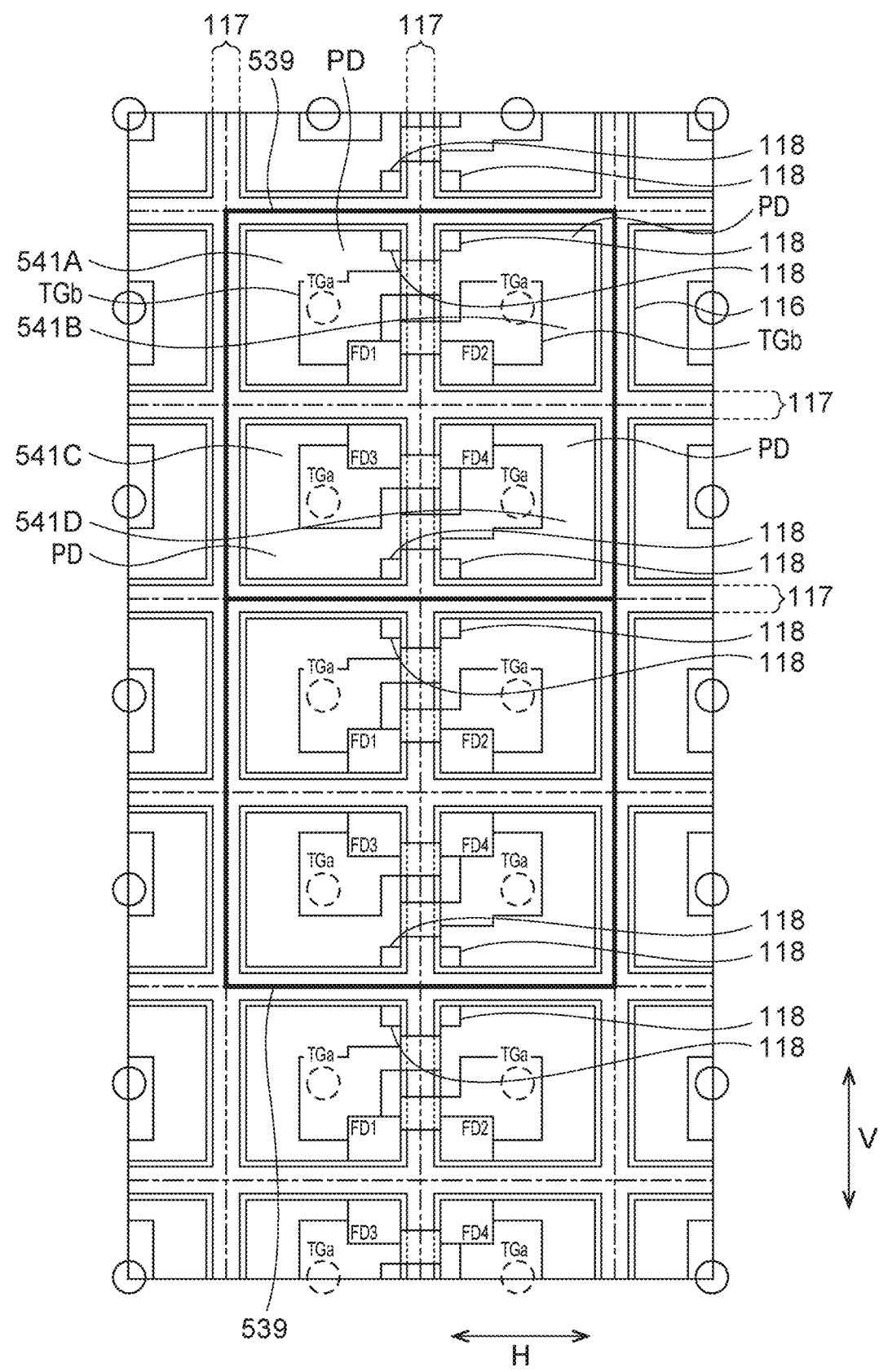
FIG. 41A is a schematic diagram illustrating an example of a planar configuration of a main part of the first substrate illustrated in FIG. 40.

FIG. 41A illustrates an example of a planar configuration of the first substrate 100. FIG. 41A mainly illustrates a planar configuration of a pixel isolation portion 117, the photodiode PD, a floating diffusion FD, a VSS contact region 118, and a transfer transistor TR of the first substrate 100. A configuration of the first substrate 100 will be described with reference to FIG. 41A together with FIG. 40.

The floating diffusion FD and the VSS contact region 118 are provided in the vicinity of the surface of the semiconductor layer 100S. The floating diffusion FD includes an n-type semiconductor region provided in the p-well layer 115. The floating diffusion FD (floating diffusion FD1, FD2, FD3, or FD4) of each of the pixels 541A, 541B, 541C, and 541D is provided, for example, close to each other in the central portion of the pixel sharing unit 539 (FIG. 41A). Although details will be described later, the four floating diffusions (floating diffusions FD1, FD2, FD3, and FD4) included in the sharing unit 539 are electrically connected to each other in the first substrate 100 (more specifically, in the wiring layer 100T) via electrical connection means (pad portion 120 described later). Further, the floating diffusion FD is connected from the first substrate 100 to the second substrate 200 (more specifically, from the wiring layer 100T to the wiring layer 200T) via electrical means (through electrode 120E described later). In the second substrate 200 (more specifically, inside the wiring layer 200T), the floating diffusion FD is electrically connected to the gate of the amplification transistor AMP and the source of the FD conversion gain switching transistor FDG by this electrical means.

The VSS contact region 118 is a region electrically connected to the reference potential line VSS, and is disposed away from the floating diffusion FD. For example, in the pixels 541A, 541B, 541C, and 541D, the floating diffusion FD is arranged at one end in the V direction of each pixel, and the VSS contact region 118 is arranged at the other end (FIG. 41A). The VSS contact region 118 includes, for example, a p-type semiconductor region. The VSS contact region 118 is connected to, for example, a ground potential or a fixed potential. As a result, the reference potential is supplied to the semiconductor layer 100S.

The transfer transistor TR is provided on the first substrate 100 together with the photodiode PD, the floating diffusion FD, and the VSS contact region 118. The photodiode PD, the floating diffusion FD, the VSS contact region 118, and the transfer transistor TR are provided in each of the pixels 541A, 541B, 541C, and 541D. The transfer transistor TR is provided on the front surface side (side opposite to light incident surface side, second substrate 200 side) of the semiconductor layer 100S. The transfer transistor TR has a transfer gate TG. The transfer gate TG includes, for example, a horizontal portion TGb facing the surface of the semiconductor layer 100S and a vertical portion TGa provided in the semiconductor layer 100S. The vertical portion TGa extends in the thickness direction of the semiconductor layer 100S. One end of the vertical portion TGa is in contact with the horizontal portion TGb, and the other end is provided in the n-type semiconductor region 114. By configuring the transfer transistor TR with such a vertical transistor, transfer failure of the pixel signal hardly occurs, and readout efficiency of the pixel signal can be improved.

The horizontal portion TGb of the transfer gate TG extends from a position facing the vertical portion TGa toward, for example, the central portion of the pixel sharing unit 539 in the H direction (FIG. 41A). As a result, the position in the H direction of the through electrode (through electrode TGV to be described later) reaching the transfer gate TG can be brought close to the position in the H direction of the through electrode (through electrodes 120E and 121E to be described later) connected to the floating diffusion FD and the VSS contact region 118. For example, the plurality of pixel sharing units 539 provided on the first substrate 100 has the same configuration (FIG. 41A).

Figure 41B:
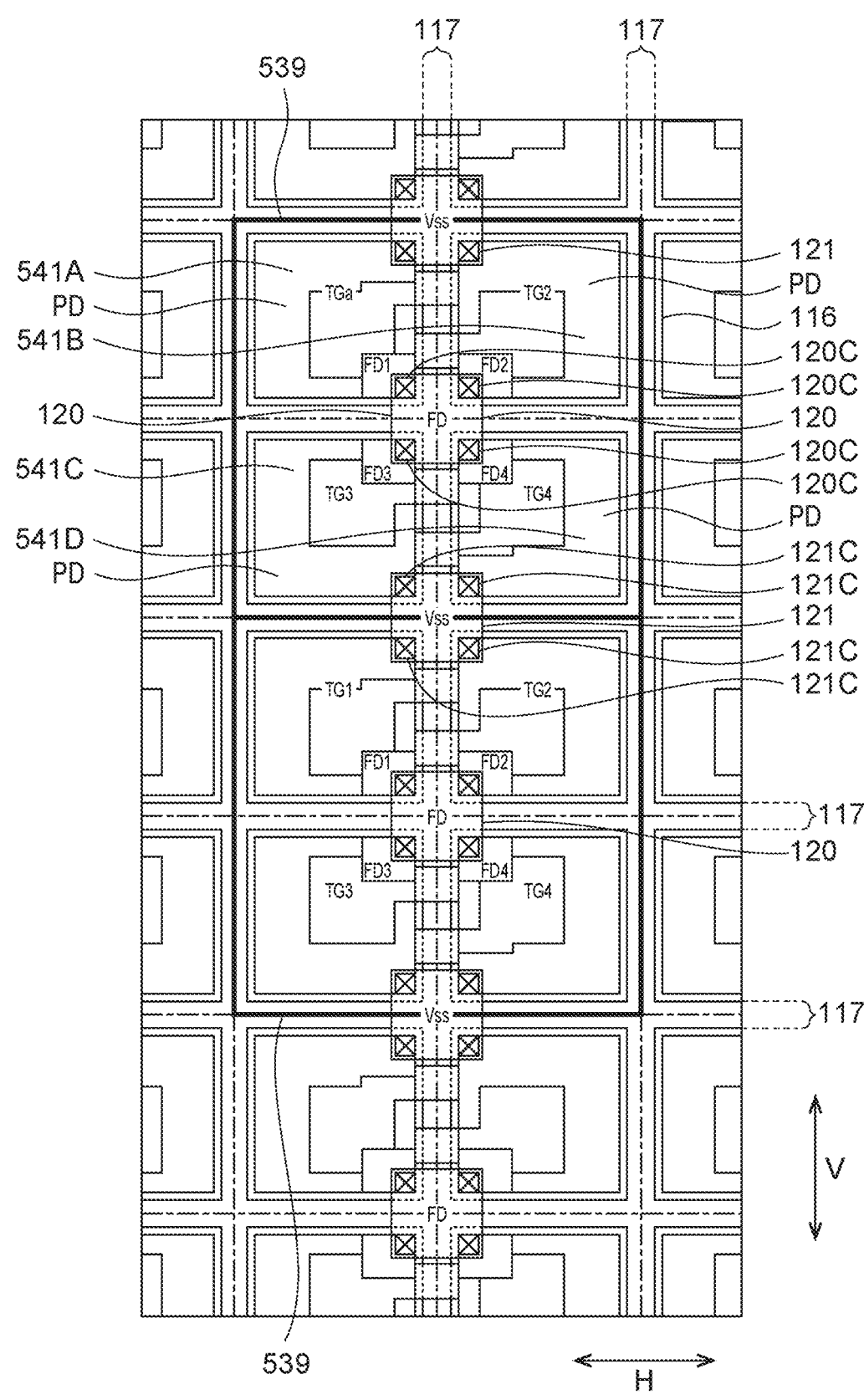
FIG. 41B is a schematic diagram illustrating a planar configuration of a pad portion together with a main part of the first substrate illustrated in FIG. 41A.

The semiconductor layer 100S is provided with the pixel isolation portion 117 that isolates the pixels 541A, 541B, 541C, and 541D from each other. The pixel isolation portion 117 is formed to extend in the normal direction of the semiconductor layer 100S (direction perpendicular to the surface of the semiconductor layer 100S). The pixel isolation portion 117 is provided so as to partition the pixels 541A, 541B, 541C, and 541D from each other, and has, for example, a grid-like planar shape (FIG. 41A and FIG. 41B). For example, the pixel isolation portion 117 electrically and optically isolates the pixels 541A, 541B, 541C, and 541D from each other. The pixel isolation portion 117 includes, for example, a light shielding film 117A and an insulating film 117B. For example, tungsten (W) or the like is used for the light shielding film 117A. The insulating film 117B is provided between the light shielding film 117A and the p-well layer 115 or the n-type semiconductor region 114. The insulating film 117B is constituted by, for example, silicon oxide (SiO). The pixel isolation portion 117 has, for example, a full trench isolation (FTI) structure and penetrates the semiconductor layer 1003. Although not illustrated, the pixel isolation portion 117 is not limited to the FTI structure penetrating the semiconductor layer 100S. For example, a deep trench isolation (DTI) structure that does not penetrate the semiconductor layer 1003 may be used. The pixel isolation portion 117 extends in the normal direction of the semiconductor layer 100S and is formed in a partial region of the semiconductor layer 100S.

In the semiconductor layer 100S, for example, a first pinning region 113 and a second pinning region 116 are provided. The first pinning region 113 is provided in the vicinity of the back surface of the semiconductor layer 100S, and is disposed between the n-type semiconductor region 114 and the fixed charge film 112. The second pinning region 116 is provided on a side surface of the pixel isolation portion 117, specifically, between the pixel isolation portion 117 and the p-well layer 115 or the n-type semiconductor region 114. The first pinning region 113 and the second pinning region 116 are constituted by, for example, a p-type semiconductor region.

The fixed charge film 112 having a negative fixed charge is provided between the semiconductor layer 100S and the insulating film 111. The first pinning region 113 of the hole accumulation layer is formed at the interface on the light receiving surface (back surface) side of the semiconductor layer 100S by the electric field induced by the fixed charge film 112. As a result, generation of dark current due to the interface state on the light receiving surface side of the semiconductor layer 100S is suppressed. The fixed charge film 112 is constituted by, for example, an insulating film having a negative fixed charge. Examples of the material of the insulating film having a negative fixed charge include hafnium oxide, zircon oxide, aluminum oxide, titanium oxide, and tantalum oxide.

The light shielding film 117A is provided between the fixed charge film 112 and the insulating film 111. The light shielding film 117A may be provided continuously with the light shielding film 117A constituting the pixel isolation portion 117. The light shielding film 117A between the fixed charge film 112 and the insulating film 111 is selectively provided, for example, at a position facing the pixel isolation portion 117 in the semiconductor layer 100S. The insulating film 111 is provided so as to cover the light shielding film 117A. The insulating film 111 is constituted by, for example, silicon oxide.

The wiring layer 100T provided between the semiconductor layer 1003 and the second substrate 200 includes an interlayer insulating film 119, pad portions 120 and 121, a passivation film 122, an interlayer insulating film 123, and a bonding film 124 in this order from the semiconductor layer 100S side. The horizontal portion TGb of the transfer gate TG is provided in the wiring layer 100T, for example. The interlayer insulating film 119 is provided over the entire surface of the semiconductor layer 100S and is in contact with the semiconductor layer 100S. The interlayer insulating film 119 is constituted by, for example, a silicon oxide film. Note that the configuration of the wiring layer 100T is not limited to the above, and may be a configuration including wiring and an insulating film.

FIG. 41B illustrates the configuration of the pad portions 120 and 121 together with the planar configuration illustrated in FIG. 41A. The pad portions 120 and 121 are provided in a selective region on the interlayer insulating film 119. The pad portion 120 is for connecting the floating diffusions FD (floating diffusions FD1, FD2, FD3, and FD4) of the pixels 541A, 541B, 541C, and 541D to each other. For example, the pad portion 120 is arranged at the central portion of the pixel sharing unit 539 in plan view for each pixel sharing unit 539 (FIG. 41B). The pad portion 120 is provided across the pixel isolation portion 117, and is arranged so as to overlap at least a part of each of the floating diffusions FD1, FD2, FD3, and FD4 (FIG. 40 and FIG. 41B). Specifically, the pad portion 120 is formed in a region overlapping at least a part of each of the plurality of floating diffusions FD (floating diffusions FD1, FD2, FD3, and FD4) sharing the pixel circuit 210 and at least a part of the pixel isolation portion 117 formed between the plurality of photodiodes PD (photodiodes PD1, PD2, PD3, and PD4) sharing the pixel circuit 210 in a direction perpendicular to the surface of the semiconductor layer 100S. The interlayer insulating film 119 is provided with a connection via 120C for electrically connecting the pad portion 120 and the floating diffusions FD1, FD2, FD3, and FD4. The connection via 120C is provided in each of the pixels 541A, 541B, 541C, and 541D. For example, by embedding a part of the pad portion 120 in the connection via 120C, the pad portion 120 and the floating diffusions FD1, FD2, FD3, and FD4 are electrically connected.

The pad portion 121 is for connecting the plurality of VSS contact regions 118 to each other. For example, the VSS contact region 118 provided in the pixels 541C and 541D of one pixel sharing unit 539 adjacent in the V direction and the VSS contact region 118 provided in the pixels 541A and 541B of the other pixel sharing unit 539 are electrically connected by the pad portion 121. The pad portion 121 is provided across the pixel isolation portion 117, for example, and is arranged to overlap at least a part of each of the four VSS contact regions 118. Specifically, the pad portion 121 is formed in a region overlapping at least a part of each of the plurality of VSS contact regions 118 and at least a part of the pixel isolation portion 117 formed between the plurality of VSS contacts 118 in a direction perpendicular to the surface of the semiconductor layer 100S. The interlayer insulating film 119 is provided with a connection via 121C for electrically connecting the pad portion 121 and the VSS contact region 118. The connection via 121C is provided in each of the pixels 541A, 541B, 541C, and 541D. For example, by embedding a part of the pad portion 121 in the connection via 121C, the pad portion 121 and the VSS contact region 118 are electrically connected. For example, the pad portion 120 and the pad portion 121 of each of the plurality of pixel sharing units 539 arranged in the V direction are arranged at substantially the same position in the H direction (FIG. 41B).

By providing the pad portion 120, it is possible to reduce the number of wirings for connection from each floating diffusion FD to the pixel circuit 210 (for example, the gate electrode of the amplification transistor AMP) in the entire chip. Similarly, by providing the pad portion 121, wiring for supplying a potential to each VSS contact region 118 can be reduced in the entire chip. As a result, it is possible to reduce the area of the entire chip, suppress the electrical interference between the wirings in the miniaturized pixel, and/or reduce the cost by reducing the number of components or the like.

The pad portions 120 and 121 can be provided at desired positions on the first substrate 100 and the second substrate 200. Specifically, the pad portions 120 and 121 can be provided in either the wiring layer 100T or an insulating region 212 of the semiconductor layer 200S. In a case of being provided in the wiring layer 100T, the pad portions 120 and 121 may be brought into direct contact with the semiconductor layer 100S. Specifically, the pad portions 120 and 121 may be directly connected to at least a part of each of the floating diffusion FD and/or the VSS contact region 118. In addition, connection vias 120C and 121C may be provided from the floating diffusion FD and/or the VSS contact region 118 connected to the pad portions 120 and 121, respectively, and the pad portions 120 and 121 may be provided at desired positions of an insulating region 2112 of the wiring layer 100T and the semiconductor layer 200S.

In particular, in a case where the pad portions 120 and 121 are provided in the wiring layer 100T, it is possible to reduce the number of wirings connected to the floating diffusion FD and/or the VSS contact region 118 in the insulating region 212 of the semiconductor layer 200S. As a result, in the second substrate 200 forming the pixel circuit 210, the area of the insulating region 212 for forming the through wiring for connecting from the floating diffusion FD to the pixel circuit 210 can be reduced. Therefore, it is possible to secure a large area of the second substrate 200 forming the pixel circuit 210. By securing the area of the pixel circuit 210, it is possible to form a large pixel transistor and contribute to image quality improvement by noise reduction or the like.

In particular, in a case where the FTI structure is used for the pixel isolation portion 117, it is preferable to provide the floating diffusion FD and/or the VSS contact region 118 in each pixel 541. Therefore, by using the configurations of the pad portions 120 and 121, the wiring connecting the first substrate 100 and the second substrate 200 can be greatly reduced.

Furthermore, as illustrated in FIG. 41B, for example, the pad portion 120 to which the plurality of floating diffusions FD is connected and the pad portion 121 to which the plurality of VSS contacts 118 is connected are alternately arranged linearly in the V direction. Furthermore, the pad portions 120 and 121 are formed at positions surrounded by the plurality of photodiodes PD, the plurality of transfer gates TG, and the plurality of floating diffusions FD. As a result, elements other than the floating diffusion FD and the VSS contact region 118 can be freely arranged on the first substrate 100 forming a plurality of elements, and the efficiency of the layout of the entire chip can be improved.

Furthermore, symmetry in the layout of the elements formed in each pixel sharing unit 539 is secured, and variations in characteristics of each pixel 541 can be suppressed.

The pad portions 120 and 121 are constituted by, for example, polysilicon (Poly Si), more specifically, doped polysilicon doped with impurities. The pad portions 120 and 121 are preferably constituted by a conductive material having high heat resistance such as polysilicon, tungsten (W), titanium (Ti), or titanium nitride (TiN). As a result, the pixel circuit 210 can be formed after the semiconductor layer 200S of the second substrate 200 is bonded to the first substrate 100. Hereinafter, the reason will be described. Note that, in the following description, a method of forming the pixel circuit 210 after bonding the first substrate 100 and the semiconductor layer 200S of the second substrate 200 is referred to as a first manufacturing method.

Here, it is also conceivable to form the pixel circuit 210 on the second substrate 200 and then bond this to the first substrate 100 (hereinafter referred to as a second manufacturing method). In the second manufacturing method, an electrode for electrical connection is formed in advance on each of the surface of the first substrate 100 (the surface of the wiring layer 100T) and the surface of the second substrate 200 (the surface of the wiring layer 200T). When the first substrate 100 and the second substrate 200 are bonded to each other, the electrodes for electrical connection formed on the surface of the first substrate 100 and the surface of the second substrate 200 come into contact with each other at the same time. As a result, an electrical connection is formed between the wiring included in the first substrate 100 and the wiring included in the second substrate 200. Therefore, by adopting the configuration of the imaging apparatus 1 using the second manufacturing method, for example, manufacturing can be performed using an appropriate process according to the configuration of each of the first substrate 100 and the second substrate 200, and a high-quality and high-performance imaging apparatus can be manufactured.

In such a second manufacturing method, when the first substrate 100 and the second substrate 200 are bonded to each other, an error in alignment may occur due to a manufacturing apparatus for bonding. In addition, the first substrate 100 and the second substrate 200 have a size of, for example, about several tens of centimeters in diameter, but when the first substrate 100 and the second substrate 200 are bonded to each other, there is a possibility that expansion and contraction of the substrates occur in microscopic regions of the respective parts of the first substrate 100 and the second substrate 200. This expansion and contraction of the substrates is caused by a slight shift in the timing of contact between the substrates. Due to such expansion and contraction of the first substrate 100 and the second substrate 200, an error may occur in the positions of the electrodes for electrical connection formed on the surface of the first substrate 100 and the surface of the second substrate 200. In the second manufacturing method, even if such an error occurs, it is preferable to take measures so that the electrodes of the first substrate 100 and the second substrate 200 come into contact with each other. Specifically, at least one, preferably both, of the electrodes of the first substrate 100 or the second substrate 200 is increased in consideration of the above error. Therefore, when the second manufacturing method is used, for example, the size of the electrode formed on the surface of the first substrate 100 or the second substrate 200 (the size in the substrate planar direction) is larger than the size of the internal electrode extending from the inside of the first substrate 100 or the second substrate 200 to the surface in the thickness direction.

On the other hand, the pad portions 120 and 121 are constituted by a heat-resistant conductive material, so that the above-described first manufacturing method can be used. In the first manufacturing method, after the first substrate 100 including the photodiode PD, the transfer transistor TR, and the like is formed, the first substrate 100 and the second substrate 200 (semiconductor layer 20003) are bonded to each other. At this time, the second substrate 200 is in a state in which patterns such as active elements and wiring layers constituting the pixel circuit 210 are not formed. Since the second substrate 200 is in a state before the pattern is formed, even if an error occurs in the bonding position when the first substrate 100 and the second substrate 200 are bonded, an error does not occur in alignment between the pattern of the first substrate 100 and the pattern of the second substrate 200 due to the bonding error. This is because the pattern of the second substrate 200 is formed after the first substrate 100 and the second substrate 200 are bonded. Note that, when a pattern is formed on the second substrate, for example, in an exposure apparatus for pattern formation, the pattern is formed while the pattern formed on the first substrate is set as an alignment target. For the above reason, the error in the bonding position between the first substrate 100 and the second substrate 200 does not cause a problem in manufacturing the imaging apparatus 1 in the first manufacturing method. For a similar reason, an error caused by expansion and contraction of the substrate caused by the second manufacturing method does not cause a problem in manufacturing the imaging apparatus 1 in the first manufacturing method.

In the first manufacturing method, after the first substrate 100 and the second substrate 200 (semiconductor layer 200S) are bonded in this manner, an active element is formed on the second substrate 200. Thereafter, the through electrodes 120E and 121E and the through electrode TGV (FIG. 40) are formed. In the formation of the through electrodes 120E, 121E, and TGV, for example, a pattern of the through electrode is formed from above the second substrate 200 using reduced projection exposure by an exposure apparatus. Since the reduced exposure projection is used, even if an error occurs in the alignment between the second substrate 200 and the exposure apparatus, the magnitude of the error is only a fraction (inverse of the reduced exposure projection magnification) of the magnitude of the error of the above-described second manufacturing method in the second substrate 200. Therefore, by adopting the configuration of the imaging apparatus 1 using the first manufacturing method, it is easy to align the elements formed on each of the first substrate 100 and the second substrate 200, and it is possible to manufacture a high-quality and high-performance imaging apparatus.

The imaging apparatus 1 manufactured using such a first manufacturing method has features different from those of the imaging apparatus manufactured by the second manufacturing method. Specifically, in the imaging apparatus 1 manufactured by the first manufacturing method, for example, the through electrodes 120E, 121E, and TGV have substantially constant thicknesses (sizes in the substrate planar direction) from the second substrate 200 to the first substrate 100. Alternatively, when the through electrodes 120E, 121E, and TGV have a tapered shape, they have a tapered shape with a constant inclination. In the imaging apparatus 1 including such through electrodes 120E, 121E, and TGV, the pixel 541 is easily miniaturized.

Here, when the imaging apparatus 1 is manufactured by the first manufacturing method, since the active element is formed on the second substrate 200 after the first substrate 100 and the second substrate 200 (semiconductor layer 200S) are bonded together, the first substrate 100 is also affected by the heating treatment necessary for forming the active element. Therefore, as described above, it is preferable to use a conductive material having high heat resistance for the pad portions 120 and 121 provided on the first substrate 100. For example, the pad portions 120 and 121 are preferably constituted by a material having a higher melting point (that is, higher heat resistance) than at least a part of the wiring material included in the wiring layer 200T of the second substrate 200. For example, a conductive material having high heat resistance such as doped polysilicon, tungsten, titanium, or titanium nitride is used for the pad portions 120 and 121. As a result, the imaging apparatus 1 can be manufactured using the above-described first manufacturing method.

The passivation film 122 is provided over the entire surface of the semiconductor layer 100S so as to cover the pad portions 120 and 121, for example (FIG. 40). The passivation film 122 is constituted by, for example, a silicon nitride (SiN) film. The interlayer insulating film 123 covers the pad portions 120 and 121 with the passivation film 122 interposed therebetween. The interlayer insulating film 123 is provided over the entire surface of the semiconductor layer 100S, for example. The interlayer insulating film 123 is constituted by, for example, a silicon oxide (SiO) film. The bonding film 124 is provided on a bonding surface between the first substrate 100 (specifically, the wiring layer 100T) and the second substrate 200. That is, the bonding film 124 is in contact with the second substrate 200. The bonding film 124 is provided over the entire main surface of the first substrate 100. The bonding film 124 is constituted by, for example, a silicon nitride film.

The light receiving lens 401 faces the semiconductor layer 100S with the fixed charge film 112 and the insulating film 111 interposed therebetween, for example (FIG. 40). The light receiving lens 401 is provided, for example, at a position facing the photodiode PD of each of the pixels 541A, 541B, 541C, and 541D.

The second substrate 200 includes the semiconductor layer 200S and the wiring layer 200T in this order from the first substrate 100 side. The semiconductor layer 200S is constituted by a silicon substrate. In the semiconductor layer 200S, a well region 211 is provided over the thickness direction. The well region 211 is, for example, a p-type semiconductor region. The second substrate 20 is provided with a pixel circuit 210 arranged for each pixel sharing unit 539. The pixel circuit 210 is provided, for example, on the front surface side (wiring layer 200T side) of the semiconductor layer 200S. In the imaging apparatus 1, the second substrate 200 is bonded to the first substrate 100 such that the back surface side (semiconductor layer 200S side) of the second substrate 200 faces the front surface side (wiring layer 100T side) of the first substrate 100. That is, the second substrate 200 is bonded to the first substrate 100 in a face-to-back manner.

Figure 42:
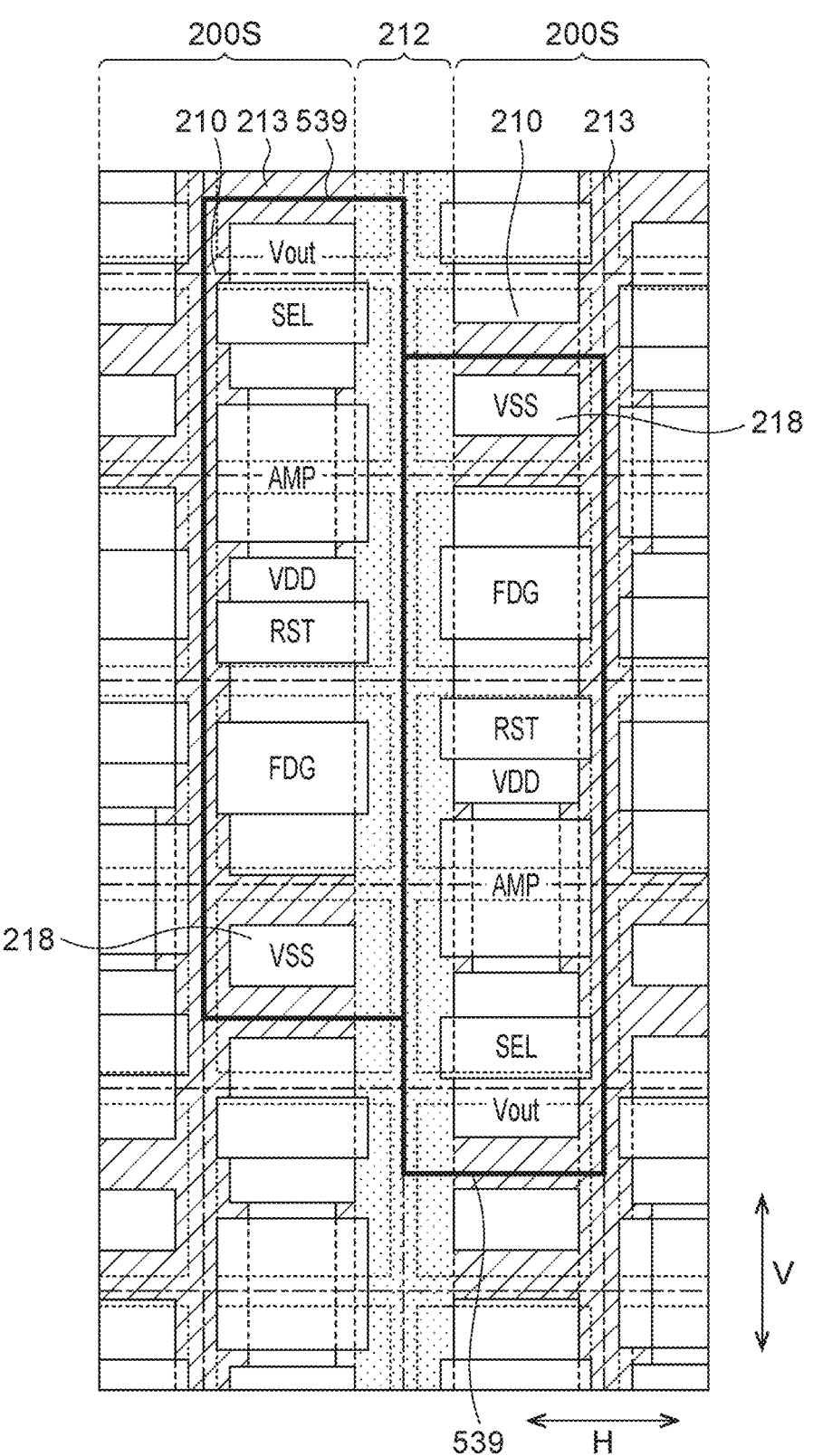
FIG. 42 is a schematic diagram illustrating an example of a planar configuration of a second substrate (semiconductor layer) illustrated in FIG. 40.
Figure 43:
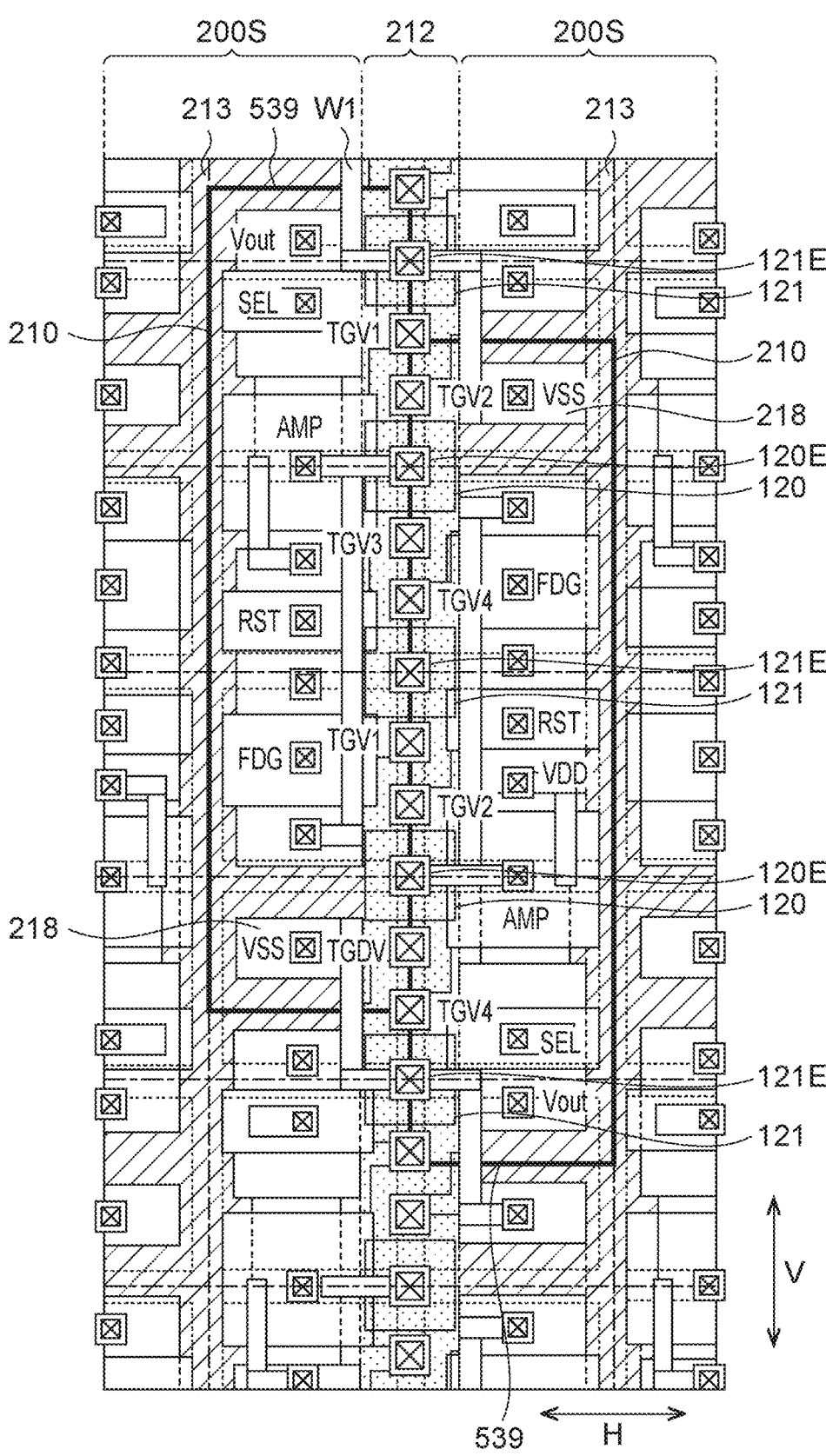
FIG. 43 is a schematic diagram illustrating an example of a planar configuration of main parts of the pixel circuit and the first substrate together with the first wiring layer illustrated in FIG. 40.

FIGS. 42 to 46 schematically illustrate an example of a planar configuration of the second substrate 200. FIG. 42 illustrates a configuration of the pixel circuit 210 provided in the vicinity of the surface of the semiconductor layer 200S. FIG. 43 schematically illustrates a configuration of each part of the wiring layer 200T (specifically, a first wiring layer W1 to be described later), the semiconductor layer 200S connected to the wiring layer 200T, and the first substrate 100.

Figure 44:
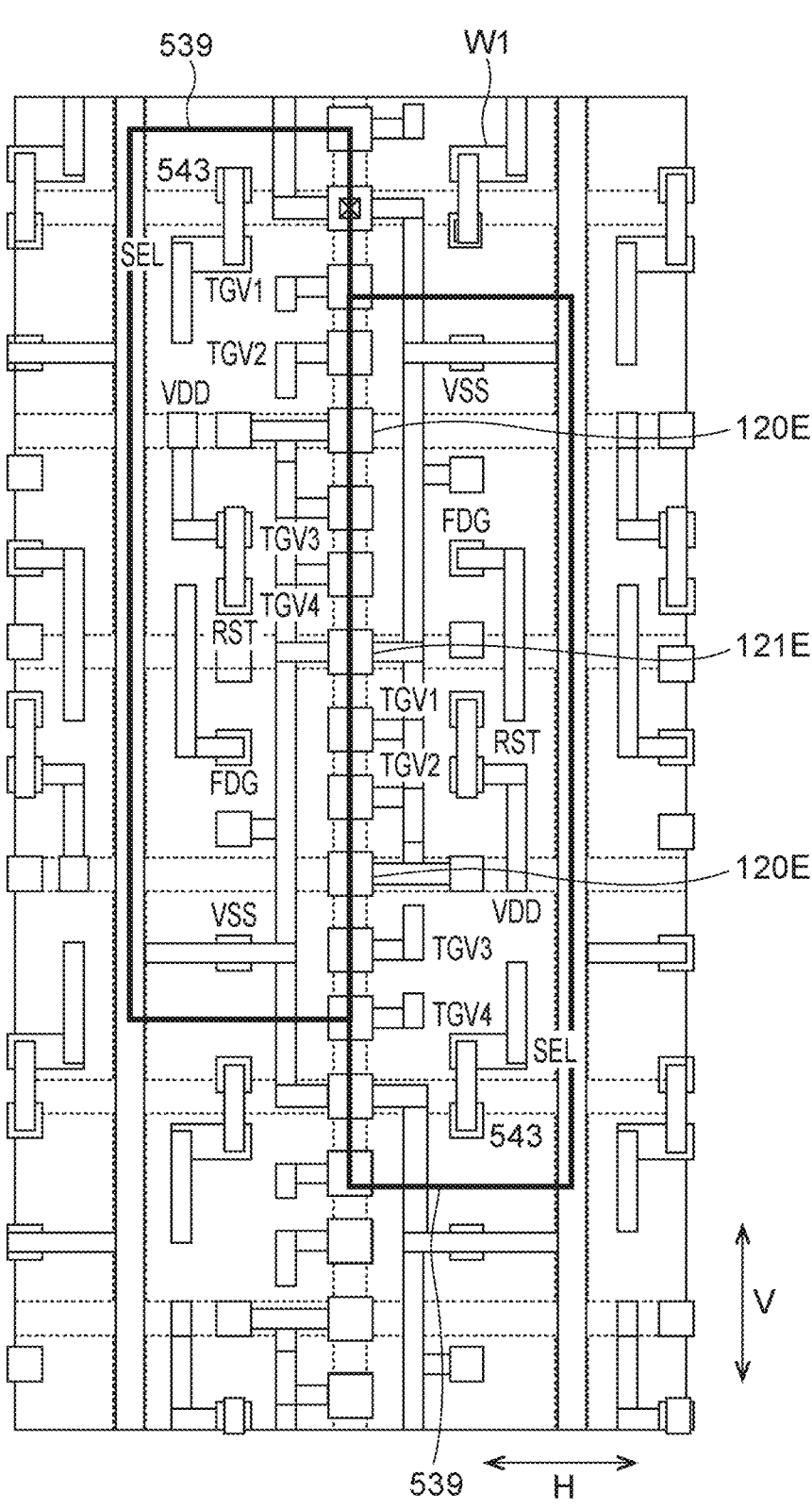
FIG. 44 is a schematic diagram illustrating an example of a planar configuration of a first wiring layer and a second wiring layer illustrated in FIG. 40.
Figure 45:
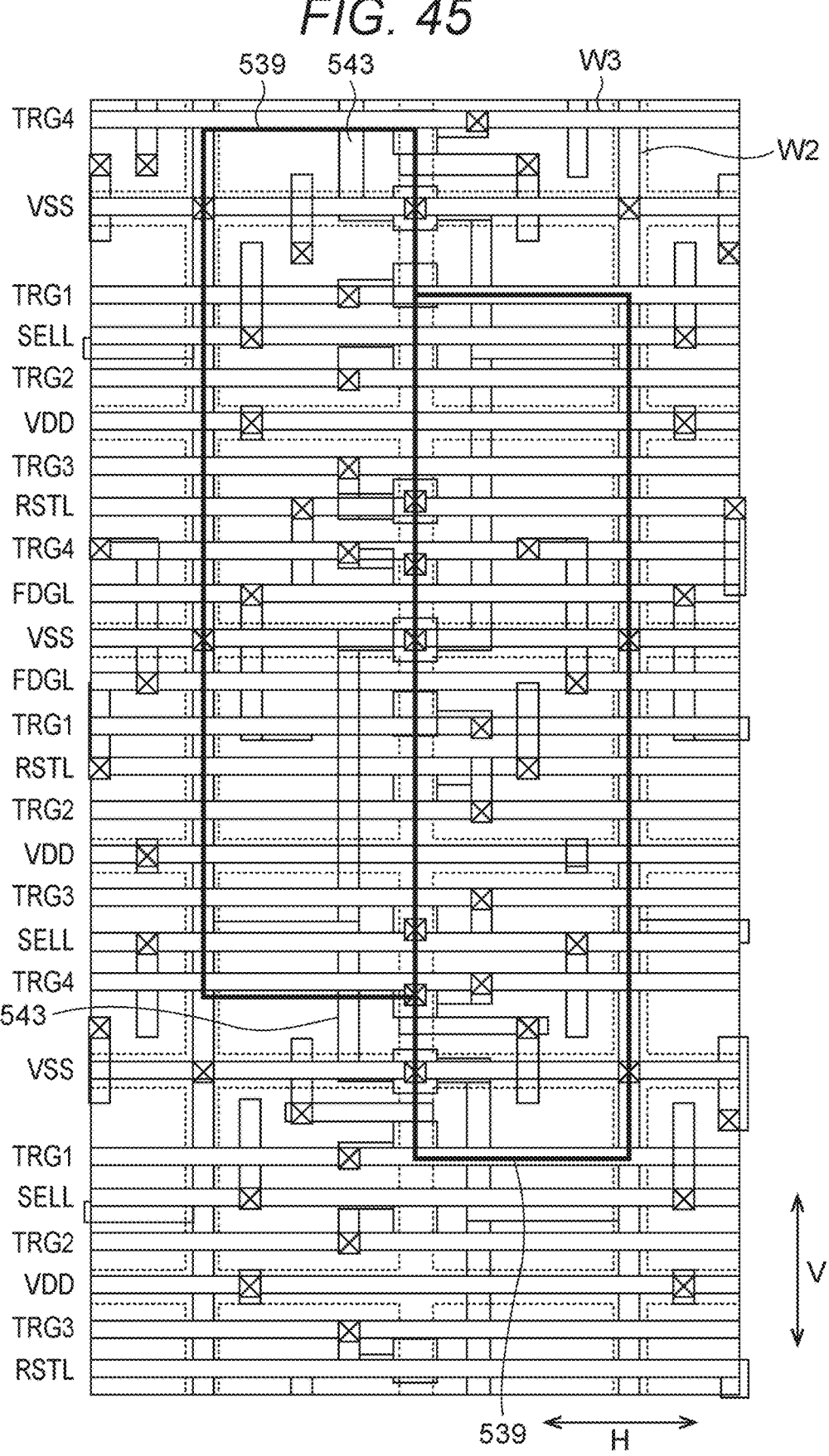
FIG. 45 is a schematic diagram illustrating an example of a planar configuration of a second wiring layer and a third wiring layer illustrated in FIG. 40.
Figure 46:
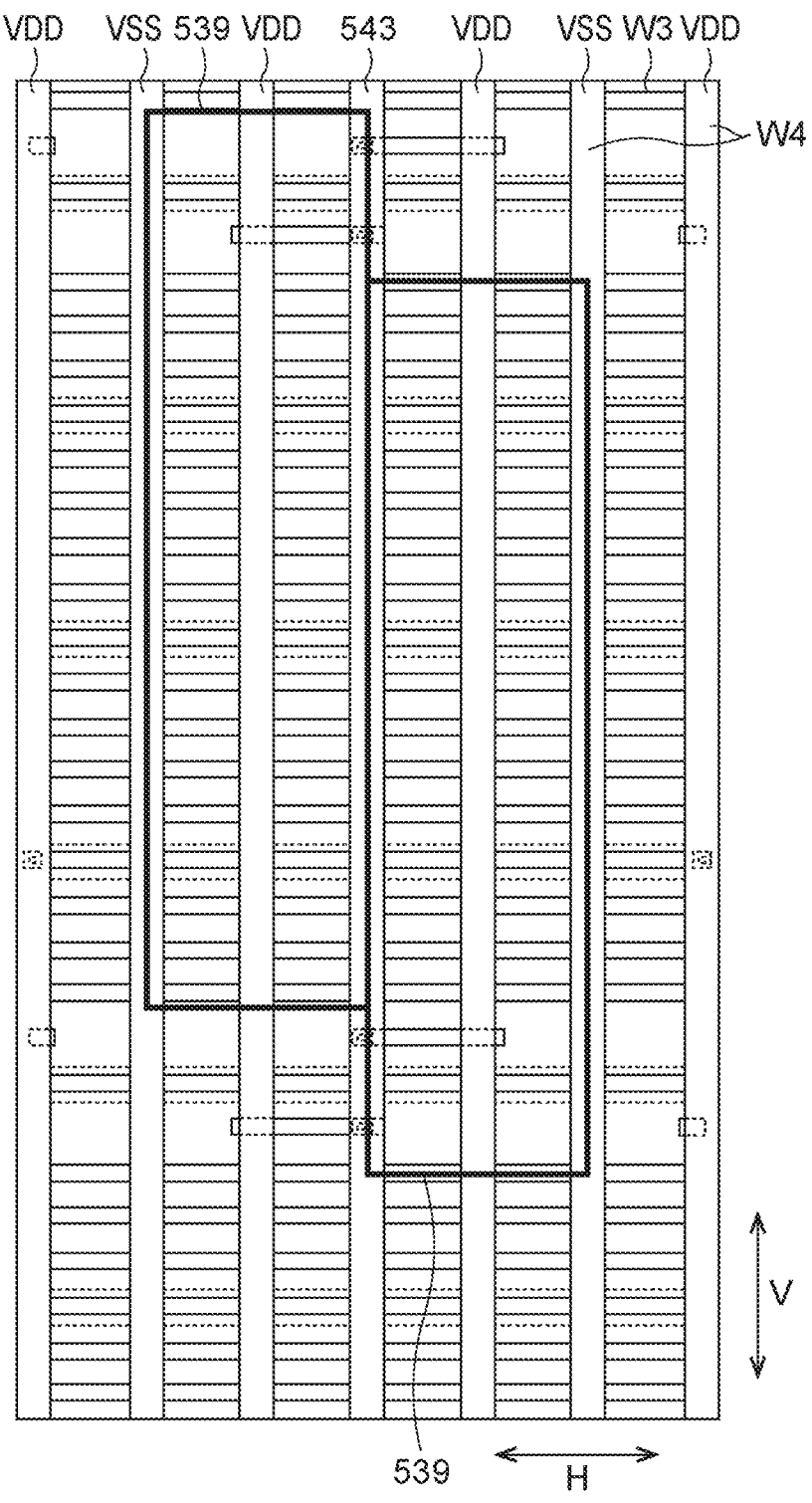
FIG. 46 is a schematic diagram illustrating an example of a planar configuration of a third wiring layer and a fourth wiring layer illustrated in FIG. 40.

FIGS. 44 to 46 illustrate an example of a planar configuration of the wiring layer 200T. Hereinafter, the configuration of the second substrate 200 will be described with reference to FIGS. 42 to 46 together with FIG. 40. In FIGS. 42 and 43, the outer shape of the photodiode PD (the boundary between the pixel isolation portion 117 and the photodiode PD) is indicated by a broken line, and the boundary between the semiconductor layer 200S and an element isolation region 213 or an insulating region 214 in a portion overlapping the gate electrode of each transistor constituting the pixel circuit 210 is indicated by a dotted line. In a portion overlapping the gate electrode of the amplification transistor AMP, a boundary between the semiconductor layer 200S and the element isolation region 213 and a boundary between the element isolation region 213 and the insulating region 213 are provided on one side in the channel width direction.

The second substrate 200 is provided with the insulating region 212 that divides the semiconductor layer 200S and the element isolation region 213 provided in a part of the semiconductor layer 200S in the thickness direction (FIG. 40). For example, the through electrodes 120E and 121E and the through electrodes TGV (through electrodes TGV1, TGV2, TGV3, and TGV4) of the two pixel sharing units 539 connected to the two pixel circuits 210 are arranged in the insulating region 212 provided between the two pixel circuits 210 adjacent in the H direction (FIG. 43).

The insulating region 212 has substantially the same thickness as the thickness of the semiconductor layer 200S (FIG. 40). The semiconductor layer 200S is divided by the insulating region 212. The through electrodes 120E and 121E and the through electrode TGV are disposed in the insulating region 212. The insulating region 212 is constituted by, for example, silicon oxide.

The through electrodes 120E and 121E are provided to penetrate the insulating region 212 in the thickness direction. The upper ends of the through electrodes 120E and 121E are connected to wiring (first wiring W1, second wiring W2, third wiring W3, and fourth wiring W4 to be described later) of the wiring layer 200T. The through electrodes 120E and 121E are provided to penetrate the insulating region 212, the bonding film 124, the interlayer insulating film 123, and the passivation film 122, and the lower end thereof is connected to the pad portions 120 and 121 (FIG. 40). The through electrode 120E is for electrically connecting the pad portion 120 and the pixel circuit 210. That is, the floating diffusion FD of the first substrate 100 is electrically connected to the pixel circuit 210 of the second substrate 200 by the through electrode 120E. The through electrode 121E is for electrically connecting the pad portion 121 and the reference potential line VSS of the wiring layer 200T. That is, the VSS contact region 118 of the first substrate 100 is electrically connected to the reference potential line VSS of the second substrate 200 by the through electrode 121E.

The through electrode TGV is provided to penetrate the insulating region 212 in the thickness direction. The upper end of the through electrode TGV is connected to the wiring of the wiring 200T. The through electrode TGV is provided to penetrate the insulating region 212, the bonding film 124, the interlayer insulating film 123, the passivation film 122, and the interlayer insulating film 119, and the lower end thereof is connected to the transfer gate TG (FIG. 40). Such a through electrode TGV is for electrically connecting the transfer gate TG (transfer gates TG1, TG2, TG3, and TG4) of each of the pixels 541A, 541B, 541C, and 541D to the wiring (a part of the row drive signal line 542, specifically, wiring lines TRG1, TRG2, TRG3, and TRG4 in FIG. 45 to be described later) of the wiring layer 200T. That is, the transfer gate TG of the first substrate 100 is electrically connected to the wiring TRG of the second substrate 200 by the through electrode TGV, and a drive signal is sent to each of the transfer transistors TR (transfer transistors TR1, TR2, TR3, and TR4).

The insulating region 212 is a region for insulating the through electrodes 120E and 121E and the through electrode TGV for electrically connecting the first substrate 100 and the second substrate 200 from the semiconductor layer 200S. For example, the through electrodes 120E and 121E and the through electrode TGV (through electrodes TGV1, TGV2, TGV3, and TGV4) connected to the two pixel circuits 210 are arranged in the insulating region 212 provided between the two pixel circuits 210 (sharing unit 539) adjacent in the H direction. The insulating region 212 is provided, for example, to extend in the V direction (FIG. 42 and FIG. 43). Here, by devising the arrangement of the horizontal portion TGb of the transfer gate TG, the through electrode TGV is arranged such that the position of the through electrode TGV in the H direction approaches the positions of the through electrodes 120E and 121E in the H direction as compared with the position of the vertical portion TGa (FIG. 41A, FIG. 43). For example, the through electrode TGV is disposed at substantially the same position as the through electrodes 120E and 120E in the H direction. As a result, the through electrodes 120E and 121E and the through electrode TGV can be collectively provided in the insulating region 212 extending in the V direction. As another arrangement example, it is also conceivable to provide the horizontal portion TGb only in a region overlapping the vertical portion TGa. In this case, the through electrode TGV is formed substantially immediately above the vertical portion TGa, and for example, the through electrode TGV is disposed substantially at the central portion in the H direction and the V direction of each pixel 541. At this time, the position of the through electrode TGV in the H direction greatly deviates from the positions of the through electrodes 120E and 121E in the H direction. For example, the insulating region 212 is provided around the through electrode TGV and the through electrodes 120E and 121E in order to electrically insulate them from the adjacent semiconductor layer 200S. In a case where the position of the through electrode TGV in the H direction and the positions of the through electrodes 120E and 121E in the H direction are greatly separated from each other, it is necessary to provide the insulating region 212 independently around each of the through electrodes 120E, 121E, and TGV. As a result, the semiconductor layer 200S is finely divided. In comparison, the layout in which the through electrodes 120E and 121E and the through electrode TGV are collectively arranged in the insulating region 212 extending in the V direction can increase the size of the semiconductor layer 200S in the H direction. Therefore, a large area of the semiconductor element formation region in the semiconductor layer 200S can be secured. As a result, for example, the size of the amplification transistor AMP can be increased, and noise can be suppressed.

As described with reference to FIG. 38, the pixel sharing unit 539 has a structure in which the floating diffusion FD provided in each of the plurality of pixels 541 is electrically connected, and the plurality of pixels 541 shares one pixel circuit 210. Then, the floating diffusion FD is electrically connected to each other by the pad portion 120 provided on the first substrate 100 (FIG. 40 and FIG. 41B). The electrical connection portion (pad portion 120) provided on the first substrate 100 and the pixel circuit 210 provided on the second substrate 200 are electrically connected via one through electrode 120E. As another structural example, it is also conceivable to provide an electrical connection portion between the floating diffusions FD on the second substrate 200. In this case, the pixel sharing unit 539 is provided with four through electrodes connected to the floating diffusions FD1, FD2, FD3, and FD4, respectively. Therefore, in the second substrate 200, the number of through electrodes penetrating the semiconductor layer 200S increases, and the insulating region 212 that insulates the periphery of these through electrodes increases. In comparison, in the structure in which the pad portion 120 is provided on the first substrate 100 (FIG. 40 and FIG. 41B), the number of through electrodes can be reduced, and the insulating region 212 can be reduced. Therefore, a large area of the semiconductor element formation region in the semiconductor layer 200S can be secured. As a result, for example, the size of the amplification transistor AMP can be increased, and noise can be suppressed.

The element isolation region 213 is provided on the front surface side of the semiconductor layer 200S. The element isolation region 213 has a shallow trench isolation (STI) structure. In the element isolation region 213, the semiconductor layer 200S is dug in the thickness direction (the direction perpendicular to the main surface of the second substrate 200), and an insulating film is embedded in the dug. This insulating film is constituted by, for example, silicon oxide. The element isolation region 213 isolates the plurality of transistors constituting the pixel circuit 210 from each other in accordance with the layout of the pixel circuit 210. The semiconductor layer 200S (specifically, well region 211) extends below the element isolation region 213 (deep portion of the semiconductor layer 2003).

Here, a difference between the outer shape (outer shape in the substrate planar direction) of the pixel sharing unit 539 on the first substrate 100 and the outer shape of the pixel sharing unit 539 on the second substrate 200 will be described with reference to FIGS. 41A, 41B, and 42.

In the imaging apparatus 1, the pixel sharing unit 539 is provided over both the first substrate 100 and the second substrate 200. For example, the outer shape of the pixel sharing unit 539 provided on the first substrate 100 is different from the outer shape of the pixel sharing unit 539 provided on the second substrate 200.

In FIGS. 41A and 41B, the outline of the pixels 541A, 541B, 541C, and 541D is indicated by a one-dot chain line, and the outer shape of the pixel sharing unit 539 is indicated by a thick line. For example, the pixel sharing unit 539 of the first substrate 100 includes two pixels 541 (pixels 541A and 541B) arranged adjacent to each other in the H direction and two pixels 541 (pixels 541C and 541D) arranged adjacent to each other in the V direction. That is, the pixel sharing unit 539 of the first substrate 100 includes four pixels 541 in adjacent two rows×two columns, and the pixel sharing unit 539 of the first substrate 100 has a substantially square outer shape. In the pixel array section 540, such pixel sharing units 539 are arranged adjacent to each other at a two-pixel pitch (a pitch corresponding to two pixels 541) in the H direction and a two-pixel pitch (a pitch corresponding to two pixels 541) in the V direction.

In FIGS. 42 and 43, the outline of the pixels 541A, 541B, 541C, and 541D is indicated by a one-dot chain line, and the outer shape of the pixel sharing unit 539 is indicated by a thick line. For example, the outer shape of the pixel sharing unit 539 of the second substrate 200 is smaller than the pixel sharing unit 539 of the first substrate 100 in the H direction and larger than the pixel sharing unit 539 of the first substrate 100 in the V direction. For example, the pixel sharing unit 539 of the second substrate 200 is formed in a size (region) corresponding to one pixel in the H direction, and is formed in a size corresponding to four pixels in the V direction. That is, the pixel sharing unit 539 of the second substrate 200 is formed in a size corresponding to the pixels arranged in adjacent one row×four columns, and the pixel sharing unit 539 of the second substrate 200 has a substantially rectangular outer shape.

For example, in each pixel circuit 210, the selection transistor SEL, the amplification transistor AMP, the reset transistor RST, and the FD conversion gain switching transistor FDG are arranged in this order in the V direction (FIG. 42). By providing the outer shape of each pixel circuit 210 in a substantially rectangular shape as described above, four transistors (selection transistor SEL, amplification transistor AMP, reset transistor RST, and FD conversion gain switching transistor FDG) can be arranged side by side in one direction (V direction in FIG. 42). As a result, the drain of the amplification transistor AMP and the drain of the reset transistor RST can be shared by one diffusion region (diffusion region connected to the power supply line VDD). For example, the formation region of each pixel circuit 210 can be provided in a substantially square shape (see FIG. 55 described later). In this case, two transistors are arranged along one direction, and it is difficult to share the drain of the amplification transistor AMP and the drain of the reset transistor RST in one diffusion region. Therefore, by providing the formation region of the pixel circuit 210 in a substantially rectangular shape, the four transistors can be easily arranged close to each other, and the formation region of the pixel circuit 210 can be reduced. That is, the pixels can be miniaturized. Furthermore, when it is unnecessary to reduce the formation region of the pixel circuit 210, the formation region of the amplification transistor AMP can be increased to suppress noise.

For example, in the vicinity of the surface of the semiconductor layer 200S, a VSS contact region 218 connected to the reference potential line VSS is provided in addition to the selection transistor SEL, the amplification transistor AMP, the reset transistor RST, and the FD conversion gain switching transistor FDG. The VSS contact region 218 includes, for example, a p-type semiconductor region. The VSS contact region 218 is electrically connected to the VSS contact region 118 of the first substrate 100 (semiconductor layer 1003) via the wiring of the wiring layer 200T and the through electrode 121E. The VSS contact region 218 is provided, for example, at a position adjacent to the source of the FD conversion gain switching transistor FDG with the element isolation region 213 interposed therebetween (FIG. 42).

Next, a positional relationship between the pixel sharing unit 539 provided on the first substrate 100 and the pixel sharing unit 539 provided on the second substrate 200 will be described with reference to FIGS. 41B and 42. For example, one (for example, the upper side on the paper surface of FIG. 41B) pixel sharing unit 539 of the two pixel sharing units 539 arranged in the V direction on the first substrate 100 is connected to one (for example, the left side on the paper surface of FIG. 42) pixel sharing unit 539 of the two pixel sharing units 539 arranged in the H direction on the second substrate 200. For example, the other (for example, the lower side on the paper surface of FIG. 41B) pixel sharing unit 539 of the two pixel sharing units 539 arranged in the V direction on the first substrate 100 is connected to the other (for example, the right side on the paper surface of FIG. 42) pixel sharing unit 539 of the two pixel sharing units 539 arranged in the H direction on the second substrate 200.

For example, in the two pixel sharing units 539 arranged in the H direction of the second substrate 200, the internal layout (arrangement of transistors and the like) of one pixel sharing unit 539 is substantially equal to the layout obtained by inverting the internal layout of the other pixel sharing unit 539 in the V direction and the H direction. Hereinafter, effects obtained by this layout will be described.

In the two pixel sharing units 539 arranged in the V direction of the first substrate 100, each pad portion 120 is arranged at the central portion of the outer shape of the pixel sharing unit 539, that is, at the central portions in the V direction and the H direction of the pixel sharing unit 539 (FIG. 41B). On the other hand, since the pixel sharing unit 539 of the second substrate 200 has a substantially rectangular outer shape long in the V direction as described above, for example, the amplification transistor AMP connected to the pad portion 120 is arranged at a position shifted upward on the paper surface from the center of the pixel sharing unit 539 in the V direction. For example, when the internal layouts of the two pixel sharing units 539 arranged in the H direction of the second substrate 200 are the same, the distance between the amplification transistor AMP of one pixel sharing unit 539 and the pad portion 120 (for example, the pad portion 120 of the pixel sharing unit 539 on the upper side on the paper surface of FIG. 41) becomes relatively short. However, the distance between the amplification transistor AMP of the other pixel sharing unit 539 and the pad portion 120 (for example, the pad portion 120 of the pixel sharing unit 539 on the lower side on the paper surface of FIG. 41) becomes long. For this reason, the area of the wiring required for connecting the amplification transistor AMP and the pad portion 120 increases, and the wiring layout of the pixel sharing unit 539 may become complicated. This may affect miniaturization of the imaging apparatus 1.

On the other hand, by inverting the internal layout of the two pixel sharing units 539 arranged in the H direction of the second substrate 200 at least in the V direction, the distance between the amplification transistor AMP and the pad portion 120 of both of the two pixel sharing units 539 can be shortened. Therefore, it is easy to miniaturize the imaging apparatus 1 as compared with a configuration in which the internal layouts of the two pixel sharing units 539 arranged in the H direction of the second substrate 200 are the same. Note that the planar layout of each of the plurality of pixel sharing units 539 of the second substrate 200 is bilaterally symmetrical in the range illustrated in FIG. 42, but is bilaterally asymmetrical when including the layout of the first wiring layer W1 described later in FIG. 43.

Furthermore, it is preferable that the internal layouts of the two pixel sharing units 539 arranged in the H direction of the second substrate 200 are also inverted in the H direction. Hereinafter, the reason will be described. As illustrated in FIG. 43, each of the two pixel sharing units 539 arranged in the H direction on the second substrate 200 is connected to the pad portions 120 and 121 of the first substrate 100. For example, the pad portions 120 and 121 are arranged at the central portion in the H direction (between the two pixel sharing units 539 arranged in the H direction) of the two pixel sharing units 539 arranged in the H direction on the second substrate 200. Therefore, it is possible to reduce the distance between each of the plurality of pixel sharing units 539 of the second substrate 200 and the pad portions 120 and 121 by inverting the internal layouts of the two pixel sharing units 539 arranged in the H direction of the second substrate 200 in the H direction. That is, it is easier to miniaturize the imaging apparatus 1.

Furthermore, the position of the outline of the pixel sharing unit 539 of the second substrate 200 may not be aligned with the position of any outline of the pixel sharing unit 539 of the first substrate 100. For example, in one (for example, the left side of the paper surface of FIG. 43) pixel sharing unit 539 of the two pixel sharing units 539 arranged in the H direction on the second substrate 200, the outline of one (for example, the upper side on the paper surface of FIG. 43) in the V direction is arranged outside the outline of one in the V direction of the pixel sharing unit 539 (for example, the upper side on the paper surface of FIG. 41B) of the corresponding first substrate 100. Furthermore, in the other (for example, the right side on the paper surface of FIG. 42) pixel sharing unit 539 of the two pixel sharing units 539 arranged in the H direction on the second substrate 200, the outline of the other (for example, the lower side on the paper surface of FIG. 43) in the V direction is arranged outside the outline of the other in the V direction of the pixel sharing unit 539 (for example, the lower side on the paper surface of FIG. 41B) of the corresponding first substrate 100. As described above, by arranging the pixel sharing unit 539 of the second substrate 200 and the pixel sharing unit 539 of the first substrate 100 to each other, the distance between the amplification transistor AMP and the pad portion 120 can be shortened. Therefore, it is easy to miniaturize the imaging apparatus 1.

Furthermore, the positions of the outlines of the plurality of pixel sharing units 539 of the second substrate 200 may not be aligned. For example, the two pixel sharing units 539 arranged in the H direction of the second substrate 200 are arranged such that the positions of the outlines in the V direction are shifted. As a result, the distance between the amplification transistor AMP and the pad portion 120 can be shortened. Therefore, it is easy to miniaturize the imaging apparatus 1.

The repetitive arrangement of the pixel sharing units 539 in the pixel array section 540 will be described with reference to FIGS. 41B and 43. The pixel sharing unit 539 of the first substrate 100 has the sizes of two pixels 541 in the H direction and the sizes of two pixels 541 in the V direction (FIG. 41B). For example, in the pixel array section 540 of the first substrate 100, the pixel sharing units 539 having sizes corresponding to the four pixels 541 are repeatedly arranged adjacent to each other at a pitch of two pixels in the H direction (a pitch corresponding to two pixels 541) and at a pitch of two pixels in the V direction (a pitch corresponding to two pixels 541). Alternatively, the pixel array section 540 of the first substrate 100 may be provided with a pair of pixel sharing units 539 in which two pixel sharing units 539 are arranged adjacent to each other in the V direction. In the pixel array section 540 of the first substrate 100, for example, the pair of pixel sharing units 539 is repeatedly arranged adjacent to each other at a pitch of two pixels in the H direction (a pitch corresponding to two pixels 541) and at a pitch of four pixels in the V direction (a pitch corresponding to four pixels 541). The pixel sharing unit 539 of the second substrate 200 has the size of one pixel 541 in the H direction and the size of four pixels 541 in the V direction (FIG. 43). For example, the pixel array section 540 of the second substrate 200 is provided with a pair of pixel sharing units 539 including two pixel sharing units 539 having a size corresponding to the four pixels 541. The pixel sharing units 539 are arranged adjacent to each other in the H direction and are arranged to be shifted in the V direction. In the pixel array section 540 of the second substrate 200, for example, the pair of pixel sharing units 539 is repeatedly arrayed adjacent to each other without a gap at a pitch of two pixels in the H direction (a pitch corresponding to two pixels 541) and at a pitch of four pixels in the V direction (a pitch corresponding to four pixels 541). Such repetitive arrangement of the pixel sharing units 539 enables the pixel sharing units 539 to be arranged without any gap. Therefore, it is easy to miniaturize the imaging apparatus 1.

The amplification transistor AMP preferably has, for example, a three-dimensional structure such as a Fin type (FIG. 40). As a result, the size of the effective gate width increases, and noise can be suppressed. The selection transistor SEL, the reset transistor RST, and the FD conversion gain switching transistor FDG have, for example, a planar structure. The amplification transistor AMP may have a planar structure. Alternatively, the selection transistor SEL, the reset transistor RST, or the FD conversion gain switching transistor FDG may have a three-dimensional structure.

The wiring layer 200T includes, for example, a passivation film 221, an interlayer insulating film 222, and a plurality of wirings (first wiring layer W1, second wiring layer W2, third wiring layer W3, and fourth wiring layer W4). The passivation film 221 is, for example, in contact with the surface of the semiconductor layer 200S and covers the entire surface of the semiconductor layer 2003. The passivation film 221 covers the gate electrodes of the selection transistor SEL, the amplification transistor AMP, the reset transistor RST, and the FD conversion gain switching transistor FDG. The interlayer insulating film 222 is provided between the passivation film 221 and the third substrate 300. A plurality of wirings (first wiring layer W1, second wiring layer W2, third wiring layer W3, and fourth wiring layer W4) is separated by the interlayer insulating film 222. The interlayer insulating film 222 is constituted by, for example, silicon oxide.

In the wiring layer 200T, for example, a first wiring layer W1, a second wiring layer W2, a third wiring layer W3, a fourth wiring layer W4, and contact portions 201 and 202 are provided in this order from the semiconductor layer 200S side, and these layers are insulated from each other by an interlayer insulating film 222. The interlayer insulating film 222 is provided with a plurality of connection portions that connect the first wiring layer W1, the second wiring layer W2, the third wiring layer W3 or the fourth wiring layer W4 and lower layers thereof. The connection portion is a portion in which a conductive material is embedded in a connection hole provided in the interlayer insulating film 222. For example, the interlayer insulating film 222 is provided with a connection portion 218V that connects the first wiring layer W1 and the VSS contact region 218 of the semiconductor layer 200S. For example, the hole diameter of the connection portion connecting the elements of such a second substrate 200 is different from the hole diameters of the through electrodes 120E and 121E and the through electrode TGV. Specifically, the hole diameter of the connection hole connecting the elements of the second substrate 200 is preferably smaller than the hole diameters of the through electrodes 120E and 121E and the through electrode TGV. Hereinafter, the reason will be described. The depth of the connection portion (the connection portion 218V or the like) provided in the wiring layer 200T is smaller than the depths of the through electrodes 120E and 121E and the through electrode TGV. Therefore, the connection portion can easily fill the conductive material in the connection hole as compared with the through electrodes 120E and 121E and the through electrode TGV. By making the hole diameter of the connection portion smaller than the hole diameters of the through electrodes 120E and 121E and the through electrode TGV, it is easy to miniaturize the imaging apparatus 1.

For example, the through electrode 120E is connected to the gate of the amplification transistor AMP and the source of the FD conversion gain switching transistor FDG (specifically, a connection hole reaching the source of the FD conversion gain switching transistor FDG) by the first wiring layer W1. The first wiring layer W1 connects, for example, the through electrode 121E and the connection portion 218V, whereby the VSS contact region 218 of the semiconductor layer 200S and the VSS contact region 118 of the semiconductor layer 100S are electrically connected.

Next, a planar configuration of the wiring layer 200T will be described with reference to FIGS. 44 to 46. FIG. 44 illustrates an example of a planar configuration of the first wiring layer W1 and the second wiring layer W2. FIG. 45 illustrates an example of a planar configuration of the second wiring layer W2 and the third wiring layer W3. FIG. 46 illustrates an example of a planar configuration of the third wiring layer W3 and the fourth wiring layer W4.

For example, the third wiring layer W3 includes wiring lines TRG1, TRG2, TRG3, TRG4, SELL, RSTL, and FDGL extending in the H direction (row direction) (FIG. 45). These wirings correspond to the plurality of row drive signal lines 542 described with reference to FIG. 38. The wiring lines TRG1, TRG2, TRG3, and TRG4 are for sending drive signals to the transfer gates TG1, TG2, TG3, and TG4, respectively. The wiring lines TRG1, TRG2, TRG3, and TRG4 are connected to the transfer gates TG1, TG2, TG3, and TG4 via the second wiring layer W2, the first wiring layer W1, and the through electrode 120E, respectively. The wiring SELL is for sending a drive signal to the gate of the selection transistor SEL, the wiring RSTL is for sending a drive signal to the gate of the reset transistor RST, and the wiring FDGL is for sending a drive signal to the gate of the FD conversion gain switching transistor FDG. The wirings SELL, RSTL, and FDGL are connected to the gates of the selection transistor SEL, the reset transistor RST, and the FD conversion gain switching transistor FDG via the second wiring layer W2, the first wiring layer W1, and the connection portion, respectively.

For example, the fourth wiring layer W4 includes a power supply line VDD, a reference potential line VSS, and a vertical signal line 543 extending in the V direction (column direction) (FIG. 46). The power supply line VDD is connected to the drain of the amplification transistor AMP and the drain of the reset transistor RST via the third wiring layer W3, the second wiring layer W2, the first wiring layer W1, and the connection portion. The reference potential line VSS is connected to the VSS contact region 218 via the third wiring layer W3, the second wiring layer W2, the first wiring layer W1, and the connection portion 218V. In addition, the reference potential line VSS is connected to the VSS contact region 118 of the first substrate 100 via the third wiring layer W3, the second wiring layer W2, the first wiring layer W1, the through electrode 121E, and the pad portion 121. The vertical signal line 543 is connected to the source (Vout) of the selection transistor SEL via the third wiring layer W3, the second wiring layer W2, the first wiring layer W1, and the connection portion.

The contact portions 201 and 202 may be provided at a position overlapping the pixel array section 540 in plan view (for example, FIG. 3), or may be provided in the peripheral portion 540B outside the pixel array section 540 (for example, FIG. 40). The contact portions 201 and 202 are provided on the surface (surface on the wiring layer 200T side) of the second substrate 200. The contact portions 201 and 202 are constituted by metal such as copper (Cu) and aluminum (Al), for example. The contact portions 201 and 202 are exposed on the surface (surface on the third substrate 300 side) of the wiring layer 200T. The contact portions 201 and 202 are used for electrical connection between the second substrate 200 and the third substrate 300 and bonding between the second substrate 200 and the third substrate 300.

FIG. 40 illustrates an example in which a peripheral circuit is provided in the peripheral portion 540B of the second substrate 200. The peripheral circuit may include a part of the row drive section 520, a part of the column signal processing section 550, or the like. Furthermore, as illustrated in FIG. 3, the peripheral circuit may not be arranged in the peripheral portion 540B of the second substrate 200, and the connection holes H1 and H2 may be arranged in the vicinity of the pixel array section 540.

The third substrate 300 includes, for example, a wiring layer 300T and a semiconductor layer 300S in this order from the second substrate 200 side. For example, the surface of the semiconductor layer 300S is provided on the second substrate 200 side. The semiconductor layer 300S is constituted by a silicon substrate. A circuit is provided in a portion on the front surface side of the semiconductor layer 300S. Specifically, for example, at least a part of the input section 510A, the row drive section 520, the timing control section 530, the column signal processing section 550, the image signal processing section 560, and the output section 510B is provided in the portion on the front surface side of the semiconductor layer 300S. The wiring layer 300T provided between the semiconductor layer 300S and the second substrate 200 includes, for example, an interlayer insulating film, a plurality of wiring layers separated by the interlayer insulating film, and contact portions 301 and 302. The contact portions 301 and 302 are exposed on the surface (the surface on the second substrate 200 side) of the wiring layer 300T, the contact portion 301 is in contact with the contact portion 201 of the second substrate 200, and the contact portion 302 is in contact with the contact portion 202 of the second substrate 200. The contact portions 301 and 302 are electrically connected to a circuit (for example, at least one of the input section 510A, the row drive section 520, the timing control section 530, the column signal processing section 550, the image signal processing section 560, or the output section 510B) formed in the semiconductor layer 300S. The contact portions 301 and 302 are constituted by metal such as copper (Cu) and aluminum (Al), for example. For example, the external terminal TA is connected to the input section 510A via the connection hole H1, and the external terminal TB is connected to the output section 510B via the connection hole H2.

Here, features of the imaging apparatus 1 will be described.

In general, an imaging apparatus mainly includes a photodiode and a pixel circuit. Here, when the area of the photodiode is increased, the charge generated as a result of photoelectric conversion increases, and as a result, the signal/noise ratio (S/N ratio) of the pixel signal is improved, and the imaging apparatus can output better image data (image information). On the other hand, when the size of the transistor (particularly, the size of the amplification transistor) included in the pixel circuit is increased, noise generated in the pixel circuit is reduced, and as a result, the S/N ratio of the imaging signal is improved, and the imaging apparatus can output better image data (image information).

However, in an imaging apparatus in which a photodiode and a pixel circuit are provided on the same semiconductor substrate, if the area of the photodiode is increased in a limited area of the semiconductor substrate, the size of a transistor included in the pixel circuit may be reduced. Furthermore, if the size of the transistor included in the pixel circuit is increased, the area of the photodiode may be reduced.

In order to solve these problems, for example, the imaging apparatus 1 of the present embodiment uses a structure in which a plurality of pixels 541 shares one pixel circuit 210, and the shared pixel circuit 210 is arranged to be superimposed on the photodiode PD. As a result, it is possible to realize making the area of the photodiode PD as large as possible and making the size of the transistor included in the pixel circuit 210 as large as possible within the limited area of the semiconductor substrate. As a result, the S/N ratio of the pixel signal can be improved, and the imaging apparatus 1 can output better image data (image information).

When a structure in which the plurality of pixels 541 shares one pixel circuit 210 and the pixel circuit is superimposed and arranged on the photodiode PD is realized, a plurality of wirings connected to one pixel circuit 210 extends from the floating diffusion FD of each of the plurality of pixels 541. In order to secure a large area of the semiconductor substrate 200 forming the pixel circuit 210, for example, a connection wiring can be formed in which a plurality of extending wirings is connected to each other and integrated into one. Similarly, for the plurality of wirings extending from the VSS contact region 118, it is possible to form a connection wiring in which the plurality of extending wirings is connected to each other and integrated into one.

For example, when a connection wiring that mutually connects a plurality of wirings extending from the floating diffusion FD of each of the plurality of pixels 541 is formed in the semiconductor substrate 200 forming the pixel circuit 210, it is conceivable that an area for forming a transistor included in the pixel circuit 210 is reduced. Similarly, when a connection wiring that interconnects a plurality of wirings extending from the VSS contact region 118 of each of the plurality of pixels 541 and combines the plurality of wirings into one is formed on the semiconductor substrate 200 forming the pixel circuit 210, it is conceivable that an area for forming a transistor included in the pixel circuit 210 is reduced.

In order to solve these problems, for example, the imaging apparatus 1 of the present embodiment can have a structure in which a plurality of pixels 541 shares one pixel circuit 210, and the shared pixel circuit 210 is arranged to be superimposed on the photodiode PD, and a structure in which a connection wiring that connects the floating diffusions FD of each of the plurality of pixels 541 to each other and integrates them into one, and a connection wiring that connects the VSS contact regions 118 included in each of the plurality of pixels 541 to each other and integrates them into one are provided on the first substrate 100.

Here, when the above-described second manufacturing method is used as a manufacturing method for providing, on the first substrate 100, the connection wiring that connects the floating diffusions FD of each of the plurality of pixels 541 to each other and integrates them into one and the connection wiring that connects the VSS contact regions 118 of each of the plurality of pixels 541 to each other and integrates them into one, for example, it is possible to manufacture an imaging apparatus with high quality and high performance using an appropriate process according to the configuration of each of the first substrate 100 and the second substrate 200. In addition, the connection wiring of the first substrate 100 and the second substrate 200 can be formed by an easy process. Specifically, in the case of using the second manufacturing method described above, an electrode connected to the floating diffusion FD and an electrode connected to the VSS contact region 118 are provided on the surface of the first substrate 100 and the surface of the second substrate 200, which are the bonding boundary surfaces of the first substrate 100 and the second substrate 200, respectively. Furthermore, it is preferable to enlarge the electrodes formed on the two substrate surfaces so that the electrodes formed on the two substrate surfaces come into contact with each other even if positional deviation occurs between the electrodes provided on the two substrate surfaces when the first substrate 100 and the second substrate 200 are bonded together. In this case, it is conceivable that it becomes difficult to arrange the electrode described above in a limited area of each pixel included in the imaging apparatus 1.

In order to solve the problem that a large electrode is required at the bonding boundary surface between the first substrate 100 and the second substrate 200, for example, the imaging apparatus 1 of the present embodiment can use the first manufacturing method described above as a manufacturing method in which a plurality of pixels 541 shares one pixel circuit 210, and the shared pixel circuit 210 is arranged to be superimposed on the photodiode PD. As a result, it is easy to align the elements formed on the first substrate 100 and the second substrate 200, and a high-quality and high-performance imaging apparatus can be manufactured. Furthermore, a unique structure generated by using this manufacturing method can be provided. That is, the imaging apparatus includes a structure in which the semiconductor layer 100S and the wiring layer 100T of the first substrate 100 and the semiconductor layer 200S and the wiring layer 200T of the second substrate 200 are laminated in this order, in other words, a structure in which the first substrate 100 and the second substrate 200 are laminated in a face-to-back manner, and the through electrodes 120E and 121E that penetrate the semiconductor layer 200S, the wiring layer 100T of the first substrate 100, and reach the surface of the semiconductor layer 100S of the first substrate 100 from the front surface side of the semiconductor layer 200S of the second substrate 200.

In a structure in which the connection wiring that connects the floating diffusions FD of the plurality of pixels 541 to each other and integrates them into one and the connection wiring that connects the VSS contact regions 118 of the plurality of pixels 541 to each other and integrates them into one are provided on the first substrate 100, when this structure and the second substrate 200 are laminated using the first manufacturing method to form the pixel circuit 210 on the second substrate 200, there is a possibility that the influence of the heating treatment required when the active element included in the pixel circuit 210 is formed may reach the above-described connection wiring formed on the first substrate 100.

Therefore, in order to solve the problem that the above-described connection wiring is affected by the heating treatment when the above-described active element is formed, it is desirable that the imaging apparatus 1 of the present embodiment use a conductive material having high heat resistance for the connection wiring that connects the floating diffusions FD of the plurality of pixels 541 to each other and integrates them into one and the connection wiring that connects the VSS contact regions 118 of the plurality of pixels 541 to each other and integrates them into one.

Specifically, as the conductive material having high heat resistance, a material having a melting point higher than that of at least a part of the wiring material included in the wiring layer 200T of the second substrate 200 can be used.

As described above, for example, the imaging apparatus 1 of the present embodiment includes: (1) a structure in which the first substrate 100 and the second substrate 200 are laminated in a face-to-back manner (specifically, a structure in which the semiconductor layer 100S and the wiring layer 100T of the first substrate 100 and the semiconductor layer 200S and the wiring layer 200T of the second substrate 200 are laminated in this order); (2) a structure in which the through electrodes 120E and 121E are provided from the front surface side of the semiconductor layer 200S of the second substrate 200, penetrating the semiconductor layer 200S and the wiring layer 100T of the first substrate 100, and reaching the surface of the semiconductor layer 1003 of the first substrate 100; and (3) a structure in which the connection wiring that connects the floating diffusions FD included in the plurality of pixels 541 to each other and integrates them into one and the connection wiring that connects the VSS contact regions 118 included in the plurality of pixels 541 to each other and integrates them into one are constituted by a conductive material having high heat resistance. Therefore, without providing a large electrode at the interface between the first substrate 100 and the second substrate 200, the first substrate 100 can be provided with the connection wiring that connects the floating diffusions FD included in the plurality of pixels 541 to each other and integrates them into one and the connection wiring that connects the VSS contact regions 118 included in the plurality of pixels 541 to each other and integrates them into one.

[Operation of Imaging Apparatus 1]

Figure 47:
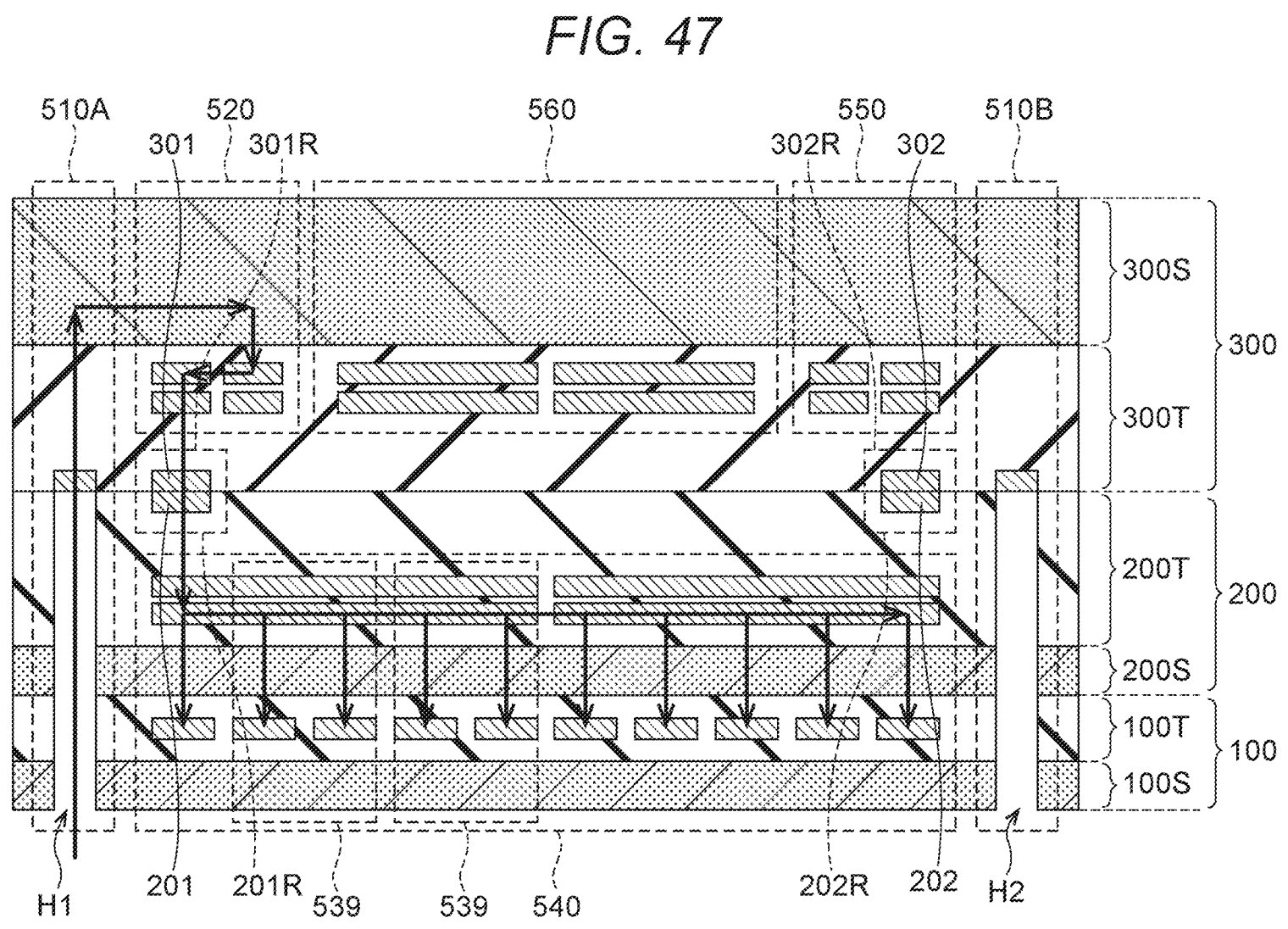
Figure 48:
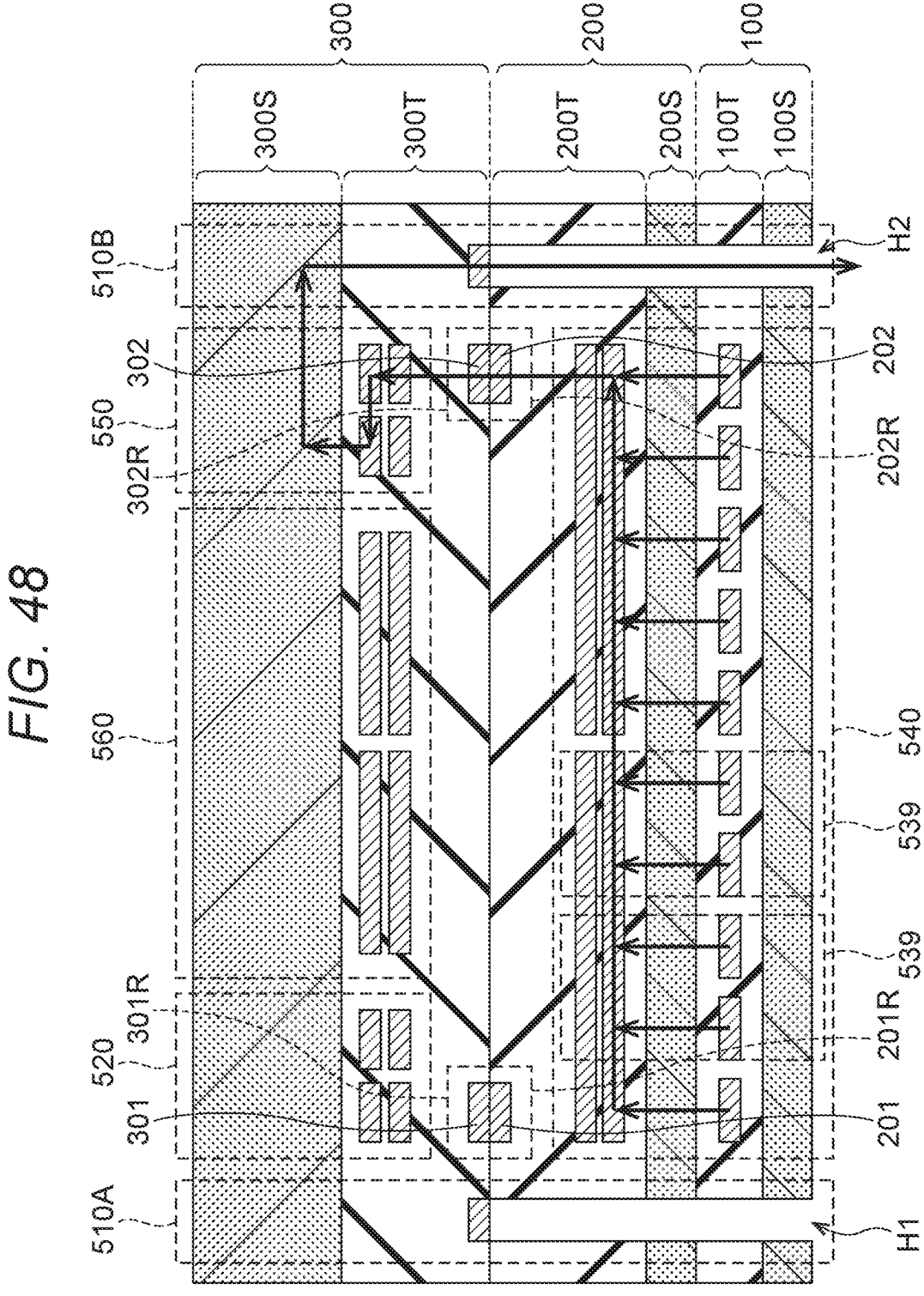
FIG. 48 is a schematic diagram for explaining a signal path of a pixel signal of the imaging apparatus illustrated in FIG. 3.

Next, the operation of the imaging apparatus 1 will be described with reference to FIGS. 47 and 48. In FIGS. 47 and 48, an arrow representing a path of each signal is added to FIG. 3. In FIG. 47, an input signal input to the imaging apparatus 1 from the outside, and paths of a power supply potential and a reference potential are indicated by arrows. In FIG. 48, a signal path of a pixel signal output from the imaging apparatus 1 to the outside is indicated by an arrow. For example, an input signal (for example, a pixel clock and a synchronization signal) input to the imaging apparatus 1 via the input section 510A is transmitted to the row drive section 520 of the third substrate 300, and the row drive section 520 creates a row drive signal. The row drive signal is sent to the second substrate 200 via the contact portions 301 and 201. Further, the row drive signal reaches each of the pixel sharing units 539 of the pixel array section 540 via the row drive signal line 542 in the wiring layer 200T. Among the row drive signals reaching the pixel sharing unit 539 of the second substrate 200, drive signals other than the transfer gate TG are input to the pixel circuit 210, and each transistor included in the pixel circuit 210 is driven. A drive signal of the transfer gate TG is input to the transfer gates TG1, TG2, TG3, and TG4 of the first substrate 100 via the through electrode TGV, and the pixels 541A, 541B, 541C, and 541D are driven (FIG. 47). Furthermore, the power supply potential and the reference potential supplied from the outside of the imaging apparatus 1 to the input section 510A (input terminal 511) of the third substrate 300 are sent to the second substrate 200 via the contact portions 301 and 201, and supplied to the pixel circuit 210 of each of the pixel sharing units 539 via the wiring in the wiring layer 200T. The reference potential is further supplied to the pixels 541A, 541B, 541C, and 541D of the first substrate 100 via the through electrode 121E. On the other hand, the pixel signal photoelectrically converted by the pixels 541A, 541B, 541C, and 541D of the first substrate 100 is sent to the pixel circuit 210 of the second substrate 200 for each pixel sharing unit 539 via the through electrode 120E. The pixel signal based on this pixel signal is sent from the pixel circuit 210 to the third substrate 300 via the vertical signal line 543 and the contact portions 202 and 302. This pixel signal is processed by the column signal processing section 550 and the image signal processing section 560 of the third substrate 300, and then output to the outside via the output section 510B.

[Effects]

In the present embodiment, the pixels 541A, 541B, 541C, and 541D (pixel sharing unit 539) and the pixel circuit 210 are provided on different substrates (first substrate 100 and second substrate 200). As a result, the areas of the pixels 541A, 541B, 541C, and 541D and the pixel circuit 210 can be enlarged as compared with a case where the pixels 541A, 541B, 541C, and 541D and the pixel circuit 210 are formed on the same substrate. As a result, the amount of pixel signals obtained by photoelectric conversion can be increased, and transistor noise of the pixel circuit 210 can be reduced. As a result, the signal/noise ratio of the pixel signal is improved, and the imaging apparatus 1 can output better pixel data (image information). In addition, the imaging apparatus 1 can be miniaturized (in other words, the pixel size is reduced and the imaging apparatus 1 is downsized). The imaging apparatus 1 can increase the number of pixels per unit area by reducing the pixel size, and can output a high-quality image.

Furthermore, in the imaging apparatus 1, the first substrate 100 and the second substrate 200 are electrically connected to each other by the through electrodes 120E and 121E provided in the insulating region 212. For example, a method of connecting the first substrate 100 and the second substrate 200 by bonding pad electrodes to each other, or a method of connecting the first substrate 100 and the second substrate 200 by through wiring (for example, through Si via (TSV)) penetrating the semiconductor layer may be considered. As compared with such a method, by providing the through electrodes 120E and 121E in the insulating region 212, the area required for connecting the first substrate 100 and the second substrate 200 can be reduced. As a result, the pixel size can be reduced, and the imaging apparatus 1 can be further downsized. Furthermore, the resolution can be further increased by further miniaturizing the area per pixel. When it is not necessary to reduce the chip size, the formation region of the pixels 541A, 541B, 541C, and 541D and the pixel circuit 210 can be enlarged. As a result, the amount of pixel signals obtained by photoelectric conversion can be increased, and noise of the transistor included in the pixel circuit 210 can be reduced. As a result, the signal/noise ratio of the pixel signal can be improved, and the imaging apparatus 1 can output better pixel data (image information).

Furthermore, in the imaging apparatus 1, the pixel circuit 210 and the column signal processing section 550 and the image signal processing section 560 are provided on different substrates (the second substrate 200 and the third substrate 300). As a result, the area of the pixel circuit 210 and the areas of the column signal processing section 550 and the image signal processing section 560 can be enlarged as compared with a case where the pixel circuit 210 and the column signal processing section 550 and the image signal processing section 560 are formed on the same substrate. As a result, noise generated in the column signal processing section 550 can be reduced, and an advanced image processing circuit can be mounted by the image signal processing section 560. Therefore, the signal/noise ratio of the pixel signal can be improved, and the imaging apparatus 1 can output better pixel data (image information).

Furthermore, in the imaging apparatus 1, the pixel array section 540 is provided on the first substrate 100 and the second substrate 200, and the column signal processing section 550 and the image signal processing section 560 are provided on the third substrate 300. In addition, the contact portions 201, 202, 301, and 302 connecting the second substrate 200 and the third substrate 300 is formed above the pixel array section 540. Therefore, the contact portions 201, 202, 301, and 302 can be freely laid out without receiving layout interference from various wirings provided in the pixel array. Accordingly, the contact portions 201, 202, 301, and 302 can be used for electrical connection between the second substrate 200 and the third substrate 300. By using the contact portions 201, 202, 301, and 302, for example, the column signal processing section 550 and the image signal processing section 560 have a higher degree of freedom in layout. As a result, noise generated in the column signal processing section 550 can be reduced, and an advanced image processing circuit can be mounted by the image signal processing section 560. Therefore, the signal/noise ratio of the pixel signal can be improved, and the imaging apparatus 1 can output better pixel data (image information).

Furthermore, in the imaging apparatus 1, the pixel isolation portion 117 penetrates the semiconductor layer 100S. As a result, color mixing among the pixels 541A, 541B, 541C, and 541D can be suppressed even in a case where the distance between adjacent pixels (pixels 541A, 541B, 541C, and 541D) is shortened due to miniaturization of the area per pixel. As a result, the signal/noise ratio of the pixel signal can be improved, and the imaging apparatus 1 can output better pixel data (image information).

Furthermore, in the imaging apparatus 1, a pixel circuit 210 is provided for each pixel sharing unit 539. As a result, as compared with a case where the pixel circuit 210 is provided in each of the pixels 541A, 541B, 541C, and 541D, the formation region of the transistor (amplification transistor AMP, reset transistor RST, selection transistor SEL, and FD conversion gain switching transistor FDG) constituting the pixel circuit 210 can be enlarged. For example, noise can be suppressed by increasing the formation region of the amplification transistor AMP. As a result, the signal/noise ratio of the pixel signal can be improved, and the imaging apparatus 1 can output better pixel data (image information).

Furthermore, in the imaging apparatus 1, the pad portion 120 that electrically connects the floating diffusions FD (floating diffusions FD1, FD2, FD3, and FD4) of the four pixels (pixels 541A, 541B, 541C, and 541D) is provided on the first substrate 100. As a result, the number of through electrodes (through electrodes 120E) connecting the first substrate 100 and the second substrate 200 can be reduced as compared with the case where such a pad portion 120 is provided on the second substrate 200. Therefore, the insulating region 212 can be made small, and the transistor formation region (semiconductor layer 200S) constituting the pixel circuit 210 can be secured with a sufficient size. As a result, noise of the transistor included in the pixel circuit 210 can be reduced, the signal/noise ratio of the pixel signal can be improved, and the imaging apparatus 1 can output better pixel data (image information).

Hereinafter, modifications of the imaging apparatus 1 according to the above embodiments will be described. In the following modifications, the same reference signs are given to the same configurations as those of the above embodiments.

1. Modification 1

Figure 49:
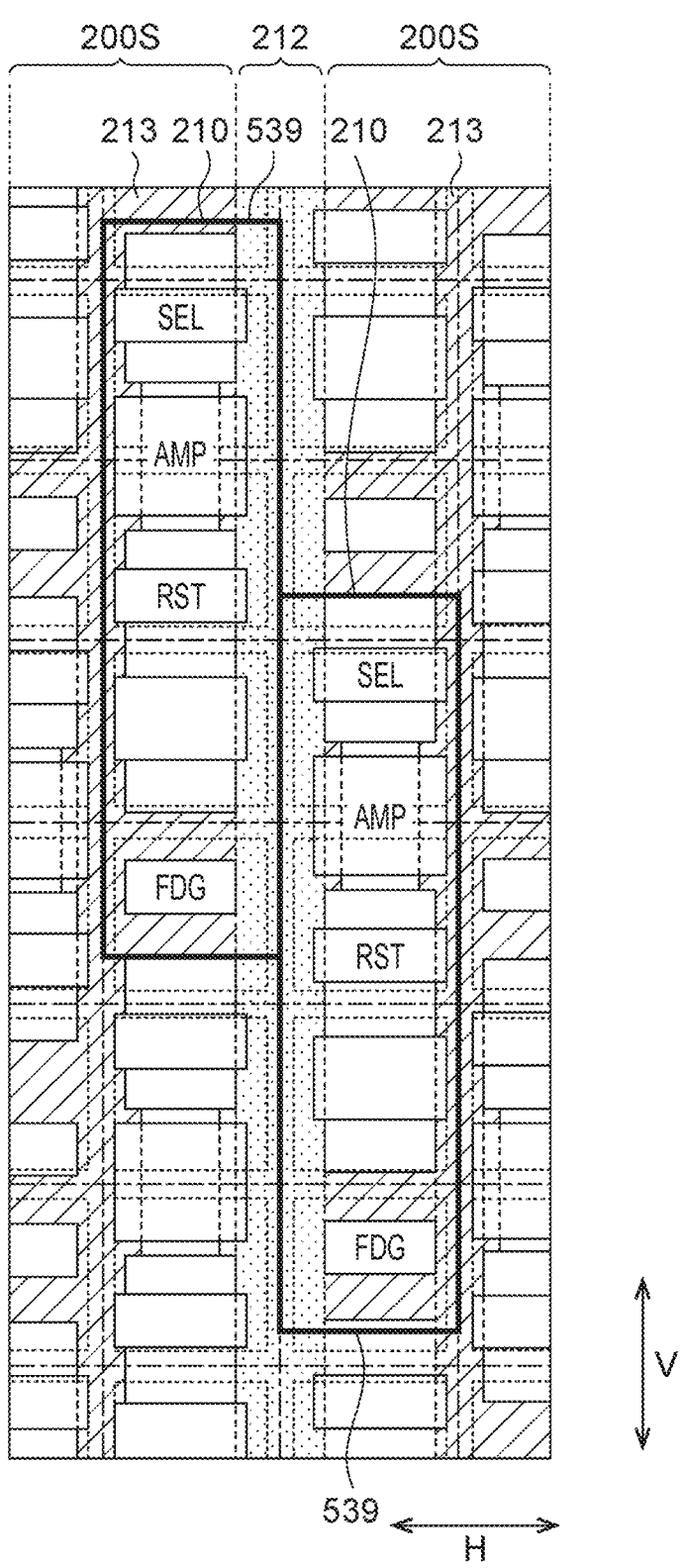
FIG. 49 is a schematic diagram illustrating a modification of the planar configuration of the second substrate (semiconductor layer) illustrated in FIG. 42.
Figure 50:
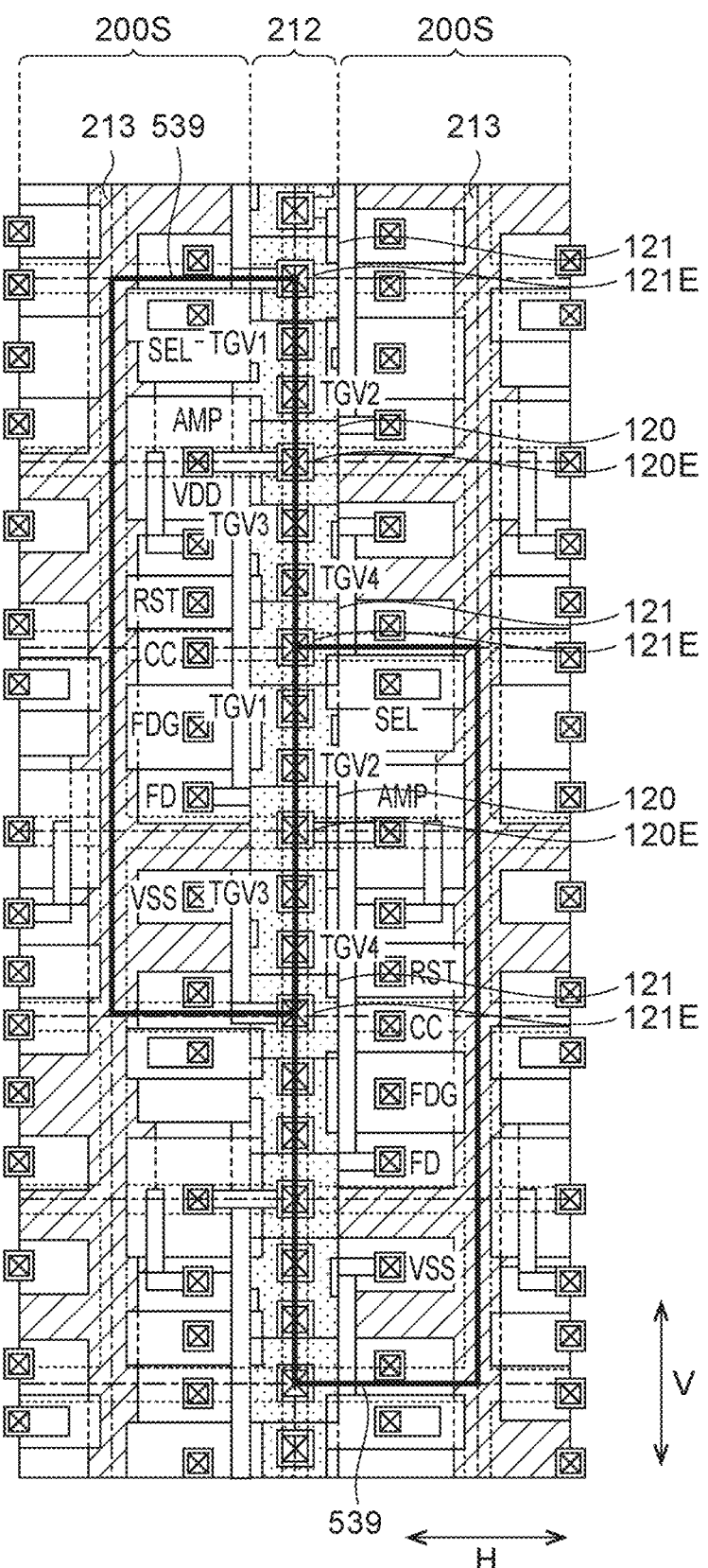
FIG. 50 is a schematic diagram illustrating a planar configuration of main parts of a first wiring layer and a first substrate together with the pixel circuit illustrated in FIG. 49.
Figure 51:
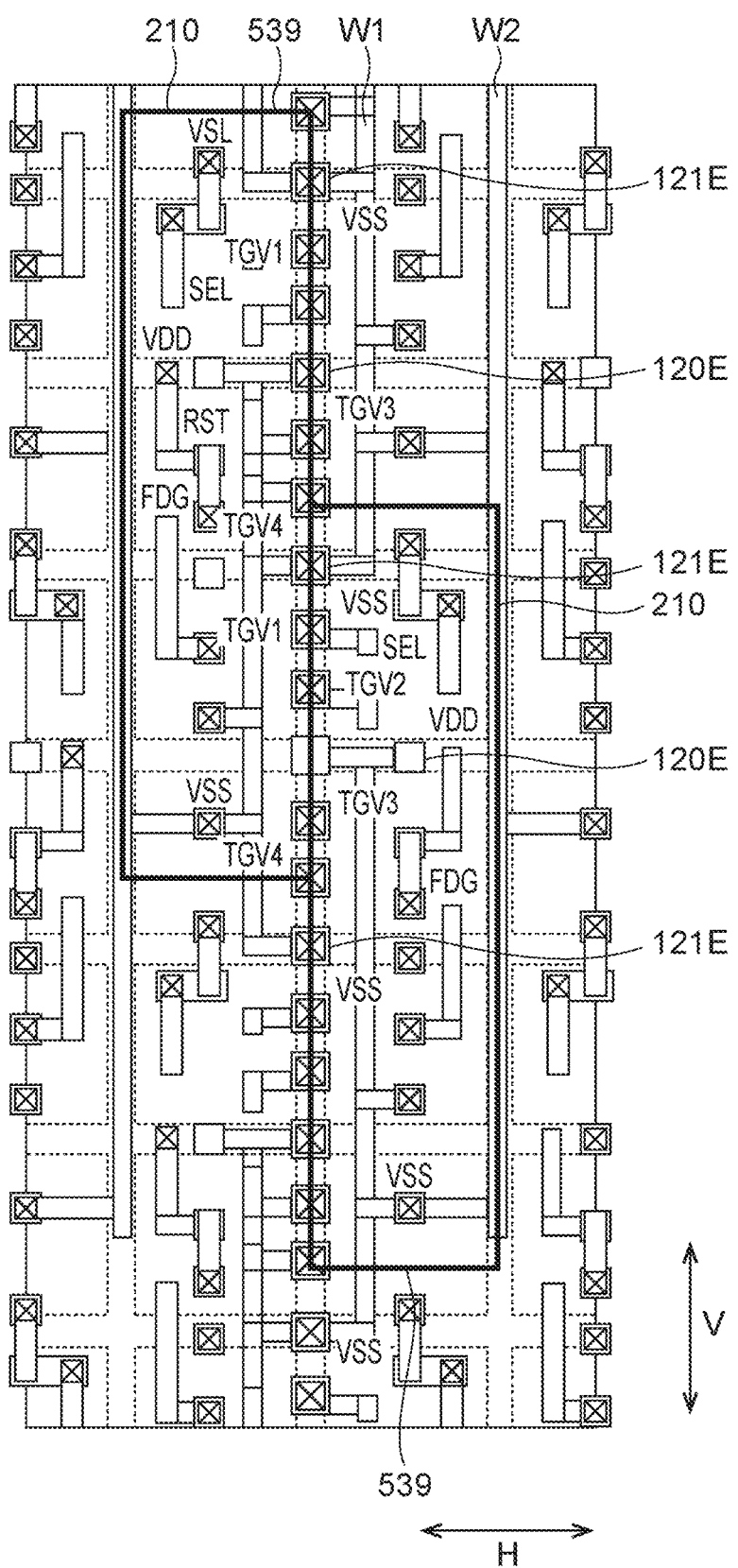
FIG. 51 is a schematic diagram illustrating an example of a planar configuration of a second wiring layer together with the first wiring layer illustrated in FIG. 50.
Figure 52:
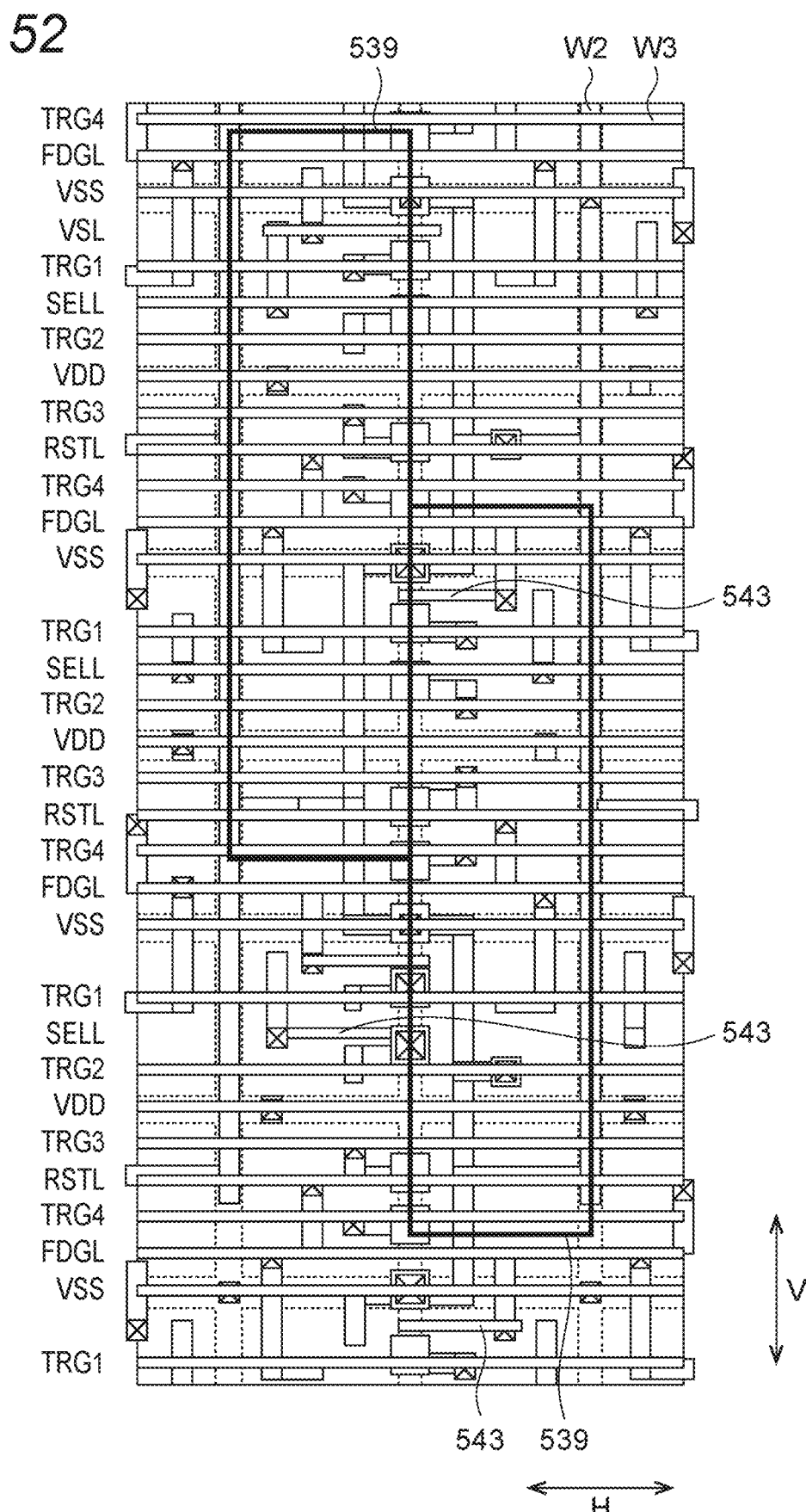
FIG. 52 is a schematic diagram illustrating an example of a planar configuration of a third wiring layer together with the second wiring layer illustrated in FIG. 51.
Figure 53:
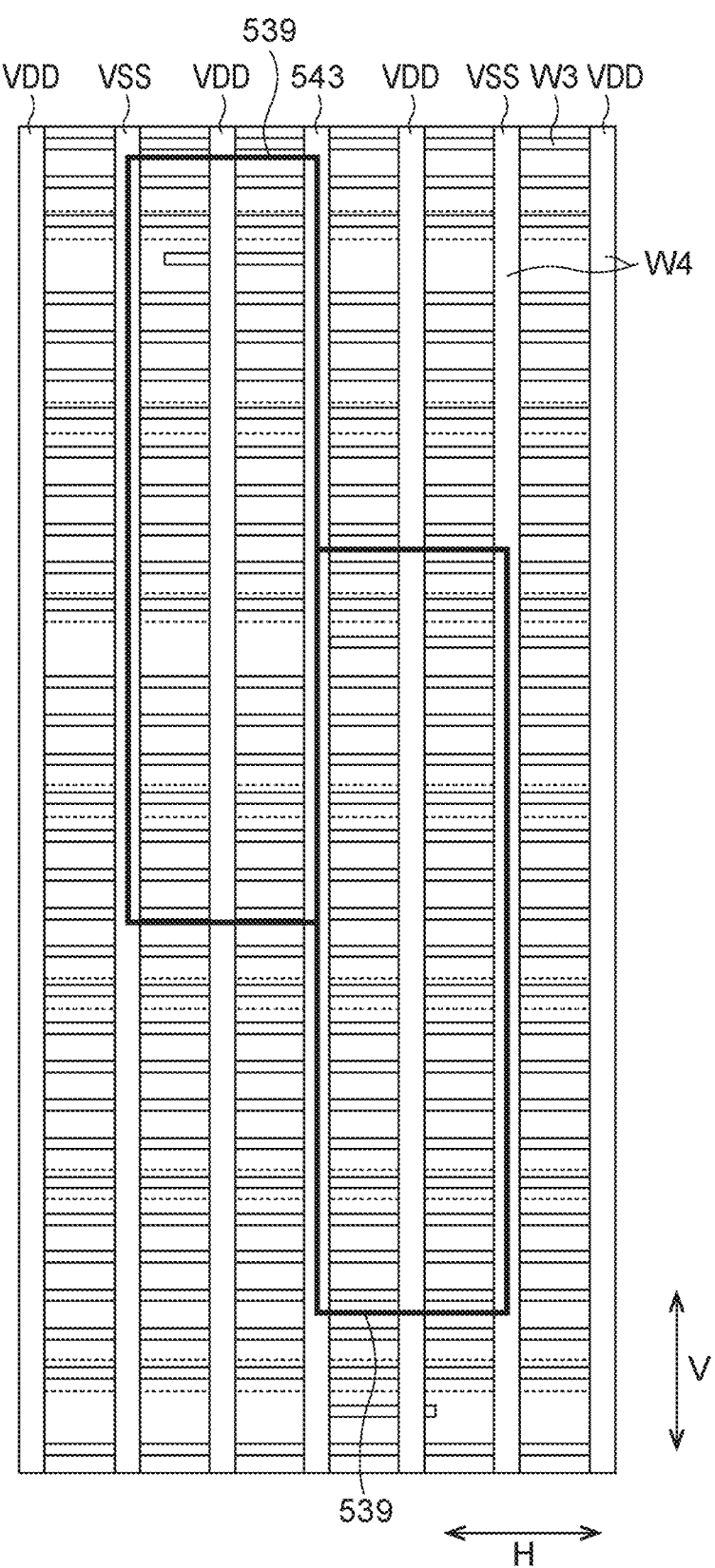
FIG. 53 is a schematic diagram illustrating an example of a planar configuration of a fourth wiring layer together with the third wiring layer illustrated in FIG. 52.

FIGS. 49 to 53 illustrate a modification of the planar configuration of the imaging apparatus 1 according to the above embodiments. FIG. 49 schematically illustrates a planar configuration in the vicinity of the surface of the semiconductor layer 200S of the second substrate 200, and corresponds to FIG. 42 described in the above embodiments. FIG. 50 schematically illustrates a configuration of each part of the first wiring layer W1, the semiconductor layer 200S connected to the first wiring layer W1, and the first substrate 100, and corresponds to FIG. 43 described in the above embodiments. FIG. 51 illustrates an example of a planar configuration of the first wiring layer W1 and the second wiring layer W2, and corresponds to FIG. 44 described in the above embodiments. FIG. 52 illustrates an example of a planar configuration of the second wiring layer W2 and the third wiring layer W3, and corresponds to FIG. 45 described in the above embodiments. FIG. 53 illustrates an example of a planar configuration of the third wiring layer W3 and the fourth wiring layer W4, and corresponds to FIG. 46 described in the above embodiments.

In the present modification, as illustrated in FIG. 50, among the two pixel sharing units 539 arranged in the H direction on the second substrate 200, the internal layout of one (for example, the right side on the paper surface) pixel sharing unit 539 has a configuration in which the internal layout of the other (for example, the left side on the paper surface) pixel sharing unit 539 is inverted only in the H direction. In addition, the deviation in the V direction between the outline of one pixel sharing unit 539 and the outline of the other pixel sharing unit 539 is larger than the deviation (FIG. 43) described in the above embodiments. In this manner, by increasing the deviation in the V direction, the distance between the amplification transistor AMP of the other pixel sharing unit 539 and the pad portion 120 (the pad portion 120 of the other (lower side on the paper surface) of the two pixel sharing units 539 arranged in the V direction illustrated in FIG. 41) connected thereto can be reduced. With such a layout, Modification 1 of the imaging apparatus 1 illustrated in FIGS. 49 to 53 can make the area of the planar layout of the two pixel sharing units 539 arranged in the H direction the same as the area of the pixel sharing unit 539 of the second substrate 200 described in the above embodiments without inverting the planar layout of the two pixel sharing units 539 in the V direction. Note that the planar layout of the pixel sharing unit 539 of the first substrate 100 is the same as the planar layout (FIG. 41A, FIG. 41B) described in the above embodiments. Therefore, the imaging apparatus 1 of the present modification can obtain effects similar to those of the imaging apparatus 1 described in the above embodiments. The arrangement of the pixel sharing unit 539 of the second substrate 200 is not limited to the arrangement described in the above embodiments and the present modification.

3. Modification 2

Figure 54:
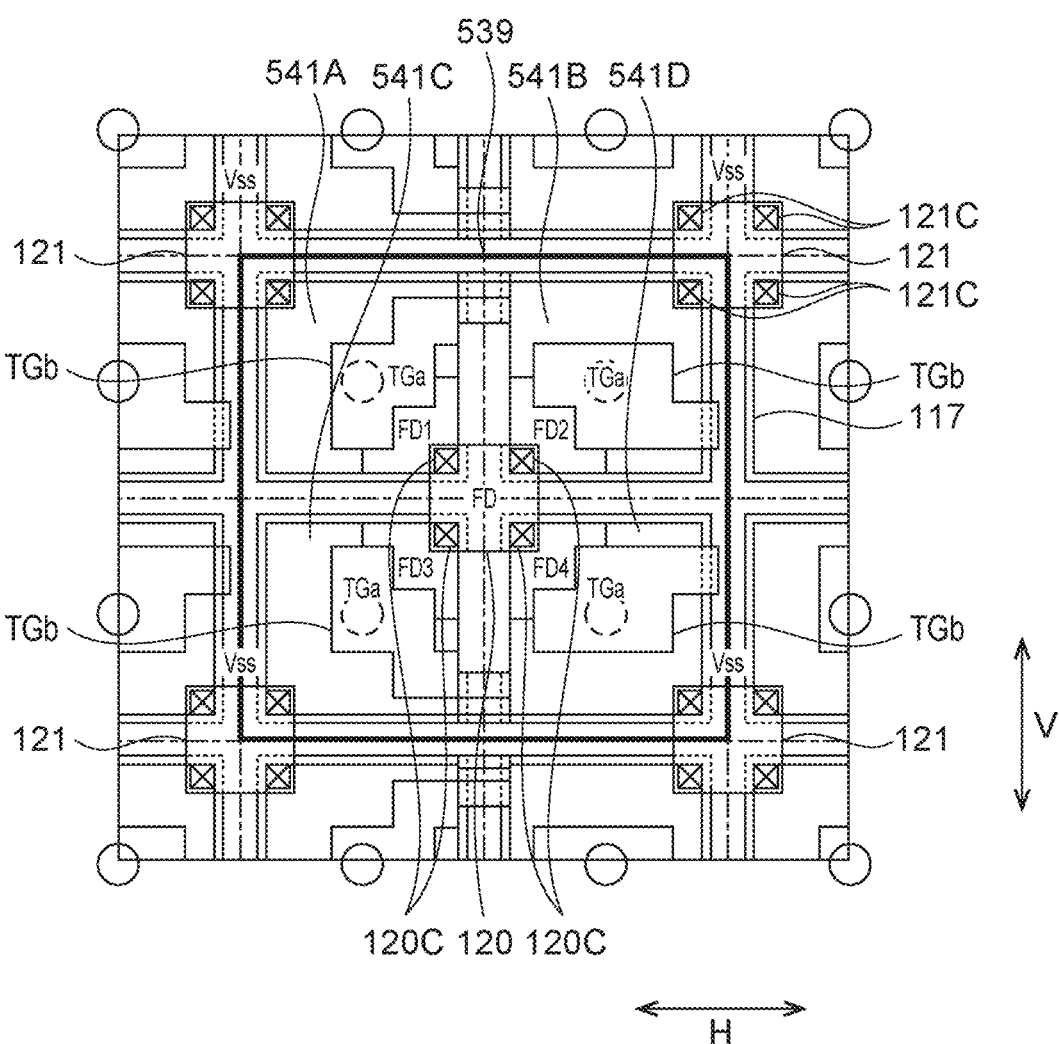
FIG. 54 is a schematic diagram illustrating a modification of the planar configuration of the first substrate illustrated in FIG. 41A.

FIGS. 54 to 59 illustrate a modification of the planar configuration of the imaging apparatus 1 according to the above embodiments. FIG. 54 schematically illustrates a planar configuration of the first substrate 100, and corresponds to FIG. 41A described in the above embodiments.

Figure 55:
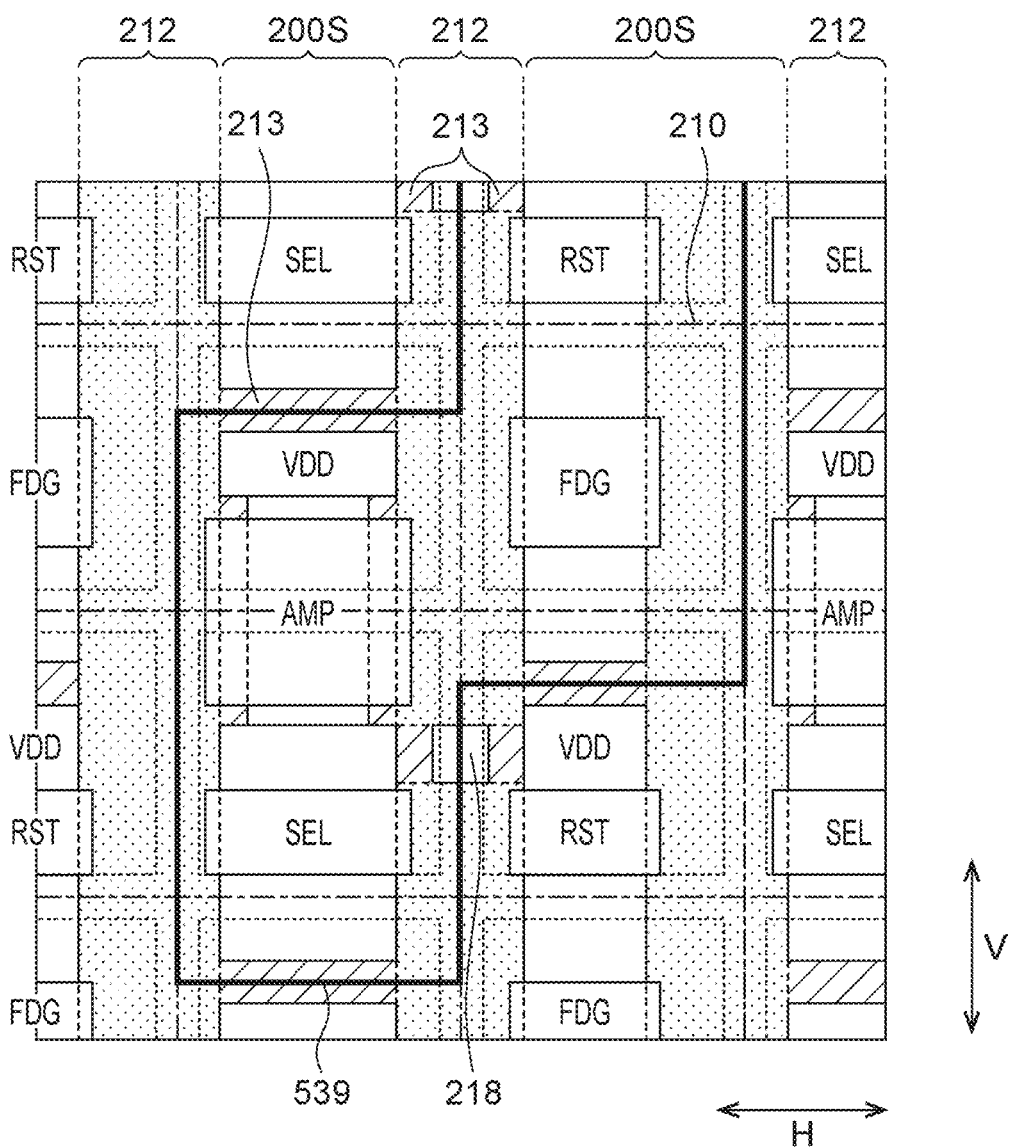
FIG. 55 is a schematic diagram illustrating an example of a planar configuration of a second substrate (semiconductor layer) laminated on the first substrate illustrated in FIG. 54.
Figure 56:
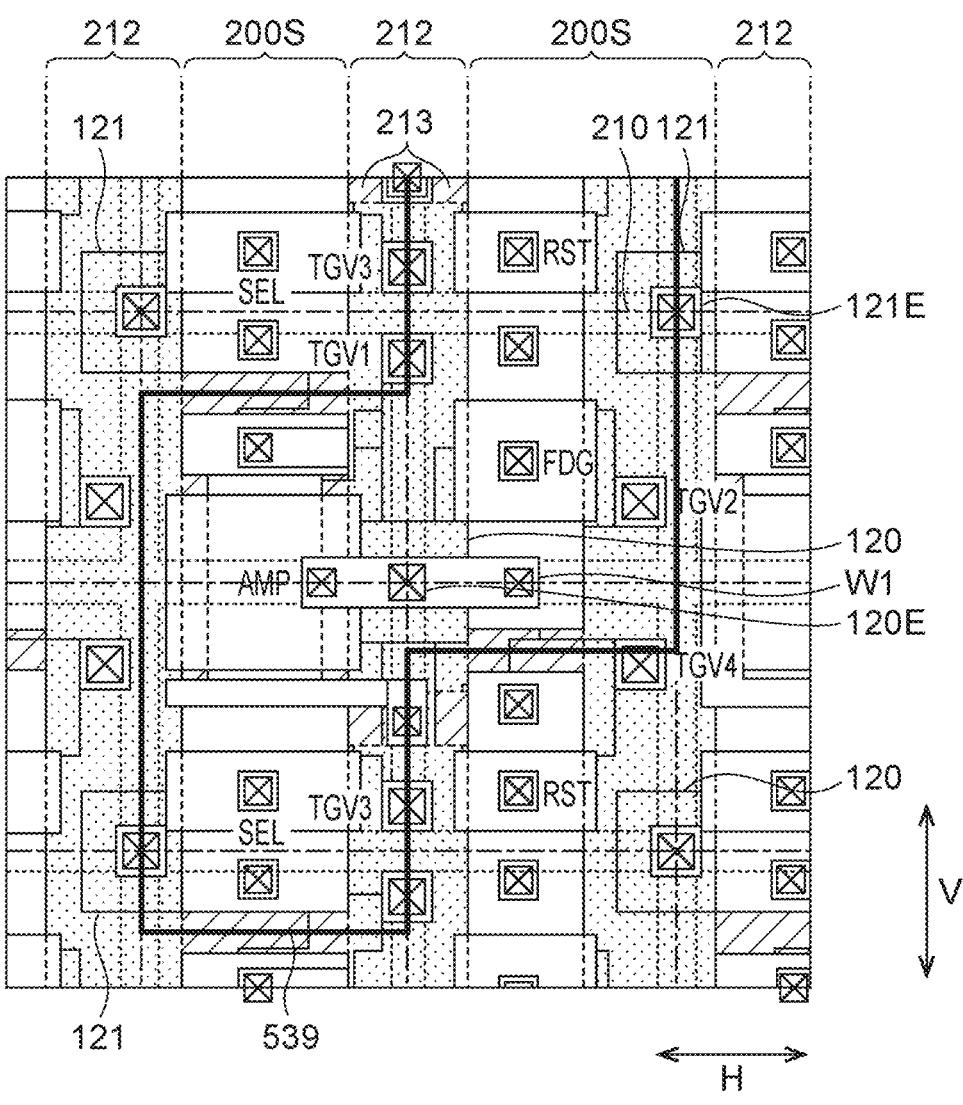
FIG. 56 is a schematic diagram illustrating an example of a planar configuration of a first wiring layer together with the pixel circuit illustrated in FIG. 55.
Figure 57:
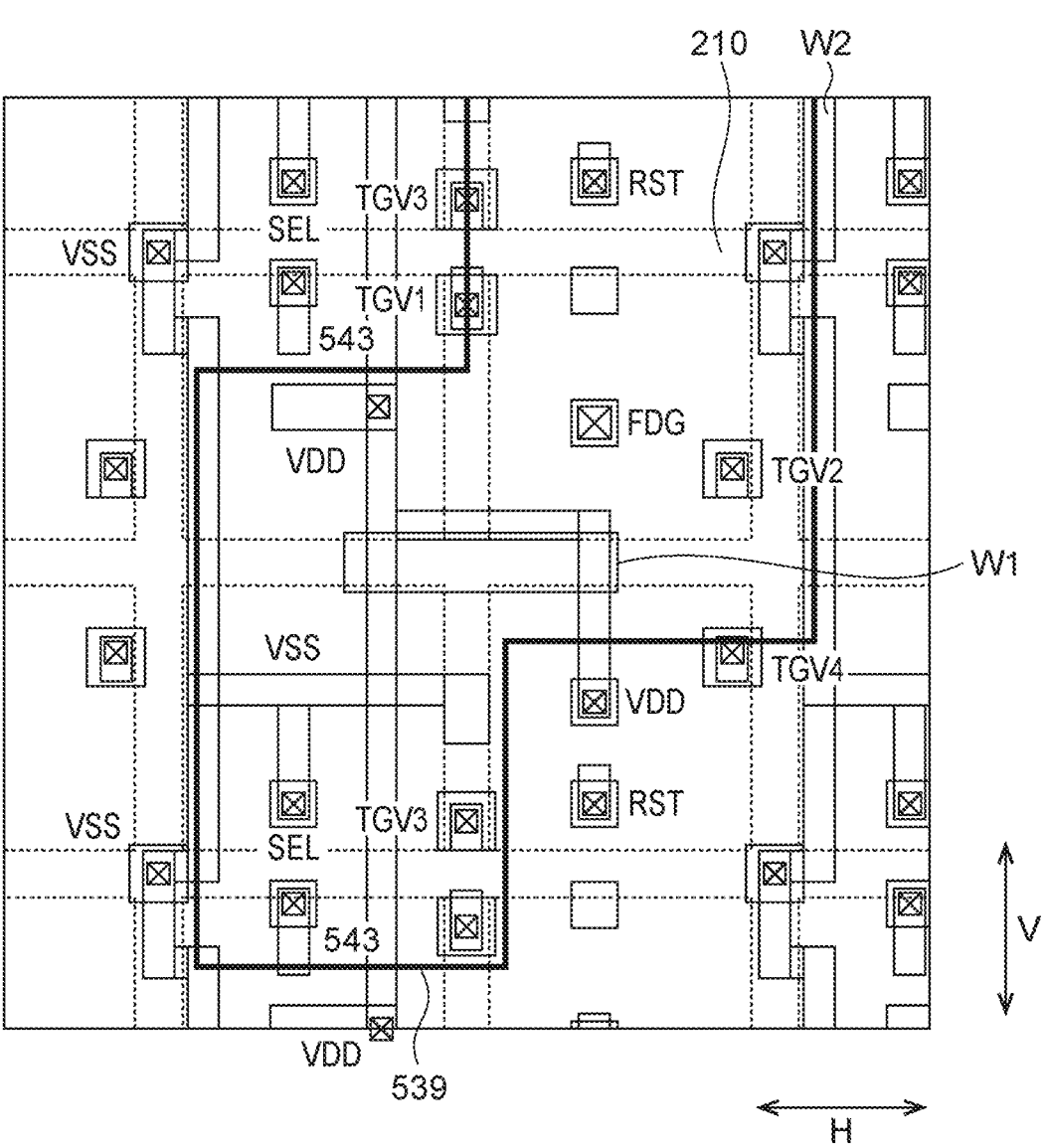
FIG. 57 is a schematic diagram illustrating an example of a planar configuration of a second wiring layer together with the first wiring layer illustrated in FIG. 26.
Figure 58:
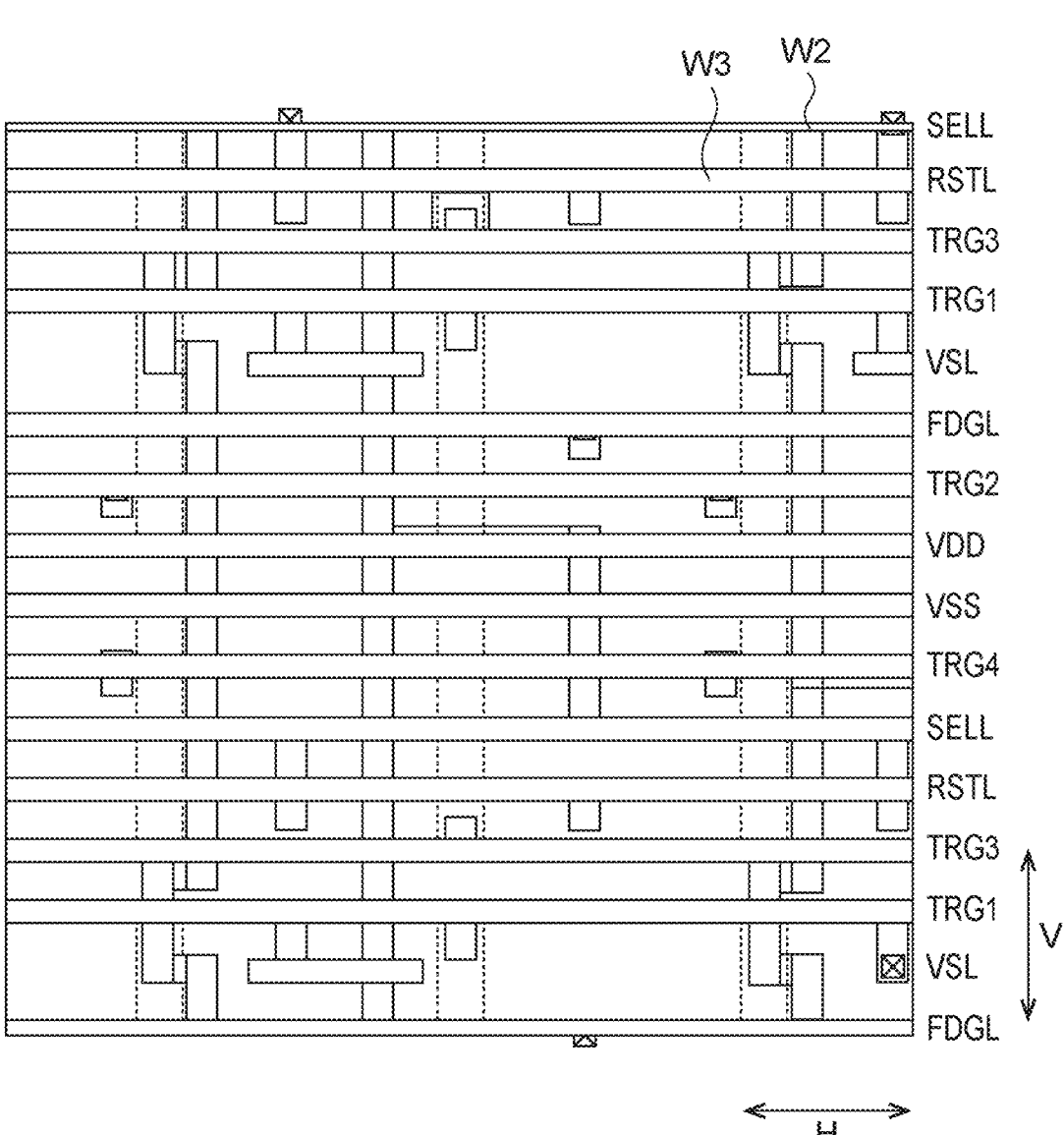
FIG. 58 is a schematic diagram illustrating an example of a planar configuration of a third wiring layer together with the second wiring layer illustrated in FIG. 57.
Figure 59:
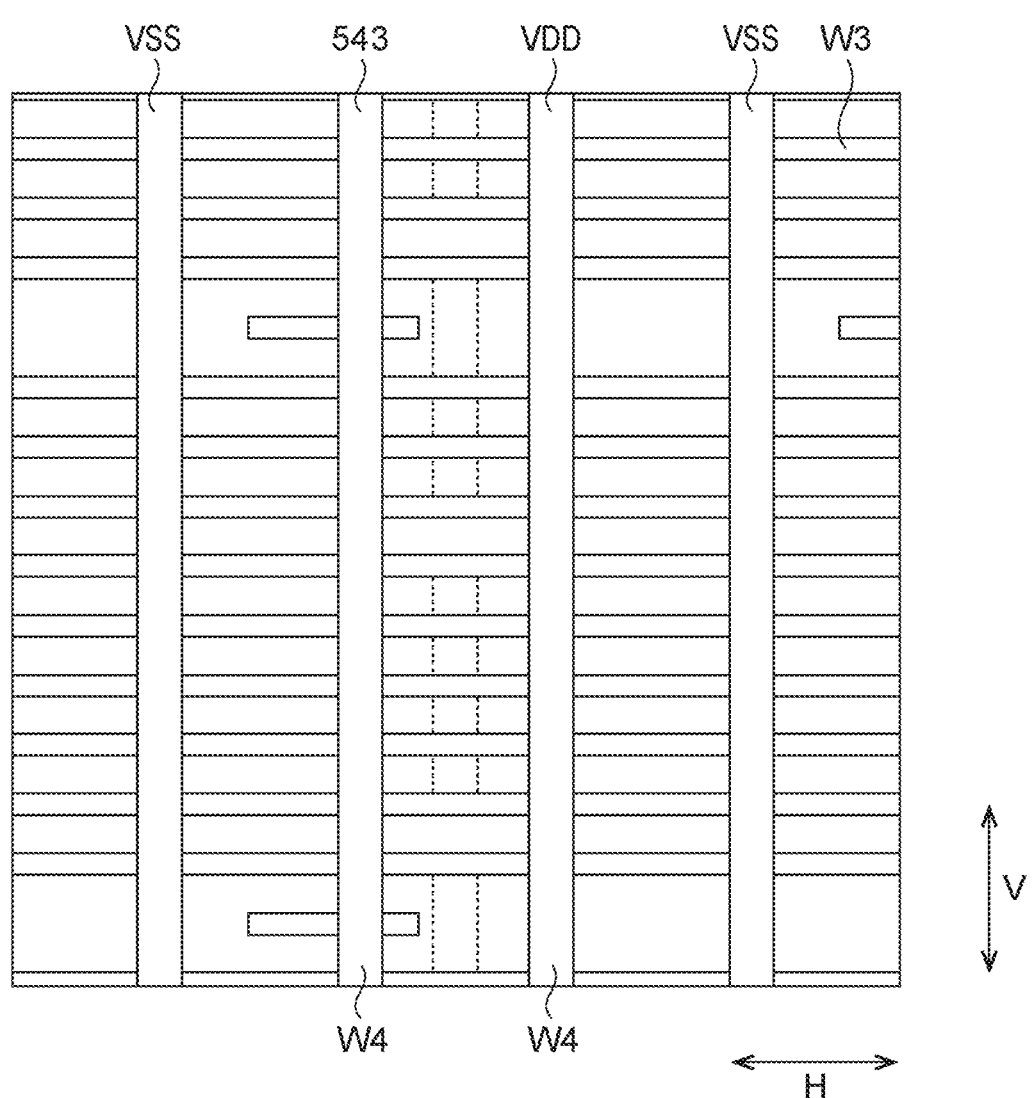
FIG. 59 is a schematic diagram illustrating an example of a planar configuration of a fourth wiring layer together with the third wiring layer illustrated in FIG. 58.

FIG. 55 schematically illustrates a planar configuration in the vicinity of the surface of the semiconductor layer 200S of the second substrate 200, and corresponds to FIG. 42 described in the above embodiments. FIG. 56 schematically illustrates a configuration of each part of the first wiring layer W1, the semiconductor layer 200S connected to the first wiring layer W1, and the first substrate 100, and corresponds to FIG. 43 described in the above embodiments. FIG. 57 illustrates an example of a planar configuration of the first wiring layer W1 and the second wiring layer W2, and corresponds to FIG. 44 described in the above embodiments. FIG. 58 illustrates an example of a planar configuration of the second wiring layer W2 and the third wiring layer W3, and corresponds to FIG. 45 described in the above embodiments. FIG. 59 illustrates an example of a planar configuration of the third wiring layer W3 and the fourth wiring layer W4, and corresponds to FIG. 46 described in the above embodiments.

In the present modification, the outer shape of each pixel circuit 210 has a substantially square planar shape (FIG. 55 and the like). In this respect, the planar configuration of the imaging apparatus 1 of the present modification is different from the planar configuration of the imaging apparatus 1 described in the above embodiments.

For example, the pixel sharing unit 539 of the first substrate 100 is formed over a pixel region of two rows×two columns, and has a substantially square planar shape (FIG. 54), as described in the above embodiments. For example, in each pixel sharing unit 539, the horizontal portions TGb of the transfer gates TG1 and TG3 of the pixel 541A and the pixel 541C of one pixel column extend in the direction from the position overlapping the vertical portion TGa toward the central portion of the pixel sharing unit 539 in the H direction (more specifically, a direction toward the outer edges of the pixels 541A and 541C and a direction toward the central portion of the pixel sharing unit 539), and the horizontal portions TGb of the transfer gates TG2 and TG4 of the pixel 541B and the pixel 541D of the other pixel column extend in the direction from the position overlapping the vertical portion TGa toward the outside of the pixel sharing unit 539 in the H direction (more specifically, a direction toward the outer edges of the pixels 541B and 541D and a direction toward the outside of the pixel sharing unit 539). The pad portion 120 connected to the floating diffusion FD is provided at a central portion of the pixel sharing unit 539 (a central portion of the pixel sharing unit 539 in the H direction and the V direction), and the pad portion 121 connected to the VSS contact region 118 is provided at an end portion of the pixel sharing unit 539 at least in the H direction (in the H direction and the V direction in FIG. 54).

As another arrangement example, it is also conceivable to provide the horizontal portions TGb of the transfer gates TG1, TG2, TG3, and TG4 only in a region facing the vertical portion TGa. At this time, the semiconductor layer 2003 is likely to be finely divided as described in the above embodiments. Therefore, it is difficult to form a large transistor of the pixel circuit 210. On the other hand, when the horizontal portions TGb of the transfer gates TG1, TG2, TG3, and TG4 are extended in the H direction from the position overlapping the vertical portion TGa as in the above modification, the width of the semiconductor layer 200S can be increased as described in the above embodiments. Specifically, the positions in the H direction of the through electrodes TGV1 and TGV3 connected to the transfer gates TG1 and TG3 can be arranged close to the position in the H direction of the through electrode 120E, and the positions in the H direction of the through electrodes TGV2 and TGV4 connected to the transfer gates TG2 and TG4 can be arranged close to the position in the H direction of the through electrode 121E (FIG. 56). As a result, the width (size in the H direction) of the semiconductor layer 2003 extending in the V direction can be increased as described in the above embodiments. Therefore, it is possible to increase the size of the transistor of the pixel circuit 210, particularly, the size of the amplification transistor AMP. As a result, the signal/noise ratio of the pixel signal is improved, and the imaging apparatus 1 can output better pixel data (image information).

The pixel sharing unit 539 of the second substrate 200 has, for example, substantially the same size in the H direction and the V direction as that of the pixel sharing unit 539 of the first substrate 100, and is provided over, for example, a region corresponding to a pixel region of approximately two rows×two columns. For example, in each pixel circuit 210, the selection transistor SEL and the amplification transistor AMP are arranged side by side in the V direction in one semiconductor layer 200S extending in the V direction, and the FD conversion gain switching transistor FDG and the reset transistor RST are arranged side by side in the V direction in one semiconductor layer 200S extending in the V direction. One semiconductor layer 2003 provided with the selection transistor SEL and the amplification transistor AMP and one semiconductor layer 200S provided with the FD conversion gain switching transistor FDG and the reset transistor RST are arranged in the H direction via the insulating region 212. The insulating region 212 extends in the V direction (FIG. 55).

Here, the outer shape of the pixel sharing unit 539 of the second substrate 200 will be described with reference to FIGS. 55 and 56. For example, the pixel sharing unit 539 of the first substrate 100 illustrated in FIG. 54 is connected to the amplification transistor AMP and the selection transistor SEL provided on one side (the left side on the paper surface of FIG. 56) of the pad portion 120 in the H direction, and the FD conversion gain switching transistor FDG and the reset transistor RST provided on the other side (the right side on the paper surface of FIG. 56) of the pad portion 120 in the H direction. The outer shape of the sharing unit 541 of the second substrate 200 including the amplification transistor AMP, the selection transistor SEL, the FD conversion gain switching transistor FDG, and the reset transistor RST is determined by the following four outer edges.

The first outer edge is an outer edge of one end (end on the upper side on the paper surface of FIG. 56) in the V direction of the semiconductor layer 200S including the selection transistor SEL and the amplification transistor AMP. The first outer edge is provided between the amplification transistor AMP included in the pixel sharing unit 539 and the selection transistor SEL included in the pixel sharing unit 539 adjacent to one side (the upper side on the paper surface of FIG. 56) of the pixel sharing unit 539 in the V direction. More specifically, the first outer edge is provided at the central portion in the V direction of the element isolation region 213 between the amplification transistor AMP and the selection transistor SEL. The second outer edge is an outer edge of the other end (the lower side on the paper surface of FIG. 56) in the V direction of the semiconductor layer 200S including the selection transistor SEL and the amplification transistor AMP. The second outer edge is provided between the selection transistor SEL included in the pixel sharing unit 539 and the amplification transistor AMP included in the pixel sharing unit 539 adjacent to the other side (the lower side on the paper surface of FIG. 56) of the pixel sharing unit 539 in the V direction. More specifically, the second outer edge is provided at the central portion in the V direction of the element isolation region 213 between the selection transistor SEL and the amplification transistor AMP. The third outer edge is an outer edge of the other end (the lower side on the paper surface of FIG. 56) in the V direction of the semiconductor layer 200S including the reset transistor RST and the FD conversion gain switching transistor FDG. The third outer edge is provided between the FD conversion gain switching transistor FDG included in the pixel sharing unit 539 and the reset transistor RST included in the pixel sharing unit 539 adjacent to the other side (the lower side on the paper surface of FIG. 56) of the pixel sharing unit 539 in the V direction. More specifically, the third outer edge is provided at the central portion in the V direction of the element isolation region 213 between the FD conversion gain switching transistor FDG and the reset transistor RST. The fourth outer edge is an outer edge of one end (the upper side on the paper surface of FIG. 56) in the V direction of the semiconductor layer 200S including the reset transistor RST and the FD conversion gain switching transistor FDG. The fourth outer edge is provided between the reset transistor RST included in the pixel sharing unit 539 and the FD conversion gain switching transistor FDG (not illustrated) included in the pixel sharing unit 539 adjacent to one side (the upper side on the paper surface of FIG. 56) of the pixel sharing unit 539 in the V direction. More specifically, the fourth outer edge is provided at the central portion in the V direction of the element isolation region 213 (not illustrated) between the reset transistor RST and the FD conversion gain switching transistor FDG.

In the outer shape of the pixel sharing unit 539 of the second substrate 200 including such first, second, third, and fourth outer edges, the third and fourth outer edges are arranged to be shifted to one side in the V direction (in other words, offset to one side in the V direction) with respect to the first and second outer edges. By using such a layout, both the gate of the amplification transistor AMP and the source of the FD conversion gain switching transistor FDG can be arranged as close as possible to the pad portion 120. Therefore, the area of the wiring connecting them is reduced, and the imaging apparatus 1 can be easily miniaturized. Note that the VSS contact region 218 is provided between the semiconductor layer 2003 including the selection transistor SEL and the amplification transistor AMP and the semiconductor layer 200S including the reset transistor RST and the FD conversion gain switching transistor FDG. For example, the plurality of pixel circuits 210 has the same arrangement.

The imaging apparatus 1 including such a second substrate 200 can also obtain effects similar to those described in the above embodiments. The arrangement of the pixel sharing unit 539 of the second substrate 200 is not limited to the arrangement described in the above embodiments and the present modification.

4. Modification 3

Figure 60:
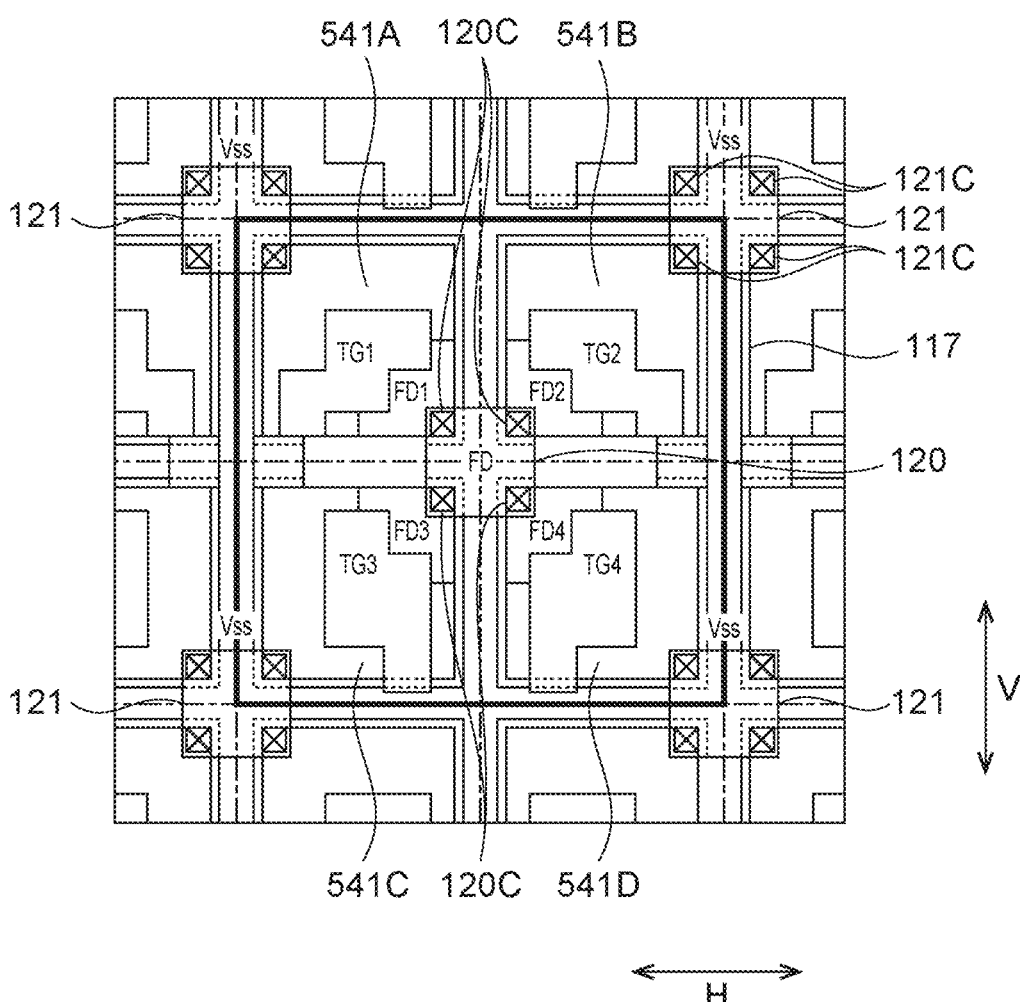
FIG. 60 is a schematic diagram illustrating another example of the planar configuration of the first substrate illustrated in FIG. 54.
Figure 61:
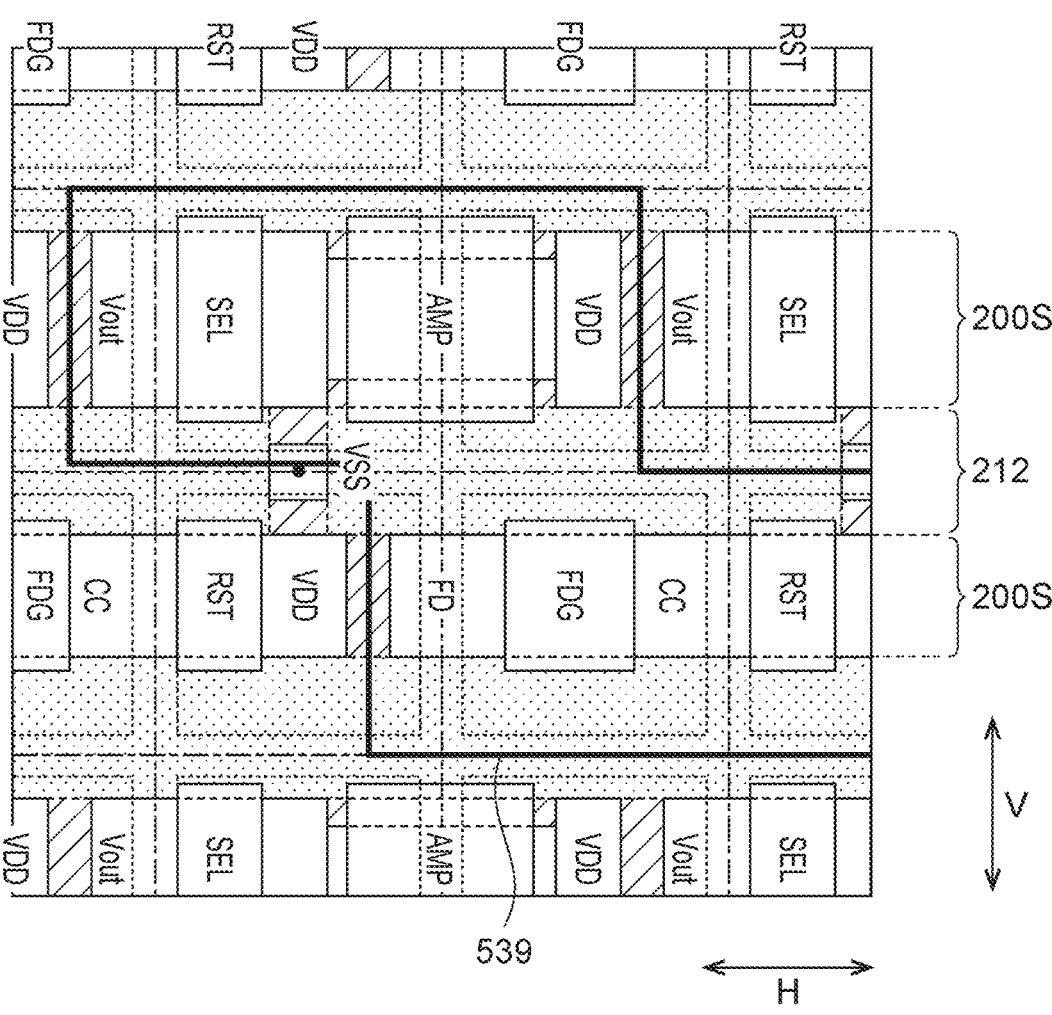
FIG. 61 is a schematic diagram illustrating an example of a planar configuration of a second substrate (semiconductor layer) laminated on the first substrate illustrated in FIG. 60.
Figure 62:
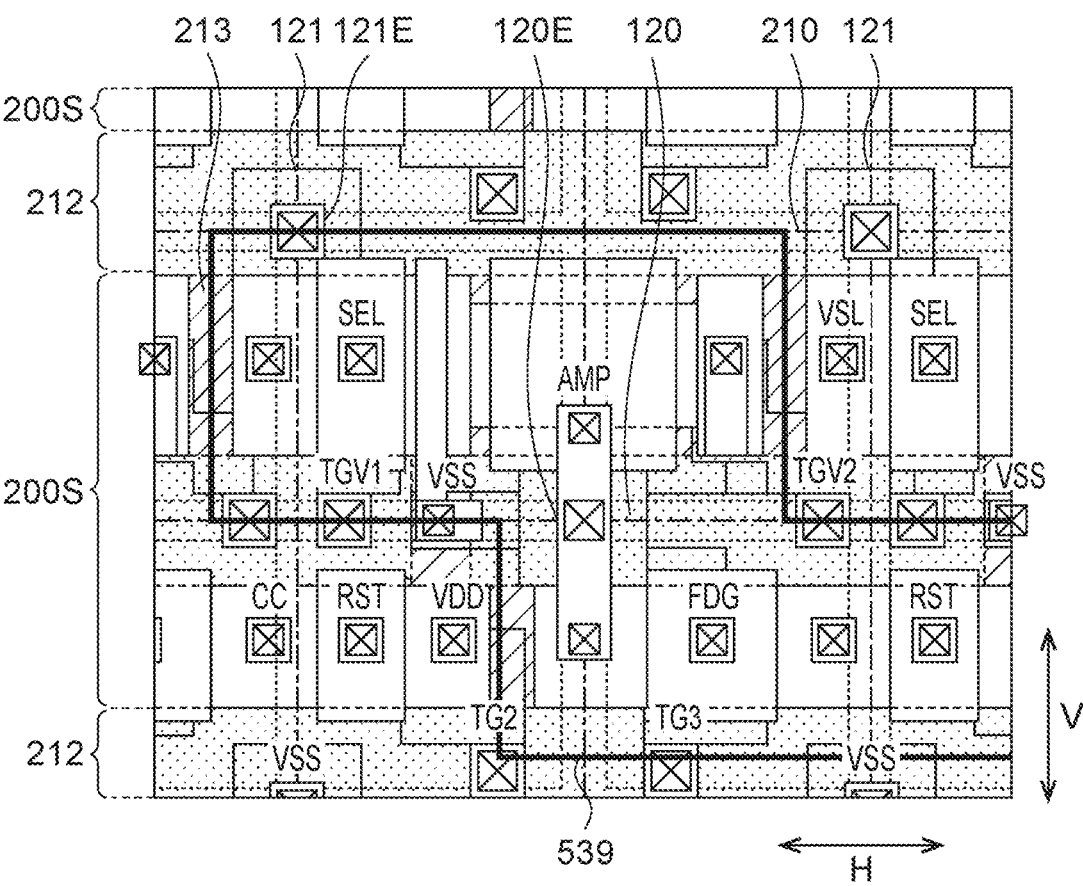
FIG. 62 is a schematic diagram illustrating an example of a planar configuration of a first wiring layer together with the pixel circuit illustrated in FIG. 61.
Figure 63:
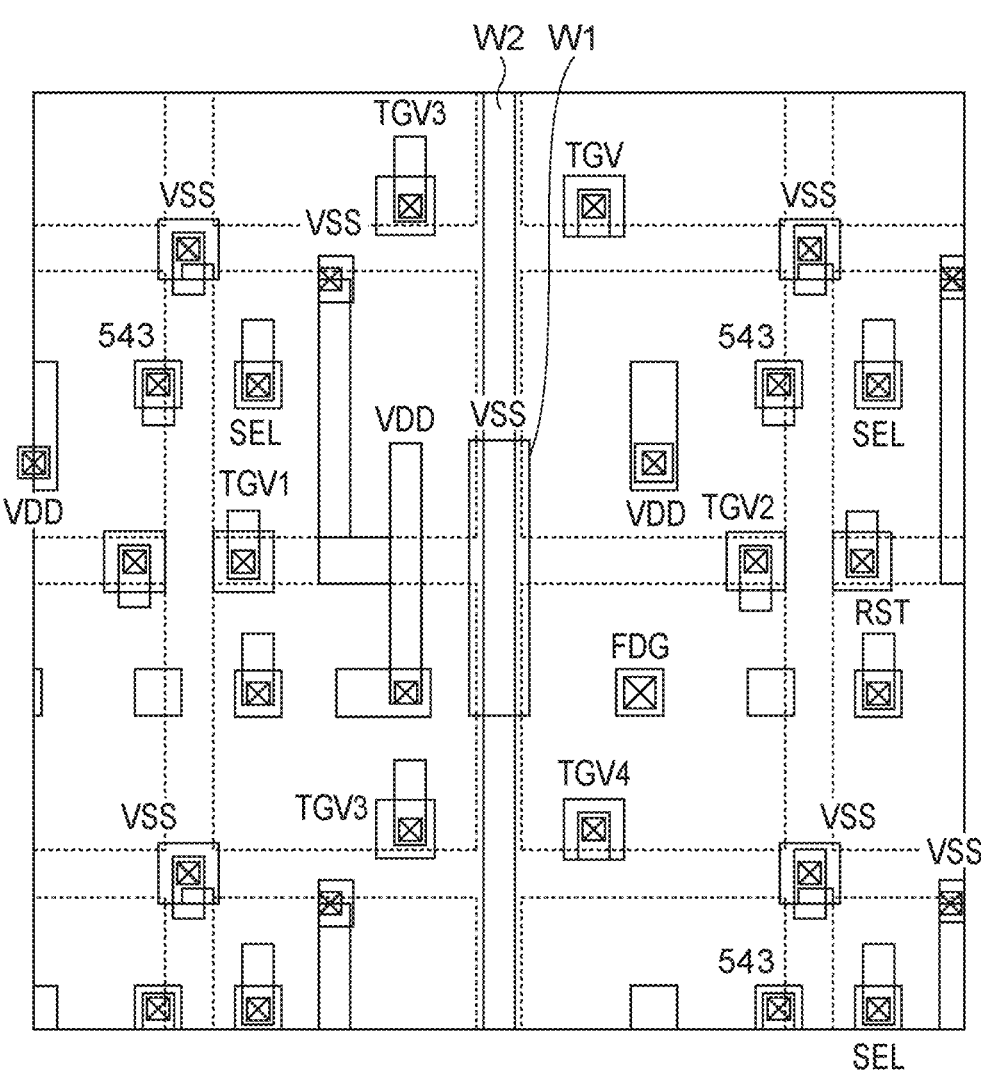
FIG. 63 is a schematic diagram illustrating an example of a planar configuration of a second wiring layer together with the first wiring layer illustrated in FIG. 62.
Figure 64:
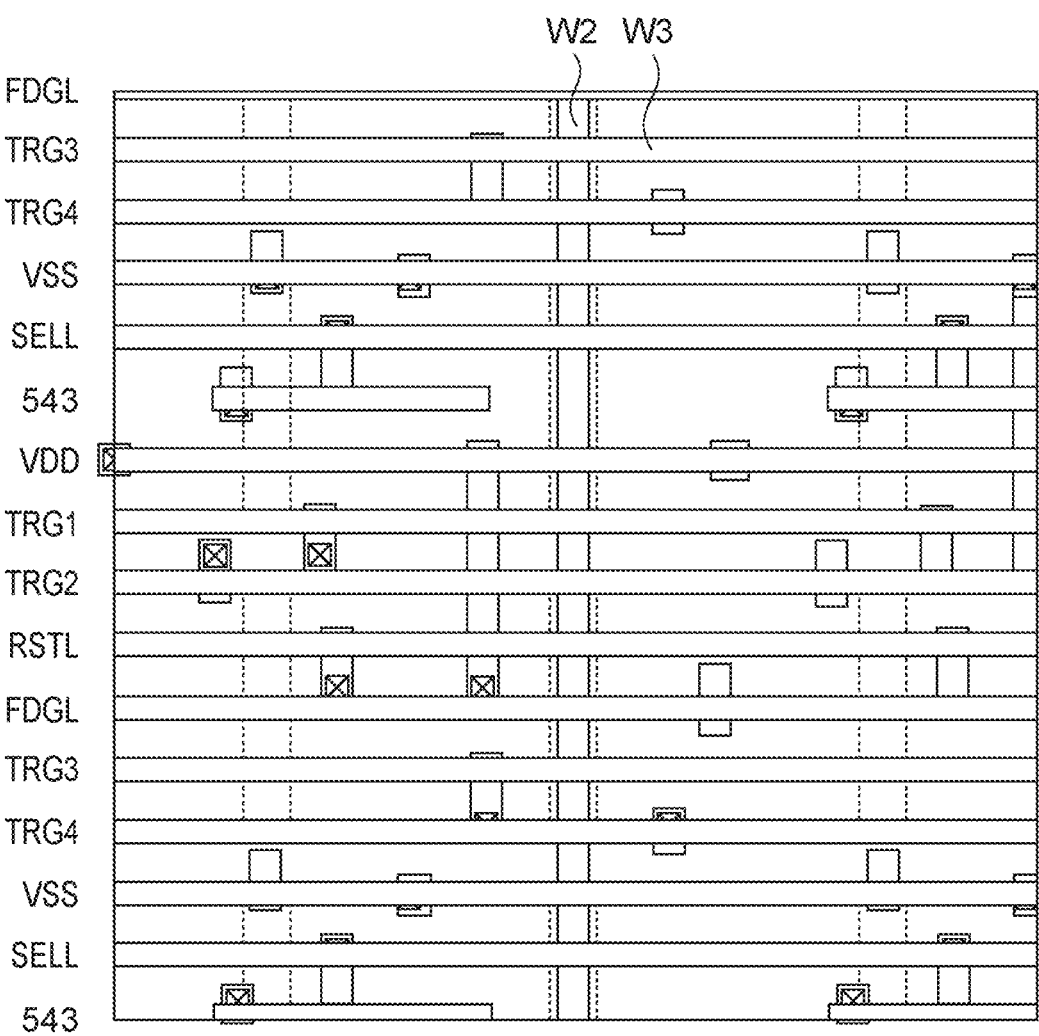
FIG. 64 is a schematic diagram illustrating an example of a planar configuration of a third wiring layer together with the second wiring layer illustrated in FIG. 63.
Figure 65:
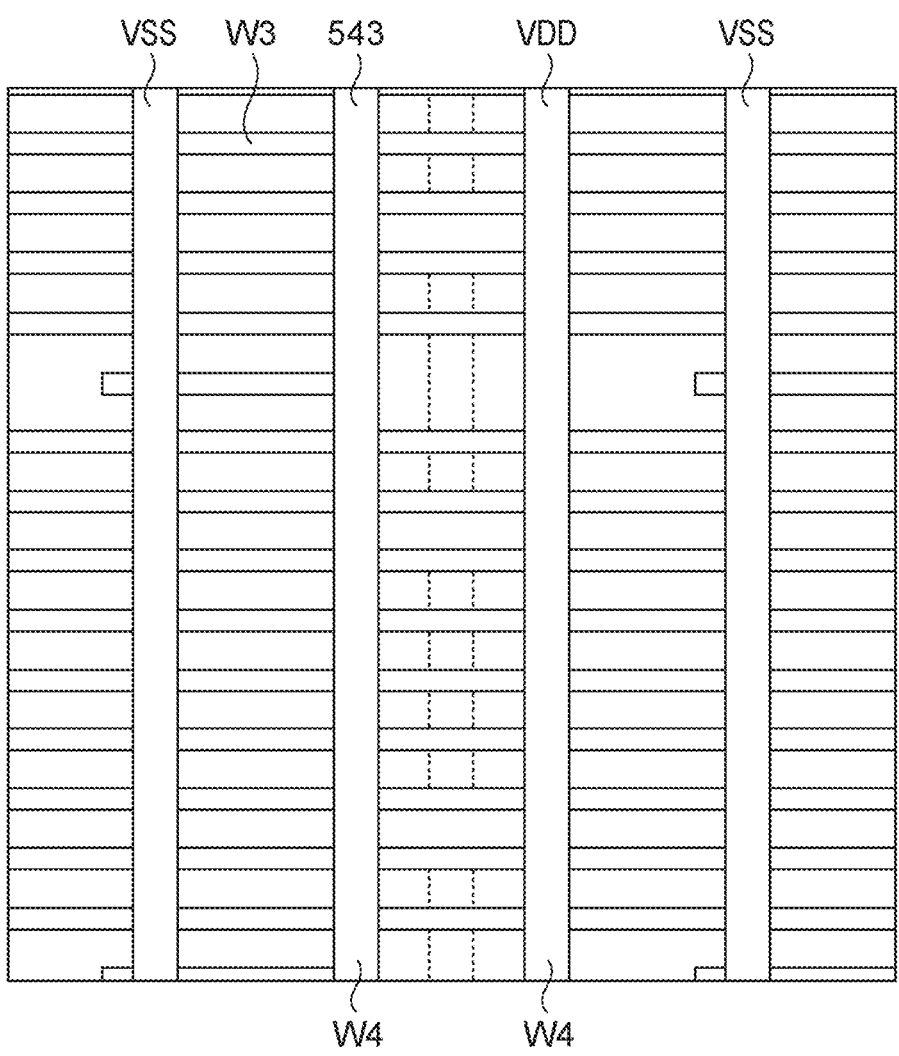
FIG. 65 is a schematic diagram illustrating an example of a planar configuration of a fourth wiring layer together with the third wiring layer illustrated in FIG. 64.

FIGS. 60 to 65 illustrate a modification of the planar configuration of the imaging apparatus 1 according to the above embodiments. FIG. 60 schematically illustrates a planar configuration of the first substrate 100, and corresponds to FIG. 41B described in the above embodiments. FIG. 61 schematically illustrates a planar configuration in the vicinity of the surface of the semiconductor layer 200S of the second substrate 200, and corresponds to FIG. 42 described in the above embodiments. FIG. 62 schematically illustrates a configuration of each part of the first wiring layer W1, the semiconductor layer 200S connected to the first wiring layer W1, and the first substrate 100, and corresponds to FIG. 43 described in the above embodiments. FIG. 63 illustrates an example of a planar configuration of the first wiring layer W1 and the second wiring layer W2, and corresponds to FIG. 44 described in the above embodiments. FIG. 64 illustrates an example of a planar configuration of the second wiring layer W2 and the third wiring layer W3, and corresponds to FIG. 45 described in the above embodiments. FIG. 65 illustrates an example of a planar configuration of the third wiring layer W3 and the fourth wiring layer W4, and corresponds to FIG. 46 described in the above embodiments.

In the present modification, the semiconductor layer 200S of the second substrate 200 extends in the H direction (FIG. 62). That is, it substantially corresponds to the configuration in which the planar configuration of the imaging apparatus 1 illustrated in FIG. 55 described above and the like is rotated by 90 degrees.

For example, the pixel sharing unit 539 of the first substrate 100 is formed over a pixel region of two rows×two columns, and has a substantially square planar shape (FIG. 60), as described in the above embodiments. For example, in each pixel sharing unit 539, the transfer gates TG1 and TG2 of the pixel 541A and the pixel 541B of one pixel row extend toward the central portion of the pixel sharing unit 539 in the V direction, and the transfer gates TG3 and TG4 of the pixel 541C and the pixel 541D of the other pixel row extend in the outer direction of the pixel sharing unit 539 in the V direction. The pad portion 120 connected to the floating diffusion FD is provided at a central portion of the pixel sharing unit 539, and the pad portion 121 connected to the VSS contact region 118 is provided at an end portion of the pixel sharing unit 539 at least in the V direction (in the V direction and the H direction in FIG. 60). At this time, the positions in the V direction of the through electrodes TGV1 and TGV2 of the transfer gates TG1 and TG2 approach the positions in the V direction of the through electrode 120E, and the positions in the V direction of the through electrodes TGV3 and TGV4 of the transfer gates TG3 and TG4 approach the positions in the V direction of the through electrode 121E (FIG. 62). Therefore, the width (the size in the V direction) of the semiconductor layer 200S extending in the H direction can be increased for reasons similar to those described in the above embodiments. Therefore, it is possible to increase the size of the amplification transistor AMP and suppress noise.

In each pixel circuit 210, the selection transistor SEL and the amplification transistor AMP are arranged side by side in the H direction, and the reset transistor RST is arranged at a position adjacent in the V direction with the selection transistor SEL and the insulating region 212 interposed therebetween (FIG. 61). The FD conversion gain switching transistor FDG is arranged side by side with the reset transistor RST in the H direction. The VSS contact region 218 is provided in an island shape in the insulating region 212. For example, the third wiring layer W3 extends in the H direction (FIG. 64), and the fourth wiring layer W4 extends in the V direction (FIG. 65).

The imaging apparatus 1 including such a second substrate 200 can also obtain effects similar to those described in the above embodiments. The arrangement of the pixel sharing unit 539 of the second substrate 200 is not limited to the arrangement described in the above embodiments and the present modification. For example, the semiconductor layer 200S described in the above embodiments and Modification 1 may extend in the H direction.

5. Modification 4

Figure 66:
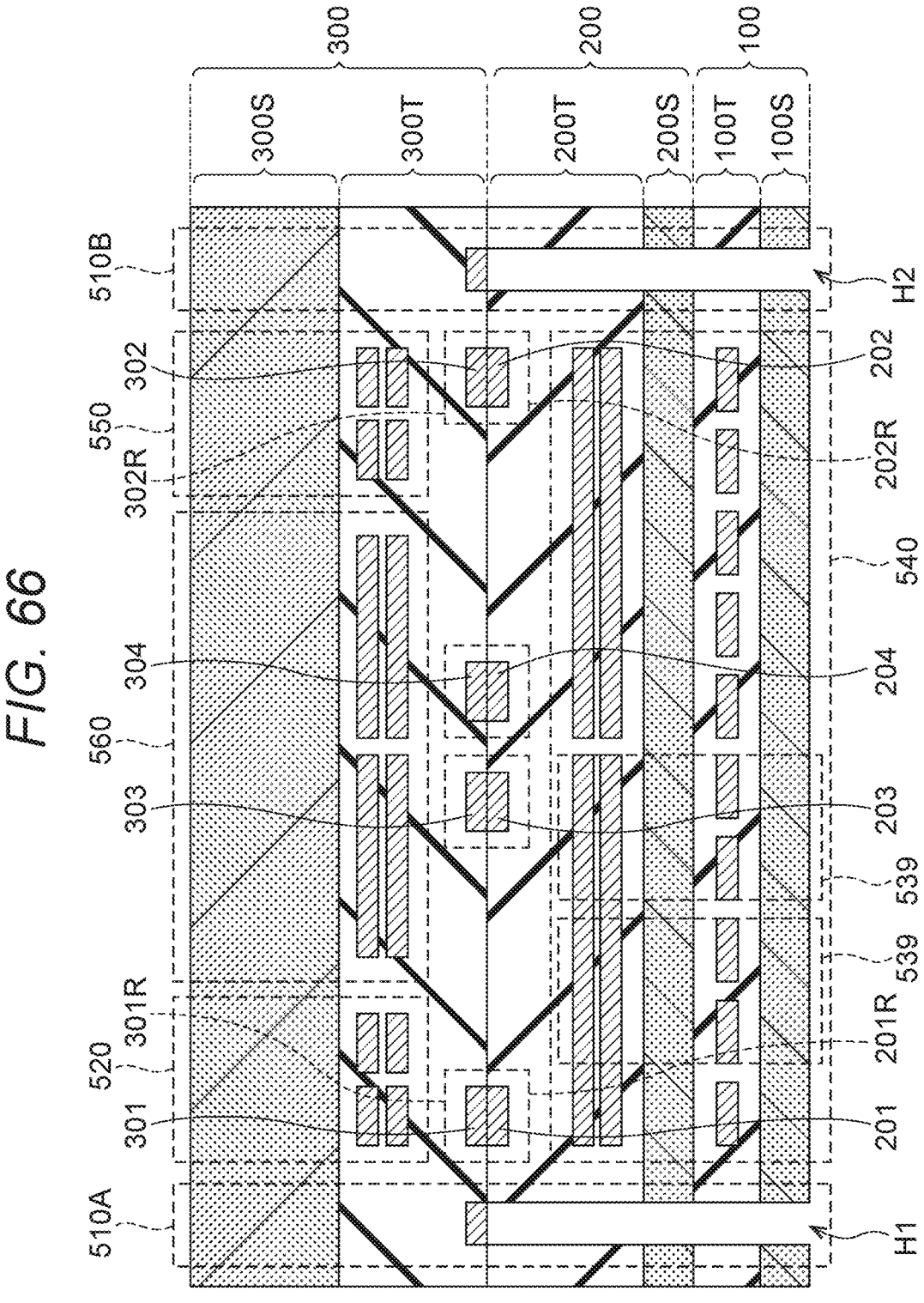
FIG. 66 is a schematic cross-sectional view illustrating another example of the imaging apparatus illustrated in FIG. 3.

FIG. 66 schematically illustrates a modification of the cross-sectional configuration of the imaging apparatus 1 according to the above embodiments. FIG. 66 corresponds to FIG. 3 described in the above embodiments. In the present modification, in addition to the contact portions 201, 202, 301, and 302, the imaging apparatus 1 includes contact portions 203, 204, 303, and 304 at a position facing the central portion of the pixel array section 540. In this respect, the imaging apparatus 1 of the present modification is different from the imaging apparatus 1 described in the above embodiments.

The contact portions 203 and 204 are provided on the second substrate 200, and a bonding surface with the third substrate 300 is exposed. The contact portions 303 and 304 are provided on the third substrate 300 and is exposed on a bonding surface with the second substrate 200. The contact portion 203 is in contact with the contact portion 303, and the contact portion 204 is in contact with the contact portion 304. That is, in the imaging apparatus 1, the second substrate 200 and the third substrate 300 are connected by the contact portions 203, 204, 303, and 304 in addition to the contact portions 201, 202, 301, and 302.

Figure 67:
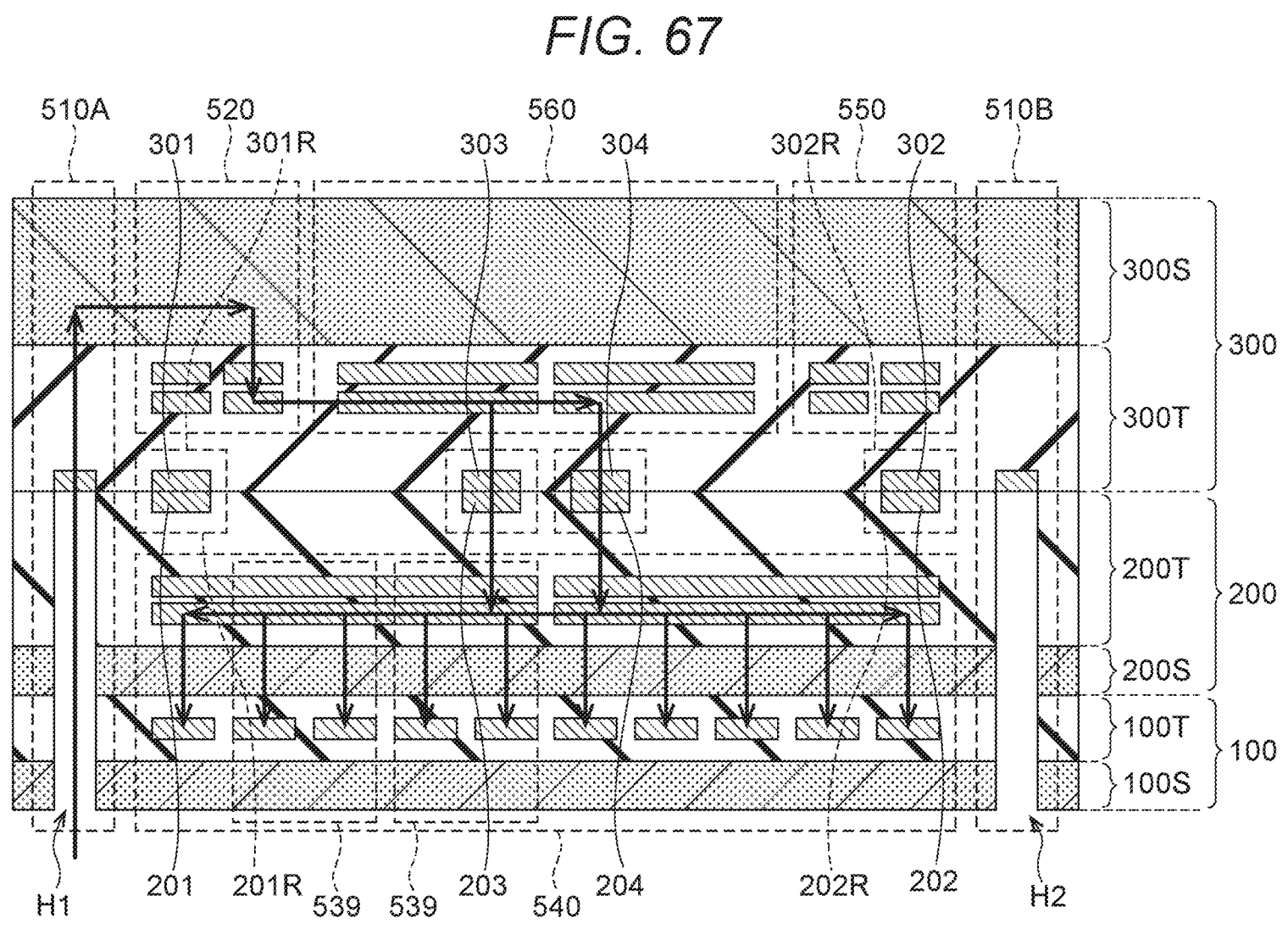
Figure 68:
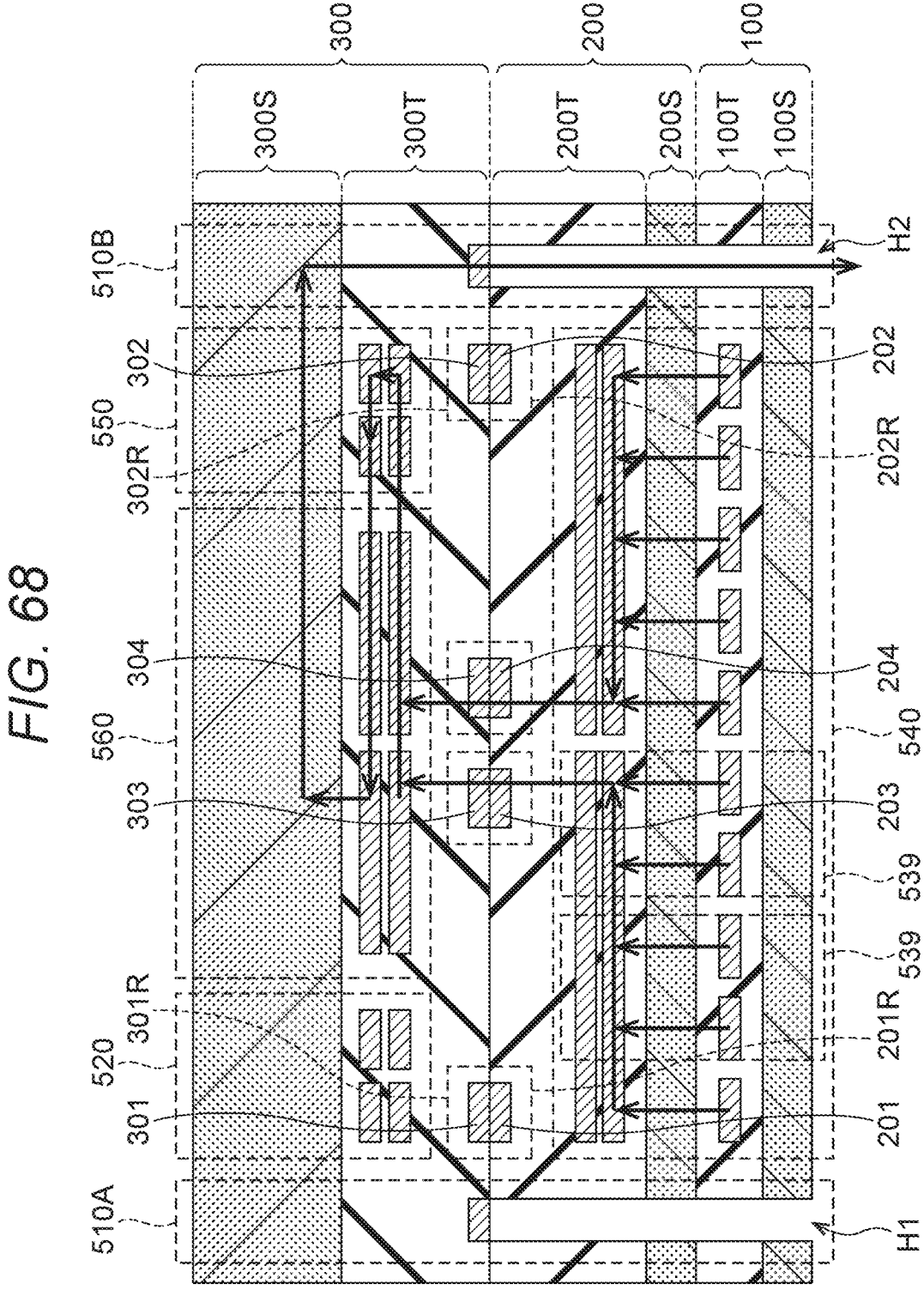
FIG. 68 is a schematic diagram for explaining a signal path of a pixel signal of the imaging apparatus illustrated in FIG. 66.

Next, the operation of the imaging apparatus 1 will be described with reference to FIGS. 67 and 68. In FIG. 67, an input signal input to the imaging apparatus 1 from the outside, and paths of a power supply potential and a reference potential are indicated by arrows. In FIG. 68, a signal path of a pixel signal output from the imaging apparatus 1 to the outside is represented by an arrow. For example, an input signal input to the imaging apparatus 1 via the input section 510A is transmitted to the row drive section 520 of the third substrate 300, and the row drive section 520 creates a row drive signal. The row drive signal is sent to the second substrate 200 via the contact portions 303 and 203. Further, the row drive signal reaches each of the pixel sharing units 539 of the pixel array section 540 via the row drive signal line 542 in the wiring layer 200T. Among the row drive signals reaching the pixel sharing unit 539 of the second substrate 200, drive signals other than the transfer gate TG are input to the pixel circuit 210, and each transistor included in the pixel circuit 210 is driven. A drive signal of the transfer gate TG is input to the transfer gates TG1, TG2, TG3, and TG4 of the first substrate 100 via the through electrode TGV, and the pixels 541A, 541B, 541C, and 541D are driven. Furthermore, the power supply potential and the reference potential supplied from the outside of the imaging apparatus 1 to the input section 510A (input terminal 511) of the third substrate 300 are sent to the second substrate 200 via the contact portions 303 and 203, and supplied to the pixel circuit 210 of each of the pixel sharing units 539 via the wiring in the wiring layer 200T. The reference potential is further supplied to the pixels 541A, 541B, 541C, and 541D of the first substrate 100 via the through electrode 121E. On the other hand, the pixel signal photoelectrically converted by the pixels 541A, 541B, 541C, and 541D of the first substrate 100 is sent to the pixel circuit 210 of the second substrate 200 for each pixel sharing unit 539. The pixel signal based on this pixel signal is sent from the pixel circuit 210 to the third substrate 300 via the vertical signal line 543 and the contact portions 204 and 304. This pixel signal is processed by the column signal processing section

550 and the image signal processing section 560 of the third substrate 300, and then output to the outside via the output section 510B.

The imaging apparatus 1 including such contact portions 203, 204, 303, and 304 can also obtain effects similar to those described in the above embodiments. The position, the number, and the like of the contact portions can be changed according to the design of the circuit or the like of the third substrate 300 to which the wiring is connected via the contact portions 303 and 304.

6. Modification 5

Figure 69:
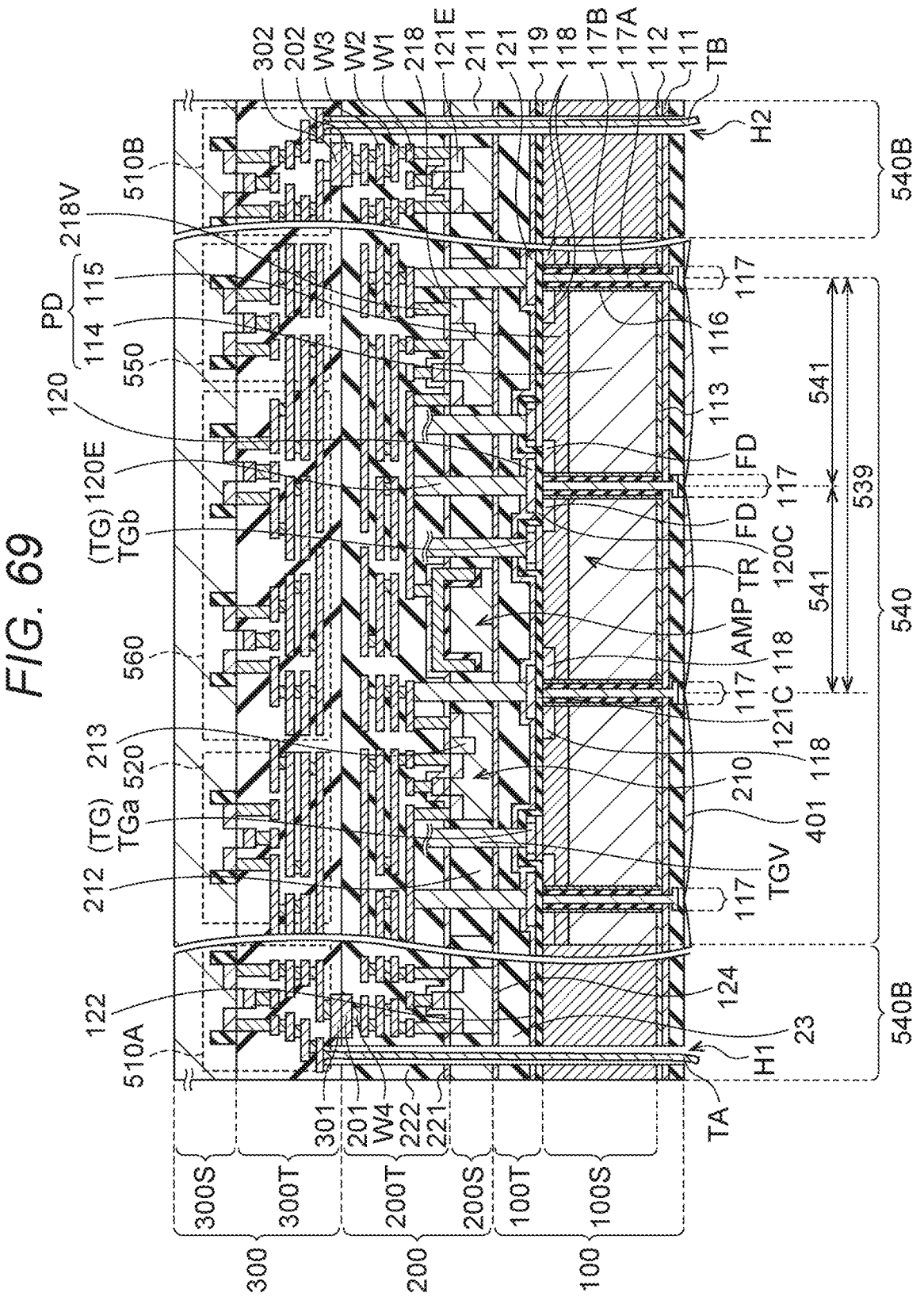
FIG. 69 is a schematic cross-sectional view illustrating another example of the imaging apparatus illustrated in FIG. 40.

FIG. 69 illustrates a modification of the cross-sectional configuration of the imaging apparatus 1 according to the above embodiments. FIG. 69 corresponds to FIG. 40 described in the above embodiments. In the present modification, the transfer transistor TR having a planar structure is provided on the first substrate 100. In this respect, the imaging apparatus 1 of the present modification is different from the imaging apparatus 1 described in the above embodiments.

In the transfer transistor TR, the transfer gate TG is configured only by the horizontal portion TGb. In other words, the transfer gate TG does not have the vertical portion TGa, and is provided to face the semiconductor layer 1003.

The imaging apparatus 1 including the transfer transistor TR having such a planar structure can also obtain effects similar to those described in the above embodiments. Furthermore, it is also conceivable to form the photodiode PD closer to the surface of the semiconductor layer 100S by providing the planar transfer gate TG on the first substrate 100 as compared with the case where the vertical transfer gate TG is provided on the first substrate 100, thereby increasing the saturation signal amount (Qs). In addition, it can be considered that the method of forming the planar transfer gate TG on the first substrate 100 has a smaller number of manufacturing processes than the method of forming the vertical transfer gate TG on the first substrate 100, and the photodiode PD is less likely to be adversely affected due to the manufacturing process.

7. Modification 6

Figure 70:
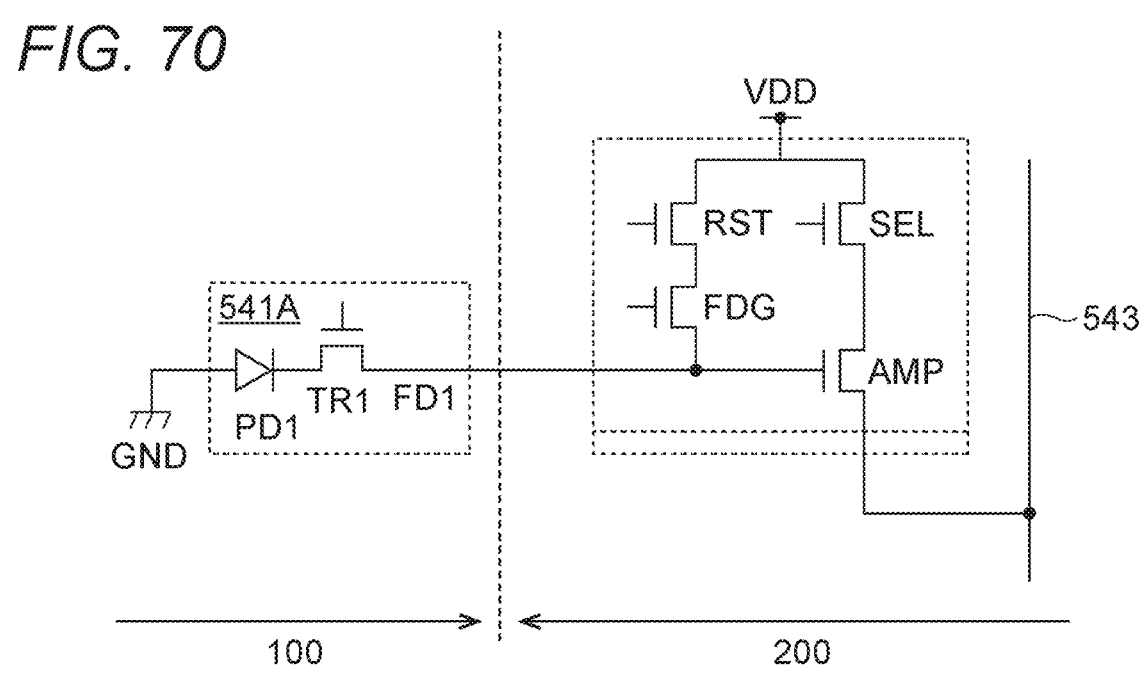
FIG. 70 is a diagram illustrating another example of the equivalent circuit illustrated in FIG. 38.

FIG. 70 illustrates a modification of the pixel circuit of the imaging apparatus 1 according to the above embodiments. FIG. 70 corresponds to FIG. 38 described in the above embodiments. In the present modification, the pixel circuit 210 is provided for each pixel (pixel 541A). That is, the pixel circuit 210 is not shared by a plurality of pixels. In this respect, the imaging apparatus 1 of the present modification is different from the imaging apparatus 1 described in the above embodiments.

The imaging apparatus 1 of the present modification is the same as the imaging apparatus 1 described in the above embodiments in that the pixel 541A and the pixel circuit 210 are provided on different substrates (the first substrate 100 and the second substrate 200). Therefore, the imaging apparatus 1 according to the present modification can also obtain effects similar to those described in the above embodiments.

8. Modification 7

Figure 71:
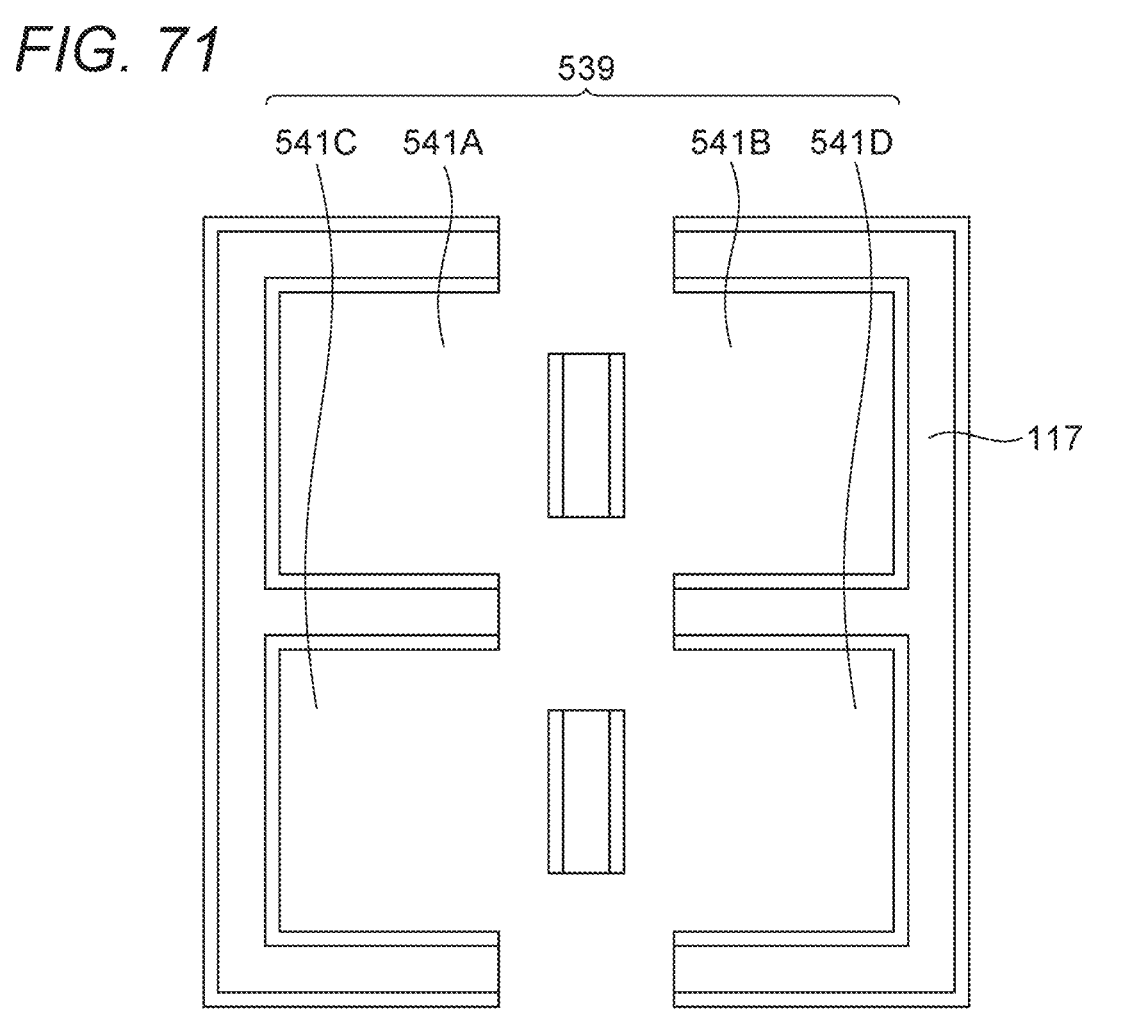

FIG. 71 illustrates a modification of the planar configuration of the pixel isolation portion 117 described in the above embodiments. A gap may be provided in the pixel isolation portion 117 surrounding each of the pixels 541A, 541B, 541C, and 541D. That is, the entire circumference of the pixels 541A, 541B, 541C, and 541D may not be surrounded by the pixel isolation portion 117. For example, the gap of the pixel isolation portion 117 is provided in the vicinity of the pad portions 120 and 121 (see FIG. 41B).

In the above embodiments, the example in which the pixel isolation portion 117 has the FTI structure penetrating the semiconductor layer 100S (see FIG. 40) has been described, but the pixel isolation portion 117 may have a configuration other than the FTI structure. For example, the pixel isolation portion 117 may not be provided so as to completely penetrate the semiconductor layer 100S, and may have a so-called deep trench isolation (DTI) structure.

9. Application Example

Figure 72:
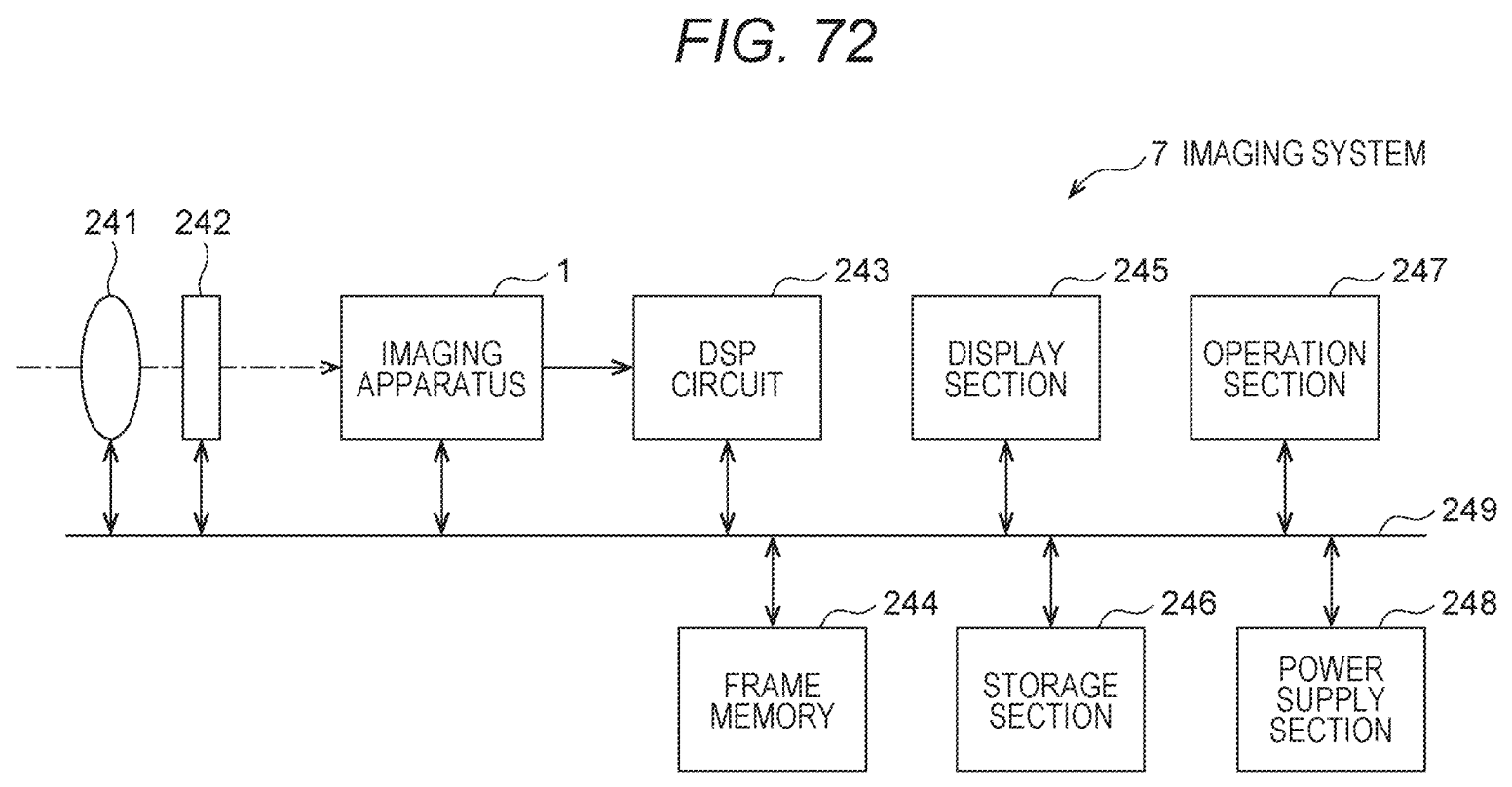

FIG. 72 illustrates an example of a schematic configuration of an imaging system 7 including the imaging apparatus 1 according to the above embodiments and the modifications thereof.

The imaging system 7 is, for example, an electronic device such as an imaging apparatus such as a digital still camera or a video camera, or a portable terminal apparatus such as a smartphone or a tablet terminal. The imaging system 7 includes, for example, the imaging apparatus 1, a DSP circuit 243, a frame memory 244, a display section 245, a storage section 246, an operation section 247, and a power supply section 248 according to the above-described embodiments and the modifications thereof. In the imaging system 7, the imaging apparatus 1, the DSP circuit 243, the frame memory 244, the display section 245, the storage section 246, the operation section 247, and the power supply section 248 according to the above-described embodiments and the modifications thereof are connected to each other via a bus line 249.

The imaging apparatus 1 according to the above-described embodiments and the modification thereof outputs image data according to incident light. The DSP circuit 243 is a signal processing circuit that processes a signal (image data) output from the imaging apparatus 1 according to the above-described embodiments and the modifications thereof. The frame memory 244 temporarily holds the image data processed by the DSP circuit 243 in units of frames. The display section 245 includes, for example, a panel-type display apparatus such as a liquid crystal panel or an organic electro luminescence (EL) panel, and displays a moving image or a still image captured by the imaging apparatus 1 according to the above-described embodiments and the modifications thereof. The storage section 246 records image data of a moving image or a still image captured by the imaging apparatus 1 according to the above-described embodiments and the modifications thereof in a recording medium such as a semiconductor memory or a hard disk. The operation section 247 issues operation commands for various functions of the imaging system 7 in accordance with an operation by the user. The power supply section 248 appropriately supplies various power supplies serving as operation power supplies of the imaging apparatus 1, the DSP circuit 243, the frame memory 244, the display section 245, the storage section 246, and the operation section 247 according to the above-described embodiments and the modifications thereof to these supply targets.

Next, an imaging procedure in the imaging system 7 will be described.

Figure 73:
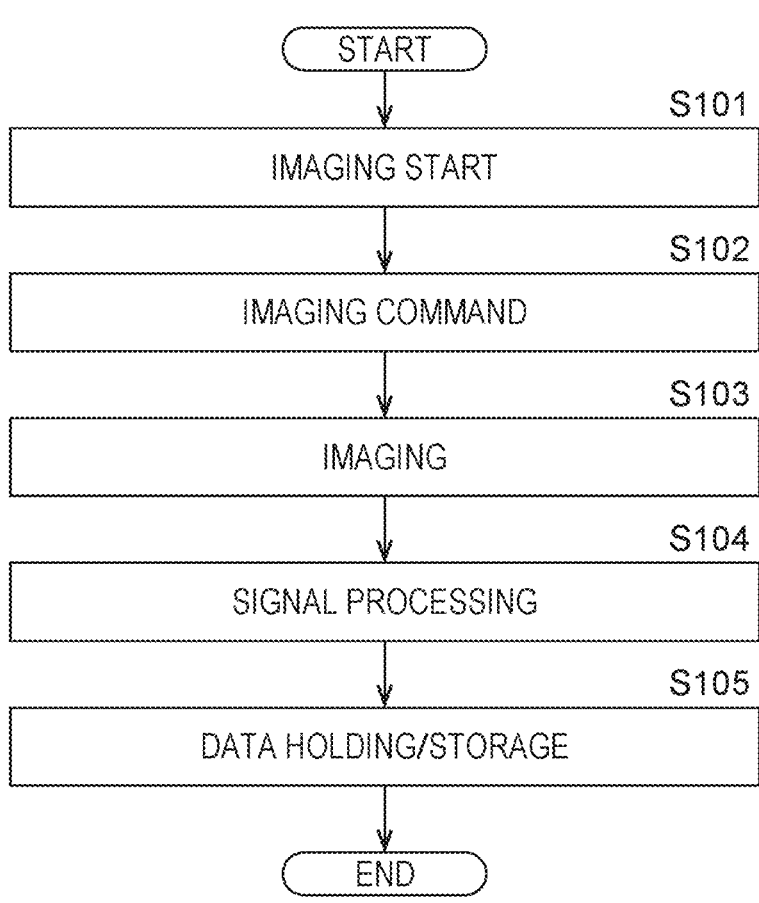
FIG. 73 is a diagram illustrating an example of an imaging procedure of the imaging system illustrated in FIG. 72.

FIG. 73 illustrates an example of a flowchart of an imaging operation in the imaging system 7. The user instructs start of imaging by operating the operation section 247 (step S101). Then, the operation section 247 transmits an imaging command to the imaging apparatus 1 (step S102). When receiving the imaging command, the imaging apparatus 1 (specifically, the system control circuit 36) executes imaging by a predetermined imaging scheme (step S103).

The imaging apparatus 1 outputs image data obtained by imaging to the DSP circuit 243. Here, the image data is data for all the pixels of the pixel signal generated on the basis of the charge temporarily held in the floating diffusion FD. The DSP circuit 243 performs predetermined signal processing (for example, noise reduction processing or the like) on the basis of the image data input from the imaging apparatus 1 (step S104). The DSP circuit 243 causes the frame memory 244 to hold the image data subjected to predetermined signal processing, and the frame memory 244 causes the storage section 246 to store the image data (step S105). In this manner, imaging in the imaging system 7 is performed.

In the present application example, the imaging apparatus 1 according to the above-described embodiments and the modifications thereof is applied to the imaging system 7. As a result, since the imaging apparatus 1 can be downsized or high definition, it is possible to provide the small or high definition imaging system 7.

10. Application Example

Application Example 1

The technology according to the present disclosure (present technology) can be applied to various electronic devices. For example, the technology according to the present disclosure may be achieved in the form of an apparatus to be mounted on a moving body of any kind, such as an automobile, an electric vehicle, a hybrid electric vehicle, a motorcycle, a bicycle, a personal mobility, an airplane, a drone, a ship, or a robot.

FIG. 74 is a block diagram illustrating a schematic configuration example of a vehicle control system as an example of a moving body control system to which the technology according to the present disclosure is applied.

The vehicle control system 12000 includes a plurality of electronic control units connected to each other via a communication network 12001. In the example illustrated in FIG. 74, the vehicle control system 12000 includes a driving system control unit 12010, a body system control unit 12020, an outside-vehicle information detecting unit 12030, an in-vehicle information detecting unit 12040, and an integrated control unit 12050. Furthermore, a microcomputer 12051, a sound/image output section 12052, and a vehicle-mounted network interface (I/F) 12053 are illustrated as a functional configuration of the integrated control unit 12050.

The driving system control unit 12010 controls the operation of apparatuses related to the driving system of the vehicle in accordance with various kinds of programs. For example, the driving system control unit 12010 functions as a control apparatus for a driving force generating apparatus for generating the driving force of the vehicle, such as an internal combustion engine, a driving motor, or the like, a driving force transmitting mechanism for transmitting the driving force to wheels, a steering mechanism for adjusting the steering angle of the vehicle, a braking apparatus for generating the braking force of the vehicle, and the like.

The body system control unit 12020 controls the operation of various kinds of apparatuses provided to a vehicle body in accordance with various kinds of programs. For example, the body system control unit 12020 functions as a control apparatus for a keyless entry system, a smart key system, a power window apparatus, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock apparatus, the power window apparatus, the lamps, or the like of the vehicle.

The outside-vehicle information detecting unit 12030 detects information about the outside of the vehicle equipped with the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the picked up image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may discriminate whether the driver is dozing.

The microcomputer 12051 can calculate a control target value for the driving force generating apparatus, the steering mechanism, or the braking apparatus on the basis of the information about the inside or outside of the vehicle which information is acquired by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS), the functions including collision avoidance or shock mitigation for the vehicle, follow-up traveling based on an inter-vehicle distance, vehicle speed maintaining traveling, vehicle collision warning, vehicle lane departure warning, and the like.

In addition, the microcomputer 12051 can perform cooperative control intended for automated driving, which makes the vehicle to travel automatedly without depending on the operation of the driver, or the like, by controlling the driving force generating apparatus, the steering mechanism, the braking apparatus, or the like on the basis of the information about the outside or inside of the vehicle which information is acquired by the outside-vehicle information detecting unit 12030 or the in-vehicle information detecting unit 12040.

In addition, the microcomputer 12051 can output a control command to the body system control unit 12020 on the basis of the information about the outside of the vehicle which information is acquired by the outside-vehicle information detecting unit 12030. For example, the microcomputer 12051 can perform cooperative control intended to prevent a glare by controlling the headlamp so as to switch from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output apparatus capable of visually or auditorily notifying information to an occupant of the vehicle or the outside of the vehicle. In the example of FIG. 74, an audio speaker 12061, a display section 12062, and an instrument panel 12063 are illustrated as the output apparatus. The display section 12062 may, for example, include at least one of an on-board display or a head-up display.

Figure 75:
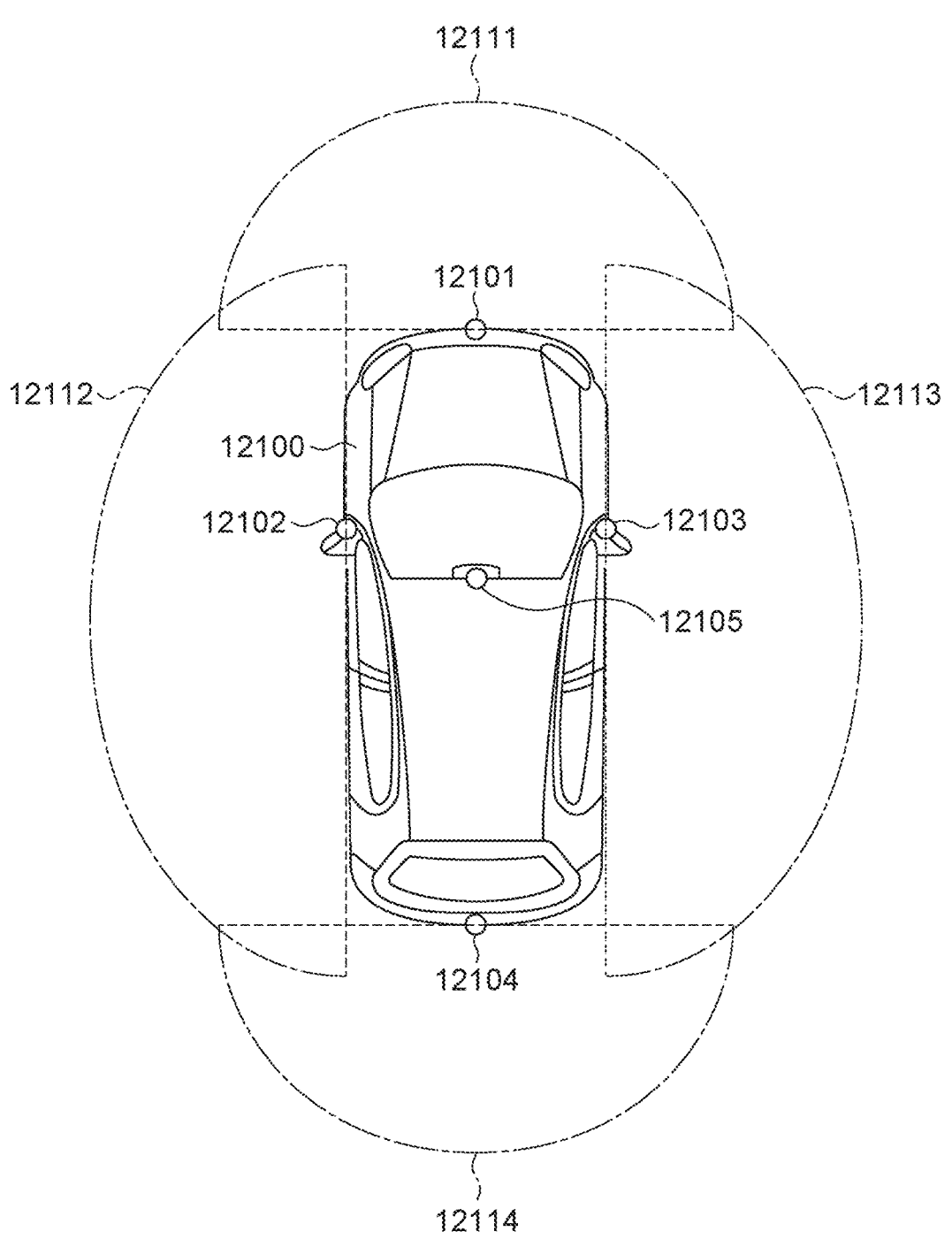
FIG. 75 is an explanatory diagram illustrating an example of installation positions of an outside-vehicle information detecting section and an imaging section.

FIG. 75 is a diagram illustrating an example of the installation position of the imaging section 12031.

In FIG. 75, a vehicle 12100 includes imaging sections 12101, 12102, 12103, 12104, and 12105, as the imaging section 12031.

The imaging sections 12101, 12102, 12103, 12104, and 12105 are provided, for example, at positions such as a front nose, a sideview mirror, a rear bumper, a back door, and an upper portion of a windshield in the interior of the vehicle 12100. The imaging section 12101 provided to the front nose and the imaging section 12105 provided to the upper portion of the windshield within the interior of the vehicle acquire mainly an image of the front of the vehicle 12100. The imaging sections 12102 and 12103 provided to the sideview mirrors acquire mainly an image of the sides of the vehicle 12100. The imaging section 12104 provided to the rear bumper or the back door acquires mainly an image of the rear of the vehicle 12100. The forward images acquired by the imaging sections 12101 and 12105 are used mainly to detect a preceding vehicle, a pedestrian, an obstacle, a traffic signal, a traffic sign, a lane, or the like.

Note that FIG. 75 illustrates an example of imaging ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of acquiring distance information. For example, at least one of the imaging sections 12101 to 12104 may be a stereo camera constituted by a plurality of image pickup elements, or may be an image pickup element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including follow-up stop control), automatic acceleration control (including follow-up start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 can outputs a warning to the driver via the audio speaker 12061 or the display section 12062 and perform forced deceleration or avoidance steering via the driving system control unit 12010 to perform driving assistance for collision avoidance.

At least one of the imaging sections 12101 to 12104 may be an infrared camera that detects infrared rays. The microcomputer 12051 can, for example, recognize a pedestrian by determining whether or not there is a pedestrian in picked up images of the imaging sections 12101 to 12104. Such recognition of a pedestrian is, for example, performed by a procedure of extracting characteristic points in the picked up images of the imaging sections 12101 to 12104 as infrared cameras and a procedure of discriminating whether or not it is the pedestrian by performing pattern matching processing on a series of characteristic points representing the contour of the object. When the microcomputer 12051 determines that there is a pedestrian in the picked up images of the imaging sections 12101 to 12104, and thus recognizes the pedestrian, the sound/image output section 12052 controls the display section 12062 so that a square contour line for emphasis is displayed so as to be superimposed on the recognized pedestrian. Furthermore, the sound/image output section 12052 may also control the display section 12062 so that an icon or the like representing the pedestrian is displayed at a desired position.

An example of the moving body control system to which the technology according to the present disclosure can be applied has been described above. The technology according to the present disclosure can be applied to the imaging section 12031 among the configurations described above. Specifically, the imaging apparatus 1 according to the above-described embodiments and the modifications thereof can be applied to the imaging section 12031. By applying the technology according to the present disclosure to the imaging section 12031, it is possible to obtain a high-definition captured image with little noise, and thus, it is possible to perform high-accuracy control using the captured image in the moving body control system.

Application Example 2

Figure 76:
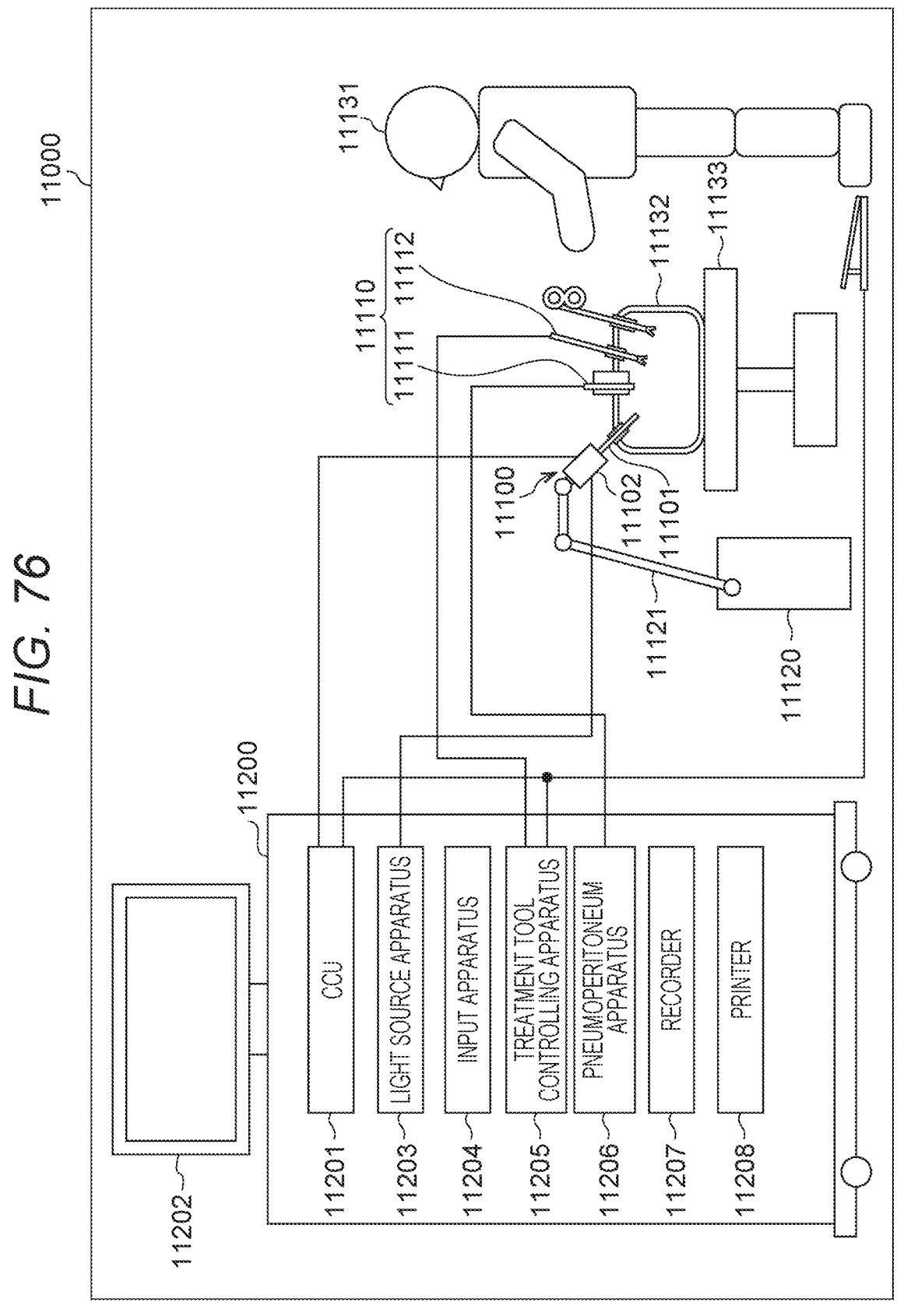
FIG. 76 is a diagram illustrating an example of a schematic configuration of an endoscopic surgery system.

FIG. 76 is a diagram illustrating an example of a schematic configuration of an endoscopic surgery system to which the technology according to the present disclosure (present technology) can be applied.

In FIG. 76, a state is depicted in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy treatment tool 11112, a supporting arm apparatus 11120 which supports the endoscope 11100 thereon, and a cart 11200 on which various apparatuses for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photoelectrically converted by the image pickup element to generate an electric signal corresponding to the observation light, namely, an image signal corresponding to an observation image. The image signal is transmitted as RAW data to a camera control unit (CCU) 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various types of image processing for displaying an image based on the image signal such as, for example, development processing (demosaic processing).

The display apparatus 11202 displays thereon an image based on an image signal, for which the image processing has been performed by the CCU 11201, under the control of the CCU 11201.

The light source apparatus 11203 includes a light source such as a light emitting diode (LED), for example, and supplies irradiation light for imaging a surgical site to the endoscope 11100.

An input apparatus 11204 is an input interface for the endoscopic surgery system 11000. A user can perform inputting of various kinds of information or instruction inputting to the endoscopic surgery system 11000 through the input apparatus 11204. For example, the user would input an instruction or a like to change an image pickup condition (type of irradiation light, magnification, focal distance or the like) by the endoscope 11100.

A treatment tool controlling apparatus 11205 controls driving of the energy treatment tool 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical site is to be imaged to the endoscope 11100 may include a white light source which includes, for example, an LED, a laser light source or a combination of them. In a case where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Furthermore, the driving of the light source apparatus 11203 may be controlled so as to change the intensity of light to be output every predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be generated.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 77:
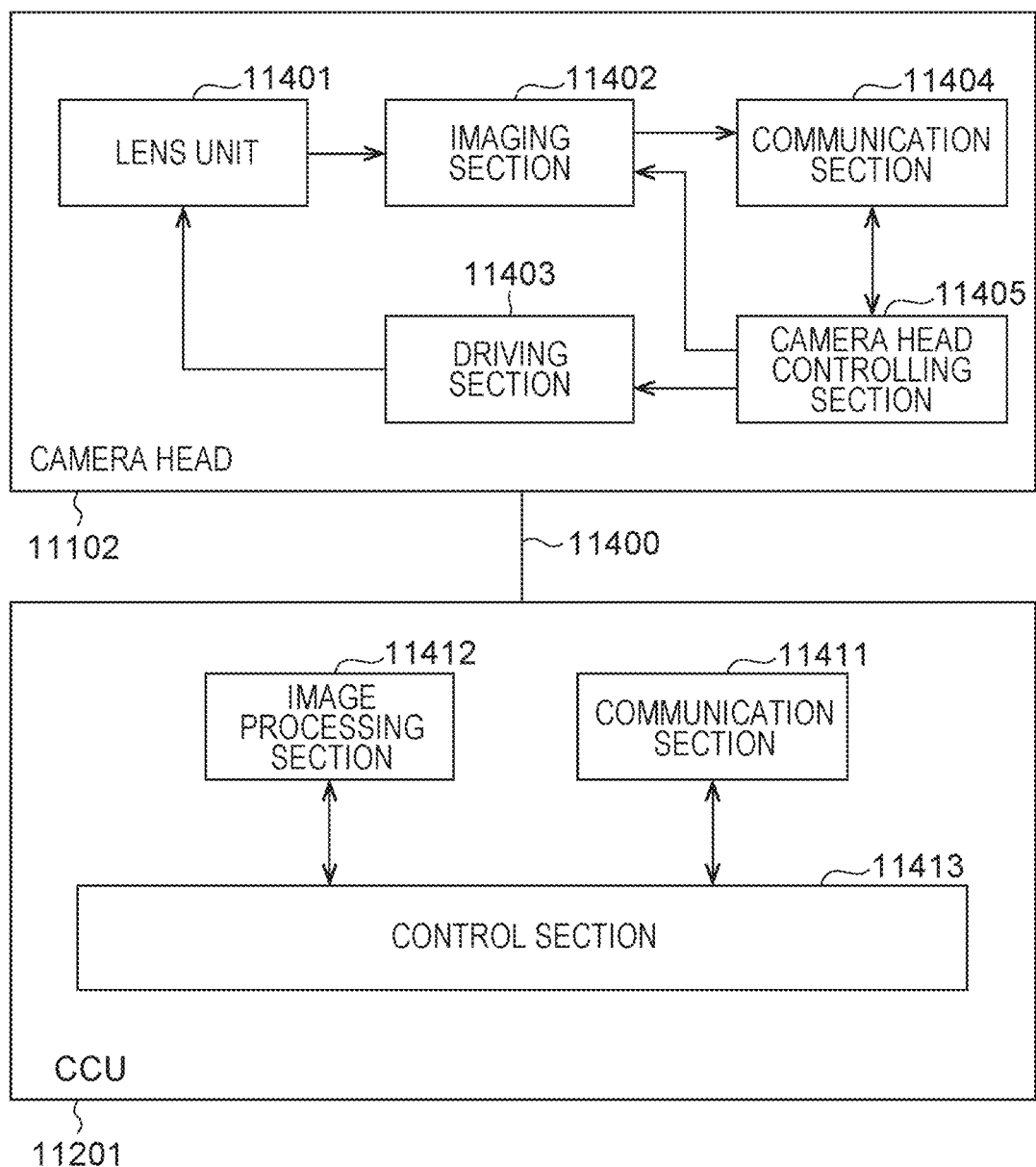
FIG. 77 is a block diagram illustrating an example of a functional configuration of a camera head and a CCU.

FIG. 77 is a block diagram illustrating an example of a functional configuration of the camera head 11102 and the CCU 11201 illustrated in FIG. 76.

The camera head 11102 includes a lens unit 11401, an imaging section 11402, a driving section 11403, a communication section 11404 and a camera head controlling section 11405. The CCU 11201 includes a communication section 11411, an image processing section 11412 and a control section 11413. The camera head 11102 and the CCU 11201 are connected for communication to each other by a transmission cable 11400.

The lens unit 11401 is an optical system, provided at a connection portion to the lens barrel 11101. Observation light taken in from the distal end of the lens barrel 11101 is guided to the camera head 11102 and enters the lens unit 11401. The lens unit 11401 includes a combination of a plurality of lenses including a zoom lens and a focusing lens.

The imaging section 11402 includes an image pickup element. The number of image pickup elements which is included by the imaging section 11402 may be one (single-plate type) or a plural number (multi-plate type). Where the imaging section 11402 is configured as that of the multi-plate type, for example, image signals corresponding to respective R, G and B are generated by the image pickup elements, and the image signals may be synthesized to obtain a color image. Alternatively, the imaging section 11402 may include a pair of image pickup elements for acquiring right-eye and left-eye image signals corresponding to three-dimensional (3D) display. If 3D display is performed, then the depth of a living body tissue in a surgical site can be comprehended more accurately by the surgeon 11131. It is to be noted that, in a case where the imaging section 11402 is configured as a multi-plate type, a plurality of systems of lens units 11401 is provided corresponding to the individual image pickup elements.

Further, the imaging section 11402 may not necessarily be provided on the camera head 11102. For example, the imaging section 11402 may be provided immediately behind the objective lens in the inside of the lens barrel 11101.

The driving section 11403 includes an actuator and moves the zoom lens and the focusing lens of the lens unit 11401 by a predetermined distance along an optical axis under the control of the camera head controlling section 11405. Consequently, the magnification and the focal point of a picked up image by the imaging section 11402 can be adjusted suitably.

The communication section 11404 includes a communication apparatus for transmitting and receiving various kinds of information to and from the CCU 11201. The communication section 11404 transmits an image signal acquired from the imaging section 11402 as RAW data to the CCU 11201 through the transmission cable 11400.

In addition, the communication section 11404 receives a control signal for controlling driving of the camera head 11102 from the CCU 11201 and supplies the control signal to the camera head controlling section 11405. The control signal includes information regarding image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point described above may be designated by the user or may be set automatically by the control section 11413 of the CCU 11201 on the basis of an acquired image signal. In the latter case, a so-called auto exposure (AE) function, an auto focus (AF) function, and an auto white balance (AWB) function are installed in the endoscope 11100.

The camera head controlling section 11405 controls driving of the camera head 11102 on the basis of a control signal from the CCU 11201 received through the communication section 11404.

The communication section 11411 includes a communication apparatus for transmitting and receiving various kinds of information to and from the camera head 11102. The communication section 11411 receives an image signal transmitted thereto from the camera head 11102 through the transmission cable 11400.

Further, the communication section 11411 transmits a control signal for controlling driving of the camera head 11102 to the camera head 11102. The image signal and the control signal can be transmitted by electrical communication, optical communication or the like.

The image processing section 11412 performs various image processes for an image signal in the form of RAW data transmitted thereto from the camera head 11102.

The control section 11413 performs various kinds of control relating to image picking up of a surgical site or the like by the endoscope 11100 and display of a picked up image obtained by image picking up of the surgical site or the like. For example, the control section 11413 generates a control signal for controlling driving of the camera head 11102.

Further, the control section 11413 controls, on the basis of an image signal for which image processes have been performed by the image processing section 11412, the display apparatus 11202 to display a picked up image in which the surgical site or the like is imaged. Thereupon, the control section 11413 may recognize various objects in the picked up image using various image recognition technologies. For example, the control section 11413 can recognize a surgical tool such as forceps, a particular living body site, bleeding, mist when the energy treatment tool 11112 is used and so forth by detecting the shape, color and so forth of edges of objects included in a picked up image. The control section 11413 may cause, when it controls the display apparatus 11202 to display a picked up image, various kinds of surgery supporting information to be displayed in an overlapping manner with an image of the surgical site using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure can be applied has been described above. The technology according to the present disclosure can be suitably applied to the imaging section 11402 provided in the camera head 11102 of the endoscope 11100 among the above-described configurations. By applying the technology according to the present disclosure to the imaging section 11402, the imaging section 11402 can be downsized or high definition, so that the endoscope 11100 having a small size or high definition can be provided.

Although the present disclosure has been described with reference to the embodiments, the modifications, application examples, and applied examples thereof above, the present disclosure is not limited to the embodiments and the like, and various modifications can be made. Note that the effects described in the present specification are merely examples. The effects of the present disclosure are not limited to the effects described herein. The present disclosure may have effects other than those described herein.

Note that the present technology may have the following configurations.

(1)

A comparator that compares a signal with a reference signal and outputs a comparison result, the comparator including:

a differential circuit that outputs a differential voltage between the signal and the reference signal; and an active load circuit electrically connected to the differential circuit, in which the active load circuit includes first and second transistors provided on a surface of a substrate, and the first and second transistors have channel regions extending in a direction substantially perpendicular to the surface of the substrate.

(2)

The comparator according to (1), in which the channel regions of the first and second transistors have at least one recess substantially perpendicular to the surface of the substrate or at least one protrusion substantially perpendicular to the surface of the substrate along a channel length direction.

(3)

The comparator according to (2), in which the recess or the protrusion includes:

two first side surfaces substantially perpendicular to the surface of the substrate; and a first bottom surface or a first upper surface substantially parallel to the surface of the substrate.

(4)

The comparator according to any one of (1) to (3), in which the differential circuit includes third and fourth transistors provided on the surface of the substrate, and the third and fourth transistors have channel regions including a second upper surface substantially parallel to the surface of the substrate and a second side surface substantially perpendicular to the surface of the substrate.

(5)

The comparator according to (4), in which the channel regions of the first and second transistors extend in a direction substantially perpendicular to the surface of the substrate to a depth substantially equal to a height of the second side surface or to a height substantially equal to the height of the second side surface.

(6)

The comparator according to any one of (1) to (5), in which the differential circuit includes third and fourth transistors provided on the surface of the substrate, and channel length directions of the first and second transistors and the third and fourth transistors as viewed from a direction substantially perpendicular to the surface of the substrate are inclined by about 90° with respect to each other.

(7)

The comparator according to any one of (1) to (6), in which the differential circuit includes third and fourth transistors provided on the surface of the substrate, the first and second transistors are p-type transistors, and the third and fourth transistors are n-type transistors.

(8)

The comparator according to (7), in which channel length directions of the first and second transistors are substantially perpendicular or substantially parallel to a (100) crystal plane of the substrate.

(9)

The comparator according to any one of (1) to (6), in which the differential circuit includes third and fourth transistors provided on the surface of the substrate, the first and second transistors are n-type transistors, and the third and fourth transistors are p-type transistors.

(10)

The comparator according to (9), in which channel length directions of the third and fourth transistors are substantially perpendicular or substantially parallel to a (110) crystal plane of the substrate.

(11)

A light detection element including:

a pixel portion including a photoelectric conversion element that photoelectrically converts incident light into a pixel signal; and a comparator that compares the pixel signal with a reference signal and outputs a comparison result, the comparator including:

a differential circuit that outputs a differential voltage between the pixel signal and the reference signal; and an active load circuit electrically connected to the differential circuit, in which the active load circuit includes first and second transistors provided on a surface of a substrate, and the first and second transistors have channel regions extending in a direction substantially perpendicular to the surface of the substrate.

(12)

The light detection element according to (11), in which the pixel portion is provided on a first substrate, the comparator is provided on a second substrate different from the first substrate, the first substrate and the second substrate are laminated, and the pixel portion and the comparator are electrically connected by a through electrode provided on the first or second substrate or a wiring junction between a wiring of the first substrate and a wiring of the second substrate.

(13)

The light detection element according to (11), in which the pixel portion and the comparator are provided on the same first substrate, the comparator is provided above the pixel portion of the first substrate, and the pixel portion and the comparator are electrically connected by a contact plug provided in an interlayer insulating film between the pixel portion and the comparator.

(14)

The light detection element according to (11), in which the differential circuit is provided on a first substrate, the active load circuit is provided on a second substrate different from the first substrate, the first substrate and the second substrate are laminated, and the differential circuit and the active load circuit are electrically connected by bonding a wiring of the first substrate and a wiring of the second substrate.

(15)

The light detection element according to (14), in which the pixel portion and the differential circuit are provided on the same first substrate, the differential circuit is provided above the pixel portion of the first substrate, and the pixel portion and the differential circuit are electrically connected by a contact plug provided in an interlayer insulating film between the pixel portion and the differential circuit.

(16)

The light detection element according to (11), in which the pixel portion and the comparator are provided on the same first substrate, the differential circuit is provided in a same layer as a transistor of the pixel portion, the active load circuit is provided above the pixel portion of the first substrate, and the differential circuit and the active load circuit are electrically connected by a contact plug provided in an interlayer insulating film between the differential circuit and the active load circuit.

(17)

An electronic device including the light detection element according to any one of (11) to (16).

Aspects of the present disclosure are not limited to the above-described individual embodiments, but include various modifications that can be conceived by those skilled in the art, and the effects of the present disclosure are not limited to the above-described contents. That is, various additions, modifications, and partial deletions are possible without departing from the conceptual idea and spirit of the present disclosure derived from the contents defined in the claims and equivalents thereof.

REFERENCE SIGNS LIST

100 First substrate
200 Second substrate
300 Third substrate
210 Comparator
539 Pixel sharing unit
210a Current mirror circuit
210b Differential circuit
210c Current source
Tp1, Tp2 p-type transistor
Tn1 to Tn4 n-type transistor
PD Photodiode
FD Floating diffusion
TR Transfer transistor
OF Overflow gate CCC Wiring junction
VIA Via contact
PLG Contact plug
W0 0 degree notch substrate
W45 45 degree notch substrate
CHtp Channel region
Gtp Gate electrode
D1, D2 Channel length direction
CHtp, CHtn Channel region
Gtp, Gtn Gate electrode
Ss1, Ss2 First side surface
St First upper surface
Sb First bottom surface
Ssf Second side surface
Stf Second upper surface
Dcp, Dcn Channel length direction

The invention claimed is:

1. A comparator that compares a signal with a reference signal and outputs a comparison result, the comparator comprising:
a differential circuit that outputs a differential voltage between the signal and the reference signal; and
an active load circuit electrically connected to the differential circuit, wherein
the active load circuit includes first and second transistors provided on a surface of a substrate,
the first and second transistors have channel regions extending in a direction substantially perpendicular to the surface of the substrate,
the differential circuit includes third and fourth transistors provided on the surface of the substrate, and
the third and fourth transistors have channel regions including a second upper surface substantially parallel to the surface of the substrate and a second side surface substantially perpendicular to the surface of the substrate.

2. The comparator according to claim 1, wherein the channel regions of the first and second transistors extend in a direction substantially perpendicular to the surface of the substrate to a depth substantially equal to a height of the second side surface or to a height substantially equal to the height of the second side surface.

3. A comparator that compares a signal with a reference signal and outputs a comparison result, the comparator comprising:
a differential circuit that outputs a differential voltage between the signal and the reference signal; and
an active load circuit electrically connected to the differential circuit, wherein
the active load circuit includes first and second transistors provided on a surface of a substrate,
the first and second transistors have channel regions extending in a direction substantially perpendicular to the surface of the substrate,
the differential circuit includes third and fourth transistors provided on the surface of the substrate, and
channel length directions of the first and second transistors and the third and fourth transistors as viewed from a direction substantially perpendicular to the surface of the substrate are inclined by about 90° with respect to each other.

4. A comparator that compares a signal with a reference signal and outputs a comparison result, the comparator comprising:
a differential circuit that outputs a differential voltage between the signal and the reference signal; and an active load circuit electrically connected to the differential circuit, wherein
the active load circuit includes first and second transistors provided on a surface of a substrate,
the first and second transistors have channel regions extending in a direction substantially perpendicular to the surface of the substrate,
the differential circuit includes third and fourth transistors provided on the surface of the substrate,
the first and second transistors are p-type transistors, and
the third and fourth transistors are n-type transistors.

5. The comparator according to claim 4, wherein channel length directions of the first and second transistors are substantially perpendicular or substantially parallel to a (100) crystal plane of the substrate.

6. A comparator that compares a signal with a reference signal and outputs a comparison result, the comparator comprising:
a differential circuit that outputs a differential voltage between the signal and the reference signal; and
an active load circuit electrically connected to the differential circuit, wherein
the active load circuit includes first and second transistors provided on a surface of a substrate,
the first and second transistors have channel regions extending in a direction substantially perpendicular to the surface of the substrate,
the differential circuit includes third and fourth transistors provided on the surface of the substrate,
the first and second transistors are n-type transistors, and
the third and fourth transistors are p-type transistors.

7. The comparator according to claim 6, wherein channel length directions of the third and fourth transistors are substantially perpendicular or substantially parallel to a (110) crystal plane of the substrate.

8. A light detection element comprising:
a pixel portion including a photoelectric conversion element that photoelectrically converts incident light into a pixel signal; and
a comparator that compares the pixel signal with a reference signal and outputs a comparison result,
the comparator including:
a differential circuit that outputs a differential voltage between the pixel signal and the reference signal; and
an active load circuit electrically connected to the differential circuit,
wherein the active load circuit includes first and second transistors provided on a surface of a substrate,
the first and second transistors have channel regions extending in a direction substantially perpendicular to the surface of the substrate,
the pixel portion is provided on a first substrate,
the comparator is provided on a second substrate different from the first substrate,
the first substrate and the second substrate are laminated, and
the pixel portion and the comparator are electrically connected by a through electrode provided on the first substrate or the second substrate or a wiring junction between a wiring of the first substrate and a wiring of the second substrate.

9. An electronic device comprising the light detection element according to claim 8.

10. A light detection element comprising:
a pixel portion including a photoelectric conversion element that photoelectrically converts incident light into a pixel signal; and a comparator that compares the pixel signal with a reference signal and outputs a comparison result, the comparator including:

a differential circuit that outputs a differential voltage between the pixel signal and the reference signal; and an active load circuit electrically connected to the differential circuit, wherein the active load circuit includes first and second transistors provided on a surface of a substrate, the first and second transistors have channel regions extending in a direction substantially perpendicular to the surface of the substrate, the pixel portion and the comparator are provided on the substrate, the comparator is provided above the pixel portion of the substrate, and the pixel portion and the comparator are electrically connected by a contact plug provided in an interlayer insulating film between the pixel portion and the comparator.

11. An electronic device comprising the light detection element according to claim 10.

12. A light detection element comprising:

a pixel portion including a photoelectric conversion element that photoelectrically converts incident light into a pixel signal; and a comparator that compares the pixel signal with a reference signal and outputs a comparison result, the comparator including:

a differential circuit that outputs a differential voltage between the pixel signal and the reference signal; and an active load circuit electrically connected to the differential circuit, wherein the active load circuit includes first and second transistors provided on a surface of a substrate, the first and second transistors have channel regions extending in a direction substantially perpendicular to the surface of the substrate, the differential circuit is provided on a first substrate, the active load circuit is provided on a second substrate different from the first substrate, the first substrate and the second substrate are laminated, and the differential circuit and the active load circuit are electrically connected by bonding a wiring of the first substrate and a wiring of the second substrate.

13. The light detection element according to claim 12, wherein the pixel portion and the differential circuit are provided on the first substrate, the differential circuit is provided above the pixel portion of the first substrate, and the pixel portion and the differential circuit are electrically connected by a contact plug provided in an interlayer insulating film between the pixel portion and the differential circuit.

14. An electronic device comprising the light detection element according to claim 12.

15. A light detection element comprising:

a pixel portion including a photoelectric conversion element that photoelectrically converts incident light into a pixel signal; and a comparator that compares the pixel signal with a reference signal and outputs a comparison result, the comparator including:

a differential circuit that outputs a differential voltage between the pixel signal and the reference signal; and an active load circuit electrically connected to the differential circuit, wherein the active load circuit includes first and second transistors provided on a surface of a substrate, the first and second transistors have channel regions extending in a direction substantially perpendicular to the surface of the substrate, the pixel portion and the comparator are provided on the substrate, the differential circuit is provided in a same layer as a transistor of the pixel portion, the active load circuit is provided above the pixel portion of the substrate, and the differential circuit and the active load circuit are electrically connected by a contact plug provided in an interlayer insulating film between the differential circuit and the active load circuit.

16. An electronic device comprising the light detection element according to claim 15.

* * * * *